(12) United States Patent
Honda

(10) Patent No.: US 8,008,130 B2
(45) Date of Patent: Aug. 30, 2011

(54) MULTILAYER INTERCONNECTION BOARD, SEMICONDUCTOR DEVICE HAVING THE SAME, AND METHOD OF FORMING THE SAME AS WELL AS METHOD OF MOUNTING THE SEMICONDUTOR CHIP ON THE INTERCONNECTION BOARD

(75) Inventor: Hirokazu Honda, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 634 days.

(21) Appl. No.: 11/727,025

(22) Filed: Mar. 23, 2007

(65) Prior Publication Data

US 2007/0184604 A1    Aug. 9, 2007

Related U.S. Application Data

(62) Division of application No. 09/678,609, filed on Oct. 4, 2000, now Pat. No. 7,217,999.

(30) Foreign Application Priority Data

Oct. 5, 1999   (JP) .................................. 11-284566
Mar. 2, 2000   (JP) ................................ 2000-057767

(51) Int. Cl.
 *H01L 21/00*    (2006.01)
 *H01L 21/44*    (2006.01)
(52) U.S. Cl. ........ 438/122; 438/125; 438/612; 438/613; 438/614; 438/759; 438/977
(58) Field of Classification Search .................. None
See application file for complete search history.

(56) References Cited

U.S. PATENT DOCUMENTS

| | | | |
|---|---|---|---|
| 3,726,002 A | | 4/1973 | Greenstein et al. |
| 4,003,621 A | | 1/1977 | Lamp |
| 4,064,623 A | | 12/1977 | Moore |
| 4,067,104 A | * | 1/1978 | Tracy ............................. 29/854 |
| 4,240,198 A | | 12/1980 | Alonso |
| 4,664,309 A | | 5/1987 | Allen et al. |
| 4,705,205 A | | 11/1987 | Allen et al. |
| 4,712,721 A | | 12/1987 | Noel et al. |
| 4,783,722 A | | 11/1988 | Osaki et al. |
| 4,807,021 A | | 2/1989 | Okumura |
| 4,818,728 A | * | 4/1989 | Rai et al. ....................... 438/108 |
| 4,847,136 A | | 7/1989 | Lo |
| 4,926,251 A | | 5/1990 | Sekizawa et al. |
| 4,995,941 A | * | 2/1991 | Nelson et al. .................. 216/18 |
| 4,998,885 A | | 3/1991 | Beaman |

(Continued)

FOREIGN PATENT DOCUMENTS

CN        1043407        6/1990

(Continued)

OTHER PUBLICATIONS

Chinese Patent Office issued a Chinese Office Action dated Jun. 26, 2009, Application No. 200810008905.

*Primary Examiner* — David E Graybill
(74) *Attorney, Agent, or Firm* — Young & Thompson

(57) ABSTRACT

In accordance with the present invention, during formation of the interconnection board, the interconnection board remains securely fixed to a high rigidity plate being higher in rigidity than the interconnection board for suppressing the interconnection board from being bent.

19 Claims, 158 Drawing Sheets

U.S. PATENT DOCUMENTS

| | | | | |
|---|---|---|---|---|
| 5,024,372 | A * | 6/1991 | Altman et al. | 228/180.22 |
| 5,030,499 | A * | 7/1991 | Shaheen et al. | 428/137 |
| 5,034,091 | A * | 7/1991 | Trask et al. | 216/18 |
| 5,046,238 | A * | 9/1991 | Daigle et al. | 29/830 |
| 5,054,192 | A | 10/1991 | Cray et al. | |
| 5,058,800 | A | 10/1991 | Yoshizawa et al. | |
| 5,072,289 | A * | 12/1991 | Sugimoto et al. | 257/737 |
| 5,136,123 | A | 8/1992 | Kobayashi et al. | |
| 5,229,647 | A | 7/1993 | Gnadinger | |
| 5,231,751 | A * | 8/1993 | Sachdev et al. | 29/852 |
| 5,239,448 | A | 8/1993 | Perkins et al. | |
| 5,262,226 | A * | 11/1993 | Yoshida | 428/209 |
| 5,274,912 | A * | 1/1994 | Olenick et al. | 29/830 |
| 5,293,072 | A * | 3/1994 | Tsuji et al. | 257/737 |
| 5,299,730 | A | 4/1994 | Pasch et al. | |
| 5,309,629 | A * | 5/1994 | Traskos et al. | 29/830 |
| 5,311,404 | A * | 5/1994 | Trask et al. | 361/762 |
| 5,329,695 | A * | 7/1994 | Traskos et al. | 29/830 |
| 5,341,564 | A * | 8/1994 | Akhavain et al. | 29/832 |
| 5,347,162 | A | 9/1994 | Pasch | |
| 5,352,926 | A | 10/1994 | Andrews | |
| 5,367,765 | A * | 11/1994 | Kusaka | 29/840 |
| 5,378,927 | A | 1/1995 | McAllister et al. | |
| 5,399,898 | A | 3/1995 | Rostoker | |
| 5,400,948 | A * | 3/1995 | Sajja et al. | 228/180.1 |
| 5,406,701 | A * | 4/1995 | Pepe et al. | 29/840 |
| 5,407,864 | A * | 4/1995 | Kim | 29/834 |
| 5,410,805 | A | 5/1995 | Pasch | |
| 5,414,299 | A * | 5/1995 | Wang et al. | 257/702 |
| 5,422,514 | A * | 6/1995 | Griswold et al. | 257/679 |
| 5,438,224 | A | 8/1995 | Papageorge et al. | |
| 5,452,182 | A * | 9/1995 | Eichelberger et al. | 361/749 |
| 5,466,635 | A * | 11/1995 | Lynch et al. | 438/614 |
| 5,468,681 | A * | 11/1995 | Pasch | 438/108 |
| 5,468,995 | A * | 11/1995 | Higgins, III | 257/697 |
| 5,474,458 | A | 12/1995 | Vafi et al. | |
| 5,480,503 | A * | 1/1996 | Casey et al. | 156/89.18 |
| 5,485,038 | A | 1/1996 | Licari et al. | |
| 5,489,804 | A | 2/1996 | Pasch | |
| 5,496,775 | A | 3/1996 | Brooks | |
| 5,504,035 | A | 4/1996 | Rostoker et al. | |
| 5,519,936 | A * | 5/1996 | Andros et al. | 29/840 |
| 5,527,741 | A * | 6/1996 | Cole et al. | 438/107 |
| 5,534,094 | A * | 7/1996 | Arjavalingam et al. | 156/155 |
| 5,534,466 | A * | 7/1996 | Perfecto et al. | 216/20 |
| 5,536,362 | A | 7/1996 | Love et al. | |
| 5,561,085 | A * | 10/1996 | Gorowitz et al. | 438/125 |
| 5,561,323 | A * | 10/1996 | Andros et al. | 257/707 |
| 5,633,533 | A * | 5/1997 | Andros et al. | 257/707 |
| 5,646,087 | A | 7/1997 | Rizkalla et al. | |
| 5,650,667 | A * | 7/1997 | Liou | 257/780 |
| 5,678,287 | A | 10/1997 | Smith et al. | |
| 5,691,245 | A * | 11/1997 | Bakhit et al. | 216/20 |
| 5,757,072 | A * | 5/1998 | Gorowitz et al. | 257/700 |
| 5,759,417 | A * | 6/1998 | Inaba | 430/312 |
| 5,766,972 | A | 6/1998 | Takahashi et al. | |
| 5,768,109 | A * | 6/1998 | Gulick et al. | 361/794 |
| 5,770,889 | A | 6/1998 | Rostoker et al. | |
| 5,773,884 | A * | 6/1998 | Andros et al. | 257/707 |
| 5,773,889 | A | 6/1998 | Love et al. | |
| 5,777,385 | A * | 7/1998 | Wu | 257/712 |
| 5,786,239 | A * | 7/1998 | Ohsawa et al. | 438/123 |
| 5,795,818 | A * | 8/1998 | Marrs | 438/612 |
| 5,796,164 | A * | 8/1998 | McGraw et al. | 257/723 |
| 5,798,780 | A | 8/1998 | Koisumi et al. | |
| 5,817,541 | A * | 10/1998 | Averkiou et al. | 438/107 |
| 5,821,624 | A | 10/1998 | Pasch | |
| 5,824,569 | A | 10/1998 | Brooks et al. | |
| 5,829,124 | A | 11/1998 | Kresge et al. | |
| 5,834,779 | A | 11/1998 | Shao et al. | |
| 5,834,848 | A * | 11/1998 | Iwasaki | 257/778 |
| 5,841,194 | A | 11/1998 | Tsukamoto | |
| 5,843,810 | A * | 12/1998 | Sato et al. | 438/123 |
| 5,847,456 | A | 12/1998 | Shoji | |
| 5,859,470 | A * | 1/1999 | Ellerson et al. | 257/772 |
| 5,866,942 | A * | 2/1999 | Suzuki et al. | 257/698 |
| 5,869,904 | A * | 2/1999 | Shoji | 257/779 |
| 5,874,780 | A * | 2/1999 | Murakami | 257/775 |
| 5,886,399 | A * | 3/1999 | Ohsawa et al. | 257/668 |
| 5,886,409 | A * | 3/1999 | Ishino et al. | 257/737 |
| 5,889,655 | A | 3/1999 | Barrow | |
| 5,900,674 | A * | 5/1999 | Wojnarowski et al. | 257/774 |
| 5,901,436 | A * | 5/1999 | Ohsawa et al. | 29/827 |
| 5,905,639 | A | 5/1999 | Warren | 361/776 |
| 5,912,510 | A * | 6/1999 | Hwang et al. | 257/778 |
| 5,920,770 | A * | 7/1999 | Yasunaga et al. | 438/124 |
| 5,933,713 | A | 8/1999 | Farnworth | |
| 5,936,847 | A * | 8/1999 | Kazle | 361/771 |
| 5,948,533 | A * | 9/1999 | Gallagher et al. | 428/418 |
| 5,960,308 | A | 9/1999 | Akagawa et al. | |
| 5,982,033 | A * | 11/1999 | Ohsawa et al. | 257/737 |
| 5,998,291 | A * | 12/1999 | Bakhit et al. | 438/618 |
| 6,002,168 | A | 12/1999 | Bellaar et al. | |
| 6,013,946 | A | 1/2000 | Lee et al. | |
| 6,016,013 | A | 1/2000 | Baba | |
| 6,018,463 | A * | 1/2000 | Winslow et al. | 361/803 |
| 6,020,220 | A | 2/2000 | Gilleo et al. | |
| 6,020,221 | A | 2/2000 | Lim et al. | 438/125 |
| 6,020,626 | A * | 2/2000 | Ohsawa et al. | 257/668 |
| 6,020,637 | A | 2/2000 | Karnezos | 257/738 |
| 6,022,761 | A * | 2/2000 | Grupen-Shemansky et al. | 438/125 |
| 6,025,650 | A * | 2/2000 | Tsuji et al. | 257/786 |
| 6,036,809 | A * | 3/2000 | Kelly et al. | 156/247 |
| 6,038,133 | A | 3/2000 | Nakatani et al. | |
| 6,043,564 | A | 3/2000 | Brooks et al. | |
| 6,046,410 | A * | 4/2000 | Wojnarowski et al. | 174/262 |
| 6,051,093 | A * | 4/2000 | Tsukahara | 156/251 |
| 6,051,450 | A * | 4/2000 | Ohsawa et al. | 438/123 |
| 6,051,489 | A * | 4/2000 | Young et al. | 438/612 |
| 6,054,772 | A | 4/2000 | Mostafazadeh et al. | |
| 6,057,600 | A | 5/2000 | Kitazawa et al. | |
| 6,060,340 | A * | 5/2000 | Chou | 438/110 |
| 6,063,646 | A | 5/2000 | Okuno et al. | |
| 6,066,808 | A | 5/2000 | Kresge et al. | |
| 6,074,898 | A * | 6/2000 | Ohsawa et al. | 438/123 |
| 6,078,097 | A * | 6/2000 | Ohsawa | 257/666 |
| 6,081,038 | A | 6/2000 | Murayama | 257/783 |
| 6,087,719 | A * | 7/2000 | Tsunashima | 257/686 |
| 6,091,140 | A | 7/2000 | Toh et al. | |
| 6,091,141 | A * | 7/2000 | Heo | 257/704 |
| 6,097,610 | A * | 8/2000 | Hashimoto | 361/760 |
| 6,104,091 | A * | 8/2000 | Ito et al. | 257/738 |
| 6,107,678 | A * | 8/2000 | Shigeta et al. | 257/669 |
| 6,114,187 | A * | 9/2000 | Hayes | 438/106 |
| 6,114,755 | A * | 9/2000 | Ito et al. | 257/675 |
| 6,118,178 | A * | 9/2000 | Takeuchi | 257/707 |
| 6,132,226 | A | 10/2000 | Noda | |
| 6,137,185 | A * | 10/2000 | Ishino et al. | 257/786 |
| 6,140,153 | A * | 10/2000 | Ohsawa et al. | 438/123 |
| 6,148,512 | A * | 11/2000 | Brown | 29/837 |
| 6,148,900 | A * | 11/2000 | Yamasaki et al. | 164/80 |
| 6,150,193 | A | 11/2000 | Glenn | |
| 6,163,463 | A * | 12/2000 | Marrs | 361/773 |
| 6,166,915 | A * | 12/2000 | Lake et al. | 361/748 |
| 6,187,612 | B1 * | 2/2001 | Orcutt | 438/106 |
| 6,191,493 | B1 | 2/2001 | Yasunaga et al. | 257/787 |
| 6,194,778 | B1 * | 2/2001 | Ohsawa et al. | 257/668 |
| 6,222,738 | B1 | 4/2001 | Maeno et al. | |
| 6,229,209 | B1 | 5/2001 | Nakamura et al. | |
| 6,239,495 | B1 * | 5/2001 | Sakui et al. | 257/777 |
| 6,245,595 | B1 * | 6/2001 | Nguyen et al. | 438/108 |
| 6,249,044 | B1 | 6/2001 | Kao et al. | |
| 6,252,300 | B1 | 6/2001 | Hsuan et al. | |
| 6,255,740 | B1 * | 7/2001 | Tsuji et al. | 257/792 |
| 6,278,192 | B1 | 8/2001 | Takigawa et al. | |
| 6,280,640 | B1 | 8/2001 | Hurwitz et al. | |
| 6,285,079 | B1 * | 9/2001 | Kunikiyo | 257/737 |
| 6,287,893 | B1 * | 9/2001 | Elenius et al. | 438/108 |
| 6,291,270 | B1 * | 9/2001 | Saito | 438/114 |
| 6,291,899 | B1 * | 9/2001 | Wensel et al. | 257/787 |
| 6,298,551 | B1 | 10/2001 | Wojnarowski et al. | |
| 6,300,685 | B1 | 10/2001 | Hasegawa et al. | |
| 6,329,713 | B1 | 12/2001 | Farquhar et al. | |
| 6,336,269 | B1 * | 1/2002 | Eldridge et al. | 29/885 |
| 6,352,881 | B1 * | 3/2002 | Nguyen et al. | 438/108 |
| 6,352,923 | B1 | 3/2002 | Hsuan et al. | |

| | | | | | |
|---|---|---|---|---|---|
| 6,372,547 B2 | 4/2002 | Honda | | FOREIGN PATENT DOCUMENTS | |
| 6,372,620 B1 * | 4/2002 | Oosawa et al. ............... 438/612 | | | |
| 6,387,731 B1 * | 5/2002 | Wensel et al. ............... 438/121 | EP | 0 065 425 | 8/1889 |
| 6,391,220 B1 * | 5/2002 | Zhang et al. .................... 216/67 | EP | 0 788 158 | 8/1997 |
| 6,406,942 B2 | 6/2002 | Honda | EP | 801423 A2 * | 10/1997 |
| 6,414,585 B1 * | 7/2002 | Marcoux et al. ............. 338/309 | GB | 2225670 | 6/1990 |
| 6,521,511 B1 * | 2/2003 | Inoue et al. ................... 438/458 | GB | 2 286 084 | 8/1995 |
| 6,544,430 B2 * | 4/2003 | McCormack et al. .......... 216/67 | JP | 62 52953 | 3/1987 |
| 6,572,780 B2 * | 6/2003 | McCormack et al. .......... 216/13 | JP | 8 306745 | 8/1989 |
| 6,630,730 B2 | 10/2003 | Grigg | JP | 11 238972 | 6/1994 |
| 6,673,652 B1 * | 1/2004 | Cheng et al. ................. 438/108 | JP | 8 78575 | 3/1996 |
| 6,673,653 B2 | 1/2004 | Pierce | JP | 8 78757 | 3/1996 |
| 6,720,500 B1 * | 4/2004 | Inoue ........................... 174/258 | JP | 8-167629 | 6/1996 |
| 6,734,566 B2 | 5/2004 | Honda | JP | 8-250541 | 9/1996 |
| 6,774,473 B1 | 8/2004 | Shen | JP | 6 177278 | 11/1996 |
| 6,785,148 B1 * | 8/2004 | Ishida et al. ................. 361/769 | JP | 8 306745 | 11/1996 |
| 6,809,421 B1 | 10/2004 | Hayasaka et al. | JP | 10-125818 | 5/1998 |
| 6,969,905 B2 | 11/2005 | Paulus | JP | 10 275878 | 10/1998 |
| 2001/0020739 A1 | 9/2001 | Honda | JP | 10275878 | 10/1998 |
| 2001/0026021 A1 | 10/2001 | Honda | JP | 11 233556 | 8/1999 |
| 2002/0064935 A1 | 5/2002 | Honda | JP | 11260973 A * | 9/1999 |
| 2002/0121689 A1 | 9/2002 | Honda | WO | 96/09645 | 8/1999 |
| 2005/0200028 A1 | 9/2005 | Farnworth et al. | | | |
| 2005/0269700 A1 | 12/2005 | Farnworth et al. | * cited by examiner | | |

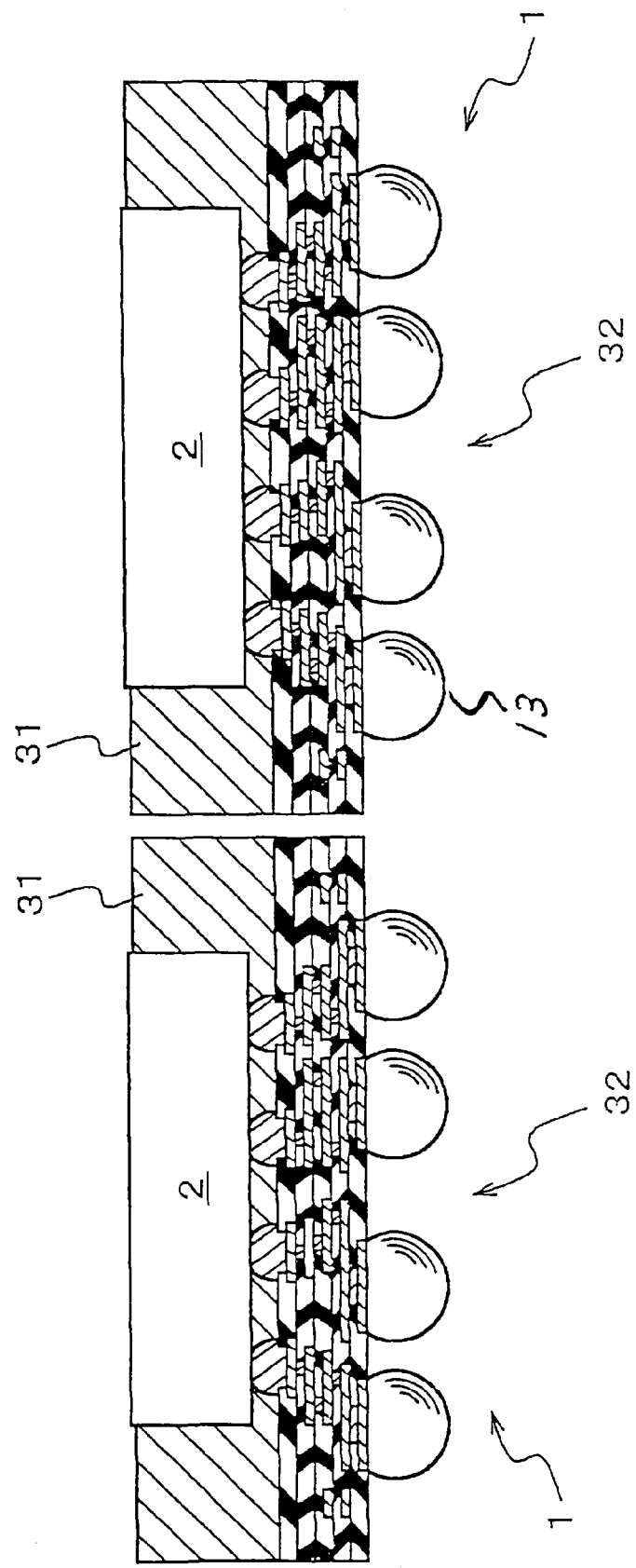

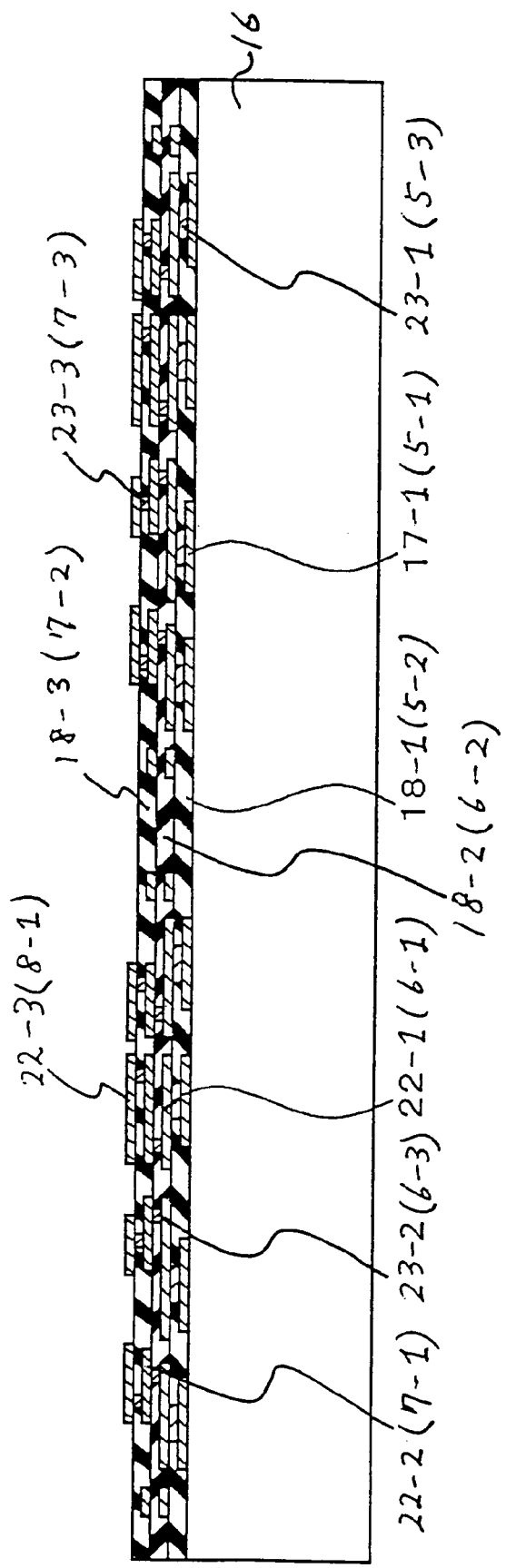

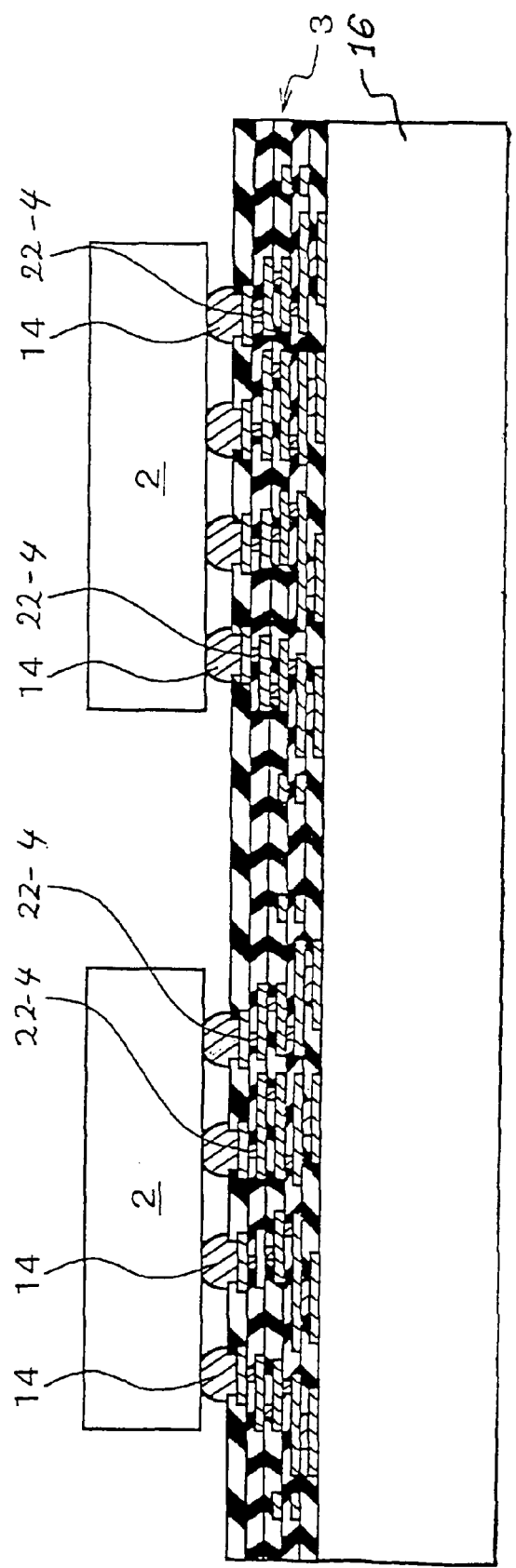

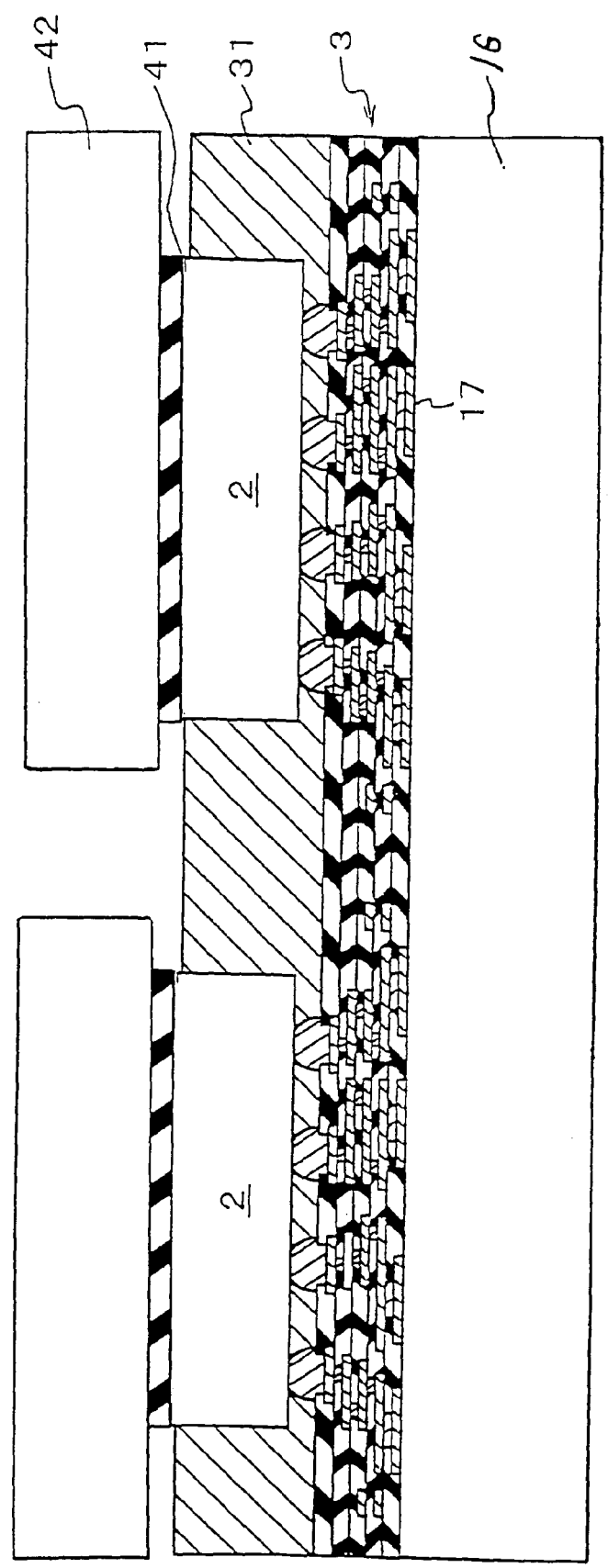

MULTILAYER INTERCONNECTION BOARD, SEMICONDUCTOR DEVICE HAVING THE SAME, AND METHOD OF FORMING THE SAME AS WELL AS METHOD OF MOUNTING THE SEMICONDUTOR CHIP ON THE INTERCONNECTION BOARD

BACKGROUND OF THE INVENTION

The present invention relates to an interconnection board, a semiconductor device having an interconnection board, a method of forming the interconnection board and a method of mounting the semiconductor chip on the interconnection board, and more particularly to a multilayer interconnection board for allowing a flip-chip semiconductor chip to be mounted thereon, a semiconductor device having a multilayer interconnection board, a method of forming the multilayer interconnection board and a method of mounting the flip-chip semiconductor chip on the multilayer interconnection board.

In recent years, the importance of the flip-chip semiconductor chip for realizing the high density package has been on the increase. FIG. 1 is a schematic cross sectional elevation view illustrative of a flip-chip semiconductor chip. A flip-chip semiconductor chip 101 has a first surface which further has a predetermined area array of external terminals not illustrated on a peripheral area thereof and/or an active region thereof. Bumps 102 are provided on the external terminals. The bumps 102 are made of a metal material such as a solder material, Au, Sn—Ag based alloy. FIG. 2 is a schematic cross sectional elevation view illustrative of a flip-chip semiconductor chip mounted on a multilayer interconnection board. A multilayer interconnection board 103 has electrode pads which patterns correspond to patterns of the bumps 102 of the flip-chip semiconductor chip 101. The flip-chip semiconductor chip 101 is mounted on the multilayer interconnection board 103. If the bumps 102 are made of a solder material, an IR re-flow process using a flux is used for mounting the flip-chip semiconductor chip 101 on the multilayer interconnection board 103. The multilayer interconnection board 103 mounted with the flip-chip semiconductor chip 101 is further mounted on a circuit board through external terminals which are not illustrated.

The multilayer interconnection board 103 is different in linear expansion coefficient from the flip-chip semiconductor chip 101. The above conventional technique is disadvantageous in deteriorated mounting reliability, particularly deteriorated temperature cycle characteristics. In order to solve the above disadvantage, the following two conventional techniques have been proposed.

The first technique is to use, for the multilayer interconnection board, a ceramic-based material having a small difference in linear expansion coefficient from silicon of the flip-chip semiconductor chip 101. The use of the ceramic-based material is effective in improvement in reliability of mounting the flip-chip semiconductor chip 101 on the multilayer interconnection board 103, but disadvantageous as the ceramic-based material is expensive. The application of this conventional technique is limited to supercomputers and large scale computers.

The second technique is to use, for the multilayer interconnection board, an organic material which is inexpensive but is larger in linear expansion coefficient than silicon of the flip-chip semiconductor chip. In this second technique, an under-fill resin is provided between the semiconductor chip and the multilayer interconnection board, so that a shearing stress of the bumps between the semiconductor chip and the multi-layer interconnection board is distributed or dispersed to the under-fill resin which covers the bumps, thereby to improve the reliability.

If the second technique using the organic material for the multilayer interconnection board is selected, then the multilayer interconnection board may be a build-up board in view of a minimum pitch of bump array patterns and the number of pins. FIGS. 3A through 3F are fragmentary cross sectional elevation views illustrative of build-up boards as the multilayer interconnection boards in sequential steps involved in a conventional fabrication method.

With reference to FIG. 3A, a glass epoxy base material board 104, typically FR4, FR5 or BT board, is prepared. Cu-foils 105 having a thickness in the range of 10-40 micrometers are adhered on both surfaces of the glass epoxy base material board 104. The Cu-foils 105 are then patterned to form Cu-interconnection patterns 105 on both surfaces of the glass epoxy base material board 104. A penetrating hole is made to the glass epoxy base material board 104 by a drilling process and then the penetrating hole is then plated thereby to form a plated through hole 106 which penetrates the glass epoxy base material board 104 and electrically connecting the Cu-interconnection patterns 105. An insulative resin filler is filled to the plated through hole 106, whereby a core board 107 is completed.

With reference to FIG. 3B, insulating resin material layers 108 are formed over the both surfaces of the glass epoxy base material board 104 so that the insulating resin material layers 108 cover the Cu-interconnection patterns 105. An opening 109 is selectively formed in the insulating resin material layers 108 by a photo-lithography technique or a laser beam process, so that a part of the Cu-interconnection patterns 105 is shown through the opening 109.

With reference to FIG. 3C, metal thin film layers 110 are entirely formed by a sputtering method or a Cu-electroless plating process, so that the metal thin film layers 110 extend on the insulating resin material layers 108 and in the opening 109, whereby the metal thin film layers 110 are electrically connected with the Cu-interconnection patterns 105.

With reference to FIG. 3D, photo-resist films 111 having a thickness in the range of 20-40 micrometers or dry films are formed over the metal thin film layers 110. The photo-resist films 111 or the dry films are patterned by exposure and subsequent development processes thereby to form photo-resist patterns 111 or dry film patterns on the metal thin film layers 110.

With reference to FIG. 3E, a selective Cu-electroplating process is carried out by use of the photo-resist patterns 111 or the dry film patterns as masks and also use of the metal thin film layers 110 as an electric supply line, thereby to selectively form interconnection patterns 112.

With reference to FIG. 3F, the photo-resist patterns 111 or the dry film patterns are removed. A selective wet etching process to the metal thin film layers 110 is carried out by use of the interconnection patterns 112 as a mask for selectively removing the metal thin film layers 110 to complete the interconnection patterns 112.

If necessary, the above processes shown in FIGS. 3B through 3F will be repeated to increase the number of the multilayers or the multilevels of the interconnections to complete the build-up board or the multilayer interconnection board.

The above second conventional technique using the organic material for the multilayer interconnection board is advantages in selecting the glass epoxy resin base material which is inexpensive and superior in formability of through holes. However, the glass epoxy resin base material has a large difference in thermal expansion coefficient from the semiconductor chip, whereby a large stress is applied between the multilayer interconnection board of the glass epoxy resin base material and the semiconductor chip thereby to drop the reliability in connection between the multilayer interconnection board and the semiconductor chip. The above multilevel interconnection patterns 105 and 112 over the glass epoxy base material board 104 are so thick as to relax the stress applied between the multilayer interconnection board and the semiconductor chip due to the relatively large thermal expansion coefficient between the multilayer interconnection board and the semiconductor chip. The necessary thickness of the above multilevel interconnection patterns 105 and 112 is, for example, in the range of 10-30 micrometers. This further requires that the thickness of the photo-resist patterns 111 or the dry film patterns is, for example, in the range of 20-40 micrometers. As a result, the minimum pitch of the photo-resist patterns 111 or the dry film is about 30 micrometers. Accordingly, the minimum pitch of the above multilevel interconnection patterns 105 and 112 is about 30 micrometers. This limitation to minimize the pitch of the above multilevel interconnection patterns makes it difficult to further increase the density of the multilayer interconnection board and further reduce the external size of the multilayer interconnection board.

Consequently, the multilayer interconnection board of the glass epoxy resin base material makes it difficult to further increase the density of the multilayer interconnection board and further reduce the external size of the multilayer interconnection board. Even the glass epoxy resin base material is inexpensive, the number of the multilayer interconnection boards obtained from a single large panel is small. This makes it difficult to further reduce the cost of the multilayer interconnection board.

Further, when the insulating resin material layers 108 are formed over the both surfaces of the glass epoxy base material board 104, the multilayer interconnection board is likely to be bent.

Furthermore, when the multilayer interconnection board with the semiconductor chip is mounted on a circuit board, a stress is applied between the multilayer interconnection board and the circuit board due to a difference in thermal expansion coefficient between the multilayer interconnection board and the circuit board, thereby deteriorating a reliability in connection between the multilayer interconnection board and the circuit board.

In the above circumstances, it had been required to develop a novel multilayer interconnection board free from the above problems, as well as a semiconductor device having the novel interconnection board.

SUMMARY OF THE INVENTION

Accordingly, it is an object of the present invention to provide a novel interconnection board free from the above problems.

It is a further object of the present invention to provide a novel interconnection board which is inexpensive.

It is a still further object of the present invention to provide a novel interconnection board allowing a further reduction in the cost thereof.

It is yet a further object of the present invention to provide a novel interconnection board free of any bend.

It is further more object of the present invention to provide a novel interconnection board allowing a high reliability in connection between the interconnection board and a semiconductor chip.

It is moreover object of the present invention to provide a novel interconnection board allowing a further increase in density of the interconnection board.

It is still more object of the present invention to provide a novel interconnection board allowing a further reduction in an external size of the interconnection board.

It is yet more object of the present invention to provide a novel interconnection board free from a deterioration in reliability of connection between the interconnection board and a circuit board on which the interconnection board is mounted.

It is another object of the present invention to provide a novel semiconductor device having an improved interconnection board free from the above problems.

It is a further object of the present invention to provide a novel semiconductor device having an improved interconnection board which is inexpensive.

It is a still further object of the present invention to provide a novel semiconductor device having an improved interconnection board allowing a further reduction in the cost thereof.

It is yet a further object of the present invention to provide a novel semiconductor device having an improved interconnection board free of any bend.

It is further more object of the present invention to provide a novel semiconductor device having an improved interconnection board allowing a high reliability in connection between the interconnection board and a semiconductor chip.

It is moreover object of the present invention to provide a novel semiconductor device having an improved interconnection board allowing a further increase in density of the interconnection board.

It is still more object of the present invention to provide a novel semiconductor device having an improved interconnection board allowing a further reduction in an external size of the interconnection board.

It is yet more object of the present invention to provide a novel semiconductor device having an improved interconnection board free from a deterioration in reliability of connection between the interconnection board and a circuit board on which the interconnection board is mounted.

It is still another object of the present invention to provide a novel method of forming an improved interconnection board free from the above problems.

It is a further object of the present invention to provide a novel method of forming an improved interconnection board which is inexpensive.

It is a still further object of the present invention to provide a novel method of forming an improved interconnection board allowing a further reduction in the cost thereof.

It is yet a further object of the present invention to provide a novel method of forming an improved interconnection board free of any bend.

It is further more object of the present invention to provide a novel method of forming an improved interconnection board allowing a high reliability in connection between the interconnection board and a semiconductor chip.

It is moreover object of the present invention to provide a novel method of forming an improved interconnection board allowing a further increase in density of the interconnection board.

It is still more object of the present invention to provide a novel method of forming an improved interconnection board allowing a further reduction in an external size of the interconnection board.

It is yet more object of the present invention to provide a novel method of forming an improved interconnection board free from a deterioration in reliability of connection between the interconnection board and a circuit board on which the interconnection board is mounted.

It is yet another object of the present invention to provide a novel method of mounting a semiconductor chip on an improved interconnection board free from the above problems.

It is a further object of the present invention to provide a novel method of mounting a semiconductor chip on an improved interconnection board which is inexpensive.

It is a still further object of the present invention to provide a novel method of mounting a semiconductor chip on an improved interconnection board allowing a further reduction in the cost thereof.

It is yet a further object of the present invention to provide a novel method of mounting a semiconductor chip on an improved interconnection board free of any bend.

It is further more object of the present invention to provide a novel method of mounting a semiconductor chip on an improved interconnection board allowing a high reliability in connection between the interconnection board and a semiconductor chip.

It is moreover object of the present invention to provide a novel method of mounting a semiconductor chip on an improved interconnection board allowing a further increase in density of the interconnection board.

It is still more object of the present invention to provide a novel method of mounting a semiconductor chip on an improved interconnection board allowing a further reduction in an external size of the interconnection board.

It is yet more object of the present invention to provide a novel method of mounting a semiconductor chip on an improved interconnection board free from a deterioration in reliability of connection between the interconnection board and a circuit board on which the interconnection board is mounted.

The first present invention provides a semiconductor device comprising: an interconnection board; and a high rigidity plate securely fixed to the interconnection board, the high rigidity plate being higher in rigidity than the interconnection board for suppressing the interconnection board from being bent.

The second present invention provides a semiconductor device comprising: an interconnection board having first and second surfaces; at least a semiconductor chip mounted on the first surface of the interconnection board; and a high rigidity plate securely fixed to the second surface of the interconnection board, the high rigidity plate being higher in rigidity than the interconnection board for suppressing the interconnection board from being bent.

The third present invention provides a semiconductor device comprising: an interconnection board having first and second surfaces; at least a semiconductor chip mounted on the first surface of the interconnection board; and a buffer layer having a first surface in contact with the second surface of the interconnection board and also the buffer layer having a second surface on which at least an external electrode is provided, and the buffer layer having at least an electrical contact between the interconnection board and the at least external electrode, and the buffer layer being capable of absorbing and/or relaxing a stress applied to the at least external electrode to make the interconnection board free from application of the stress.

The fourth present invention provides a semiconductor device comprising: an interconnection board having first and second surfaces; at least a semiconductor chip mounted on the first surface of the interconnection board; external electrodes fixed to external electrode pads on the second surface of the interconnection board; and a supporting layer on the second surface of the interconnection board for supporting the external electrodes.

The fifth present invention provides a method of forming an interconnection board, wherein during formation of the interconnection board, the interconnection board remains securely fixed to a high rigidity plate being higher in rigidity than the interconnection board for suppressing the interconnection board from being bent.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
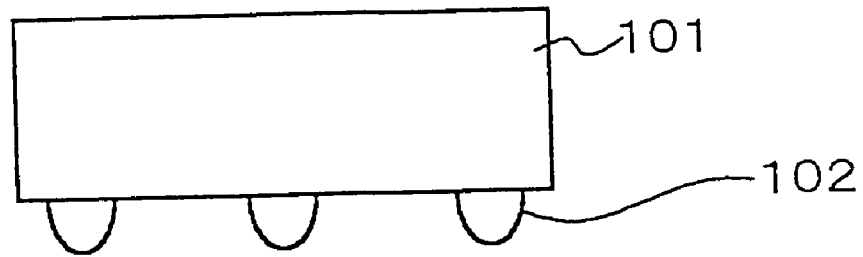
FIG. 1 is a schematic cross sectional elevation view illustrative of a flip-chip semiconductor chip.
Figure 2:
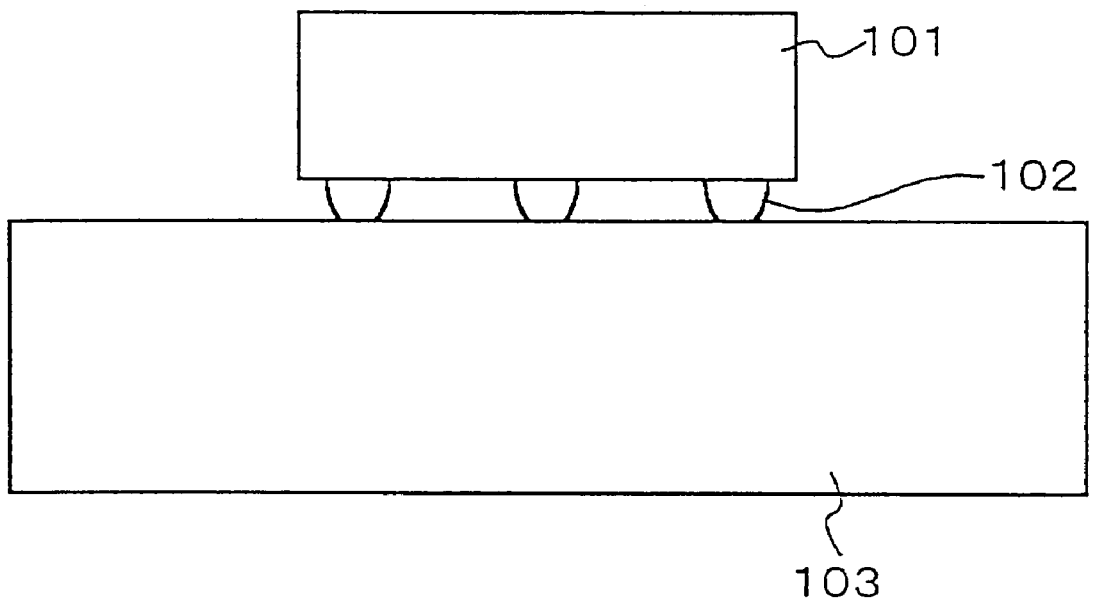
FIG. 2 is a schematic cross sectional elevation view illustrative of a flip-chip semiconductor chip mounted on a multilayer interconnection board.
Figure 3A:
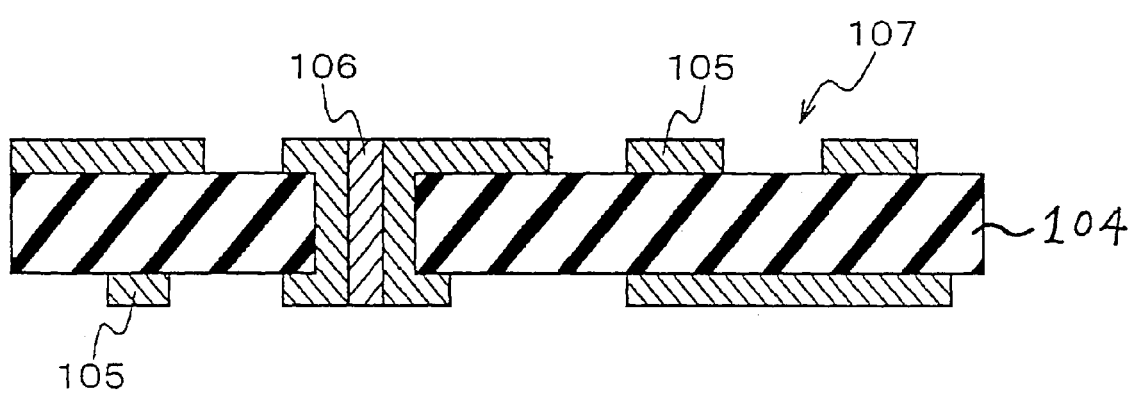
FIGS. 3A through 3F are fragmentary cross sectional elevation views illustrative of build-up boards as the multilayer interconnection boards in sequential steps involved in a conventional fabrication method.
Figure 3B:
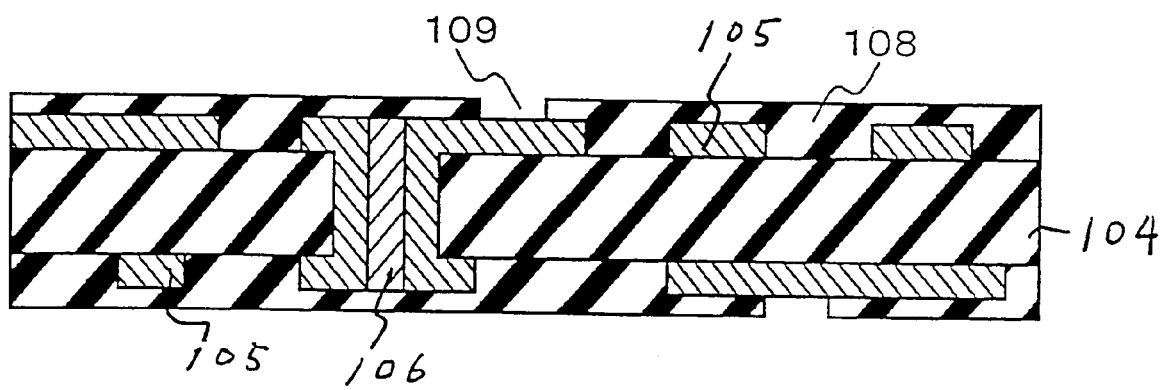
Figure 3C:
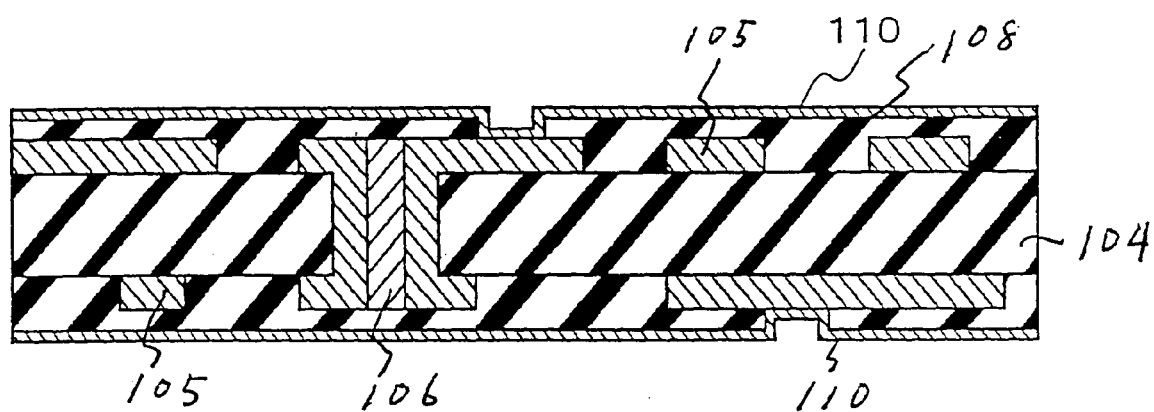
Figure 3D:
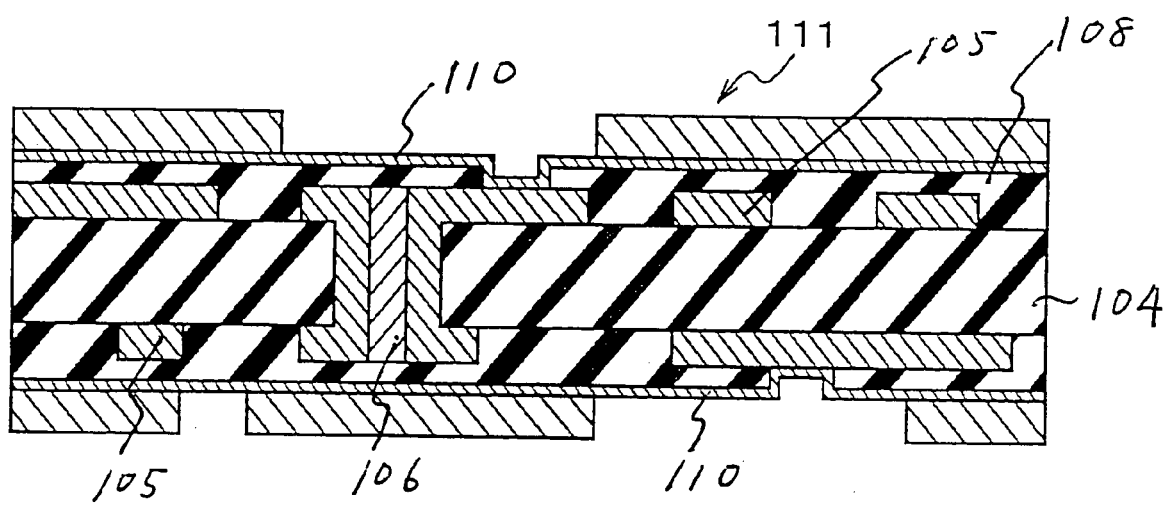
Figure 3E:
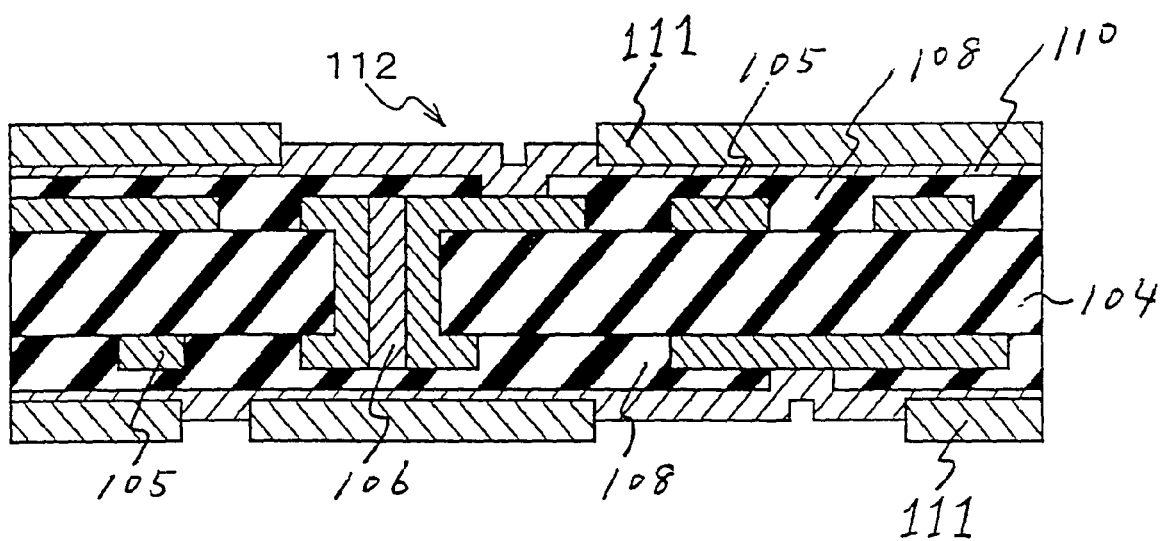
Figure 3F:
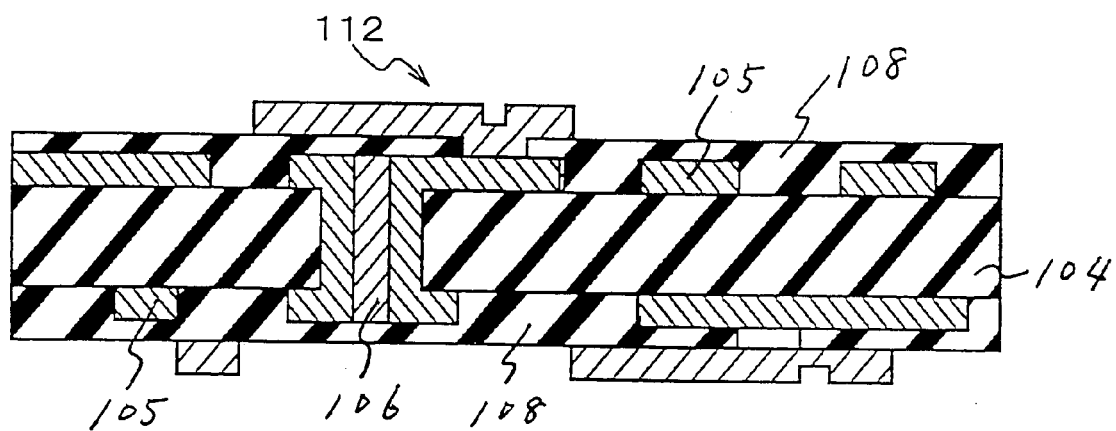

The first present invention provides a semiconductor device comprising: an interconnection board; and a high rigidity plate securely fixed to the interconnection board, the high rigidity plate being higher in rigidity than the interconnection board for suppressing the interconnection board from being bent.

It is preferable that the interconnection board comprises a multilayer interconnection board having a multilevel interconnection structure.

It is also preferable that the high rigidity plate is made of a metal.

It is also preferable that the high rigidity plate is made of an alloy.

It is also preferable that the high rigidity plate is made of a ceramic.

It is also preferable that a base material of the interconnection board is an organic insulative material. It is further preferable that the organic material is a polymer resin material.

The second present invention provides a semiconductor device comprising: an interconnection board having first and second surfaces; at least a semiconductor chip mounted on the first surface of the interconnection board; and a high rigidity plate securely fixed to the second surface of the interconnection board, the high rigidity plate being higher in rigidity than the interconnection board for suppressing the interconnection board from being bent.

It is preferable that the interconnection board comprises a multilayer interconnection board having a multilevel interconnection structure.

It is also preferable that the high rigidity plate is made of a metal.

It is also preferable that the high rigidity plate is made of an alloy.

It is also preferable that the high rigidity plate is made of a ceramic.

It is also preferable that a base material of the interconnection board is an organic material. It is further preferable that the organic material is a polymer resin material.

It is also preferable that the at least semiconductor chip is bonded via bumps to the second surface of the interconnection board. It is also preferable to further comprise a sealing resin material provided on the first surface of the interconnection board for sealing the at least semiconductor chip and the bumps. It is preferable to further comprise at least a heat spreader provided on the at least semiconductor chip.

The third present invention provides a semiconductor device comprising: an interconnection board having first and second surfaces; at least a semiconductor chip mounted on the first surface of the interconnection board; and a buffer layer having a first surface in contact with the second surface of the interconnection board and also the buffer layer having a second surface on which at least an external electrode is provided, and the buffer layer having at least an electrical contact between the interconnection board and the at least external electrode, and the buffer layer being capable of absorbing and/or relaxing a stress applied to the at least external electrode to make the interconnection board free from application of the stress.

It is preferable that the interconnection board comprises a multilayer interconnection board having a multilevel interconnection structure.

It is also preferable that the at least external electrode comprises plural external electrodes.

It is also preferable that the external electrode comprises a solder ball.

It is also preferable that the external electrode comprises a pin electrode.

It is also preferable that the external electrode comprises a coil-spring electrode.

It is also preferable that the external electrode comprises a generally column shaped electrode. It is further preferable that the generally column shaped electrode comprises a straight column shaped electrode which is uniform in horizontal cross sectional area from a bottom to a top thereof.

It is also preferable that the generally column shaped electrode comprises a center-pinched column shaped electrode which decreases in horizontal cross sectional area toward an intermediate level thereof.

It is also preferable that the buffer layer comprises: plural generally column shaped electrically conductive layers, each of which has a first end fixed to an external electrode pad of the interconnection board and a second end directly fixed the external electrode. It is further preferable that the plural generally column shaped electrically conductive layers are made of a metal.

It is also preferable that the buffer layer comprises: plural generally column shaped electrically conductive layers, each of which has a first end fixed to an external electrode pad of the interconnection board and a second end directly fixed the external electrode; and an stress absorption layer filling gaps between the plural generally column shaped electrically conductive layers, and the stress absorption layer being lower in rigidity than the plural generally column shaped electrically conductive layers, and the stress absorption layer surrounding the plural generally column shaped electrically conductive layers so that the stress absorption layer is in tightly contact with the plural generally column shaped electrically conductive layers. It is further preferable that the plural generally column shaped electrically conductive layers are made of a metal.

It is also preferable that the stress absorption layer is made of an organic insulative material.

It is also preferable that the buffer layer comprises: plural generally column shaped electrically conductive layers, each of which has a first end fixed to an external electrode pad of the interconnection board and a second end directly fixed the external electrode; a supporting plate having plural holes, into which the plural generally column shaped electrically conductive layers with the external electrodes are inserted, and the supporting plate extending in parallel to the second surface of the interconnection board to form an inter-space between the supporting plate and the second surface of the interconnection board; and a supporting sealing resin material filling the inter-space and surrounding both the plural generally column shaped electrically conductive layers and parts of the external electrodes so that the supporting sealing resin material is in tightly contact with the plural generally column shaped electrically conductive layers and the parts of the external electrodes for supporting the external electrodes. It is further preferable that the supporting sealing resin material is lower in rigidity than the plural generally column shaped electrically conductive layers so that the supporting sealing resin material is capable of absorbing and/or relaxing a stress applied to the external electrodes.

It is also preferable that the plural generally column shaped electrically conductive layers are made of a metal.

It is also preferable that the supporting sealing resin material is made of an organic insulative material. It is also preferable to further comprise a supporting layer on the second surface of the buffer layer for supporting the external electrode.

It is also preferable that the supporting layer further comprises: a supporting plate having plural holes, into which the external electrodes are inserted, and the supporting plate extending in parallel to the second surface of the buffer layer to form an inter-space between the supporting plate and the second surface of the buffer layer; and a supporting sealing resin material filling the inter-space and surrounding parts of the external electrodes so that the supporting sealing resin material is in tightly contact with the parts of the external electrodes for supporting the external electrodes.

It is also preferable that the at least semiconductor chip is bonded via bumps to the second surface of the interconnection board. It is further preferable that further comprising a sealing resin material provided on the first surface of the interconnection board for sealing the at least semiconductor chip and the bumps. It is preferable to further comprise at least a heat spreader provided on the at least semiconductor chip.

It is also preferable that further comprising an under-fill resin material provided on the first surface of the interconnection board for sealing the at least semiconductor chip and the bumps. It is also preferable to further comprise: a stiffener extending on a peripheral region of the buffer layer; and at least a heat spreader provided on the at least semiconductor chip and on the stiffener.

The fourth present invention provides a semiconductor device comprising: an interconnection board having first and second surfaces; at least a semiconductor chip mounted on the first surface of the interconnection board; external electrodes fixed to external electrode pads on the second surface of the interconnection board; and a supporting layer on the second surface of the interconnection board for supporting the external electrodes.

It is also preferable that the supporting layer further comprises: a supporting plate having plural holes, into which the external electrodes are inserted, and the supporting plate extending in parallel to the second surface of the buffer layer to form an inter-space between the supporting plate and the second surface of the buffer layer; and a supporting sealing resin material filling the inter-space and surrounding parts of the external electrodes so that the supporting sealing resin material is in tightly contact with the parts of the external electrodes for supporting the external electrodes.

It is also preferable that the at least semiconductor chip is bonded via bumps to the second surface of the interconnection board. It is further preferable that further comprising a sealing resin material provided on the first surface of the interconnection board for sealing the at least semiconductor chip and the bumps. It is preferable to further comprise at least a heat spreader provided on the at least semiconductor chip. It is also preferable to further comprise an under-fill resin material provided on the first surface of the interconnection board for sealing the at least semiconductor chip and the bumps. It is also preferable to further comprise: a stiffener extending on a peripheral region of the buffer layer; and at least a heat spreader provided on the at least semiconductor chip and on the stiffener.

It is also preferable that the external electrodes connected through plural generally column shaped electrically conductive layers to external electrode pads on the second surface of the interconnection board, and the supporting layer further comprises: a supporting plate having plural holes, into which the plural generally column shaped electrically conductive layers with the external electrodes are inserted, and the supporting plate extending in parallel to the second surface of the interconnection board to form an inter-space between the supporting plate and the second surface of the interconnection board; and a supporting sealing resin material filling the inter-space and surrounding both the plural generally column shaped electrically conductive layers and parts of the external electrodes so that the supporting sealing resin material is in tightly contact with the plural generally column shaped electrically conductive layers and the parts of the external electrodes for supporting the external electrodes. It is further preferable that the supporting sealing resin material is lower in rigidity than the plural generally column shaped electrically conductive layers so that the supporting sealing resin material is capable of absorbing and/or relaxing a stress applied to the external electrodes.

It is also preferable that the plural generally column shaped electrically conductive layers are made of a metal.

It is also preferable that the supporting sealing resin material is made of an organic insulative material.

It is also preferable that the external electrode comprises a solder ball.

It is also preferable that the external electrode comprises a pin electrode.

It is also preferable that the external electrode comprises a coil-spring electrode.

It is also preferable that the external electrode comprises a generally column shaped electrode.

It is also preferable that the generally column shaped electrode comprises a straight column shaped electrode which is uniform in horizontal cross sectional area from a bottom to a top thereof.

It is also preferable that the generally column shaped electrode comprises a center-pinched column shaped electrode which decreases in horizontal cross sectional area toward an intermediate level thereof.

The fifth present invention provides a method of forming an interconnection board, wherein during formation of the interconnection board, the interconnection board remains securely fixed to a high rigidity plate being higher in rigidity than the interconnection board for suppressing the interconnection board from being bent.

It is preferable that the interconnection board comprises a multilayer interconnection board having a multilevel interconnection structure.

It is also preferable to further comprise the step of: completely removing the high rigidity plate from the interconnection board, after the interconnection board is fabricated on the high rigidity plate.

It is also preferable that the high rigidity plate is made of a metal.

It is also preferable that the high rigidity plate is made of an alloy.

It is also preferable that the high rigidity plate is made of a ceramic.

It is also preferable that a base material of the interconnection board is an organic insulative material.

It is further preferable that the organic material is a polymer resin material.

It is also preferable to further comprise the step of: selectively removing the high rigidity plate from the interconnection board to form plural generally column shaped electrically conductive layers on the interconnection board, after the interconnection board is fabricated on the high rigidity plate.

It is also preferable to further comprise the step of: forming external electrodes on the plural generally column shaped electrically conductive layers so that the external electrodes are electrically connected through the plural generally column shaped electrically conductive layers to the interconnection board.

It is also preferable to further comprise the step of: forming an stress absorption layer being lower in rigidity than the plural generally column shaped electrically conductive layers, which fills gaps between the plural generally column shaped electrically conductive layers, so that the stress absorption layer surrounds the plural generally column shaped electrically conductive layers, whereby the stress absorption layer is in tightly contact with the plural generally column shaped electrically conductive layers.

It is also preferable to further comprise the step of: forming external electrodes on the plural generally column shaped electrically conductive layers so that the external electrodes are electrically connected through the plural generally column shaped electrically conductive layers to the interconnection board.

It is also preferable to further comprise the step of: forming a supporting plate having plural holes, into which the external electrodes are inserted, so that the supporting plate extends in parallel to the second surface of the buffer layer to form an inter-space between the supporting plate and the second surface of the buffer layer; and forming a supporting sealing resin material which fills the inter-space and surrounding parts of the external electrodes so that the supporting sealing resin material is in tightly contact with the parts of the external electrodes for supporting the external electrodes.

It is also preferable to further comprise the step of: completely removing the high rigidity plate from the interconnection board, after the interconnection board is fabricated on the high rigidity plate; forming a supporting plate having plural holes, into which the external electrodes are inserted, so that the supporting plate extends in parallel to the second surface of the buffer layer to form an inter-space between the supporting plate and the second surface of the buffer layer; and forming a supporting sealing resin material which fills the inter-space and surrounding parts of the external electrodes so that the supporting sealing resin material is in tightly contact with the parts of the external electrodes for supporting the external electrodes.

It is also preferable to further comprise the step of: completely removing the high rigidity plate from the interconnection board, after the interconnection board is fabricated on the high rigidity plate; bonding plural generally column shaped electrically conductive layers to the interconnection board via an adhesive; and forming external electrodes on the plural generally column shaped electrically conductive layers so that the external electrodes are electrically connected through the plural generally column shaped electrically conductive layers to the interconnection board.

It is also preferable to further comprise the step of: forming a supporting plate having plural holes, into which the plural generally column shaped electrically conductive layers with the external electrodes are inserted, and the supporting plate extending in parallel to the second surface of the interconnection board to form an inter-space between the supporting plate and the second surface of the interconnection board; and forming a supporting sealing resin material which fills the inter-space and surrounds both the plural generally column shaped electrically conductive layers and parts of the external electrodes so that the supporting sealing resin material is in tightly contact with the plural generally column shaped electrically conductive layers and the parts of the external electrodes for supporting the external electrodes.

It is also preferable to further comprise the step of: mounting at least a semiconductor chip on the interconnection board; and completely removing the high rigidity plate from the interconnection board.

It is also preferable to further comprise the step of: mounting at least a semiconductor chip on the interconnection board; forming at least a heat spreader on the at least semiconductor chip; and completely removing the high rigidity plate from the interconnection board.

It is also preferable to further comprise the step of: mounting at least a semiconductor chip on the interconnection board; and selectively removing the high rigidity plate from the interconnection board to form plural generally column shaped electrically conductive layers on the interconnection board.

It is also preferable to further comprise the step of: mounting at least a semiconductor chip on the interconnection board; forming at least a heat spreader on the at least semiconductor chip; and selectively removing the high rigidity plate from the interconnection board to form plural generally column shaped electrically conductive layers on the interconnection board.

PREFERRED EMBODIMENT

First Embodiment

Figure 4:
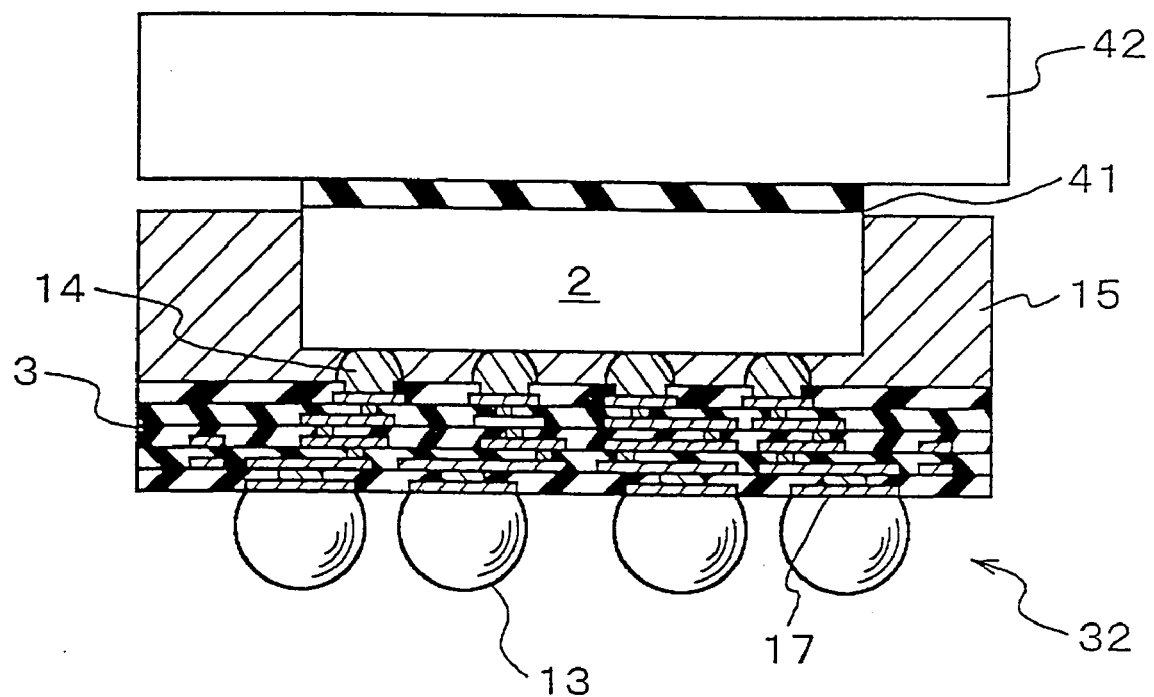
FIG. 4 is a cross sectional elevation view illustrative of a semiconductor device having a multilayer interconnection board, on which a semiconductor chip is mounted in a first embodiment according to the present invention.

A first embodiment according to the present invention will be described in detail with reference to the drawings. FIG. 4 is a cross sectional elevation view illustrative of a semiconductor device having a multilayer interconnection board, on which a semiconductor chip is mounted in a first embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17 on which solder balls 13 are formed. A sealing resin material 15 is provided over the first surface of the multilayer interconnection board 3 for sealing the semiconductor chip 2 and the bumps 14. A heat conductive adhesive layer 41 is provided on a second surface of the semiconductor chip 2. A heat spreader 42 is provided on the heat conductive adhesive layer 41 so that the heat spreader 42 is adhered through the heat conductive adhesive layer 41 to the second surface of the semiconductor chip 2. The bumps 14 and the solder balls 13 are eclectically connected to each other through multilevel interconnections of the multilayer interconnection board 3.

Figure 5:
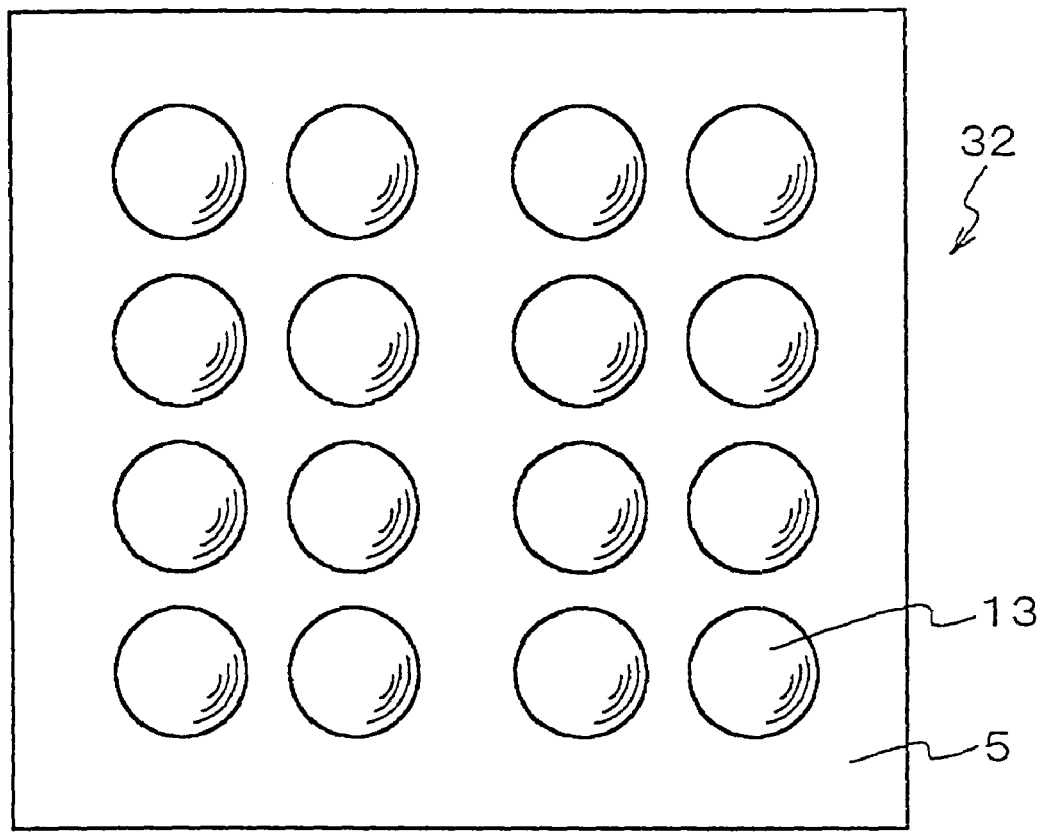
FIG. 5 is a plane view illustrative of a second surface of the multilayer interconnection board of the semiconductor device shown in FIG. 4.

FIG. 5 is a plane view illustrative of a second surface of the multilayer interconnection board of the semiconductor device shown in FIG. 4. The solder balls 13 are aligned in matrix over the second surface of the multilayer interconnection board 3 of the semiconductor device 3.

Figure 6:
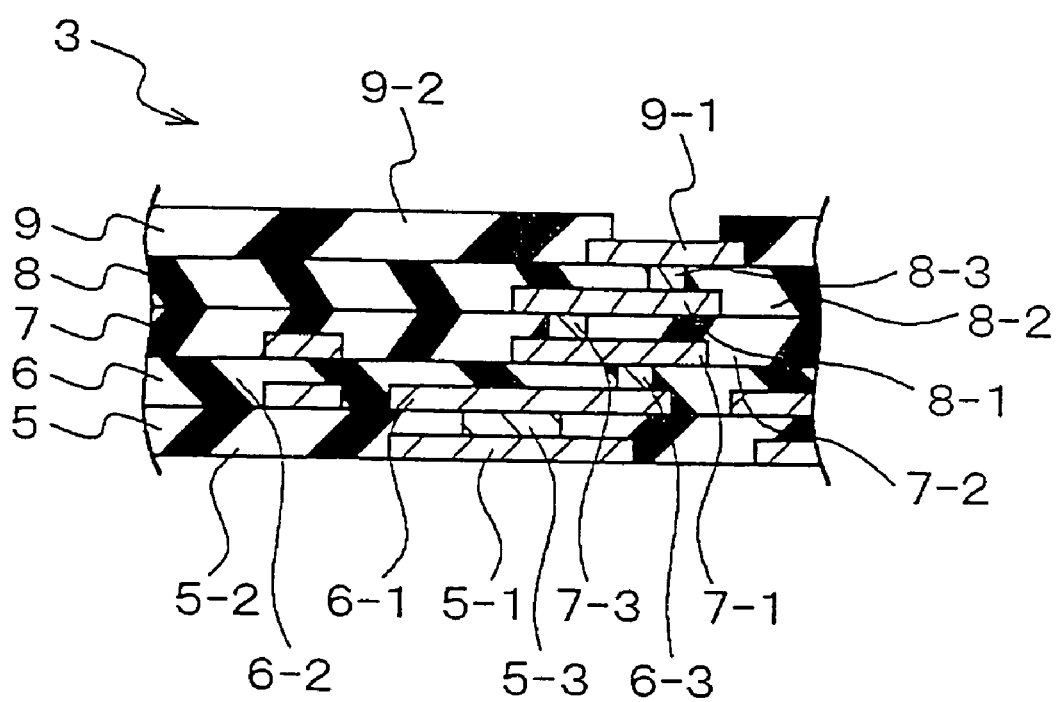
FIG. 6 is a fragmentary cross sectional elevation view illustrative of multilayer structure of the multilayer interconnection board of the semiconductor device shown in FIG. 4.

FIG. 6 is a fragmentary cross sectional elevation view illustrative of multilayer structure of the multilayer interconnection board of the semiconductor device shown in FIG. 4. The multilayer interconnection board 3 comprises sequential laminations of multiple interconnection layers, for example, first, second, third, fourth and fifth interconnection layers 5, 6, 7, 8 and 9. The second interconnection layer 6 is laminated on the first interconnection layer 5. The third interconnection layer 7 is laminated on the second interconnection layer 6. The fourth interconnection layer 8 is laminated on the third interconnection layer 7. The fifth interconnection layer 9 is laminated on the fourth interconnection layer 8. The first interconnection layer 5 is in the second surface side of the multilayer interconnection board 3. The solder balls 13 are provided on the first interconnection layer 5. The fifth interconnection layer 9 is in the first surface side of the multilayer interconnection board 3. The bumps 14 are provided on the fifth interconnection layer 9. The first interconnection layer 5 comprises a first level interconnection pattern 5-1, a first level insulating layer 5-2 and a first level contact layer 5-3, wherein the first level interconnection pattern 5-1 is selectively formed in a bottom half region of the first level insulating layer 5-2 and the first level contact layer 5-3 is selectively formed in a top half region of the first level insulating layer 5-2, so that the first level contact layer 5-3 is in contact with a part of the first level interconnection pattern 5-1. The second interconnection layer 6 comprises a second level interconnection pattern 6-1, a second level insulating layer 6-2 and a second level contact layer 6-3, wherein the second level interconnection pattern 6-1 is selectively formed in a bottom half region of the second level insulating layer 6-2 and the second level contact layer 6-3 is selectively formed in a top half region of the second level insulating layer 6-2, so that the second level contact layer 6-3 is in contact with a part of the second level interconnection pattern 6-1. The second interconnection layer 6 is laminated on the first interconnection layer 5, so that the second level interconnection pattern 6-1 is in contact with the first level contact layer 5-3 of the first interconnection layer 5, whereby the second level interconnection pattern 6-1 is electrically connected through the first level contact layer 5-3 to the first level interconnection pattern 5-1 of the first interconnection layer 5. The third interconnection layer 7 comprises a third level interconnection pattern 7-1, a third level insulating layer 7-2 and a third level contact layer 7-3, wherein the third level interconnection pattern 7-1 is selectively formed in a bottom half region of the third level insulating layer 7-2 and the third level contact layer 7-3 is selectively formed in a top half region of the third level insulating layer 7-2, so that the third level contact layer 7-3 is in contact with a part of the third level interconnection pattern 7-1. The third interconnection layer 7 is laminated on the second interconnection layer 6, so that the third level interconnection pattern 7-1 is in contact with the second level contact layer 6-3 of the second interconnection layer 6, whereby the third level interconnection pattern 7-1 is electrically connected through the second level contact layer 6-3 to the second level interconnection pattern 6-1 of the second interconnection layer 6. The fourth interconnection layer 8 comprises a fourth level interconnection pattern 8-1, a fourth level insulating layer 8-2 and a fourth level contact layer 8-3, wherein the fourth level interconnection pattern 8-1 is selectively formed in a bottom half region of the fourth level insulating layer 8-2 and the fourth level contact layer 8-3 is selectively formed in a top half region of the fourth level insulating layer 8-2, so that the fourth level contact layer 8-3 is in contact with a part of the fourth level interconnection pattern 8-1. The fourth interconnection layer 8 is laminated on the third interconnection layer 7, so that the fourth level interconnection pattern 8-1 is in contact with the third level contact layer 7-3 of the third interconnection layer 7, whereby the fourth level interconnection pattern 8-1 is electrically connected through the third level contact layer 7-3 to the third level interconnection pattern 7-1 of the third interconnection layer 7. The fifth interconnection layer 9 comprises a fifth level interconnection pattern 9-1 and a fifth level insulating layer 9-2, wherein the fifth level interconnection pattern 9-1 is selectively formed in a bottom half region of the fifth level insulating layer 9-2. The fifth interconnection layer 9 is laminated on the fourth interconnection layer 8, so that the fifth level interconnection pattern 9-1 is in contact with the fourth level contact layer 8-3 of the fourth interconnection layer 8, whereby the fifth level interconnection pattern 9-1 is electrically connected through the fourth level contact layer 8-3 to the fourth level interconnection pattern 8-1 of the fourth interconnection layer 8. The above first, second third, fourth and fifth level interconnection patterns 5-1, 6-1, 7-1, 8-1 and 9-1 are connected to each other through the first, second, third and fourth level contact layers 5-3, 6-3, 7-3 and 8-3.

Figure 7A:
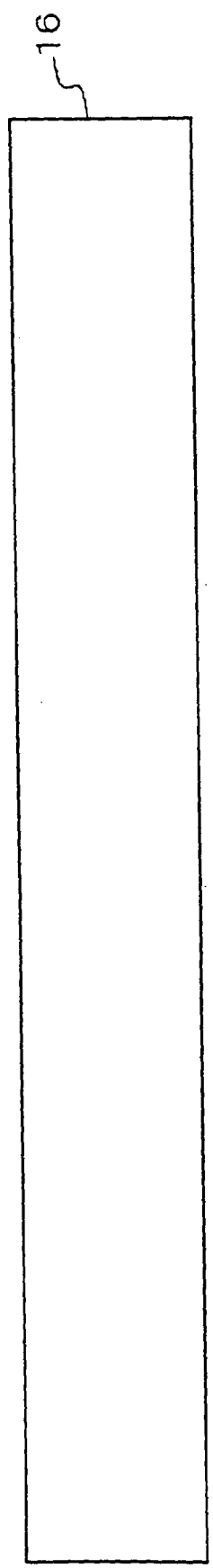
FIGS. 7A through 7Q are fragmentary cross sectional elevation views illustrative of a novel method of forming a semiconductor device having a multilayer interconnection board on which a semiconductor chip is mounted in a first embodiment in accordance with the present invention.
Figure 7B:
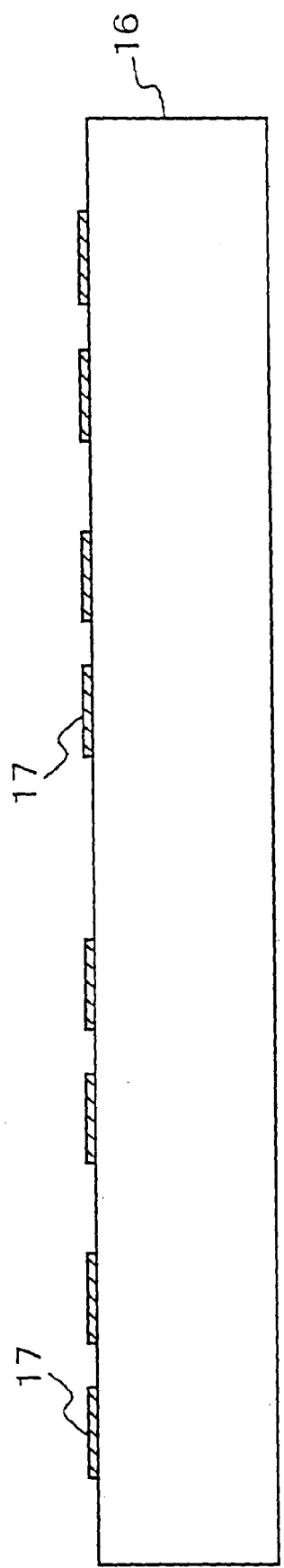
Figure 7C:
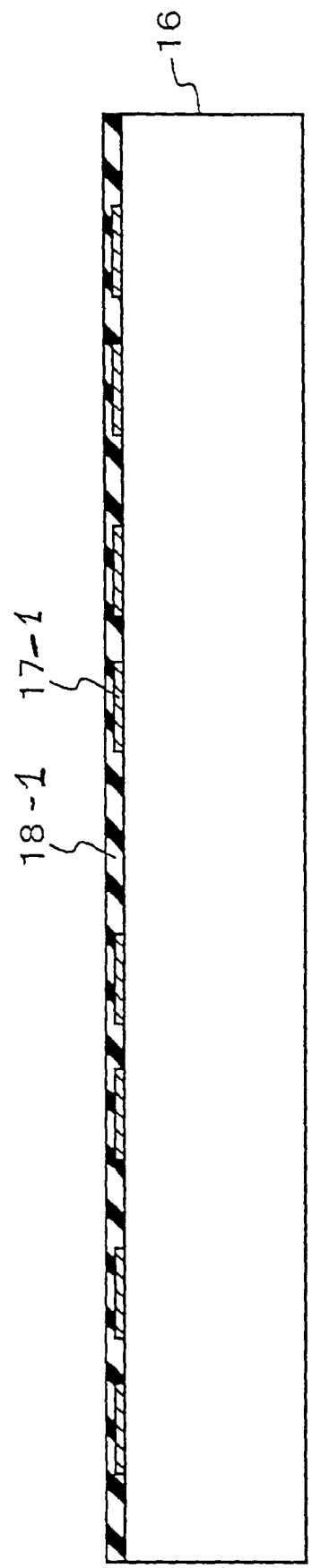
Figure 7D:
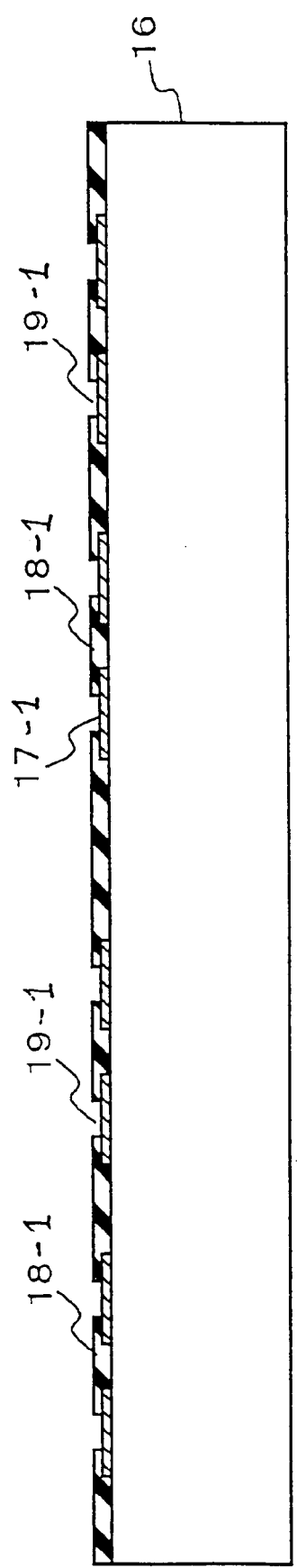
Figure 7E:
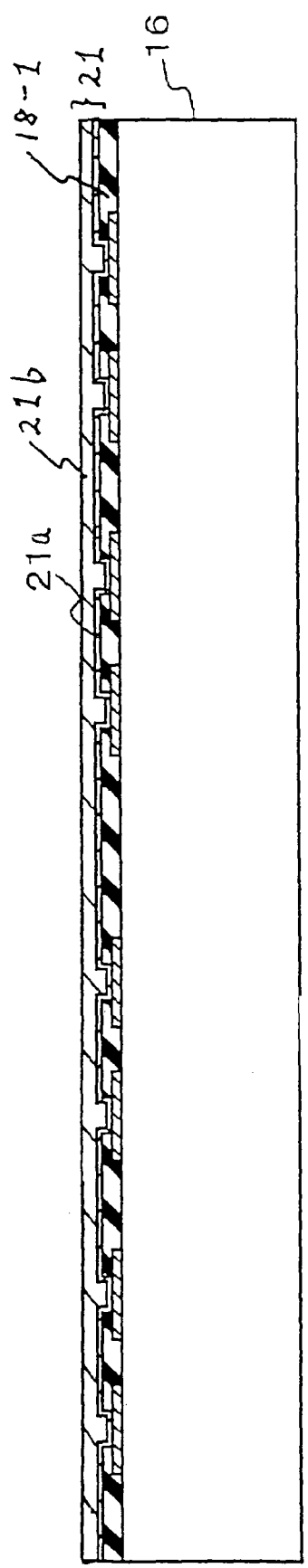
Figure 7F:
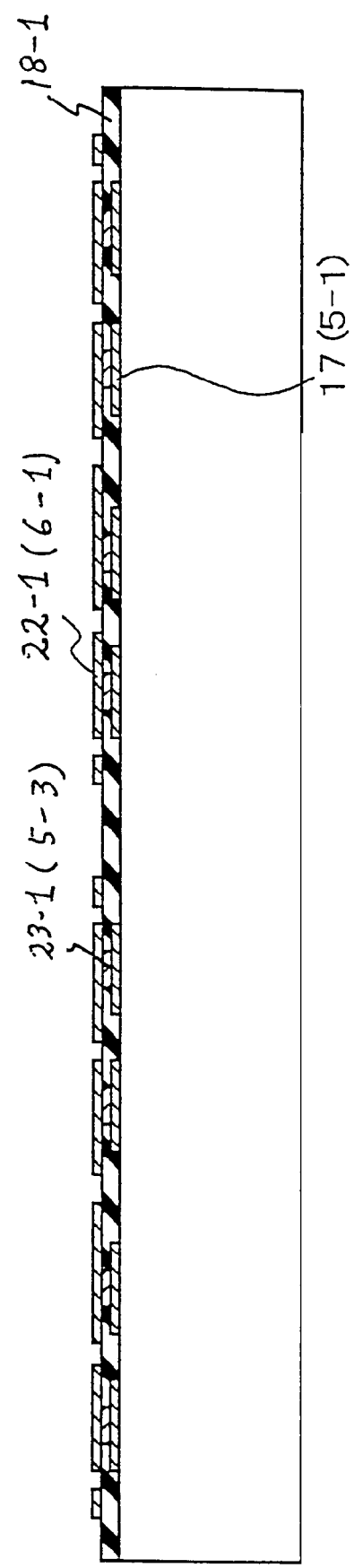
Figure 7G:
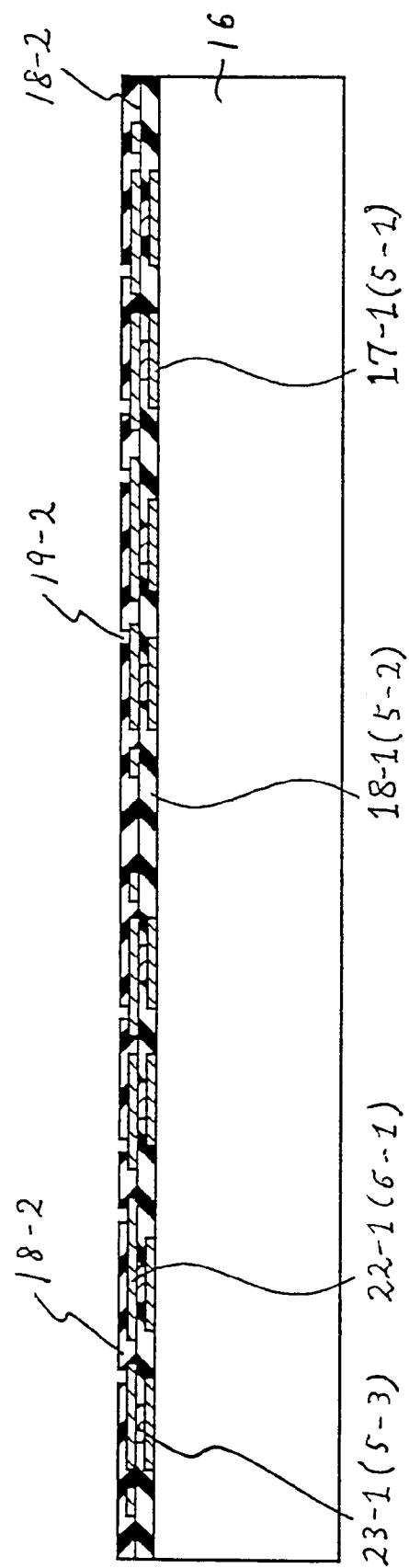
Figure 7H:
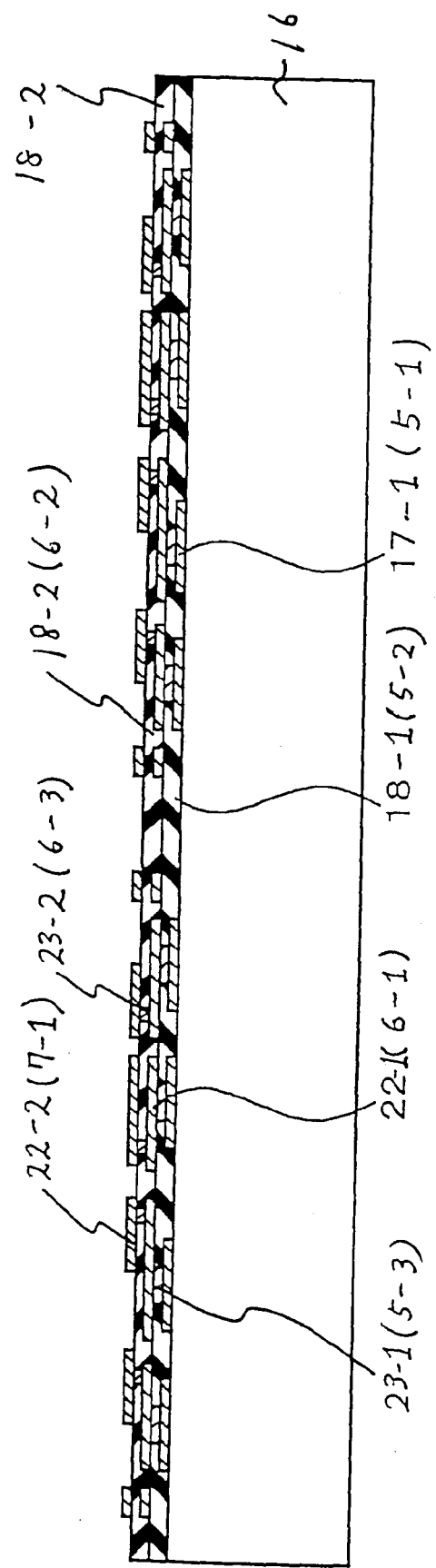
Figure 7I:
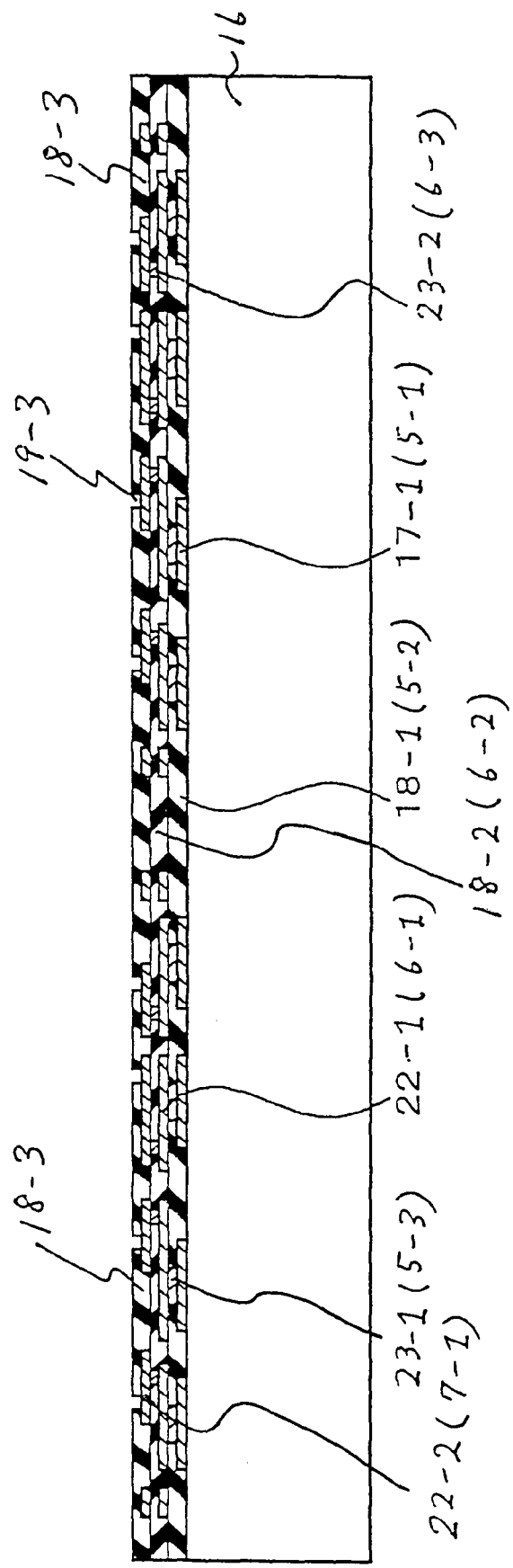
Figure 7J:
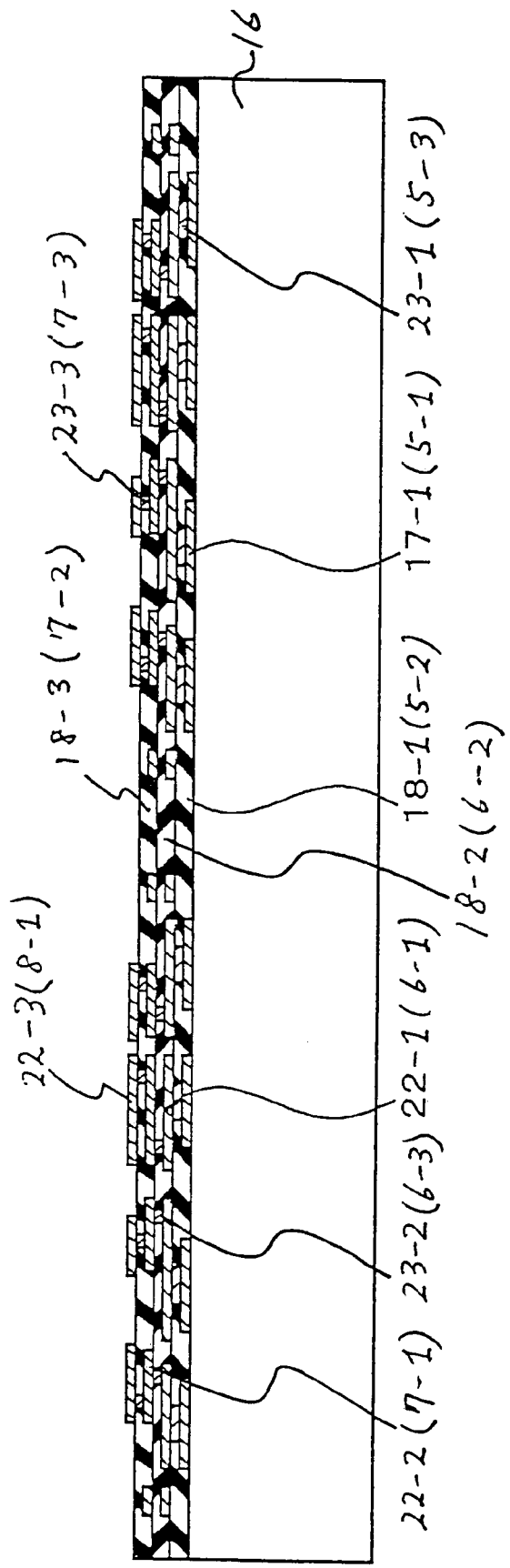
Figure 7K:
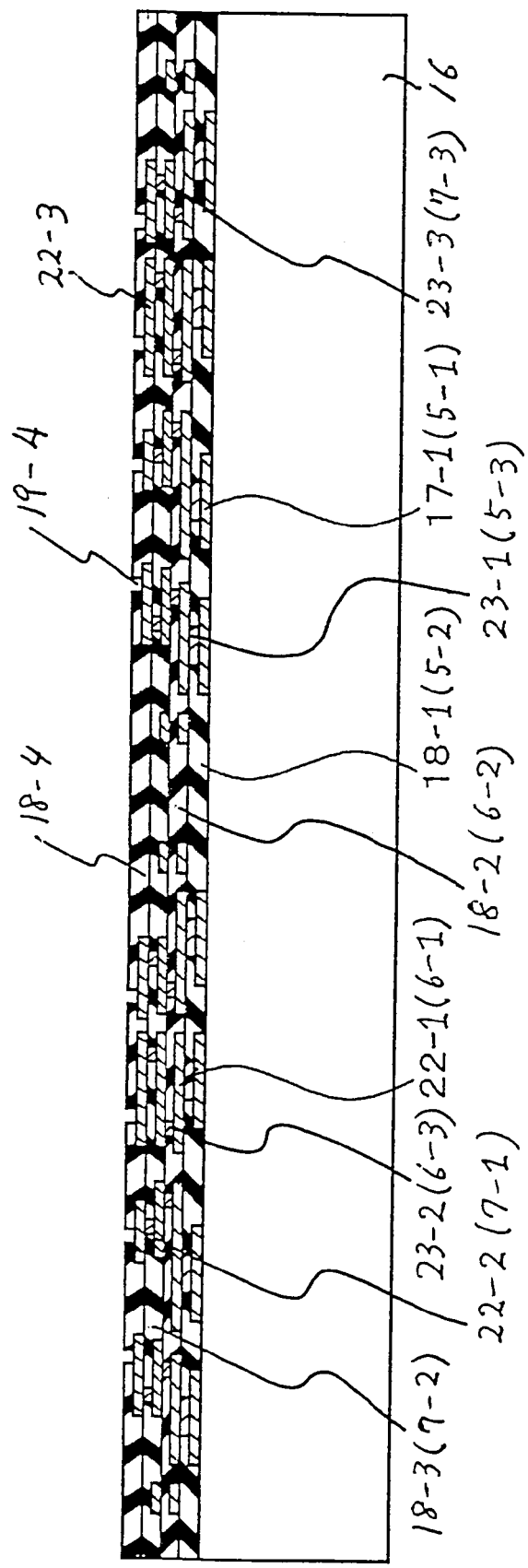
Figure 7L:
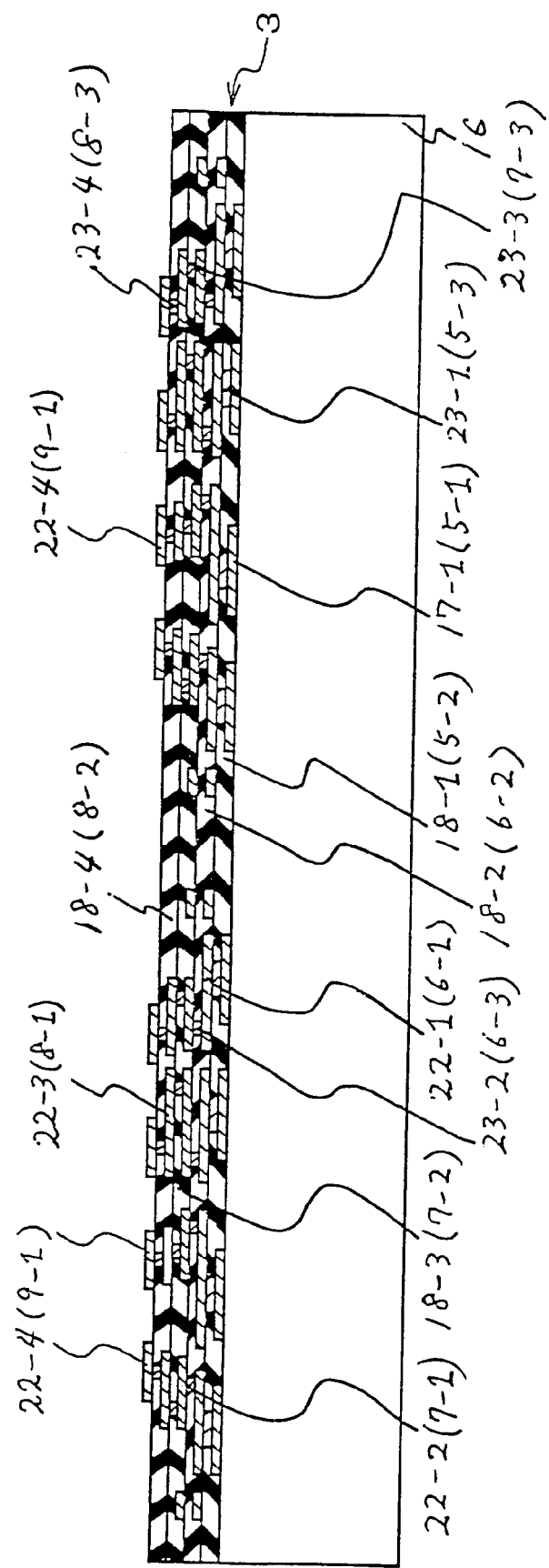
Figure 7M:
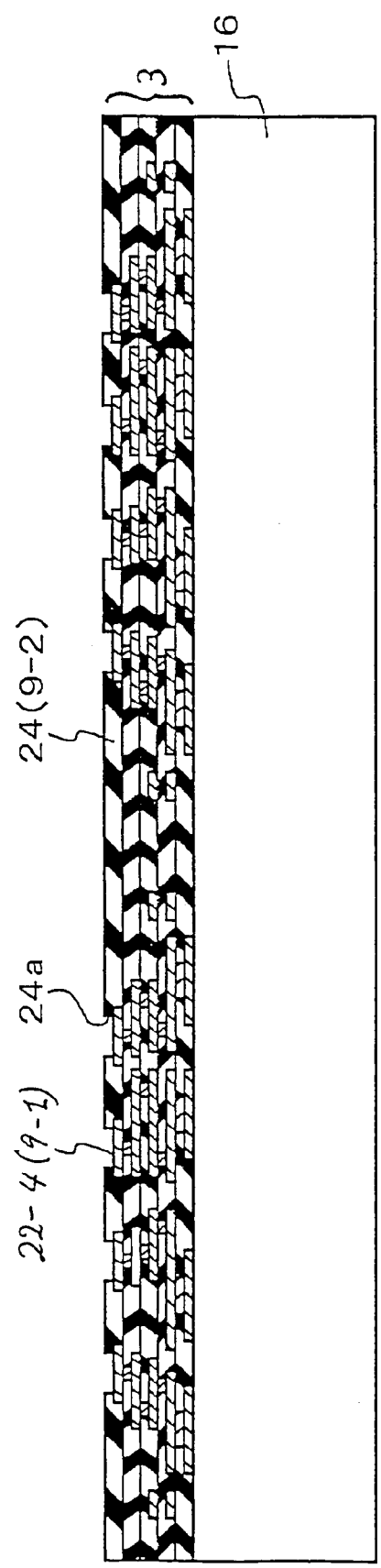
Figure 7N:
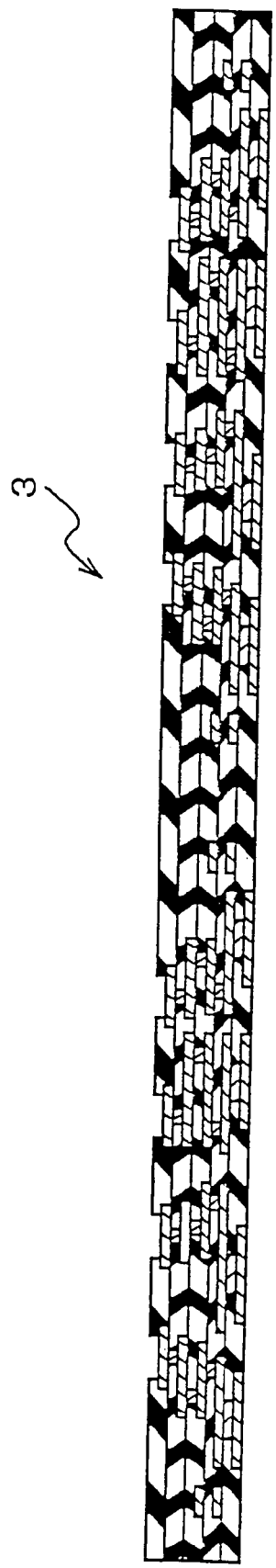
Figure 70:
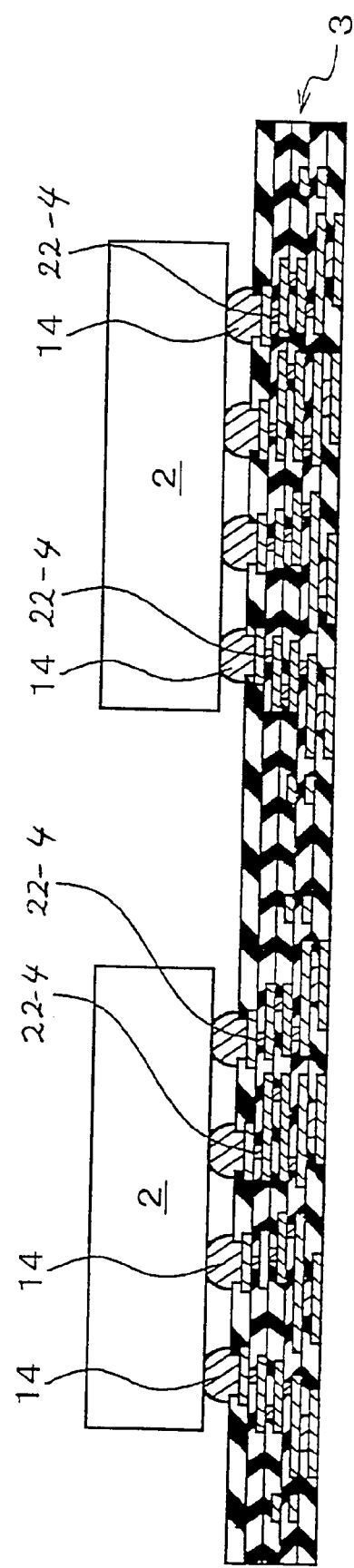
Figure 7P:
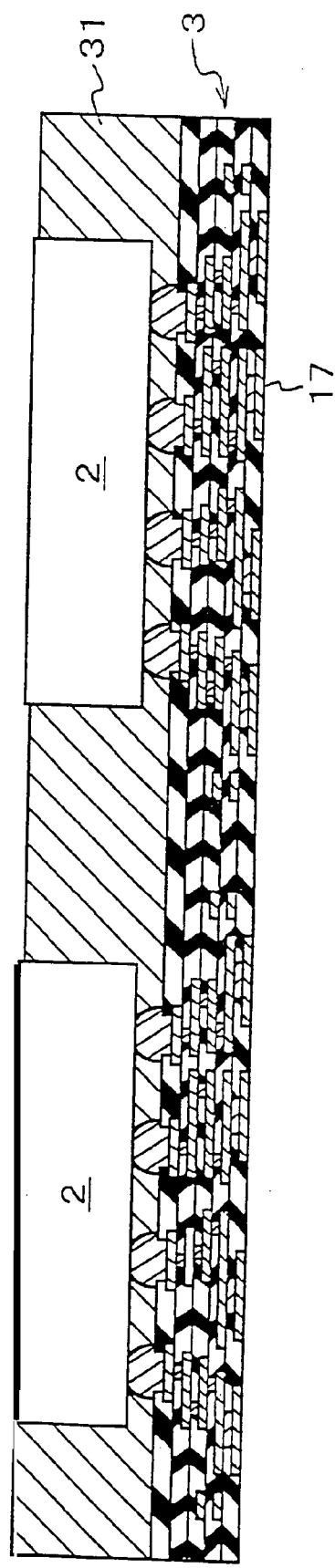
Figure 7Q:
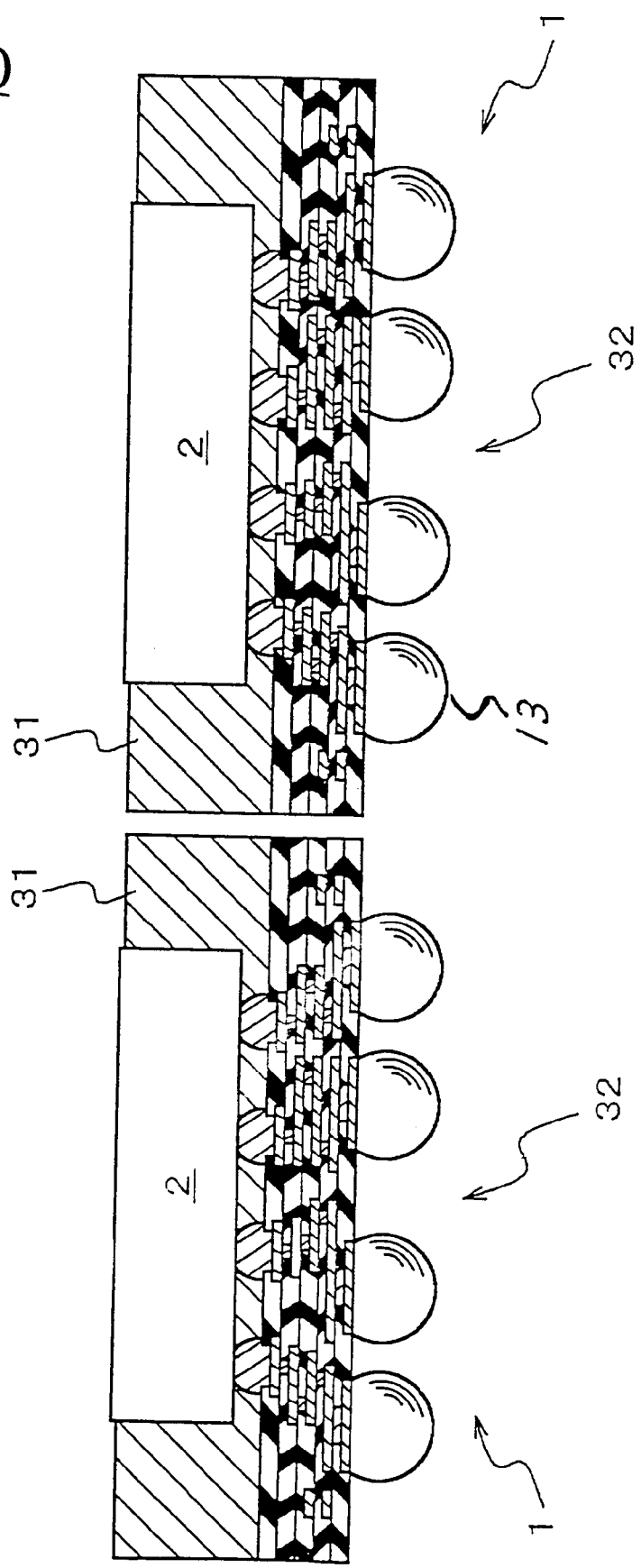

FIGS. 7A through 7Q are fragmentary cross sectional elevation views illustrative of a novel method of forming a semiconductor device having a multilayer interconnection board on which a semiconductor chip is mounted in a first embodiment in accordance with the present invention.

With reference to FIG. 7A, a high rigidity plate 16 is prepared. The high rigidity plate 16 may be made of any material having a high rigidity. Metals such as Cu-, Ni-, Al-, W-, Mo-, Au-, Ag- and Pt-based metals, complex materials of different metals and ceramics are available for the high rigidity plate 16.

With reference to FIG. 7B, an adhesive metal layer of a metal such as a Ti-base alloy, a Cr-base alloy, a Mo-base alloy, and a W-base alloy is formed on a first surface of the high rigidity plate 16 by a sputtering method. An electrode material layer of a metal such as Cu, Al, and Ni is then formed on the adhesive metal layer by a sputtering method to form laminations of the adhesive metal layer and the electrode material layer. A resist film is then applied on the laminations of the adhesive metal layer and the electrode material layer. The resist film is then patterned by an exposure and a subsequent development to form a resist pattern. A selective wet etching process or a selective dry etching process to the laminations of the adhesive metal layer and the electrode material layer is carried out by use of the resist pattern as a mask so as to pattern the laminations of the adhesive metal layer and the electrode material layer, whereby external electrode pads 17-1 are selectively formed on the first surface of the high rigidity plate 16. The used resist pattern is then removed.

If a minimum pitch of the external electrode pads 17-1 is not so narrow, then it is possible as a modification that a resist is coated directly on the first surface of the high rigidity plate 16 and then patterned by an exposure and a development to form a resist pattern before a selective electroplating of metal is then carried out by use of the resist pattern as a mask, followed by removal of the used resist pattern.

With reference to FIG. 7C, an insulative resin thin film 18-1 is then formed over the external electrode pads 17-1 and the first surface of the high rigidity plate 16. The insulative resin thin film 18-1 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-1. If a fine pattern of not more than 1.0 micrometer is required, it is preferable to use the silicon dioxide based inorganic materials for utilizing diffusion processes of semiconductor.

With reference to FIG. 7D, the insulative resin thin film 18-1 is selectively removed to form openings 19-1 in the insulative resin thin film 18-1 and over the external electrode pads 17-1. A resist film is applied on the insulative resin thin film 18-1 and then patterned by an exposure and a subsequent development to form a resist pattern on the insulative resin thin film 18-1. If the insulative resin thin film 18-1 is made of a material which is removable by a chemical etching process, the insulative resin thin film 18-1 is selectively removed by a wet etching by use of the resist pattern as a mask to form the openings 19-1 in the insulative resin thin film 18-1. If the insulative resin thin film 18-1 is made of a material which is unremovable by the chemical etching process, the insulative resin thin film 18-1 is selectively removed by a dry etching by use of the resist pattern as a mask to form the openings 19-1 in the insulative resin thin film 18-1. The external electrode pads 17-1 are partially shown through the openings 19-1 formed in the insulative resin thin film 18-1. The used resist pattern is then removed.

With reference to FIG. 7E, an adhesive metal thin film 21*a* is entirely formed which extends on the surface of the insulative resin thin film 18-1 and the shown parts of the external electrode pads 17-1 by a sputtering method. The adhesive metal thin film 21*a* may be made of a Ti-based alloy, a Cr-based alloy, a Mo-based alloy, or a W-based alloy. Subsequently, a metal electrode thin film 21*b* is also entirely formed on the adhesive metal thin film 21*a* by a sputtering method, a chemical vapor deposition or an electroless plating method. The metal electrode thin film 21*b* may be made of Cu, Al or Ni. Laminations of the adhesive metal thin film 21*a* and the metal electrode thin film 21*b* form a metal thin film 21 which extends on the surface of the insulative resin thin film 18-1 and within the openings 19-1 over the external electrode pads 17-1.

With reference to FIG. 7F, a resist film is entirely formed on the metal thin film 21 and then patterned by an exposure and a subsequent development to form a resist pattern over the metal thin film 21. The metal thin film 21 is then patterned by a wet etching or a dry etching by use of the resist pattern as a mask to form metal thin film contact layers 23-1 in the openings 19-1 and metal thin film interconnection layers 22-1 over the insulative resin thin film 18-1, wherein the metal thin film interconnection layers 22-1 are in contact directly with the metal thin film contact layers 23-1, so that the metal thin film interconnection layers 22-1 are electrically connected through the metal thin film contact layers 23-1 to the external electrode pads 17-1. The used resist mask is then removed. The external electrode pads 17-1 shown in FIG. 7F correspond to the first level interconnection pattern 5-1 of the first interconnection layer 5 shown in FIG. 6. The insulative resin thin film 18-1 shown in FIG. 7F also corresponds to the first level insulating layer 5-2 of the first interconnection layer 5 shown in FIG. 6. The metal thin film contact layers 23-1 shown in FIG. 7F also corresponds to the first level contact layer 5-3 of the first interconnection layer 5. The metal thin film interconnection layers 22-1 shown in FIG. 7F also corresponds to the second level interconnection pattern 6-1 of the second interconnection layer 6.

If the pattern pitch of the metal thin film interconnection layers 22-1 is not so narrow, then it is possible as a modification that after the metal thin film 21 has been formed, then the resist pattern is formed on the metal thin film 21 so that a selective electroplating of metal such as Cu is carried out by use of the resist pattern as a mask to form Cu-plated patterns over the metal thin film 21. The used resist mask is then removed. The metal thin film 21 is then selectively etched by use of the Cu-plated patterns as a mask thereby to form the metal thin film interconnection layers 22-1 over the insulative resin thin film 18-1 and the metal thin film contact layers 23-1 in the openings 19-1.

In accordance with the above described method and its modification, it is possible that the thicknesses of the resist film and the metal thin film interconnection layers 22-1 are not more than 1 micrometers.

With reference to FIG. 7G, an insulative resin thin film 18-2 is then formed over the metal thin film interconnection layers 22-1 and the insulative resin thin film 18-1. The insulative resin thin film 18-2 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-2. If a fine pattern of not more than 1.0 micrometer is required, it is preferable to use the silicon dioxide based inorganic materials for utilizing diffusion processes of semiconductor. The insulative resin thin film 18-2 is selectively removed to form openings 19-2 in the insulative resin thin film 18-2 and over the metal thin film interconnection layers 22-1. A resist film is applied on the insulative resin thin film 18-2 and then patterned by an exposure and a subsequent development to form a resist pattern on the insulative resin thin film 18-2. If the insulative resin thin film 18-2 is made of a material which is removable by a chemical etching process, the insulative resin thin film 18-2 is selectively removed by a wet etching by use of the resist pattern as a mask to form the openings 19-2 in the insulative resin thin film 18-2. If the insulative resin thin film 18-2 is made of a material which is unremovable by the chemical etching process, the insulative resin thin film 18-2 is selectively removed by a dry etching by use of the resist pattern as a mask to form the openings 19-2 in the insulative resin thin film 18-2. The metal thin film interconnection layers 22-1 are partially shown through the openings 19-2 formed in the insulative resin thin film 18-2. The used resist pattern is then removed.

With reference to FIG. 7H, an adhesive metal thin film is entirely formed which extends on the surface of the insulative resin thin film 18-2 and the shown parts of the metal thin film interconnection layers 22-1 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-2 and within the openings 19-2 over the metal thin film interconnection layers 22-1. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-2 in the openings 19-2 and metal thin film interconnection layers 22-2 over the insulative resin thin film 18-2, wherein the metal thin film interconnection layers 22-2 are in contact directly with the metal thin film contact layers 23-2, so that the metal thin film interconnection layers 22-2 are electrically connected through the metal thin film contact layers 23-2 to the metal thin film interconnection layers 22-1. The used resist mask is then removed. The metal thin film interconnection layers 22-1 shown in FIG. 7H correspond to the second level interconnection pattern 6-1 of the second interconnection layer 6 shown in FIG. 6. The insulative resin thin film 18-2 shown in FIG. 7H also corresponds to the second level insulating layer 6-2 of the second interconnection layer 6 shown in FIG. 6. The metal thin film contact layers 23-2 shown in FIG. 7H also corresponds to the second level contact layer 6-3 of the second interconnection layer 6. The metal thin film interconnection layers 22-2 shown in FIG. 7H also corresponds to the third level interconnection pattern 7-1 of the third interconnection layer 7.

If the pattern pitch of the metal thin film interconnection layers 22-2 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-2 over the insulative resin thin film 18-2 and the metal thin film contact layers 23-2 in the openings 19-2.

In accordance with the above described method and its modification, it is possible that the thicknesses of the resist film and the metal thin film interconnection layers 22-2 are not more than 1 micrometers.

With reference to FIG. 7I, an insulative resin thin film 18-3 is then formed over the metal thin film interconnection layers 22-2 and the insulative resin thin film 18-2. The insulative resin thin film 18-3 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-3. If a fine pattern of not more than 1.0 micrometer is required, it is preferable to use the silicon dioxide based inorganic materials for utilizing diffusion processes of semiconductor. The insulative resin thin film 18-3 is selectively removed to form openings 19-3 in the insulative resin thin film 18-3 and over the metal thin film interconnection layers 22-2. A resist film is applied on the insulative resin thin film 18-3 and then patterned by an exposure and a subsequent development to form a resist pattern on the insulative resin thin film 18-3. If the insulative resin thin film 18-3 is made of a material which is removable by a chemical etching process, the insulative resin thin film 18-3 is selectively removed by a wet etching by use of the resist pattern as a mask to form the openings 19-3 in the insulative resin thin film 18-3. If the insulative resin thin film 18-3 is made of a material which is unremovable by the chemical etching process, the insulative resin thin film 18-3 is selectively removed by a dry etching by use of the resist pattern as a mask to form the openings 19-3 in the insulative resin thin film 18-3. The metal thin film interconnection layers 22-2 are partially shown through the openings 19-3 formed in the insulative resin thin film 18-3. The used resist pattern is then removed.

With reference to FIG. 7J, an adhesive metal thin film is entirely formed which extends on the surface of the insulative resin thin film 18-3 and the shown parts of the metal thin film interconnection layers 22-2 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-3 and within the openings 19-3 over the metal thin film interconnection layers 22-2. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-3 in the openings 19-3 and metal thin film interconnection layers 22-3 over the insulative resin thin film 18-3, wherein the metal thin film interconnection layers 22-3 are in contact directly with the metal thin film contact layers 23-3, so that the metal thin film interconnection layers 22-3 are electrically connected through the metal thin film contact layers 23-3 to the metal thin film interconnection layers 22-2. The used resist mask is then removed. The metal thin film interconnection layers 22-2 shown in FIG. 7J correspond to the third level interconnection pattern 7-1 of the third interconnection layer 7 shown in FIG. 6. The insulative resin thin film 18-3 shown in FIG. 7J also corresponds to the third level insulating layer 7-2 of the third interconnection layer 7 shown in FIG. 6. The metal thin film contact layers 23-3 shown in FIG. 7J also corresponds to the third level contact layer 7-3 of the third interconnection layer 7. The metal thin film interconnection layers 22-3 shown in FIG. 7J also corresponds to the fourth level interconnection pattern 8-1 of the third interconnection layer 8.

If the pattern pitch of the metal thin film interconnection layers 22-3 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-3 over the insulative resin thin film 18-3 and the metal thin film contact layers 23-3 in the openings 19-3.

In accordance with the above described method and its modification, it is possible that the thicknesses of the resist film and the metal thin film interconnection layers 22-3 are not more than 1 micrometers.

With reference to FIG. 7K, an insulative resin thin film 18-4 is then formed over the metal thin film interconnection layers 22-3 and the insulative resin thin film 18-3. The insulative resin thin film 18-4 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-4. If a fine pattern of not more than 1.0 micrometer is required, it is preferable to use the silicon dioxide based inorganic materials for utilizing diffusion processes of semiconductor. The insulative resin thin film 18-4 is selectively removed to form openings 19-4 in the insulative resin thin film 18-4 and over the metal thin film interconnection layers 22-3. A resist film is applied on the insulative resin thin film 18-4 and then patterned by an exposure and a subsequent development to form a resist pattern on the insulative resin thin film 18-4. If the insulative resin thin film 18-4 is made of a material which is removable by a chemical etching process, the insulative resin thin film 18-4 is selectively removed by a wet etching by use of the resist pattern as a mask to form the openings 19-4 in the insulative resin thin film 18-4. If the insulative resin thin film 18-4 is made of a material which is unremovable by the chemical etching process, the insulative resin thin film 18-4 is selectively removed by a dry etching by use of the resist pattern as a mask to form the openings 19-4 in the insulative resin thin film 18-3. The metal thin film interconnection layers 22-3 are partially shown through the openings 19-4 formed in the insulative resin thin film 18-4. The used resist pattern is then removed.

With reference to FIG. 7L, an adhesive metal thin film is entirely formed which extends on the surface of the insulative resin thin film 18-4 and the shown parts of the metal thin film interconnection layers 22-3 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-4 and within the openings 19-4 over the metal thin film interconnection layers 22-3. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-4 in the openings 19-4 and pad electrodes 22-4 over the insulative resin thin film 18-4, wherein the pad electrodes 22-4 are in contact directly with the metal thin film contact layers 23-4, so that the pad electrodes 22-4 are electrically connected through the metal thin film contact layers 23-4 to the metal thin film interconnection layers 22-3. The used resist mask is then removed. The metal thin film interconnection layers 22-3 shown in FIG. 7L correspond to the fourth level interconnection pattern 8-1 of the fourth interconnection layer 8 shown in FIG. 6. The insulative resin thin film 18-4 shown in FIG. 7L also corresponds to the fourth level insulating layer 8-2 of the fourth interconnection layer 8 shown in FIG. 6. The metal thin film contact layers 23-4 shown in FIG. 7L also corresponds to the fourth level contact layer 8-3 of the fourth interconnection layer 8. The pad electrodes 22-4 shown in FIG. 7L also corresponds to the fifth level interconnection pattern 9-1 of the fifth interconnection layer 9.

If the pattern pitch of the pad electrodes 22-4 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the pad electrodes 22-4 over the insulative resin thin film 18-4 and the metal thin film contact layers 23-4 in the openings 19-4.

In accordance with the above described method and its modification, it is possible that the thicknesses of the resist film and the pad electrodes 22-4 are not more than 1 micrometers.

With reference to FIG. 7M, a solder resist film 24 is then formed over the pad electrodes 22-4 and the insulative resin thin film 18-4 in order to protect the multilayer interconnection board 3 having the pad electrodes 24. The solder resist film 24 shown in FIG. 7M corresponds to the fifth level insulating layer 9-2 of the fifth interconnection layer 9 shown in FIG. 6. The solder resist film 24 may comprise an organic insulating film such an epoxy resin film containing an inorganic filler such as fine powders of silicon dioxide. Alternatively, the solder resist film 24 may be made of a material which has a large resistivity to external chemical stress, and a large resistivity to a Flux cleaning solution or an Au plating solution as well as a high adhesiveness to a sealing material such as an under-fill material. If the above first to fourth insulative resin thin films 18-1, 18-2, 18-3 and 18-4 are highly resistive to the chemical and chemical stresses, it is possible as a modification to eliminate the formation of the solder resist film 24. The solder resist film 24 is selectively removed to form openings 24a in the solder resist film 24 and over the pad electrodes 22-4. If the solder resist film 24 is made of a non-photosensitive material, a resist film is applied on the solder resist film 24 and then patterned by an exposure and a subsequent development to form a resist pattern on the solder resist film 24, so that the solder resist film 24 is selectively removed by a wet etching by use of the resist pattern as a mask to form the openings 24a in the solder resist film 24, followed by removal of the used resist pattern. If the solder resist film 24 is made of a photosensitive material, then the solder resist film 24 is directly patterned by an exposure and a subsequent development to form the openings 24a in the solder resist film 24. The electrode pads 22-4 are partially shown through the openings 24a formed in the solder resist film 24.

With reference to FIG. 7N, the high rigidity plate 16 is completely removed by an etching process, whereby the multilayer interconnection board 3 remains. The external electrode pads 17-1 in the first interconnection layer 5 and the pad electrodes 22-4 in the fifth interconnection layer 9 are then subjected to an electroless plating for plating laminated Ni and Au layers or laminated Zn, Ni and Au layers on the external electrode pads 17-1 and the pad electrodes 22-4 in order to improve a bonding property between the external electrode pads 17-1 and also a bonding property between the pad electrodes 22-4 and the bumps 14 of the semiconductor chip 2. As a result, the multilayer interconnection board 3 is completed, which comprises plural unit multilayer interconnection boards. A test for electrical characteristics of the multilayer interconnection board 3 is then made, so that only quality-confirmed units in the plural unit multilayer interconnection boards in the electrical characteristic test are then subjected to a mounting process for mounting semiconductor chips thereon.

With reference to FIG. 7O, semiconductor chips 2 are mounted on the multilayer interconnection board 3, wherein the semiconductor chips 2 have the plural bumps 14, and the plural bumps 14 are made into contact with the electrode pads 22-4 of the multilayer interconnection board 3, so that the semiconductor chips 2 are electrically connected through the plural bumps 14 to the multilayer interconnection board 3. If the bumps 14 are made of a metal based solder material such as Sn or Pb, a flip-chip bonding utilizing a heat re-flow process using Flux is available for bonding the plural bumps 14 to the electrode pads 22-4 of the multilayer interconnection board 3. If the bumps 14 are made of a metal based solder material such as Au or In, a flip-chip bonding utilizing a thermo-compression bonding is available for bonding the plural bumps 14 to the electrode pads 22-4 of the multilayer interconnection board 3.

With reference to FIG. 7P, an insulative resin material 31 is formed which coats side walls of the semiconductor chips 2, an inter-space between the semiconductor chips 2 and the multilayer interconnection board 3 around the bumps 14 and the surface of the solder resist film 24 of the multilayer interconnection board 3 in order to protect the semiconductor chips 2, the bumps 14 and the multilayer interconnection board 3. This coating process is carried out by use of a resin injection technique involving a vacuum sealing technique or a transfer sealing technique. The insulative resin material 31 may be made of one of epoxy resin materials, silicone resin materials, polyimide resin materials, polyolefin resin materials, cyanate ester resin materials, phenol resin materials and naphthalene resin materials.

With reference to FIG. 7Q, solder balls 13 are formed which are in contact directly with the external electrode pads 17-1 of the multilayer interconnection board 3 to form a semiconductor device 1 having the multilayer interconnection board 3 and the plural semiconductor chips 2 mounted thereon. The solder balls 13 serve as external terminals. The solder balls 13 may be made of a metal based material such as Sn or Pb. The solder balls 13 may also be free of lead. The solder balls 13 may be made of an electrically conductive material having a low melting point, a high heat conductivity and a rapid solidity as well as a large surface tension so that the electrically conductive material becomes in the form of balls. The semiconductor device 1 is then diced by use of a dicing blade to divide the semiconductor device 1 into plural unit semiconductor devices 32 or flip-chip semiconductor devices 32, each of which comprises the multilayer interconnection board 3 and the single semiconductor chip 2 mounted thereon.

With reference back to FIG. 4, a heat conductive adhesive layer 41 is provided on a top surface of the semiconductor chip 2. A heat spreader 42 is provided on the heat conductive adhesive layer 41 so that the heat spreader 42 is adhered through the heat conductive adhesive layer 41 to the top surface of the semiconductor chip 2. A heat generated in the semiconductor chip 2 is conducted through the heat conductive adhesive layer 41 to the heat spreader 42 for causing a heat radiation from the heat spreader 42. The heat spreader 42 may be made of a heat conductive material such as a metal base material, for example, Cu, Al, W, Mo, Fe, Ni, and Cr, or $Al_2O_3$, AlN, SiC, other ceramics such as mullite. The heat conductive adhesive layer 41 may be made of a resin based material containing a heat conductive material, wherein the resin based material may be one of epoxy resin materials, silicone resin materials, polyimide resin materials, polyolefin resin materials, cyanate ester resin materials, phenol resin materials and naphthalene resin materials, whilst the heat conductive material may be one of Ag, Pd, Cu, Al, Au, Mo, W, diamond, $Al_2O_3$, AlN, and ceramic materials such as mullite, BN and SiC.

The flip-chip is usually applied to a high speed logic device having a large number of pins, for which reason the heat radiation from the semiconductor chip 2 is important. In this embodiment, the heat spreader 42 is provided to improve the heat radiation characteristic of the flip-chip semiconductor device 32.

In accordant with the present invention, the base material of the multilayer interconnection board is not largely different in thermal expansion coefficient from the semiconductor chip to reduce a stress applied between the multilayer interconnection board and the semiconductor chip, thereby keeping a high reliability in connection between the multilayer interconnection board and the semiconductor chip. The reduction in stress applied between the multilayer interconnection board and the semiconductor chip makes it unnecessary to increase the thicknesses of the multilevel interconnections 17-1, 2-1, 22-2, 22-3 and 24 for stress relaxation, but makes it possible that the thicknesses of the multilevel interconnections 17-1, 2-1, 22-2, 22-3 and 24 are thin, for example, not more than 1 micrometer. A metallization technique for the semiconductor wafer and an apparatus therefor are utilized for allowing the resist films and the multilevel interconnections 17-1, 2-1, 22-2, 22-3 and 24 to be patterned finely, thereby permitting a further shrinkage of the interconnection patterns.

Further, the multilayer interconnection board remains adhered or fixed to the high rigidity plate such as the metal plate during when the multilayer interconnection board is formed, so that the high rigidity plate provides or ensures a high planarity to the multilayer interconnection board. Even the high rigidity plate is different in linear expansion coefficient from the multilayer interconnection board, the high rigidity plate suppresses generation of internal stress in the multilayer interconnection board and expansion of the multilayer interconnection board, so that the high rigidity plate suppresses the multilayer interconnection board from being bent, whereby the multilayer interconnection board is free from any misalignment in patterning the insulating layers and the interconnection layers, resulting in a high yield of the flip-chip semiconductor device.

As described above, the high rigidity plate is necessary or important for keeping the multilayer interconnection board to have the high planarity until the multilayer interconnection board is completed. Notwithstanding, the high rigidity plate is not necessarily needed to the final product, for example, the flip-chip semiconductor device, for which reason as described above, after the multilayer interconnection board has been completed, then the high rigidity plate is removed. After the high rigidity plate is removed from the bottom surface of the multilayer interconnection board, then the bottom surface of the multilayer interconnection board is shown, for which reason the bottom or first insulating layer of the multilayer interconnection board may preferably be made of an insulating material such as an organic material which has a flexibility to an externally applied stress.

Accordingly, the single multilayer interconnection board is adhered or fixed to the one side of the high rigidity plate to form an asymmetric structure. The high rigidity plate prevents the multilayer interconnection board from being bent during the fabrication of the multilayer interconnection board. If the multilayer interconnection boards are adhered or fixed to both surfaces of the high rigidity plate, then it is necessary to form through holes in the high rigidity plate. In accordance with the present invention, however, it is unnecessary to form such the through holes in the high rigidity plate, whereby there are raised no problem with defect of the final product due to dusts generated in forming the through holes in the high rigidity plate nor problem with increase in the manufacturing cost due to additional process for forming the through holes in the high rigidity plate.

In the above embodiment, the high rigidity plate is removed after the multilayer interconnection board is completed and before the semiconductor chips are mounted on the multilayer interconnection board.

It is, however, possible to remove the high rigidity plate from the multilayer interconnection board after the semiconductor chips have been mounted on the multilayer interconnection board. When the semiconductor chips are mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips. These processes will be described in detail in the following second embodiment.

It is, also, possible to remove the high rigidity plate from the multilayer interconnection board after the heat spreader has been adhered through the heat conductive adhesive layer to the semiconductor chips mounted on the multilayer interconnection board and before the solder balls are formed. When the semiconductor chips are mounted on the multilayer interconnection board and then the heat spreader are then adhered through the heat conductive adhesive layer to the semiconductor chips mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips. These processes will be described in detail in the following second embodiment.

Furthermore, in the end user's side, the above flip-chip semiconductor device 32 is mounted through the solder balls 13 to a circuit board which is not illustrated. The solder balls 13 have a small stand-off height which is insufficient for relaxation of the stress applied between the above flip-chip semiconductor device 32 and the circuit board. Other novel technique for solving this disadvantage will be described in the following fourth embodiment.

Accordingly, it is possible to remove the high rigidity plate from the multilayer interconnection board any times after the multilayer interconnection board has been completed and before the solder balls are formed.

Second Embodiment

A second embodiment according to the present invention will be described in detail with reference to the drawings. The second embodiment is different from the first embodiment only in the fabrication processes for the flip-chip semiconductor device 32, for which reason the following descriptions will focus on the fabrication processes and the description of the structure of the flip-chip semiconductor device 32 will be omitted.

Figure 8A:
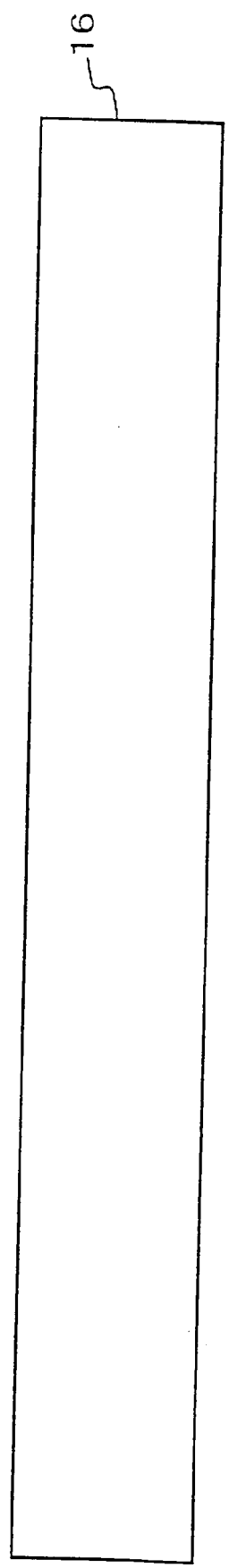
FIGS. 8A through 8Q are fragmentary cross sectional elevation views illustrative of a novel method of forming a semiconductor device having a multilayer interconnection board on which a semiconductor chip is mounted in a second embodiment in accordance with the present invention.

FIGS. 8A through 8Q are fragmentary cross sectional elevation views illustrative of a novel method of forming a semiconductor device having a multilayer interconnection board on which a semiconductor chip is mounted in a second embodiment in accordance with the present invention.

With reference to FIG. 8A, a high rigidity plate 16 is prepared. The high rigidity plate 16 may be made of any material having a high rigidity. Metals such as Cu-, Ni-, Al-, W-, Mo-, Au-, Ag- and Pt-based metals, complex materials of different metals and ceramics are available for the high rigidity plate 16.

Figure 8B:
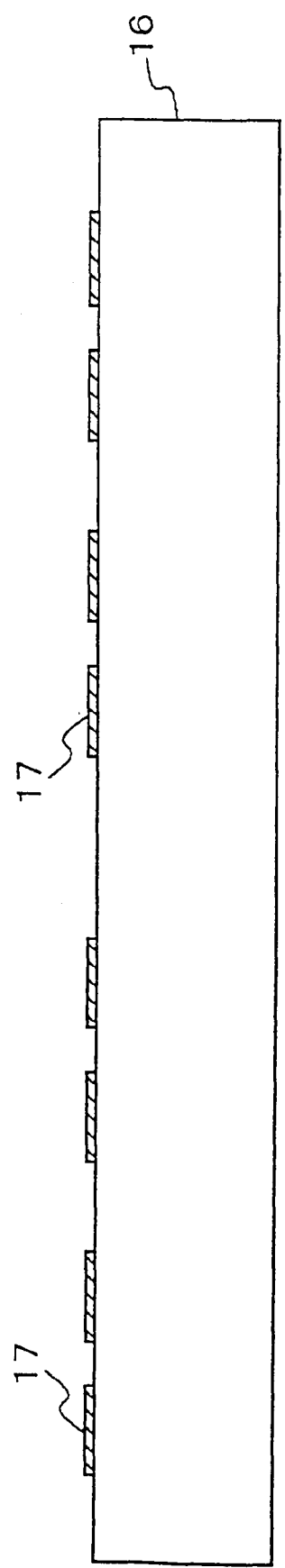

With reference to FIG. 8B, an adhesive metal layer of a metal such as a Ti-base alloy, a Cr-base alloy, a Mo-base alloy, and a W-base alloy is formed on a first surface of the high rigidity plate 16 by a sputtering method. An electrode material layer of a metal such as Cu, Al, and Ni, is then formed on the adhesive metal layer by a sputtering method to form laminations of the adhesive metal layer and the electrode material layer. A resist film is then applied on the laminations of the adhesive metal layer and the electrode material layer. The resist film is then patterned by an exposure and a subsequent development to form a resist pattern. A selective wet etching process or a selective dry etching process to the laminations of the adhesive metal layer and the electrode material layer is carried out by use of the resist pattern as a mask so as to pattern the laminations of the adhesive metal layer and the electrode material layer, whereby external electrode pads 17-1 are selectively formed on the first surface of the high rigidity plate 16. The used resist pattern is then removed.

If a minimum pitch of the external electrode pads 17-1 is not so narrow, then it is possible as a modification that a resist is coated directly on the first surface of the high rigidity plate 16 and then patterned by an exposure and a development to form a resist pattern before a selective electroplating of metal is then carried out by use of the resist pattern as a mask, followed by removal of the used resist pattern.

Figure 8C:
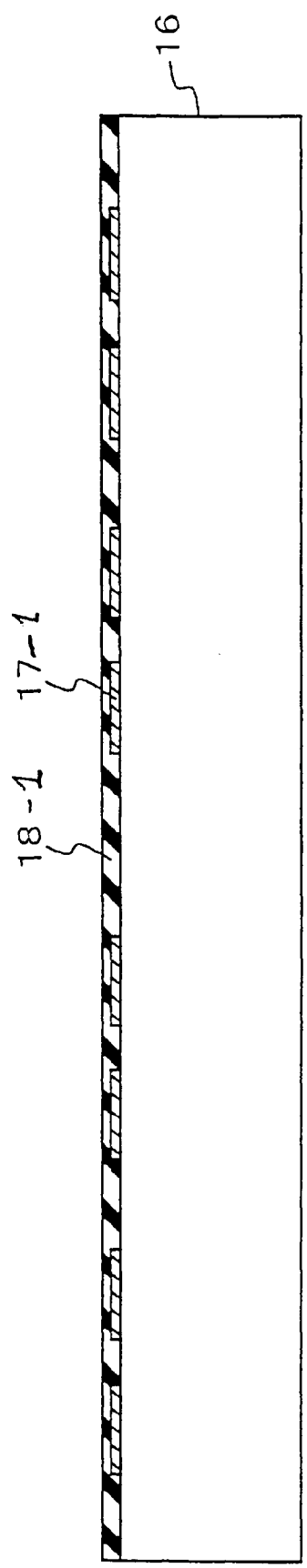

With reference to FIG. 8C, an insulative resin thin film 18-1 is then formed over the external electrode pads 17-1 and the first surface of the high rigidity plate 16. The insulative resin thin film 18-1 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-1. If a fine pattern of not more than 1.0 micrometer is required, it is preferable to use the silicon dioxide based inorganic materials for utilizing diffusion processes of semiconductor.

Figure 8D:
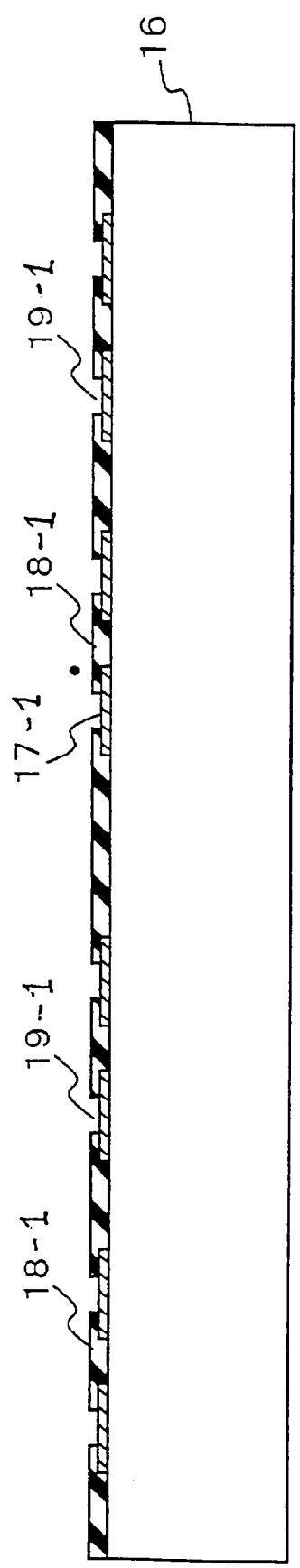

With reference to FIG. 8D, the insulative resin thin film 18-1 is selectively removed to form openings 19-1 in the insulative resin thin film 18-1 and over the external electrode pads 17-1. A resist film is applied on the insulative resin thin film 18-1 and then patterned by an exposure and a subsequent development to form a resist pattern on the insulative resin thin film 18-1. If the insulative resin thin film 18-1 is made of a material which is removable by a chemical etching process, the insulative resin thin film 18-1 is selectively removed by a wet etching by use of the resist pattern as a mask to form the openings 19-1 in the insulative resin thin film 18-1. If the insulative resin thin film 18-1 is made of a material which is unremovable by the chemical etching process, the insulative resin thin film 18-1 is selectively removed by a dry etching by use of the resist pattern as a mask to form the openings 19-1 in the insulative resin thin film 18-1. The external electrode pads 17-1 are partially shown through the openings 19-1 formed in the insulative resin thin film 18-1. The used resist pattern is then removed.

Figure 8E:
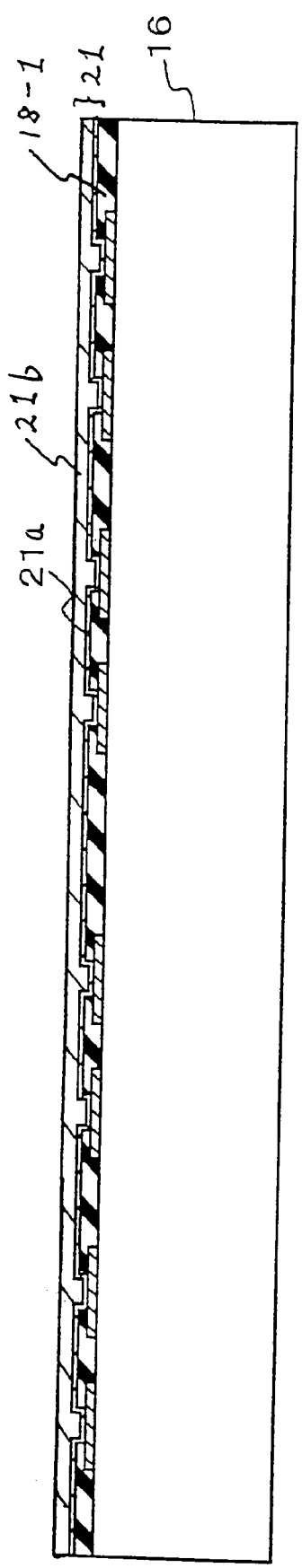

With reference to FIG. 8E, an adhesive metal thin film 21*a* is entirely formed which extends on the surface of the insulative resin thin film 18-1 and the shown parts of the external electrode pads 17-1 by a sputtering method. The adhesive metal thin film 21*a* may be made of a Ti-based alloy, a Cr-based alloy, a Mo-based alloy, or a W-based alloy. Subsequently, a metal electrode thin film 21*b* is also entirely formed on the adhesive metal thin film 21*a* by a sputtering method, a chemical vapor deposition or an electroless plating method. The metal electrode thin film 21*b* may be made of Cu, Al or Ni. Laminations of the adhesive metal thin film 21*a* and the metal electrode thin film 21*b* form a metal thin film 21 which extends on the surface of the insulative resin thin film 18-1 and within the openings 19-1 over the external electrode pads 17-1.

Figure 8F:
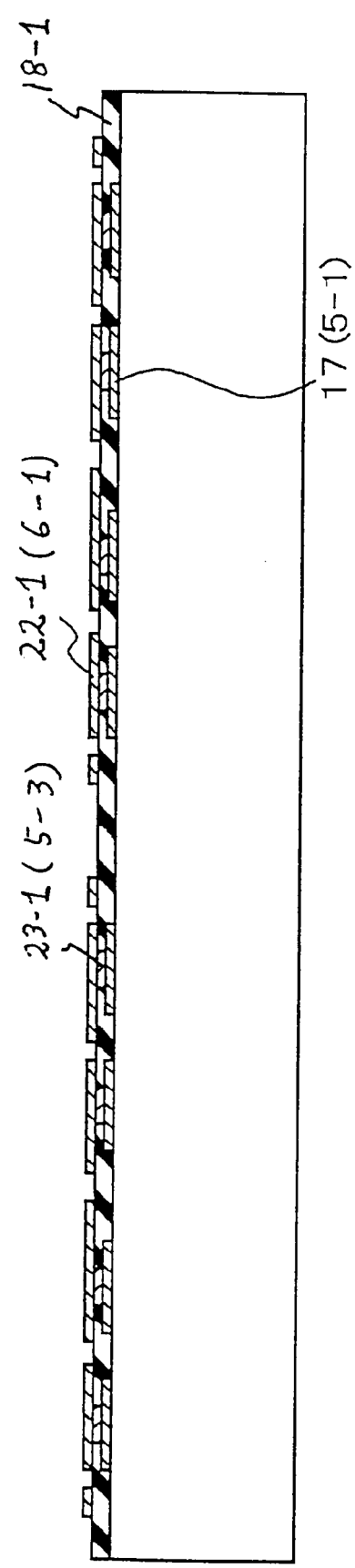

With reference to FIG. 8F, a resist film is entirely formed on the metal thin film 21 and then patterned by an exposure and a subsequent development to form a resist pattern over the metal thin film 21. The metal thin film 21 is then patterned by a wet etching or a dry etching by use of the resist pattern as a mask to form metal thin film contact layers 23-1 in the openings 19-1 and metal thin film interconnection layers 22-1 over the insulative resin thin film 18-1, wherein the metal thin film interconnection layers 22-1 are in contact directly with the metal thin film contact layers 23-1, so that the metal thin film interconnection layers 22-1 are electrically connected through the metal thin film contact layers 23-1 to the external electrode pads 17-1. The used resist mask is then removed. The external electrode pads 17-1 shown in FIG. 8F correspond to the first level interconnection pattern 5-1 of the first interconnection layer 5 shown in FIG. 6. The insulative resin thin film 18-1 shown in FIG. 8F also corresponds to the first level insulating layer 5-2 of the first interconnection layer 5 shown in FIG. 6. The metal thin film contact layers 23-1 shown in FIG. 8F also corresponds to the first level contact layer 5-3 of the first interconnection layer 5. The metal thin film interconnection layers 22-1 shown in FIG. 8F also corresponds to the second level interconnection pattern 6-1 of the second interconnection layer 6.

If the pattern pitch of the metal thin film interconnection layers 22-1 is not so narrow, then it is possible as a modification that after the metal thin film 21 has been formed, then the resist pattern is formed on the metal thin film 21 so that a selective electroplating of metal such as Cu is carried out by use of the resist pattern as a mask to form Cu-plated patterns over the metal thin film 21. The used resist mask is then removed. The metal thin film 21 is then selectively etched by use of the Cu-plated patterns as a mask thereby to form the metal thin film interconnection layers 22-1 over the insulative resin thin film 18-1 and the metal thin film contact layers 23-1 in the openings 19-1.

In accordance with the above described method and its modification, it is possible that the thicknesses of the resist film and the metal thin film interconnection layers 22-1 are not more than 1 micrometers.

Figure 8G:
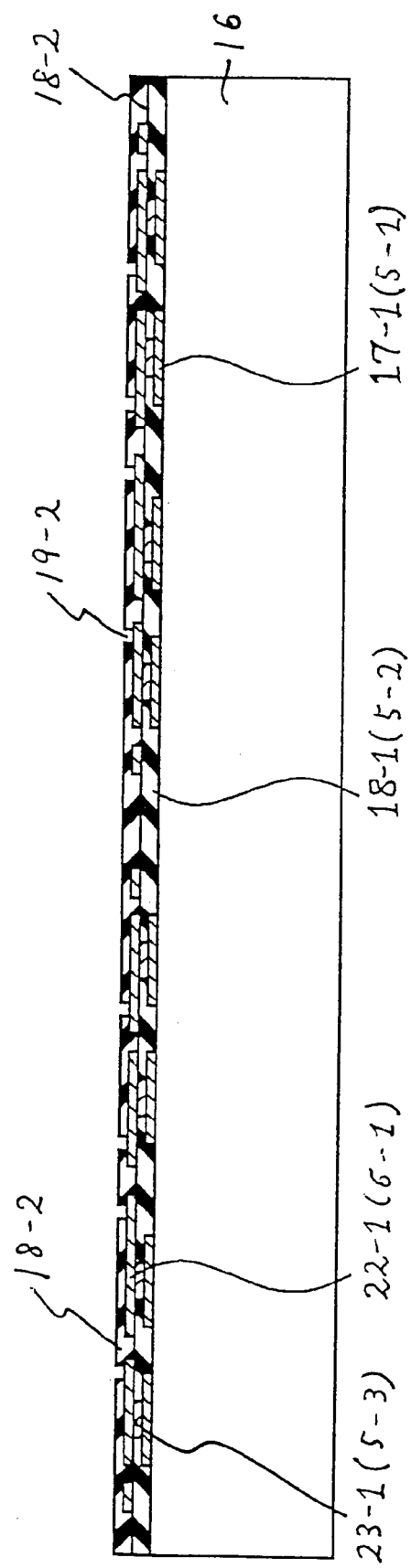

With reference to FIG. 8G, an insulative resin thin film 18-2 is then formed over the metal thin film interconnection layers 22-1 and the insulative resin thin film 18-1. The insulative resin thin film 18-2 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-2. If a fine pattern of not more than 1.0 micrometer is required, it is preferable to use the silicon dioxide based inorganic materials for utilizing diffusion processes of semiconductor. The insulative resin thin film 18-2 is selectively removed to form openings 19-2 in the insulative resin thin film 18-2 and over the metal thin film interconnection layers 22-1. A resist film is applied on the insulative resin thin film 18-2 and then patterned by an exposure and a subsequent development to form a resist pattern on the insulative resin thin film 18-2. If the insulative resin thin film 18-2 is made of a material which is removable by a chemical etching process, the insulative resin thin film 18-2 is selectively removed by a wet etching by use of the resist pattern as a mask to form the openings 19-2 in the insulative resin thin film 18-2. If the insulative resin thin film 18-2 is made of a material which is unremovable by the chemical etching process, the insulative resin thin film 18-2 is selectively removed by a dry etching by use of the resist pattern as a mask to form the openings 19-2 in the insulative resin thin film 18-2. The metal thin film interconnection layers 22-1 are partially shown through the openings 19-2 formed in the insulative resin thin film 18-2. The used resist pattern is then removed.

Figure 8H:
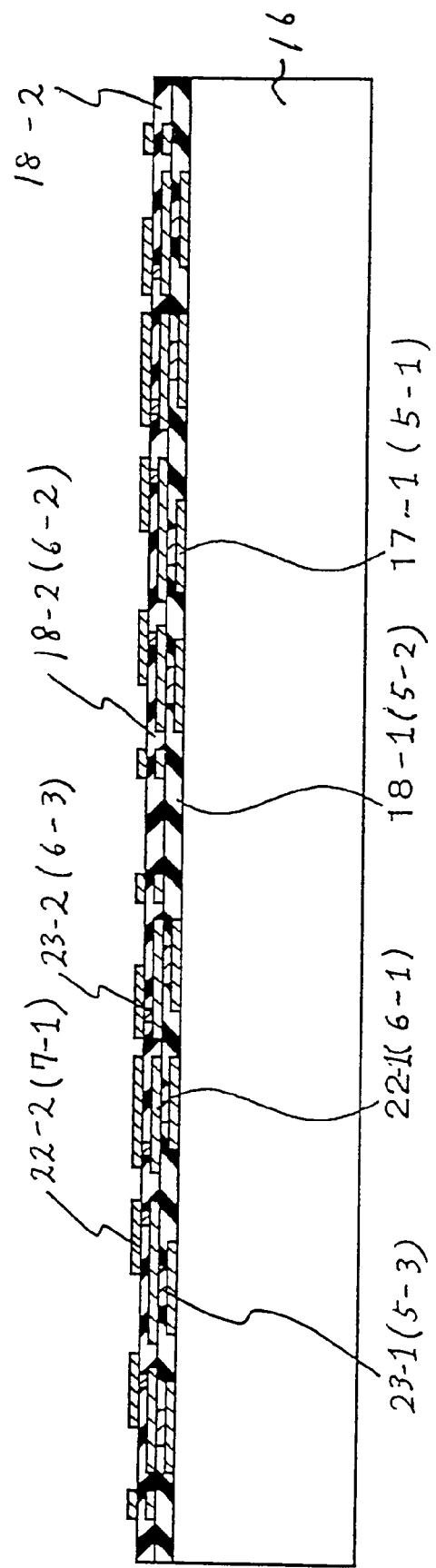

With reference to FIG. 8H, an adhesive metal thin film is entirely formed which extends on the surface of the insulative resin thin film 18-2 and the shown parts of the metal thin film interconnection layers 22-1 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-2 and within the openings 19-2 over the metal thin film interconnection layers 22-1. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-2 in the openings 19-2 and metal thin film interconnection layers 22-2 over the insulative resin thin film 18-2, wherein the metal thin film interconnection layers 22-2 are in contact directly with the metal thin film contact layers 23-2, so that the metal thin film interconnection layers 22-2 are electrically connected through the metal thin film contact layers 23-2 to the metal thin film interconnection layers 22-1. The used resist mask is then removed. The metal thin film interconnection layers 22-1 shown in FIG. 8H correspond to the second level interconnection pattern 6-1 of the second interconnection layer 6 shown in FIG. 6. The insulative resin thin film 18-2 shown in FIG. 8H also corresponds to the second level insulating layer 6-2 of the second interconnection layer 6 shown in FIG. 6. The metal thin film contact layers 23-2 shown in FIG. 8H also corresponds to the second level contact layer 6-3 of the second interconnection layer 6. The metal thin film interconnection layers 22-2 shown in FIG. 8H also corresponds to the third level interconnection pattern 7-1 of the third interconnection layer 7.

If the pattern pitch of the metal thin film interconnection layers 22-2 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-2 over the insulative resin thin film 18-2 and the metal thin film contact layers 23-2 in the openings 19-2.

In accordance with the above described method and its modification, it is possible that the thicknesses of the resist film and the metal thin film interconnection layers 22-2 are not more than 1 micrometers.

Figure 8I:
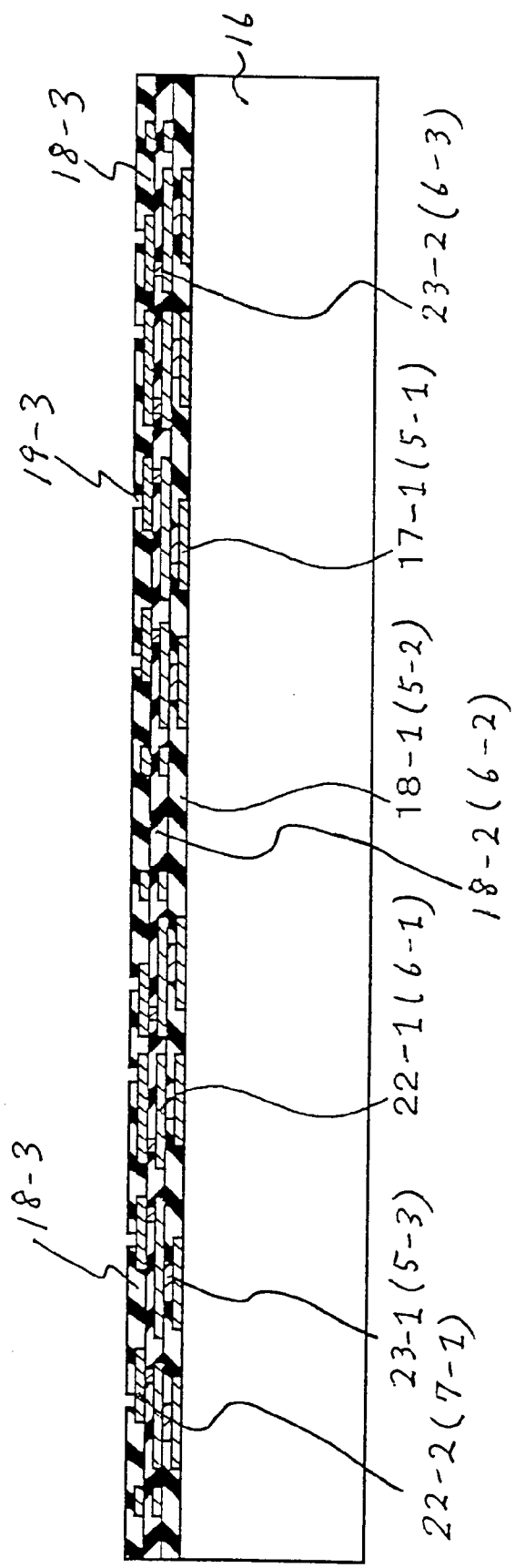

With reference to FIG. 8I, an insulative resin thin film 18-3 is then formed over the metal thin film interconnection layers 22-2 and the insulative resin thin film 18-2. The insulative resin thin film 18-3 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-3. If a fine pattern of not more than 1.0 micrometer is required, it is preferable to use the silicon dioxide based inorganic materials for utilizing diffusion processes of semiconductor. The insulative resin thin film 18-3 is selectively removed to form openings 19-3 in the insulative resin thin film 18-3 and over the metal thin film interconnection layers 22-2. A resist film is applied on the insulative resin thin film 18-3 and then patterned by an exposure and a subsequent development to form a resist pattern on the insulative resin thin film 18-3. If the insulative resin thin film 18-3 is made of a material which is removable by a chemical etching process, the insulative resin thin film 18-3 is selectively removed by a wet etching by use of the resist pattern as a mask to form the openings 19-3 in the insulative resin thin film 18-3. If the insulative resin thin film 18-3 is made of a material which is unremovable by the chemical etching process, the insulative resin thin film 18-3 is selectively removed by a dry etching by use of the resist pattern as a mask to form the openings 19-3 in the insulative resin thin film 18-3. The metal thin film interconnection layers 22-2 are partially shown through the openings 19-3 formed in the insulative resin thin film 18-3. The used resist pattern is then removed.

Figure 8J:
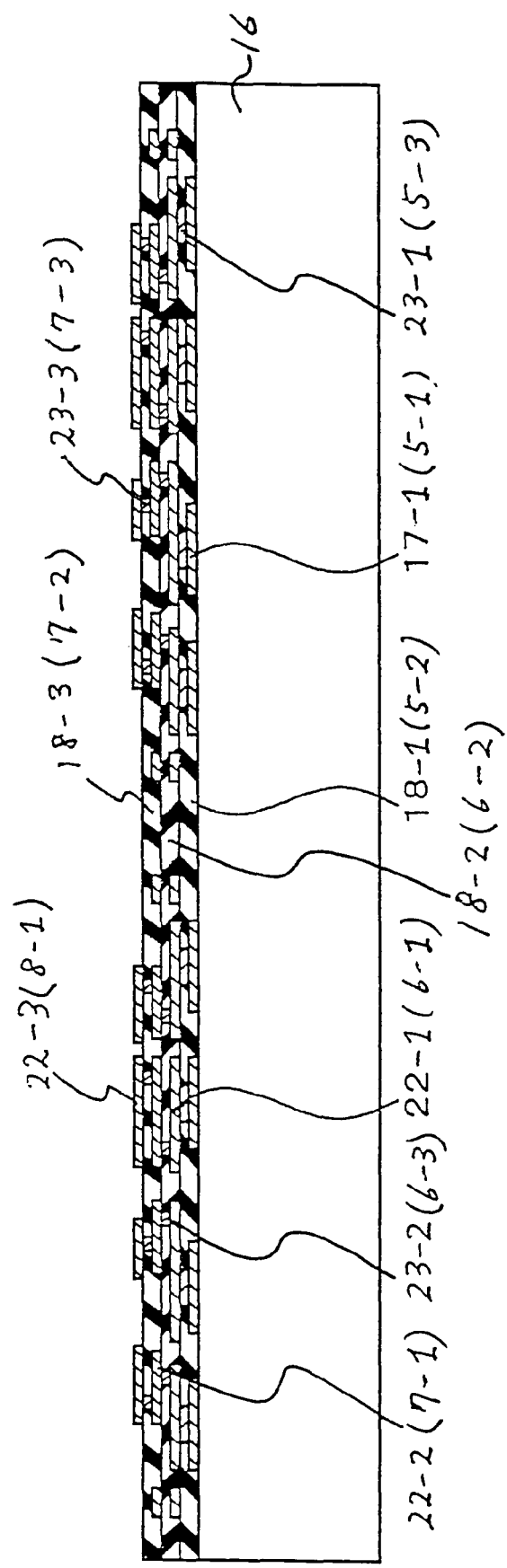

With reference to FIG. 8J, an adhesive metal thin film is entirely formed which extends on the surface of the insulative resin thin film 18-3 and the shown parts of the metal thin film interconnection layers 22-2 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-3 and within the openings 19-3 over the metal thin film interconnection layers 22-2. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-3 in the openings 19-3 and metal thin film interconnection layers 22-3 over the insulative resin thin film 18-3, wherein the metal thin film interconnection layers 22-3 are in contact directly with the metal thin film contact layers 23-3, so that the metal thin film interconnection layers 22-3 are electrically connected through the metal thin film contact layers 23-3 to the metal thin film interconnection layers 22-2. The used resist mask is then removed. The metal thin film interconnection layers 22-2 shown in FIG. 8J correspond to the third level interconnection pattern 7-1 of the third interconnection layer 7 shown in FIG. 6. The insulative resin thin film 18-3 shown in FIG. 8J also corresponds to the third level insulating layer 7-2 of the third interconnection layer 7 shown in FIG. 6. The metal thin film contact layers 23-3 shown in FIG. 8J also corresponds to the third level contact layer 7-3 of the third interconnection layer 7. The metal thin film interconnection layers 22-3 shown in FIG. 8J also corresponds to the fourth level interconnection pattern 8-1 of the third interconnection layer 8.

If the pattern pitch of the metal thin film interconnection layers 22-3 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-3 over the insulative resin thin film 18-3 and the metal thin film contact layers 23-3 in the openings 19-3.

In accordance with the above described method and its modification, it is possible that the thicknesses of the resist film and the metal thin film interconnection layers 22-3 are not more than 1 micrometers.

Figure 8K:
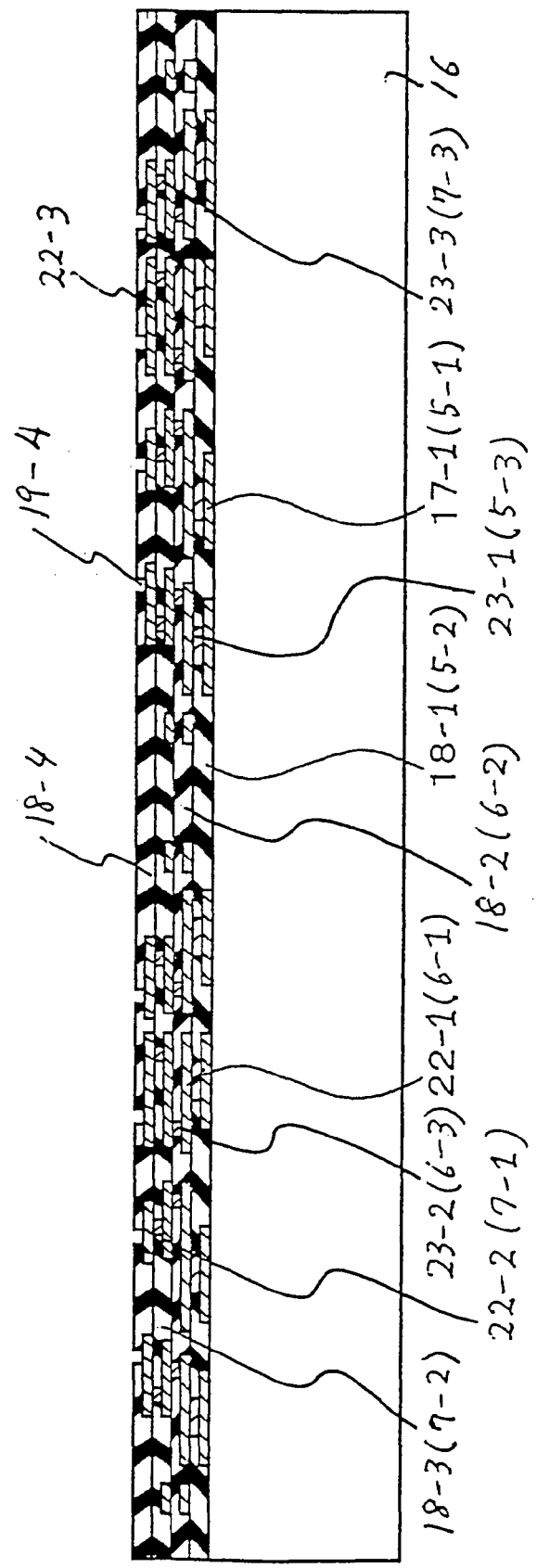

With reference to FIG. 8K, an insulative resin thin film 18-4 is then formed over the metal thin film interconnection layers 22-3 and the insulative resin thin film 18-3. The insulative resin thin film 18-4 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-4. If a fine pattern of not more than 1.0 micrometer is required, it is preferable to use the silicon dioxide based inorganic materials for utilizing diffusion processes of semiconductor. The insulative resin thin film 18-4 is selectively removed to form openings 19-4 in the insulative resin thin film 18-4 and over the metal thin film interconnection layers 22-3. A resist film is applied on the insulative resin thin film 18-4 and then patterned by an exposure and a subsequent development to form a resist pattern on the insulative resin thin film 18-4. If the insulative resin thin film 18-4 is made of a material which is removable by a chemical etching process, the insulative resin thin film 18-4 is selectively removed by a wet etching by use of the resist pattern as a mask to form the openings 19-4 in the insulative resin thin film 18-4. If the insulative resin thin film 18-4 is made of a material which is unremovable by the chemical etching process, the insulative resin thin film 18-4 is selectively removed by a dry etching by use of the resist pattern as a mask to form the openings 19-4 in the insulative resin thin film 18-3. The metal thin film interconnection layers 22-3 are partially shown through the openings 19-4 formed in the insulative resin thin film 18-4. The used resist pattern is then removed.

Figure 8L:
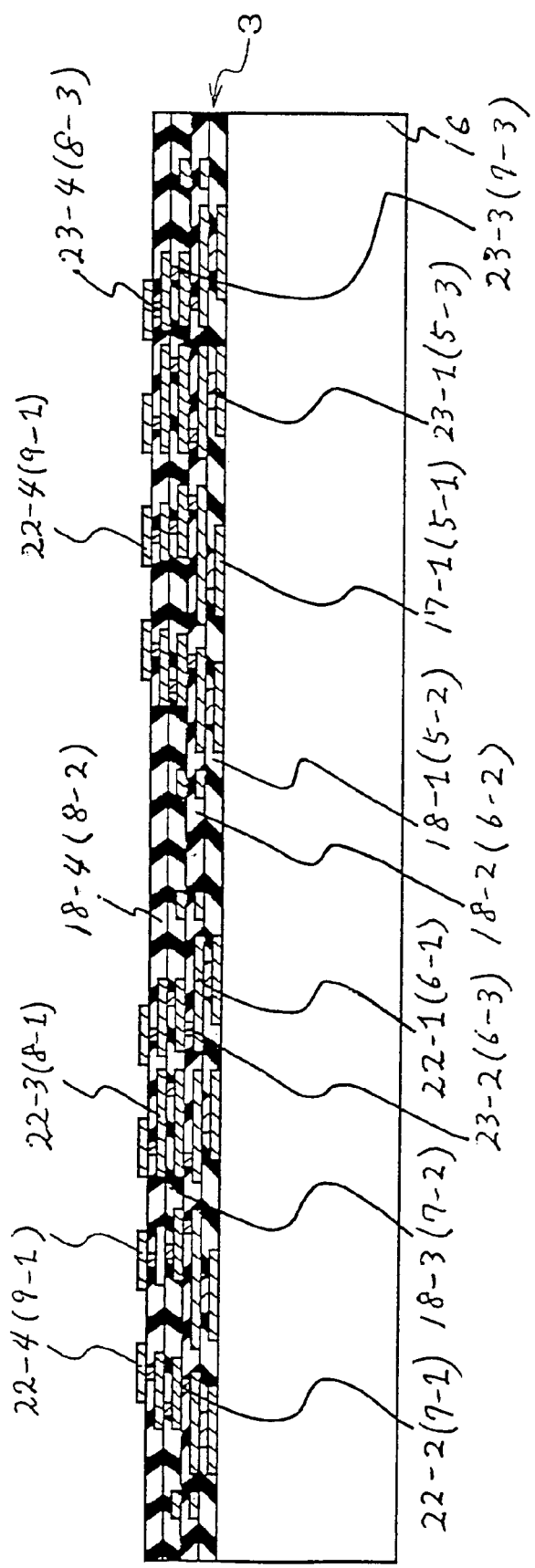

With reference to FIG. 8L, an adhesive metal thin film is entirely formed which extends on the surface of the insulative resin thin film 18-4 and the shown parts of the metal thin film interconnection layers 22-3 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-4 and within the openings 19-4 over the metal thin film interconnection layers 22-3. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-4 in the openings 19-4 and pad electrodes 22-4 over the insulative resin thin film 18-4, wherein the pad electrodes 22-4 are in contact directly with the metal thin film contact layers 23-4, so that the pad electrodes 22-4 are electrically connected through the metal thin film contact layers 23-4 to the metal thin film interconnection layers 22-3. The used resist mask is then removed. The metal thin film interconnection layers 22-3 shown in FIG. 8L correspond to the fourth level interconnection pattern 8-1 of the fourth interconnection layer 8 shown in FIG. 6. The insulative resin thin film 18-4 shown in FIG. 8L also corresponds to the fourth level insulating layer 8-2 of the fourth interconnection layer 8 shown in FIG. 6. The metal thin film contact layers 23-4 shown in FIG. 8L also corresponds to the fourth level contact layer 8-3 of the fourth interconnection layer 8. The pad electrodes 22-4 shown in FIG. 8L also corresponds to the fifth level interconnection pattern 9-1 of the fifth interconnection layer 9.

If the pattern pitch of the pad electrodes 22-4 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the pad electrodes 22-4 over the insulative resin thin film 18-4 and the metal thin film contact layers 23-4 in the openings 19-4.

In accordance with the above described method and its modification, it is possible that the thicknesses of the resist film and the pad electrodes 22-4 are not more than 1 micrometers.

Figure 8M:
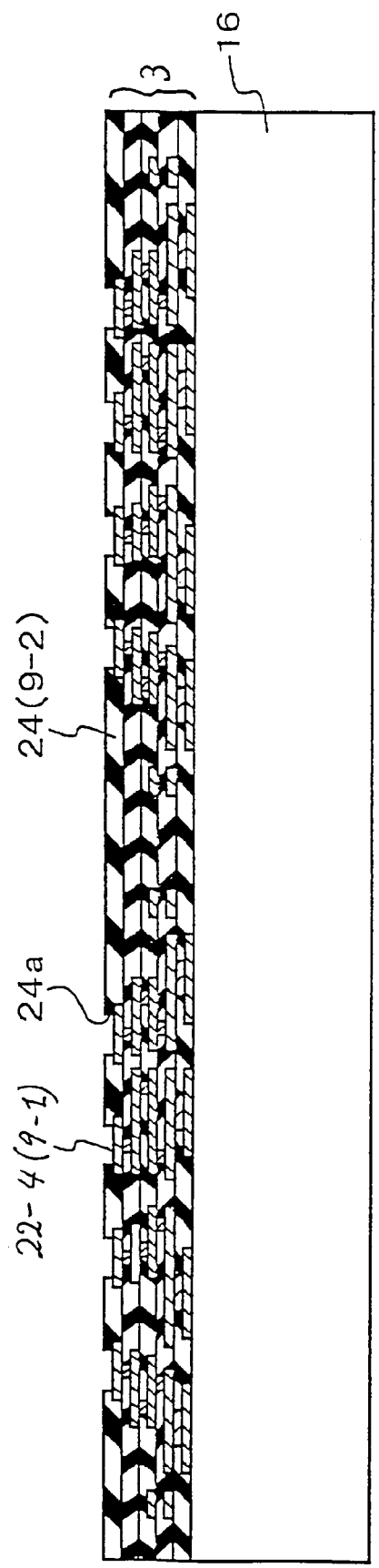

With reference to FIG. 8M, a solder resist film 24 is then formed over the pad electrodes 22-4 and the insulative resin thin film 18-4 in order to protect the multilayer interconnection board 3 having the pad electrodes 24. The solder resist film 24 shown in FIG. 8M corresponds to the fifth level insulating layer 9-2 of the fifth interconnection layer 9 shown in FIG. 6. The solder resist film 24 may comprise an organic insulating film such an epoxy resin film containing an inorganic filler such as fine powders of silicon dioxide. Alternatively, the solder resist film 24 may be made of a material which has a large resistivity to external chemical stress, and a large resistivity to a Flux cleaning solution or an Au plating solution as well as a high adhesiveness to a sealing material such as an under-fill material. If the above first to fourth insulative resin thin films 18-1, 18-2, 18-3 and 18-4 are highly resistive to the chemical and chemical stresses, it is possible as a modification to eliminate the formation of the solder resist film 24. The solder resist film 24 is selectively removed to form openings 24a in the solder resist film 24 and over the pad electrodes 22-4. If the solder resist film 24 is made of a non-photosensitive material, a resist film is applied on the solder resist film 24 and then patterned by an exposure and a subsequent development to form a resist pattern on the solder resist film 24, so that the solder resist film 24 is selectively removed by a wet etching by use of the resist pattern as a mask to form the openings 24a in the solder resist film 24, followed by removal of the used resist pattern. If the solder resist film 24 is made of a photosensitive material, then the solder resist film 24 is directly patterned by an exposure and a subsequent development to form the openings 24a in the solder resist film 24. The electrode pads 22-4 are partially shown through the openings 24a formed in the solder resist film 24.

Figure 8N:
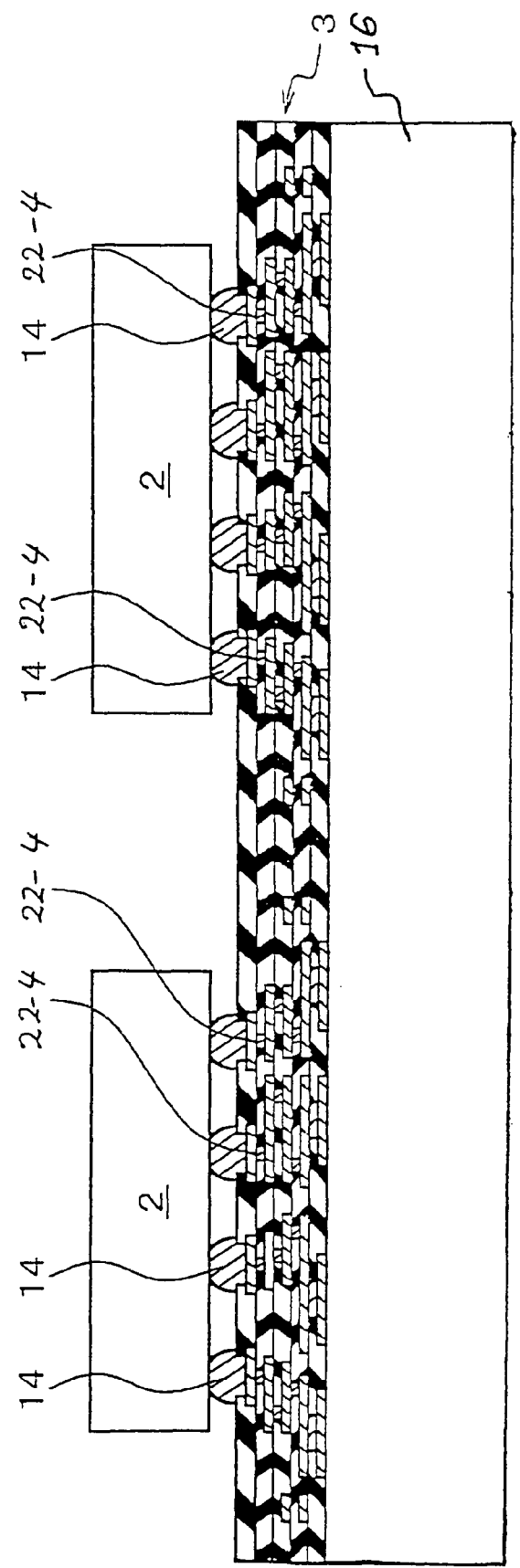

With reference to FIG. 8N, semiconductor chips 2 are mounted on the multilayer interconnection board 3, wherein the semiconductor chips 2 have the plural bumps 14, and the plural bumps 14 are made into contact with the electrode pads 22-4 of the multilayer interconnection board 3, so that the semiconductor chips 2 are electrically connected through the plural bumps 14 to the multilayer interconnection board 3. If the bumps 14 are made of a metal based solder material such as Sn or Pb, a flip-chip bonding utilizing a heat re-flow process using Flux is available for bonding the plural bumps 14 to the electrode pads 22-4 of the multilayer interconnection board 3. If the bumps 14 are made of a metal based solder material such as Au or In, a flip-chip bonding utilizing a thermo-compression bonding is available for bonding the plural bumps 14 to the electrode pads 22-4 of the multilayer interconnection board 3.

Figure 8O:
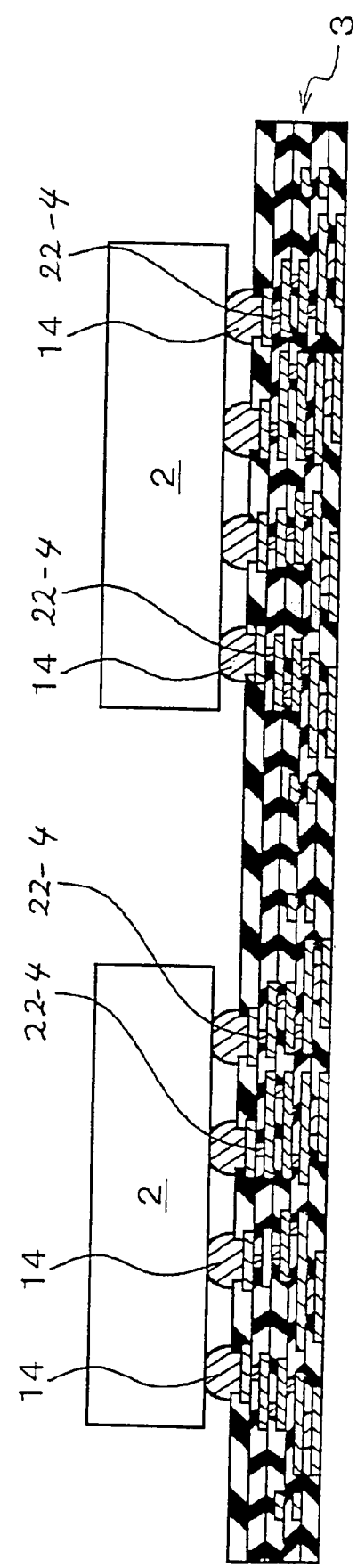

With reference to FIG. 8O, the high rigidity plate 16 is completely removed by an etching process, whereby the multilayer interconnection board 3 remains. The external electrode pads 17-1 in the first interconnection layer 5 and the pad electrodes 22-4 in the fifth interconnection layer 9 are then subjected to an electroless plating for plating laminated Ni and Au layers or laminated Zn, Ni and Au layers on the external electrode pads 17-1 and the pad electrodes 22-4 in order to improve a bonding property between the external electrode pads 17-1 and also a bonding property between the pad electrodes 22-4 and the bumps 14 of the semiconductor chip 2. As a result, the multilayer interconnection board 3 is completed, which comprises plural unit multilayer interconnection boards.

Figure 8P:
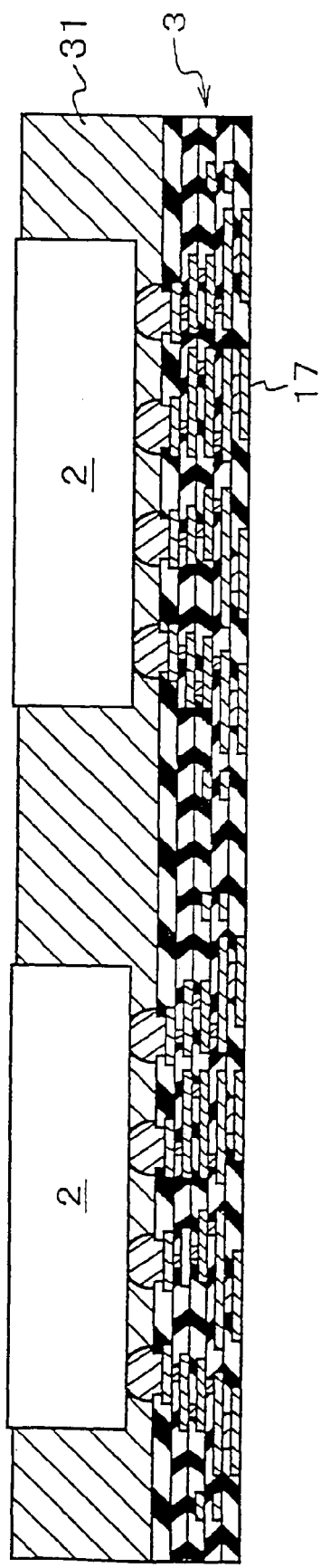

With reference to FIG. 8P, an insulative resin material 31 is formed which coats side walls of the semiconductor chips 2, an inter-space between the semiconductor chips 2 and the multilayer interconnection board 3 around the bumps 14 and the surface of the solder resist film 24 of the multilayer interconnection board 3 in order to protect the semiconductor chips 2, the bumps 14 and the multilayer interconnection board 3. This coating process is carried out by use of a resin injection technique involving a vacuum sealing technique or a transfer sealing technique. The insulative resin material 31 may be made of one of epoxy resin materials, silicone resin materials, polyimide resin materials, polyolefin resin materials, cyanate ester resin materials, phenol resin materials and naphthalene resin materials.

With reference to FIG. 8Q, solder balls 13 are formed which are in contact directly with the external electrode pads 17-1 of the multilayer interconnection board 3 to form a semiconductor device 1 having the multilayer interconnection board 3 and the plural semiconductor chips 2 mounted thereon. The solder balls 13 serve as external terminals. The solder balls 13 may be made of a metal based material such as Sn or Pb. The solder balls 13 may also be free of lead. The solder balls 13 may be made of an electrically conductive material having a low melting point, a high heat conductivity and a rapid solidity as well as a large surface tension so that the electrically conductive material becomes in the form of balls. The semiconductor device 1 is then diced by use of a dicing blade to divide the semiconductor device 1 into plural unit semiconductor devices 32 or flip-chip semiconductor devices 32, each of which comprises the multilayer interconnection board 3 and the single semiconductor chip 2 mounted thereon.

With reference back to FIG. 4, a heat conductive adhesive layer 41 is provided on a top surface of the semiconductor chip 2. A heat spreader 42 is provided on the heat conductive adhesive layer 41 so that the heat spreader 42 is adhered through the heat conductive adhesive layer 41 to the top surface of the semiconductor chip 2. A heat generated in the semiconductor chip 2 is conducted through the heat conductive adhesive layer 41 to the heat spreader 42 for causing a heat radiation from the heat spreader 42. The heat spreader 42 may be made of a heat conductive material such as a metal base material, for example, Cu, Al, W, Mo, Fe, Ni, and Cr, or $Al_2O_3$, AlN, SiC, other ceramics such as mullite. The heat conductive adhesive layer 41 may be made of a resin based material containing a heat conductive material, wherein the resin based material may be one of epoxy resin materials, silicone resin materials, polyimide resin materials, polyolefin resin materials, cyanate ester resin materials, phenol resin materials and naphthalene resin materials, whilst the heat conductive material may be one of Ag, Pd, Cu, Al, Au, Mo, W, diamond, $Al_2O_3$, AlN, and ceramic materials such as mullite, BN and SiC.

The flip-chip is usually applied to a high speed logic device having a large number of pins, for which reason the heat radiation from the semiconductor chip 2 is important. In this embodiment, the heat spreader 42 is provided to improve the heat radiation characteristic of the flip-chip semiconductor device 32.

In accordant with the present invention, the base material of the multilayer interconnection board is not largely different in thermal expansion coefficient from the semiconductor chip to reduce a stress applied between the multilayer interconnection board and the semiconductor chip, thereby keeping a high reliability in connection between the multilayer interconnection board and the semiconductor chip. The reduction in stress applied between the multilayer interconnection board and the semiconductor chip makes it unnecessary to increase the thicknesses of the multilevel interconnections 17-1, 2-1, 22-2, 22-3 and 24 for stress relaxation, but makes it possible that the thicknesses of the multilevel interconnections 17-1, 2-1, 22-2, 22-3 and 24 are thin, for example, not more than 1 micrometer. A metallization technique for the semiconductor wafer and an apparatus therefor are utilized for allowing the resist films and the multilevel interconnections 17-1, 2-1, 22-2, 22-3 and 24 to be patterned finely, thereby permitting a further shrinkage of the interconnection patterns.

Further, the multilayer interconnection board remains adhered or fixed to the high rigidity plate such as the metal plate during when the multilayer interconnection board is formed, so that the high rigidity plate provides or ensures a high planarity to the multilayer interconnection board. Even the high rigidity plate is different in linear expansion coefficient from the multilayer interconnection board, the high rigidity plate suppresses generation of internal stress in the multilayer interconnection board and expansion of the multilayer interconnection board, so that the high rigidity plate suppresses the multilayer interconnection board from being bent, whereby the multilayer interconnection board is free from any misalignment in patterning the insulating layers and the interconnection layers, resulting in a high yield of the flip-chip semiconductor device.

As described above, the high rigidity plate is necessary or important for keeping the multilayer interconnection board to have the high planarity until the multilayer interconnection board is completed. Notwithstanding, the high rigidity plate is not necessarily needed to the final product, for example, the flip-chip semiconductor device, for which reason as described above, after the multilayer interconnection board has been completed, then the high rigidity plate is removed. After the high rigidity plate is removed from the bottom surface of the multilayer interconnection board, then the bottom surface of the multilayer interconnection board is shown, for which reason the bottom or first insulating layer of the multilayer interconnection board may preferably be made of an insulating material such as an organic material which has a flexibility to an externally applied stress.

Accordingly, the single multilayer interconnection board is adhered or fixed to the one side of the high rigidity plate to form an asymmetric structure. The high rigidity plate prevents the multilayer interconnection board from being bent during the fabrication of the multilayer interconnection board. If the multilayer interconnection boards are adhered or fixed to both surfaces of the high rigidity plate, then it is necessary to form through holes in the high rigidity plate. In accordance with the present invention, however, it is unnecessary to form such the through holes in the high rigidity plate, whereby there are raised no problem with defect of the final product due to dusts generated in forming the through holes in the high rigidity plate nor problem with increase in the manufacturing cost due to additional process for forming the through holes in the high rigidity plate.

In this embodiment, the high rigidity plate is removed from the multilayer interconnection board after the semiconductor chips have been mounted on the multilayer interconnection board. When the semiconductor chips are mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

Accordingly, it is possible to remove the high rigidity plate from the multilayer interconnection board any times after the multilayer interconnection board has been completed and before the solder balls are formed.

Third Embodiment

A third embodiment according to the present invention will be described in detail with reference to the drawings. The third embodiment is different from the first embodiment only in the fabrication processes for the flip-chip semiconductor device 32, for which reason the following descriptions will focus on the fabrication processes and the description of the structure of the flip-chip semiconductor device 32 will be omitted.

Figure 9A:
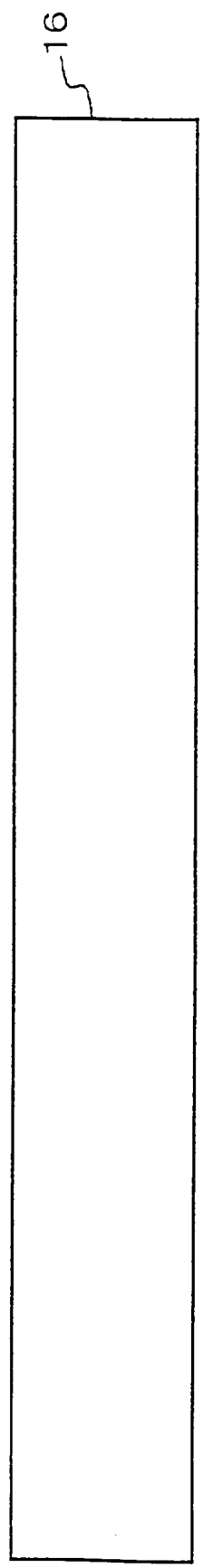
FIGS. 9A through 9P are fragmentary cross sectional elevation views illustrative of a novel method of forming a semiconductor device having a multilayer interconnection board on which a semiconductor chip is mounted in a third embodiment in accordance with the present invention.

FIGS. 9A through 9P are fragmentary cross sectional elevation views illustrative of a novel method of forming a semiconductor device having a multilayer interconnection board on which a semiconductor chip is mounted in a third embodiment in accordance with the present invention.

With reference to FIG. 9A, a high rigidity plate 16 is prepared. The high rigidity plate 16 may be made of any material having a high rigidity. Metals such as Cu-, Ni-, Al-, W, Mo-, Au-, Ag- and Pt-based metals, complex materials of different metals and ceramics are available for the high rigidity plate 16.

Figure 9B:
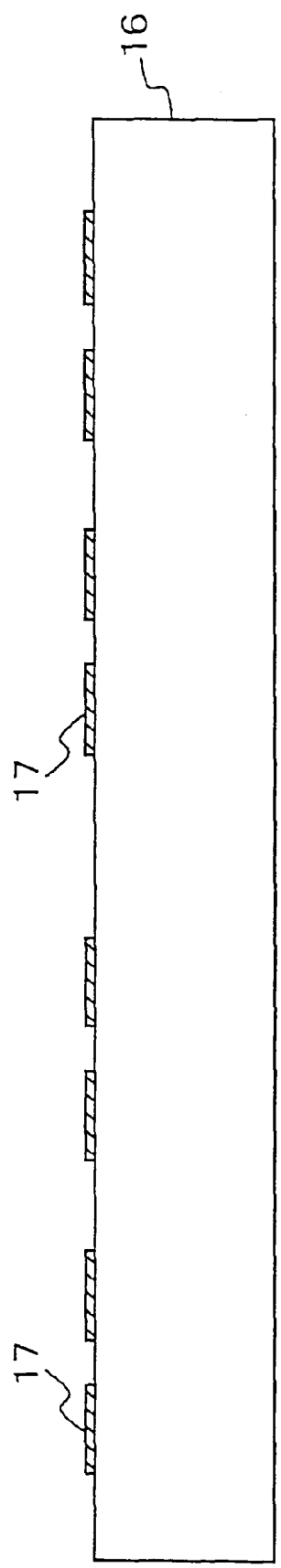

With reference to FIG. 9B, an adhesive metal layer of a metal such as a Ti-base alloy, a Cr-base alloy, a Mo-base alloy, and a W-base alloy is formed on a first surface of the high rigidity plate 16 by a sputtering method. An electrode material layer of a metal such as Cu, Al, and Ni is then formed on the adhesive metal layer by a sputtering method to form laminations of the adhesive metal layer and the electrode material layer. A resist film is then applied on the laminations of the adhesive metal layer and the electrode material layer. The resist film is then patterned by an exposure and a subsequent development to form a resist pattern. A selective wet etching process or a selective dry etching process to the laminations of the adhesive metal layer and the electrode material layer is carried out by use of the resist pattern as a mask so as to pattern the laminations of the adhesive metal layer and the electrode material layer, whereby external electrode pads 17-1 are selectively formed on the first surface of the high rigidity plate 16. The used resist pattern is then removed.

If a minimum pitch of the external electrode pads 17-1 is not so narrow, then it is possible as a modification that a resist is coated directly on the first surface of the high rigidity plate 16 and then patterned by an exposure and a development to form a resist pattern before a selective electroplating of metal is then carried out by use of the resist pattern as a mask, followed by removal of the used resist pattern.

Figure 9C:
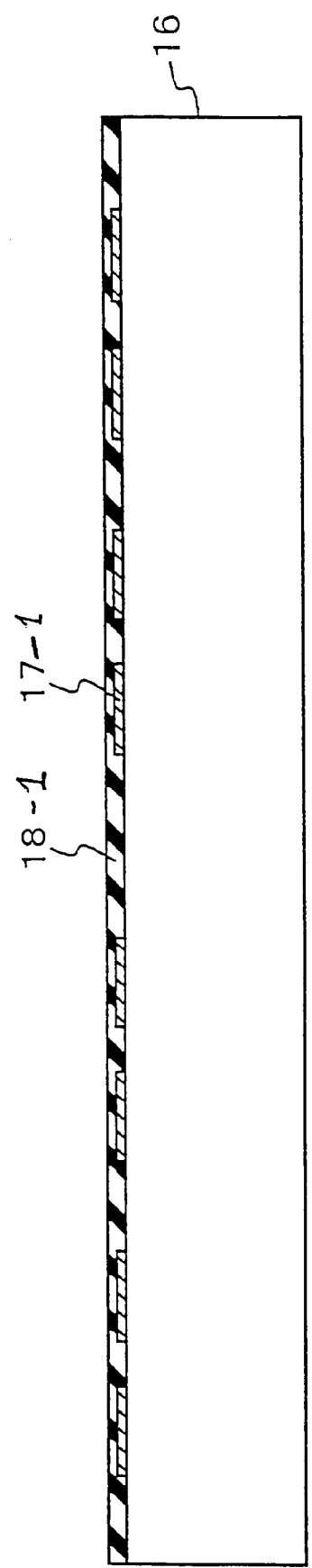

With reference to FIG. 9C, an insulative resin thin film 18-1 is then formed over the external electrode pads 17-1 and the first surface of the high rigidity plate 16. The insulative resin thin film 18-1 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-1. If a fine pattern of not more than 1.0 micrometer is required, it is preferable to use the silicon dioxide based inorganic materials for utilizing diffusion processes of semiconductor.

Figure 9D:
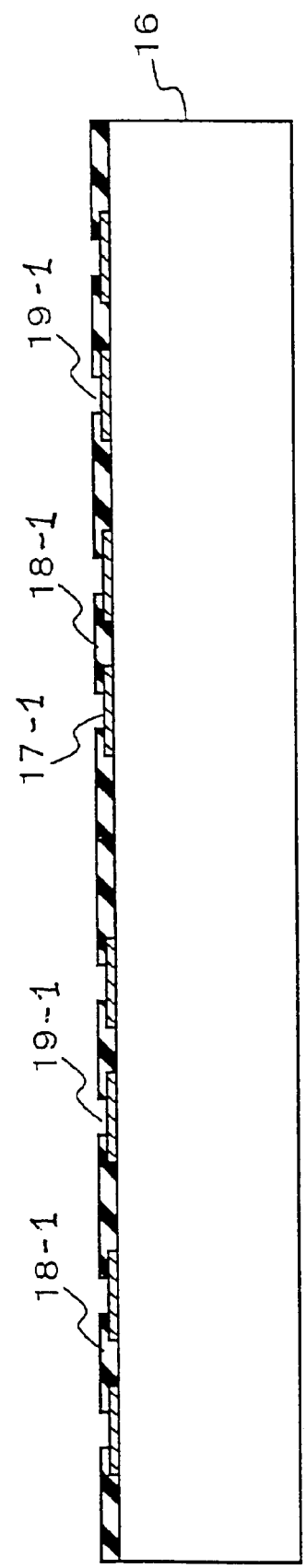

With reference to FIG. 9D, the insulative resin thin film 18-1 is selectively removed to form openings 19-1 in the insulative resin thin film 18-1 and over the external electrode pads 17-1. A resist film is applied on the insulative resin thin film 18-1 and then patterned by an exposure and a subsequent development to form a resist pattern on the insulative resin thin film 18-1. If the insulative resin thin film 18-1 is made of a material which is removable by a chemical etching process, the insulative resin thin film 18-1 is selectively removed by a wet etching by use of the resist pattern as a mask to form the openings 19-1 in the insulative resin thin film 18-1. If the insulative resin thin film 18-1 is made of a material which is unremovable by the chemical etching process, the insulative resin thin film 18-1 is selectively removed by a dry etching by use of the resist pattern as a mask to form the openings 19-1 in the insulative resin thin film 18-1. The external electrode pads 17-1 are partially shown through the openings 19-1 formed in the insulative resin thin film 18-1. The used resist pattern is then removed.

Figure 9E:
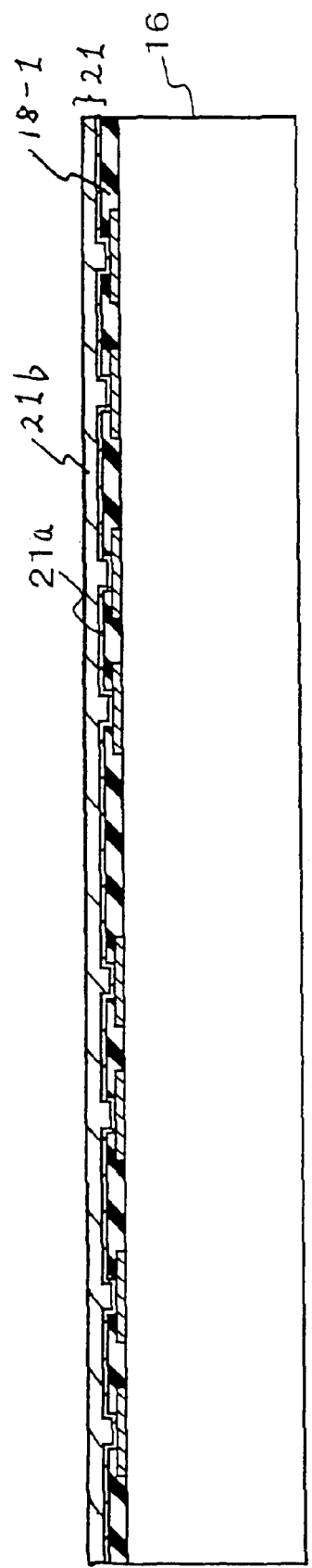

With reference to FIG. 9E, an adhesive metal thin film 21a is entirely formed which extends on the surface of the insulative resin thin film 18-1 and the shown parts of the external electrode pads 17-1 by a sputtering method. The adhesive metal thin film 21a may be made of a Ti-based alloy, a Cr-based alloy, a Mo-based alloy, or a W-based alloy. Subsequently, a metal electrode thin film 21b is also entirely formed on the adhesive metal thin film 21a by a sputtering method, a chemical vapor deposition or an electroless plating method. The metal electrode thin film 21b may be made of Cu, Al or Ni. Laminations of the adhesive metal thin film 21a and the metal electrode thin film 21b form a metal thin film 21 which extends on the surface of the insulative resin thin film 18-1 and within the openings 19-1 over the external electrode pads 17-1.

Figure 9F:
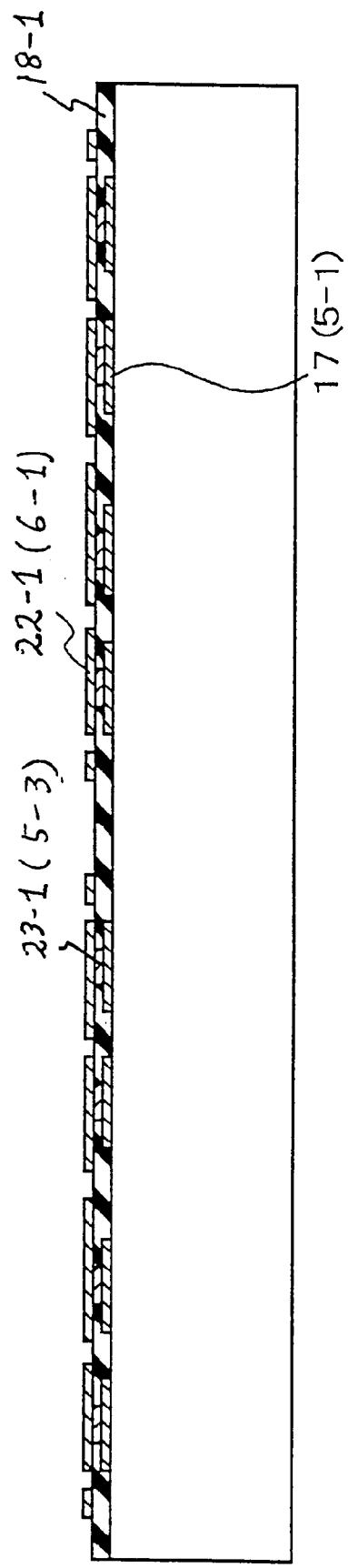

With reference to FIG. 9F, a resist film is entirely formed on the metal thin film 21 and then patterned by an exposure and a subsequent development to form a resist pattern over the metal thin film 21. The metal thin film 21 is then patterned by a wet etching or a dry etching by use of the resist pattern as a mask to form metal thin film contact layers 23-1 in the openings 19-1 and metal thin film interconnection layers 22-1 over the insulative resin thin film 18-1, wherein the metal thin film interconnection layers 22-1 are in contact directly with the metal thin film contact layers 23-1, so that the metal thin film interconnection layers 22-1 are electrically connected through the metal thin film contact layers 23-1 to the external electrode pads 17-1. The used resist mask is then removed. The external electrode pads 17-1 shown in FIG. 9F correspond to the first level interconnection pattern 5-1 of the first interconnection layer 5 shown in FIG. 6. The insulative resin thin film 18-1 shown in FIG. 9F also corresponds to the first level insulating layer 5-2 of the first interconnection layer 5 shown in FIG. 6. The metal thin film contact layers 23-1 shown in FIG. 9F also corresponds to the first level contact layer 5-3 of the first interconnection layer 5. The metal thin film interconnection layers 22-1 shown in FIG. 9F also corresponds to the second level interconnection pattern 6-1 of the second interconnection layer 6.

If the pattern pitch of the metal thin film interconnection layers 22-1 is not so narrow, then it is possible as a modification that after the metal thin film 21 has been formed, then the resist pattern is formed on the metal thin film 21 so that a selective electroplating of metal such as Cu is carried out by use of the resist pattern as a mask to form Cu-plated patterns over the metal thin film 21. The used resist mask is then removed. The metal thin film 21 is then selectively etched by use of the Cu-plated patterns as a mask thereby to form the metal thin film interconnection layers 22-1 over the insulative resin thin film 18-1 and the metal thin film contact layers 23-1 in the openings 19-1.

In accordance with the above described method and its modification, it is possible that the thicknesses of the resist film and the metal thin film interconnection layers 22-1 are not more than 1 micrometers.

Figure 9G:
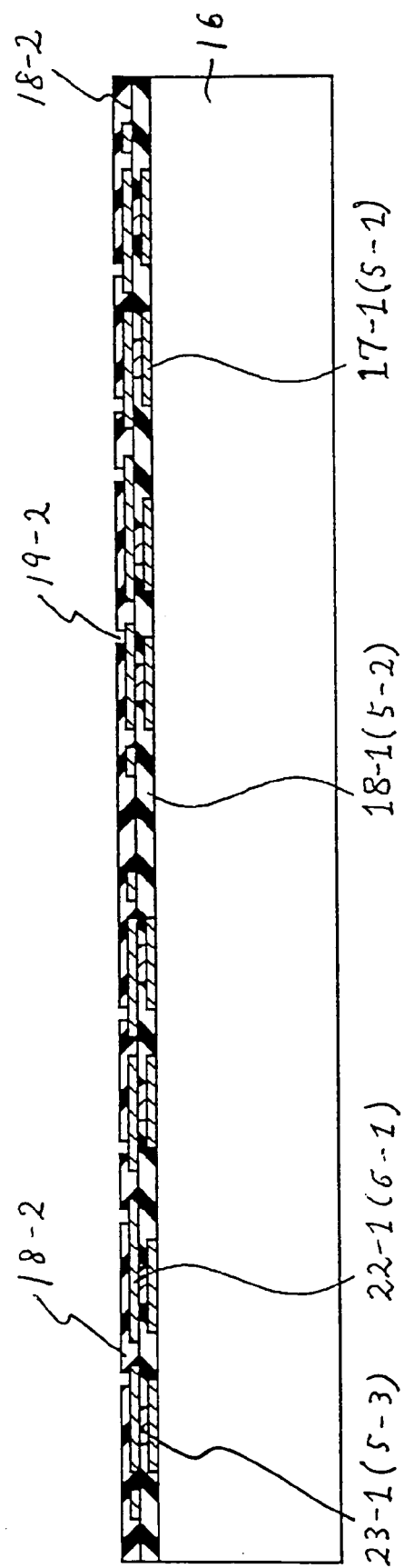

With reference to FIG. 9G, an insulative resin thin film 18-2 is then formed over the metal thin film interconnection layers 22-1 and the insulative resin thin film 18-1. The insulative resin thin film 18-2 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-2. If a fine pattern of not more than 1.0 micrometer is required, it is preferable to use the silicon dioxide based inorganic materials for utilizing diffusion processes of semiconductor. The insulative resin thin film 18-2 is selectively removed to form openings 19-2 in the insulative resin thin film 18-2 and over the metal thin film interconnection layers 22-1. A resist film is applied on the insulative resin thin film 18-2 and then patterned by an exposure and a subsequent development to form a resist pattern on the insulative resin thin film 18-2. If the insulative resin thin film 18-2 is made of a material which is removable by a chemical etching process, the insulative resin thin film 18-2 is selectively removed by a wet etching by use of the resist pattern as a mask to form the openings 19-2 in the insulative resin thin film 18-2. If the insulative resin thin film 18-2 is made of a material which is unremovable by the chemical etching process, the insulative resin thin film 18-2 is selectively removed by a dry etching by use of the resist pattern as a mask to form the openings 19-2 in the insulative resin thin film 18-2. The metal thin film interconnection layers 22-1 are partially shown through the openings 19-2 formed in the insulative resin thin film 18-2. The used resist pattern is then removed.

Figure 9H:
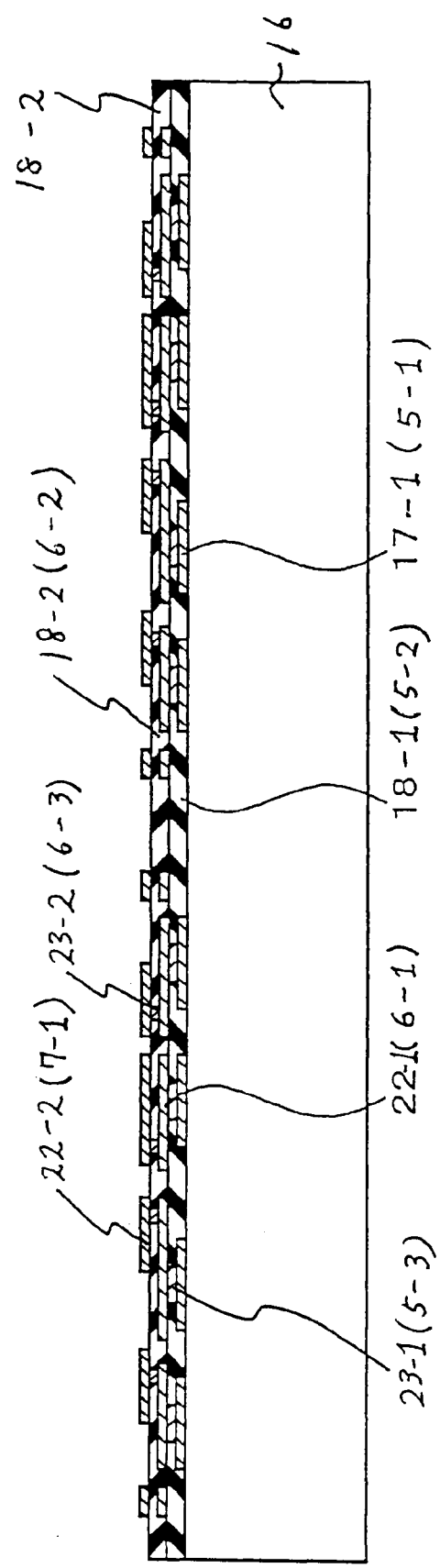

With reference to FIG. 9H, an adhesive metal thin film is entirely formed which extends on the surface of the insulative resin thin film 18-2 and the shown parts of the metal thin film interconnection layers 22-1 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-2 and within the openings 19-2 over the metal thin film interconnection layers 22-1. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-2 in the openings 19-2 and metal thin film interconnection layers 22-2 over the insulative resin thin film 18-2, wherein the metal thin film interconnection layers 22-2 are in contact directly with the metal thin film contact layers 23-2, so that the metal thin film interconnection layers 22-2 are electrically connected through the metal thin film contact layers 23-2 to the metal thin film interconnection layers 22-1. The used resist mask is then removed. The metal thin film interconnection layers 22-1 shown in FIG. 9H correspond to the second level interconnection pattern 6-1 of the second interconnection layer 6 shown in FIG. 6. The insulative resin thin film 18-2 shown in FIG. 9H also corresponds to the second level insulating layer 6-2 of the second interconnection layer 6 shown in FIG. 6. The metal thin film contact layers 23-2 shown in FIG. 9H also corresponds to the second level contact layer 6-3 of the second interconnection layer 6. The metal thin film interconnection layers 22-2 shown in FIG. 9H also corresponds to the third level interconnection pattern 7-1 of the third interconnection layer 7.

If the pattern pitch of the metal thin film interconnection layers 22-2 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-2 over the insulative resin thin film 18-2 and the metal thin film contact layers 23-2 in the openings 19-2.

In accordance with the above described method and its modification, it is possible that the thicknesses of the resist film and the metal thin film interconnection layers 22-2 are not more than 1 micrometers.

Figure 9I:
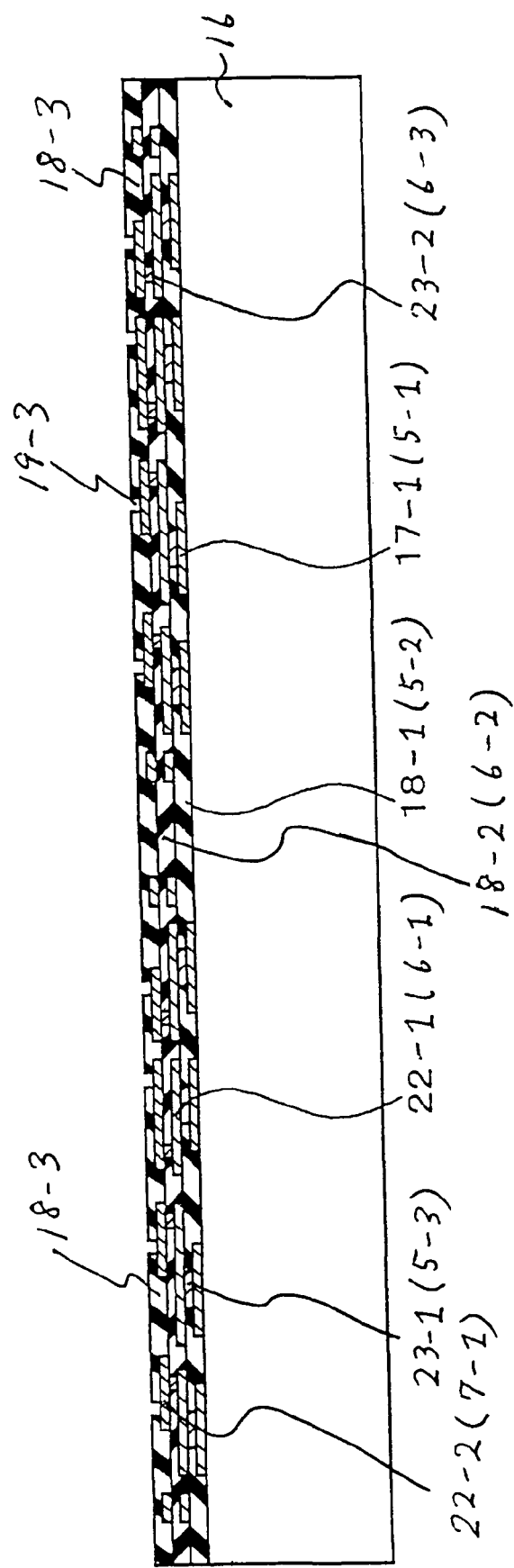

With reference to FIG. 9I, an insulative resin thin film 18-3 is then formed over the metal thin film interconnection layers 22-2 and the insulative resin thin film 18-2. The insulative resin thin film 18-3 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-3. If a fine pattern of not more than 1.0 micrometer is required, it is preferable to use the silicon dioxide based inorganic materials for utilizing diffusion processes of semiconductor. The insulative resin thin film 18-3 is selectively removed to form openings 19-3 in the insulative resin thin film 18-3 and over the metal thin film interconnection layers 22-2. A resist film is applied on the insulative resin thin film 18-3 and then patterned by an exposure and a subsequent development to form a resist pattern on the insulative resin thin film 18-3. If the insulative resin thin film 18-3 is made of a material which is removable by a chemical etching process, the insulative resin thin film 18-3 is selectively removed by a wet etching by use of the resist pattern as a mask to form the openings 19-3 in the insulative resin thin film 18-3. If the insulative resin thin film 18-3 is made of a material which is unremovable by the chemical etching process, the insulative resin thin film 18-3 is selectively removed by a dry etching by use of the resist pattern as a mask to form the openings 19-3 in the insulative resin thin film 18-3. The metal thin film interconnection layers 22-2 are partially shown through the openings 19-3 formed in the insulative resin thin film 18-3. The used resist pattern is then removed.

With reference to FIG. 9J, an adhesive metal thin film is entirely formed which extends on the surface of the insulative resin thin film 18-3 and the shown parts of the metal thin film interconnection layers 22-2 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-3 and within the openings 19-3 over the metal thin film interconnection layers 22-2. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-3 in the openings 19-3 and metal thin film interconnection layers 22-3 over the insulative resin thin film 18-3, wherein the metal thin film interconnection layers 22-3 are in contact directly with the metal thin film contact layers 23-3, so that the metal thin film interconnection layers 22-3 are electrically connected through the metal thin film contact layers 23-3 to the metal thin film interconnection layers 22-2. The used resist mask is then removed. The metal thin film interconnection layers 22-2 shown in FIG. 9J correspond to the third level interconnection pattern 7-1 of the third interconnection layer 7 shown in FIG. 6. The insulative resin thin film 18-3 shown in FIG. 9J also corresponds to the third level insulating layer 7-2 of the third interconnection layer 7 shown in FIG. 6. The metal thin film contact layers 23-3 shown in FIG. 9J also corresponds to the third level contact layer 7-3 of the third interconnection layer 7. The metal thin film interconnection layers 22-3 shown in FIG. 9J also corresponds to the fourth level interconnection pattern 8-1 of the third interconnection layer 8.

If the pattern pitch of the metal thin film interconnection layers 22-3 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-3 over the insulative resin thin film 18-3 and the metal thin film contact layers 23-3 in the openings 19-3.

In accordance with the above described method and its modification, it is possible that the thicknesses of the resist film and the metal thin film interconnection layers 22-3 are not more than 1 micrometers.

Figure 9K:
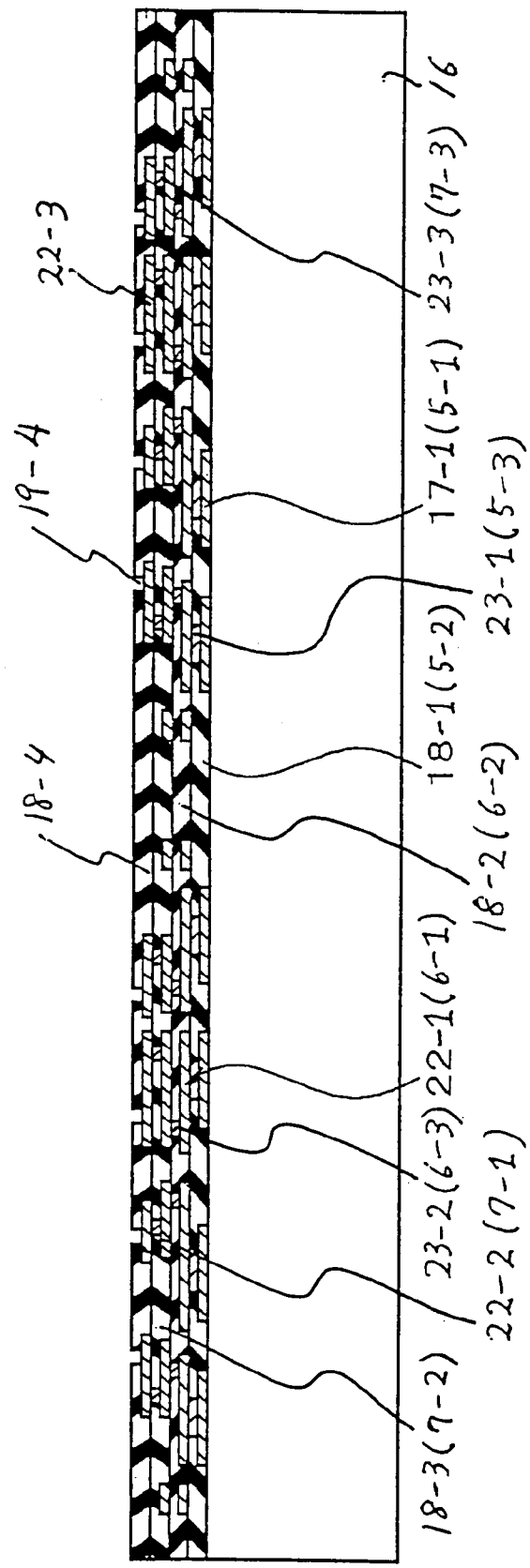

With reference to FIG. 9K, an insulative resin thin film 18-4 is then formed over the metal thin film interconnection layers 22-3 and the insulative resin thin film 18-3. The insulative resin thin film 18-4 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-4. If a fine pattern of not more than 1.0 micrometer is required, it is preferable to use the silicon dioxide based inorganic materials for utilizing diffusion processes of semiconductor. The insulative resin thin film 18-4 is selectively removed to form openings 19-4 in the insulative resin thin film 18-4 and over the metal thin film interconnection layers 22-3. A resist film is applied on the insulative resin thin film 18-4 and then patterned by an exposure and a subsequent development to form a resist pattern on the insulative resin thin film 18-4. If the insulative resin thin film 18-4 is made of a material which is removable by a chemical etching process, the insulative resin thin film 18-4 is selectively removed by a wet etching by use of the resist pattern as a mask to form the openings 19-4 in the insulative resin thin film 18-4. If the insulative resin thin film 18-4 is made of a material which is unremovable by the chemical etching process, the insulative resin thin film 18-4 is selectively removed by a dry etching by use of the resist pattern as a mask to form the openings 19-4 in the insulative resin thin film 18-3. The metal thin film interconnection layers 22-3 are partially shown through the openings 19-4 formed in the insulative resin thin film 18-4. The used resist pattern is then removed.

Figure 9L:
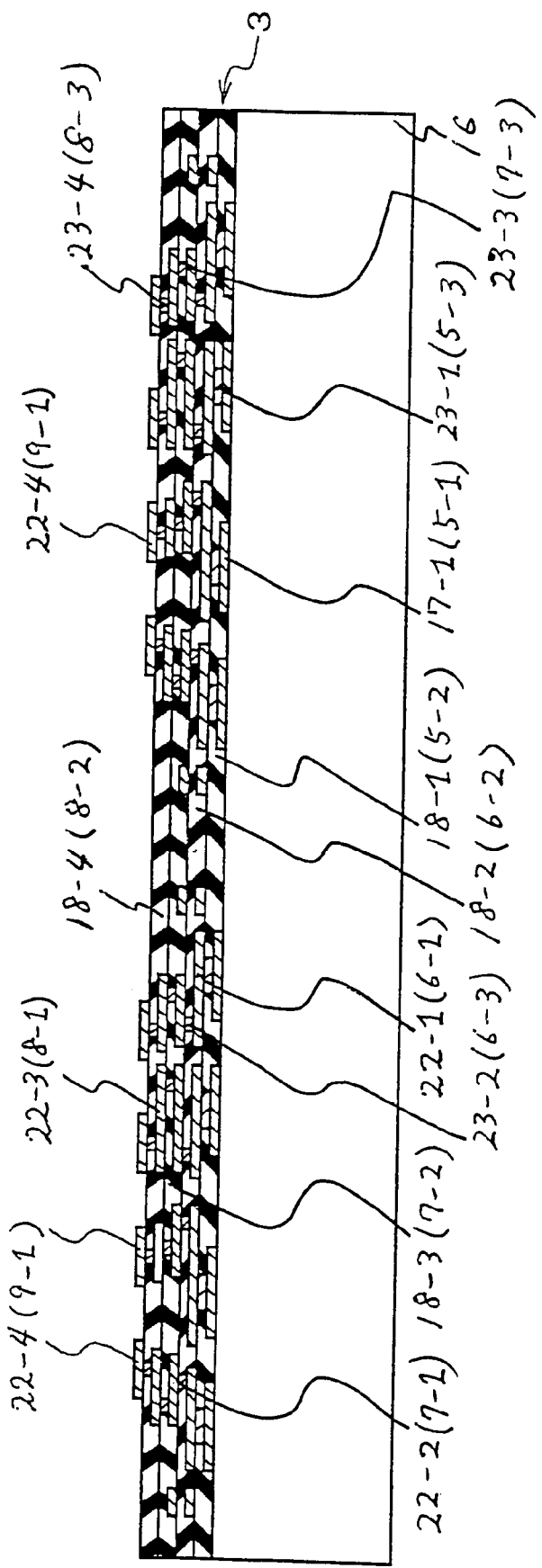

With reference to FIG. 9L, an adhesive metal thin film is entirely formed which extends on the surface of the insulative resin thin film 18-4 and the shown parts of the metal thin film interconnection layers 22-3 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-4 and within the openings 19-4 over the metal thin film interconnection layers 22-3. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-4 in the openings 19-4 and pad electrodes 22-4 over the insulative resin thin film 18-4, wherein the pad electrodes 22-4 are in contact directly with the metal thin film contact layers 23-4, so that the pad electrodes 22-4 are electrically connected through the metal thin film contact layers 23-4 to the metal thin film interconnection layers 22-3. The used resist mask is then removed. The metal thin film interconnection layers 22-3 shown in FIG. 9L correspond to the fourth level interconnection pattern 8-1 of the fourth interconnection layer 8 shown in FIG. 6. The insulative resin thin film 18-4 shown in FIG. 9L also corresponds to the fourth level insulating layer 8-2 of the fourth interconnection layer 8 shown in FIG. 6. The metal thin film contact layers 23-4 shown in FIG. 9L also corresponds to the fourth level contact layer 8-3 of the fourth interconnection layer 8. The pad electrodes 22-4 shown in FIG. 9L also corresponds to the fifth level interconnection pattern 9-1 of the fifth interconnection layer 9.

If the pattern pitch of the pad electrodes 22-4 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the pad electrodes 22-4 over the insulative resin thin film 18-4 and the metal thin film contact layers 23-4 in the openings 19-4.

In accordance with the above described method and its modification, it is possible that the thicknesses of the resist film and the pad electrodes 22-4 are not more than 1 micrometers.

Figure 9M:
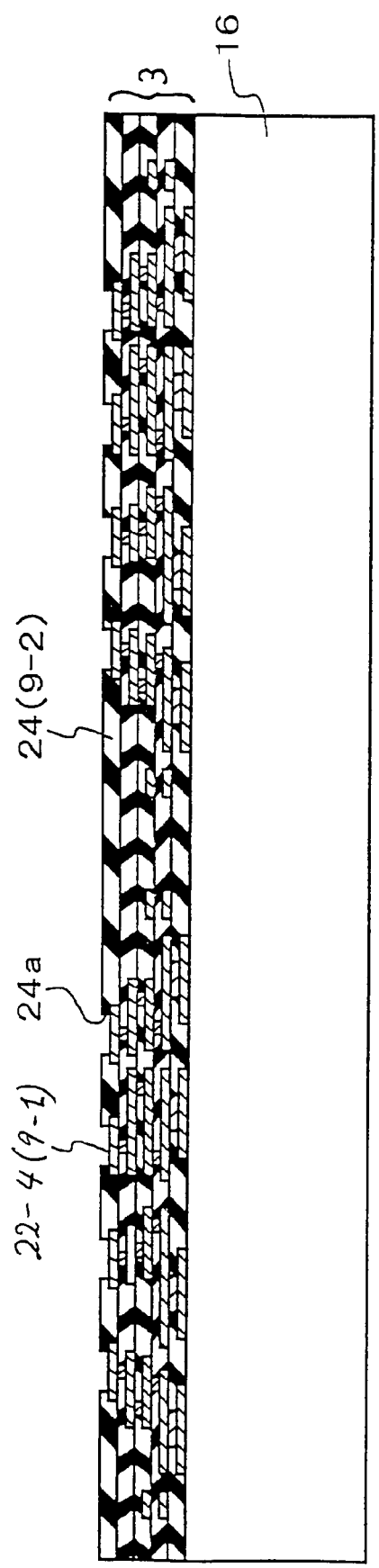

With reference to FIG. 9M, a solder resist film 24 is then formed over the pad electrodes 22-4 and the insulative resin thin film 18-4 in order to protect the multilayer interconnection board 3 having the pad electrodes 24. The solder resist film 24 shown in FIG. 9M corresponds to the fifth level insulating layer 9-2 of the fifth interconnection layer 9 shown in FIG. 6. The solder resist film 24 may comprise an organic insulating film such an epoxy resin film containing an inorganic filler such as fine powders of silicon dioxide. Alternatively, the solder resist film 24 may be made of a material which has a large resistivity to external chemical stress, and a large resistivity to a Flux cleaning solution or an Au plating solution as well as a high adhesiveness to a sealing material such as an under-fill material. If the above first to fourth insulative resin thin films 18-1, 18-2, 18-3 and 18-4 are highly resistive to the chemical and chemical stresses, it is possible as a modification to eliminate the formation of the solder resist film 24. The solder resist film 24 is selectively removed to form openings 24a in the solder resist film 24 and over the pad electrodes 22-4. If the solder resist film 24 is made of a non-photosensitive material, a resist film is applied on the solder resist film 24 and then patterned by an exposure and a subsequent development to form a resist pattern on the solder resist film 24, so that the solder resist film 24 is selectively removed by a wet etching by use of the resist pattern as a mask to form the openings 24a in the solder resist film 24, followed by removal of the used resist pattern. If the solder resist film 24 is made of a photosensitive material, then the solder resist film 24 is directly patterned by an exposure and a subsequent development to form the openings 24a in the solder resist film 24. The electrode pads 22-4 are partially shown through the openings 24a formed in the solder resist film 24.

With reference to FIG. 9N, semiconductor chips 2 are mounted on the multilayer interconnection board 3, wherein the semiconductor chips 2 have the plural bumps 14, and the plural bumps 14 are made into contact with the electrode pads 22-4 of the multilayer interconnection board 3, so that the semiconductor chips 2 are electrically connected through the plural bumps 14 to the multilayer interconnection board 3. If the bumps 14 are made of a metal based solder material such as Sn or Pb, a flip-chip bonding utilizing a heat re-flow process using Flux is available for bonding the plural bumps 14 to the electrode pads 22-4 of the multilayer interconnection board 3. If the bumps 14 are made of a metal based solder material such as Au or In, a flip-chip bonding utilizing a thermo-compression bonding is available for bonding the plural bumps 14 to the electrode pads 22-4 of the multilayer interconnection board 3.

Figure 9O:
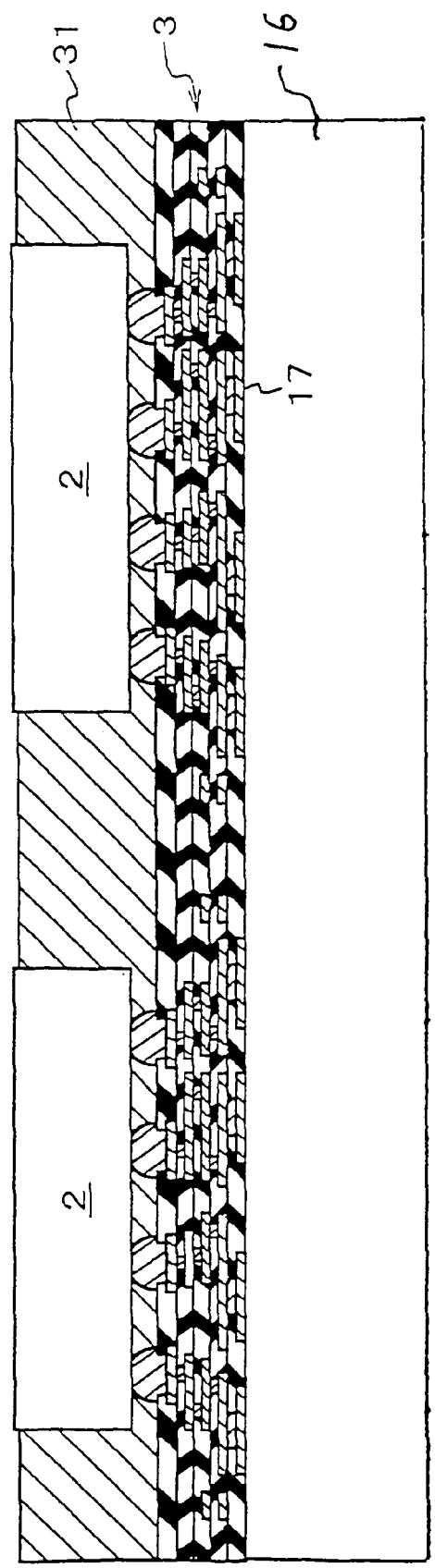

With reference to FIG. 9O, an insulative resin material 31 is formed which coats side walls of the semiconductor chips 2, an inter-space between the semiconductor chips 2 and the multilayer interconnection board 3 around the bumps 14 and the surface of the solder resist film 24 of the multilayer interconnection board 3 in order to protect the semiconductor chips 2, the bumps 14 and the multilayer interconnection board 3. This coating process is carried out by use of a resin injection technique involving a vacuum sealing technique or a transfer sealing technique. The insulative resin material 31 may be made of one of epoxy resin materials, silicone resin materials, polyimide resin materials, polyolefin resin materials, cyanate ester resin materials, phenol resin materials and naphthalene resin materials.

With reference to FIG. 9P, a heat conductive adhesive layer 41 is provided on a top surface of the semiconductor chip 2. A heat spreader 42 is provided on the heat conductive adhesive layer 41 so that the heat spreader 42 is adhered through the heat conductive adhesive layer 41 to the top surface of the semiconductor chip 2. A heat generated in the semiconductor chip 2 is conducted through the heat conductive adhesive layer 41 to the heat spreader 42 for causing a heat radiation from the heat spreader 42. The heat spreader 42 may be made of a heat conductive material such as a metal base material, for example, Cu, Al, W, Mo, Fe, Ni, and Cr, or $Al_2O_3$, AlN, SiC, other ceramics such as mullite. The heat conductive adhesive layer 41 may be made of a resin based material containing a heat conductive material, wherein the resin based material may be one of epoxy resin materials, silicone resin materials, polyimide resin materials, polyolefin resin materials, cyanate ester resin materials, phenol resin materials and naphthalene resin materials, whilst the heat conductive material may be one of Ag, Pd, Cu, Al, Au, Mo, W, diamond, $Al_2O_3$, AlN, and ceramic materials such as mullite, BN and SiC.

With reference back to FIG. 4, the high rigidity plate 16 is completely removed by an etching process, whereby the multilayer interconnection board 3 remains. The external electrode pads 17-1 in the first interconnection layer 5 and the pad electrodes 22-4 in the fifth interconnection layer 9 are then subjected to an electroless plating for plating laminated Ni and Au layers or laminated Zn, Ni and Au layers on the external electrode pads 17-1 and the pad electrodes 22-4 in order to improve a bonding property between the external electrode pads 17-1 and also a bonding property between the pad electrodes 22-4 and the bumps 14 of the semiconductor chip 2. As a result, the multilayer interconnection board 3 is completed, which comprises plural unit multilayer interconnection boards.

Solder balls 13 are formed which are in contact directly with the external electrode pads 17-1 of the multilayer interconnection board 3 to form a semiconductor device 1 having the multilayer interconnection board 3 and the plural semiconductor chips 2 mounted thereon. The solder balls 13 serve as external terminals. The solder balls 13 may be made of a metal based material such as Sn or Pb. The solder balls 13 may also be free of lead. The solder balls 13 may be made of an electrically conductive material having a low melting point, a high heat conductivity and a rapid solidity as well as a large surface tension so that the electrically conductive material becomes in the form of balls. The semiconductor device 1 is then diced by use of a dicing blade to divide the semiconductor device 1 into plural unit semiconductor devices 32 or flip-chip semiconductor devices 32, each of which comprises the multilayer interconnection board 3 and the single semiconductor chip 2 mounted thereon.

The flip-chip is usually applied to a high speed logic device having a large number of pins, for which reason the heat radiation from the semiconductor chip 2 is important. In this embodiment, the heat spreader 42 is provided to improve the heat radiation characteristic of the flip-chip semiconductor device 32.

In accordant with the present invention, the base material of the multilayer interconnection board is not largely different in thermal expansion coefficient from the semiconductor chip to reduce a stress applied between the multilayer interconnection board and the semiconductor chip, thereby keeping a high reliability in connection between the multilayer interconnection board and the semiconductor chip. The reduction in stress applied between the multilayer interconnection board and the semiconductor chip makes it unnecessary to increase the thicknesses of the multilevel interconnections 17-1, 2-1, 22-2, 22-3 and 24 for stress relaxation, but makes it possible that the thicknesses of the multilevel interconnections 17-1, 2-1, 22-2, 22-3 and 24 are thin, for example, not more than 1 micrometer. A metallization technique for the semiconductor wafer and an apparatus therefor are utilized for allowing the resist films and the multilevel interconnections 17-1, 2-1, 22-2, 22-3 and 24 to be patterned finely, thereby permitting a further shrinkage of the interconnection patterns.

Further, the multilayer interconnection board remains adhered or fixed to the high rigidity plate such as the metal plate during when the multilayer interconnection board is formed, so that the high rigidity plate provides or ensures a high planarity to the multilayer interconnection board. Even the high rigidity plate is different in linear expansion coefficient from the multilayer interconnection board, the high rigidity plate suppresses generation of internal stress in the multilayer interconnection board and expansion of the multilayer interconnection board, so that the high rigidity plate suppresses the multilayer interconnection board from being bent, whereby the multilayer interconnection board is free from any misalignment in patterning the insulating layers and the interconnection layers, resulting in a high yield of the flip-chip semiconductor device.

As described above, the high rigidity plate is necessary or important for keeping the multilayer interconnection board to have the high planarity until the multilayer interconnection board is completed. Notwithstanding, the high rigidity plate is not necessarily needed to the final product, for example, the flip-chip semiconductor device, for which reason as described above, after the multilayer interconnection board has been completed, then the high rigidity plate is removed. After the high rigidity plate is removed from the bottom surface of the multilayer interconnection board, then the bottom surface of the multilayer interconnection board is shown, for which reason the bottom or first insulating layer of the multilayer interconnection board may preferably be made of an insulating material such as an organic material which has a flexibility to an externally applied stress.

Accordingly, the single multilayer interconnection board is adhered or fixed to the one side of the high rigidity plate to form an asymmetric structure. The high rigidity plate prevents the multilayer interconnection board from being bent during the fabrication of the multilayer interconnection board. If the multilayer interconnection boards are adhered or fixed to both surfaces of the high rigidity plate, then it is necessary to form through holes in the high rigidity plate. In accordance with the present invention, however, it is unnecessary to form such the through holes in the high rigidity plate, whereby there are raised no problem with defect of the final product due to dusts generated in forming the through holes in the high rigidity plate nor problem with increase in the manufacturing cost due to additional process for forming the through holes in the high rigidity plate.

In this embodiment, the high rigidity plate is removed from the multilayer interconnection board after the semiconductor chips have been mounted on the multilayer interconnection board. When the semiconductor chips are mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

Accordingly, it is possible to remove the high rigidity plate from the multilayer interconnection board any times after the multilayer interconnection board has been completed and before the solder balls are formed.

In this embodiment, the high rigidity plate is removed from the multilayer interconnection board after the heat spreader has been adhered through the heat conductive adhesive layer to the semiconductor chips mounted on the multilayer interconnection board and before the solder balls are formed. When the semiconductor chips are mounted on the multilayer interconnection board and then the heat spreader are then adhered through the heat conductive adhesive layer to the semiconductor chips mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

Fourth Embodiment

A fourth embodiment according to the present invention will be described in detail with reference to the drawings. A difference of the fourth embodiment from the first embodiment is in further providing a buffer layer as a first substrate layer between solder balls and external electrode pads for allowing relaxation to stress applied between the flip-chip semiconductor device and the circuit board. In the end user's side, the flip-chip semiconductor device is mounted through the solder balls to the circuit board which is not illustrated. The solder balls have a small stand-off height which is insufficient for relaxation of the stress applied between the flip-chip semiconductor device and the circuit board. The buffer layer as a first substrate layer is provided between the solder balls and the external electrode pads for relaxation of the stress applied between the flip-chip semiconductor device and the circuit board.

Figure 10:
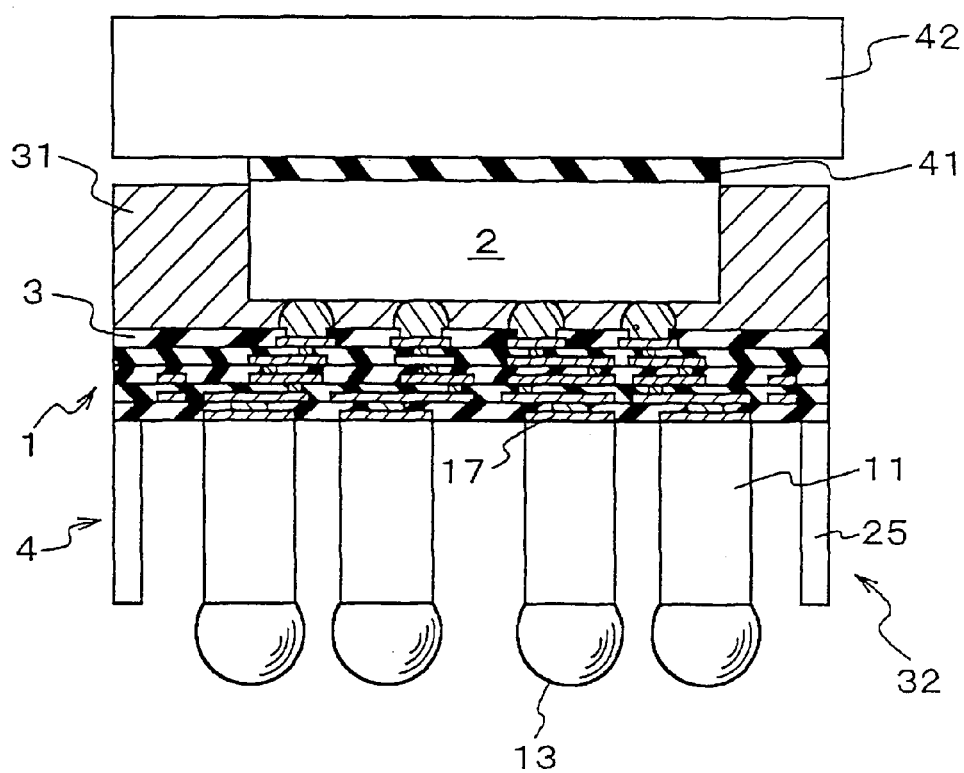
FIG. 10 is a cross sectional elevation view illustrative of a semiconductor device having a multilayer interconnection board, on which a semiconductor chip is mounted in a fourth embodiment according to the present invention.

FIG. 10 is a cross sectional elevation view illustrative of a semiconductor device having a multilayer interconnection board, on which a semiconductor chip is mounted in a fourth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17 on which a buffer layer 4 is formed. Solder balls 13 are formed on a bottom surface of the buffer layer 4. The buffer layer 4 comprises plurality of metal buffer layers 11 which are in contact with the external electrode pads 17. The buffer layer 4 is thus provided between the external electrode pads 17 of the multilayer interconnection board 3 and the solder balls 13. The buffer layer 4 comprising plural metal buffer layers 11 has a sufficient stand-off height for relaxing the stress applied between the flip-chip semiconductor device 32 and the circuit board not illustrated. Further, a supporting frame 25 is provided which extends on a peripheral region of the bottom surface of the multilayer interconnection board 3. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13. A sealing resin material 31 is provided over the first surface of the multilayer interconnection board 3 for sealing the semiconductor chip 2 and the bumps 14. A heat conductive adhesive layer 41 is provided on a second surface of the semiconductor chip 2. A heat spreader 42 is provided on the heat conductive adhesive layer 41 so that the heat spreader 42 is adhered through the heat conductive adhesive layer 41 to the second surface of the semiconductor chip 2. The bumps 14 and the solder balls 13 are eclectically connected to each other through multilevel interconnections of the multilayer interconnection board 3.

The structure of the multilayer interconnection board 3 is the same as in the first embodiment and as shown in FIG. 6.

Figure 11A:
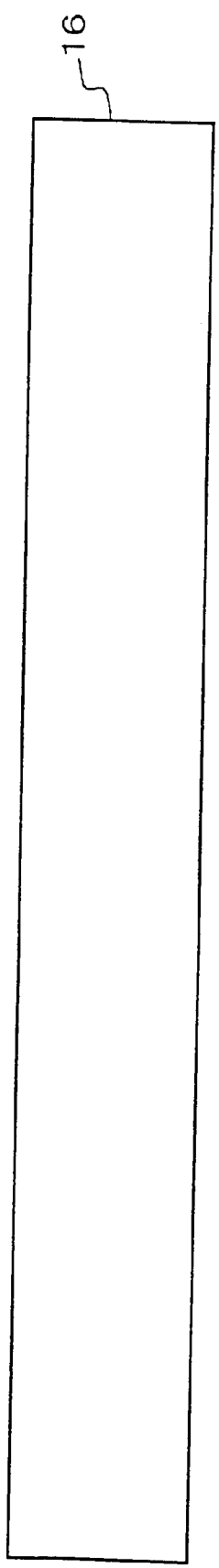
FIGS. 11A through 11S are fragmentary cross sectional elevation views illustrative of a novel method of forming a semiconductor device having a multilayer interconnection board on which a semiconductor chip is mounted in a fourth embodiment in accordance with the present invention.
Figure 11B:
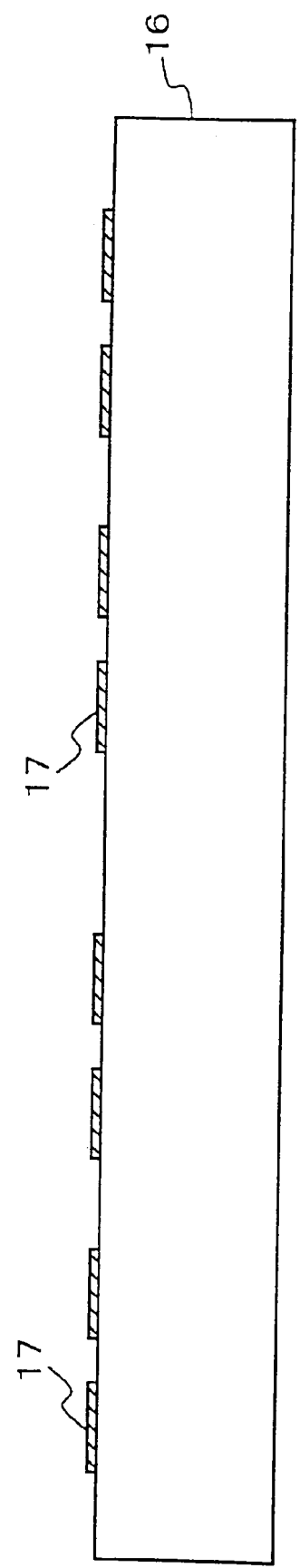
Figure 11C:
Figure 11D:
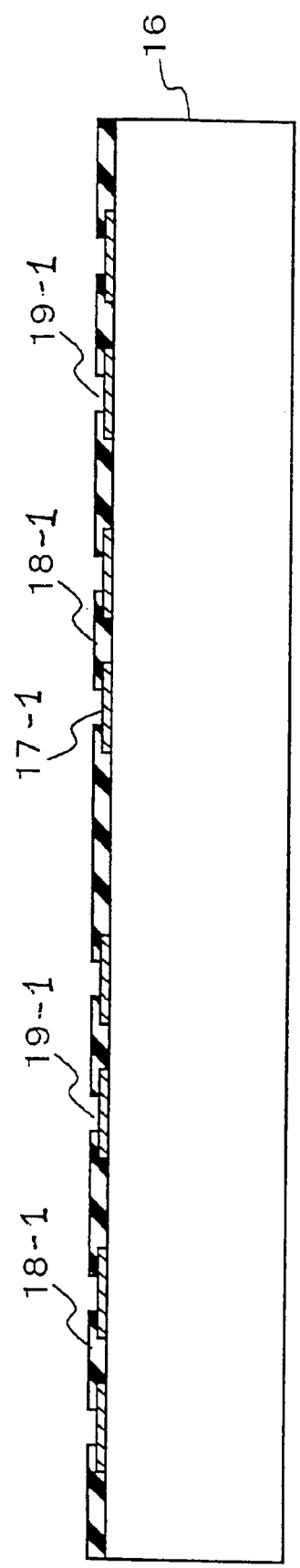
Figure 11E:
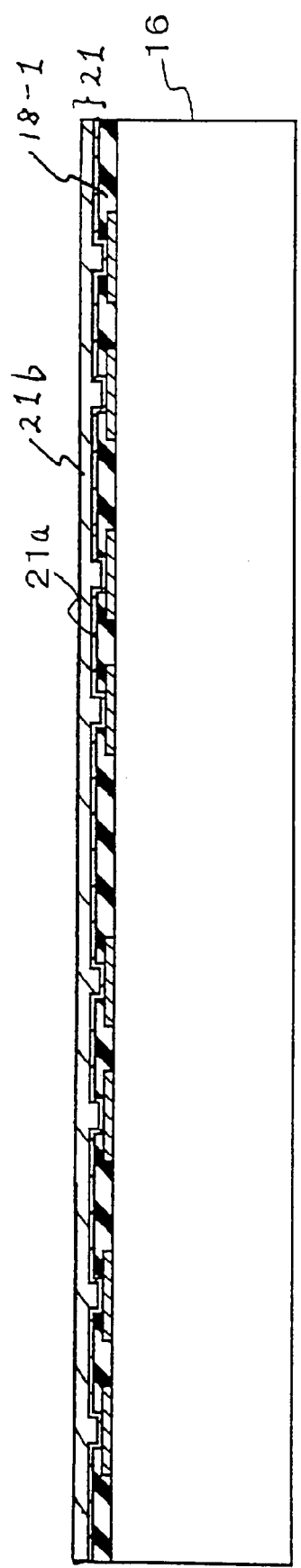
Figure 11F:
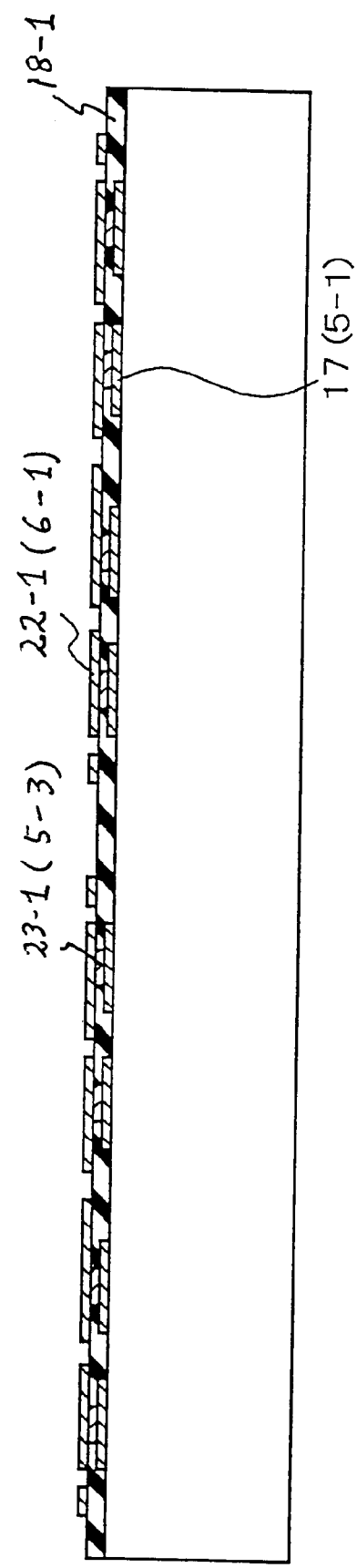
Figure 11G:
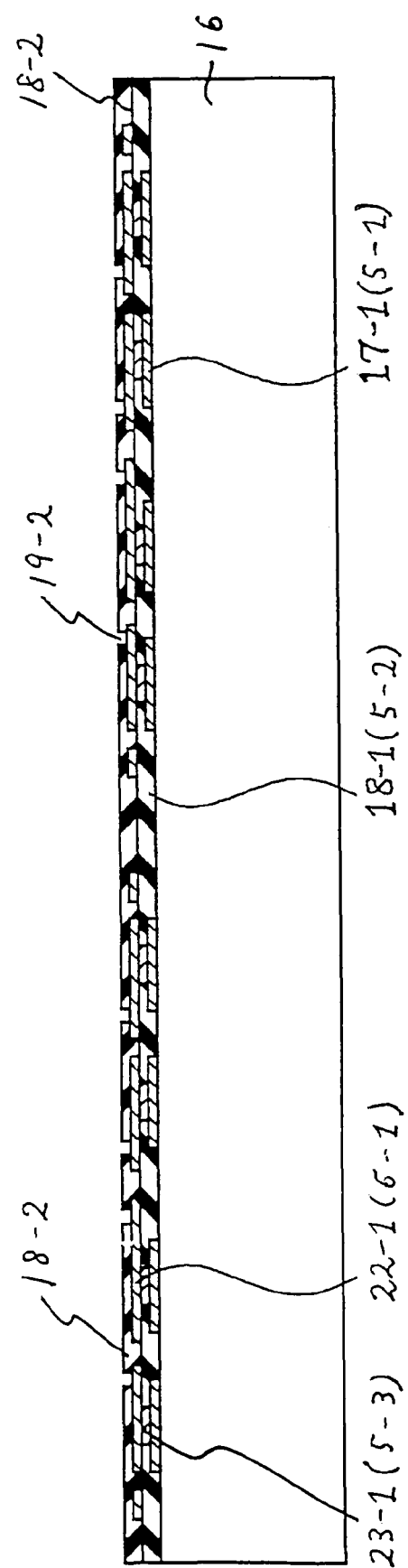
Figure 11H:
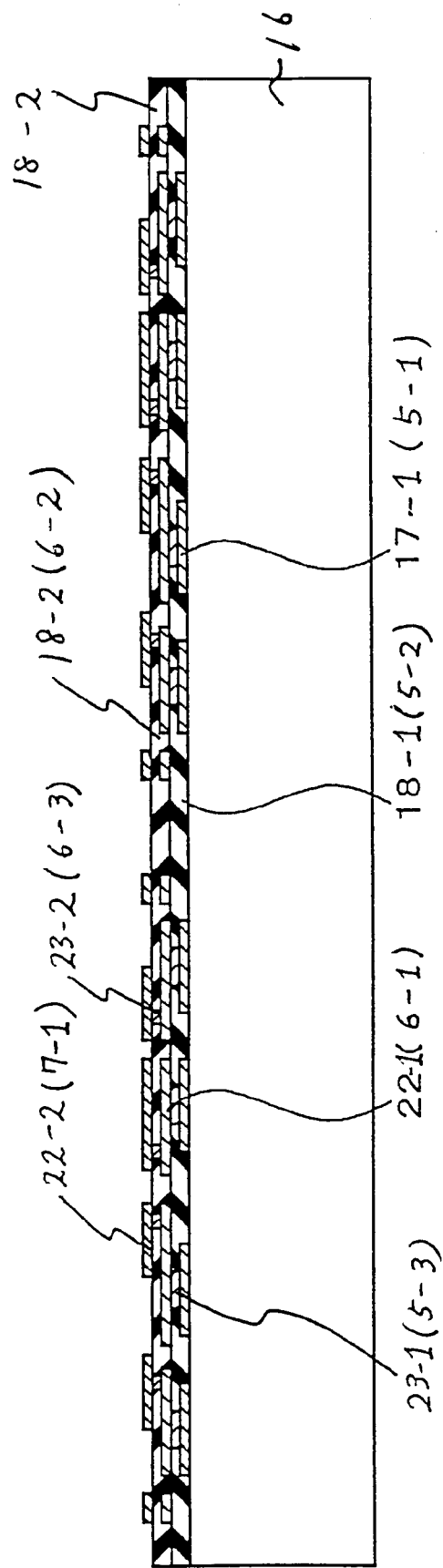
Figure 11I:
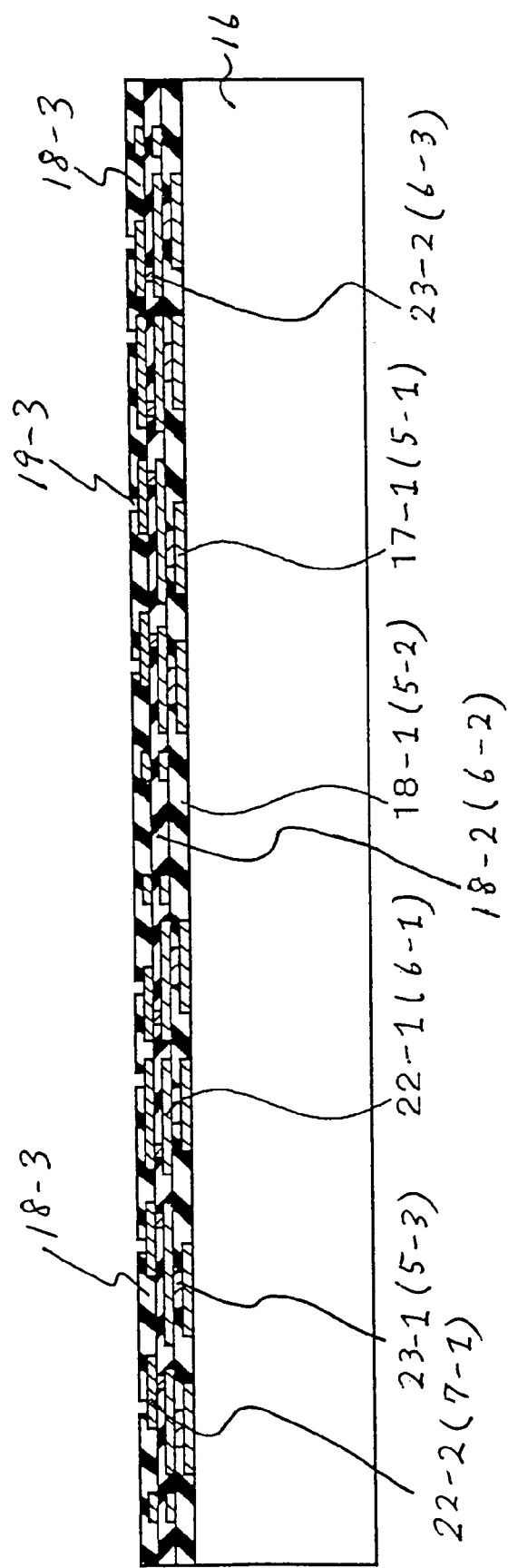
Figure 11J:
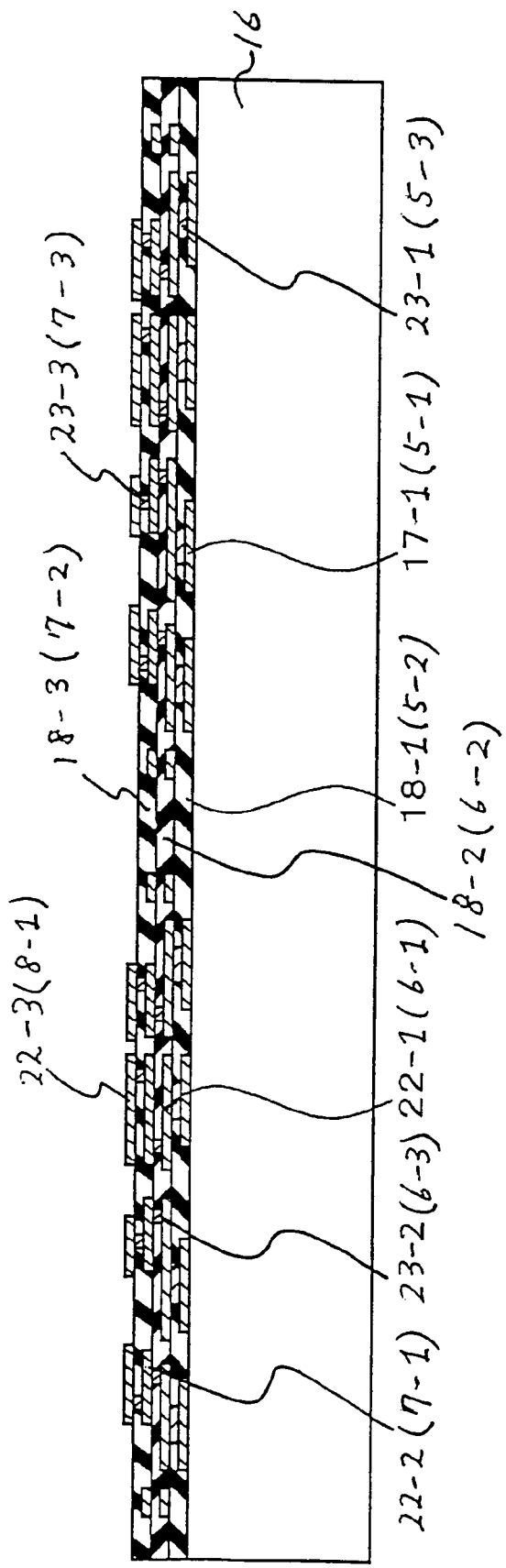
Figure 11K:
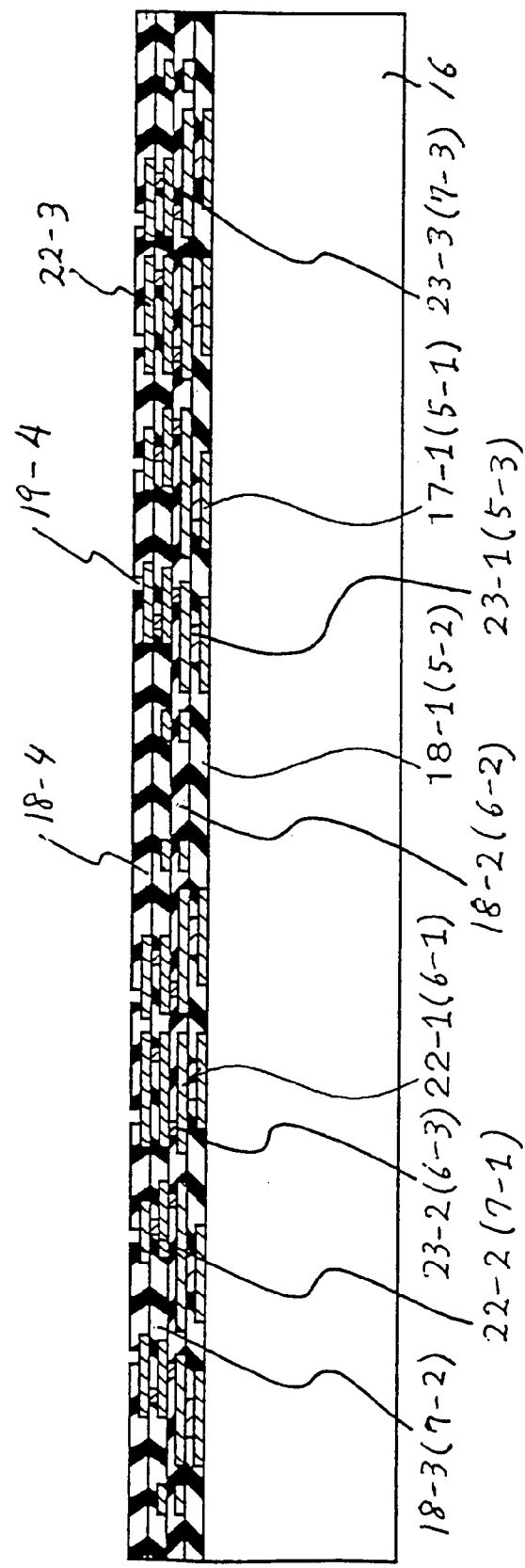
Figure 11L:
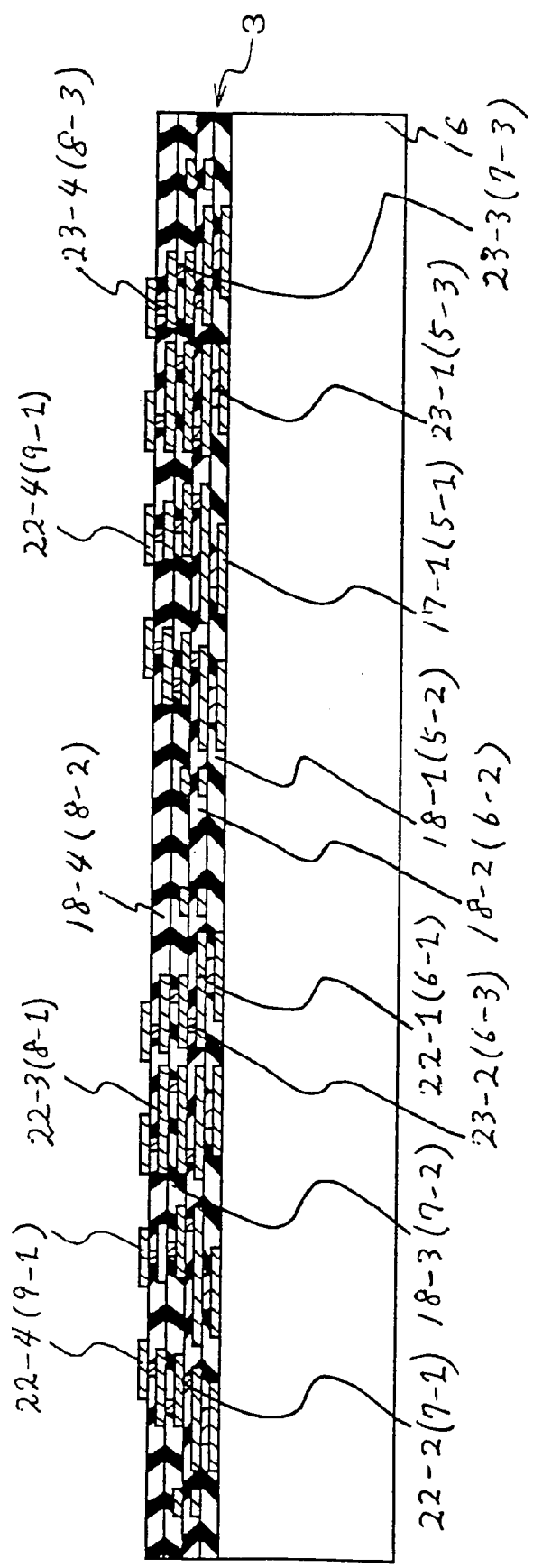
Figure 11M:
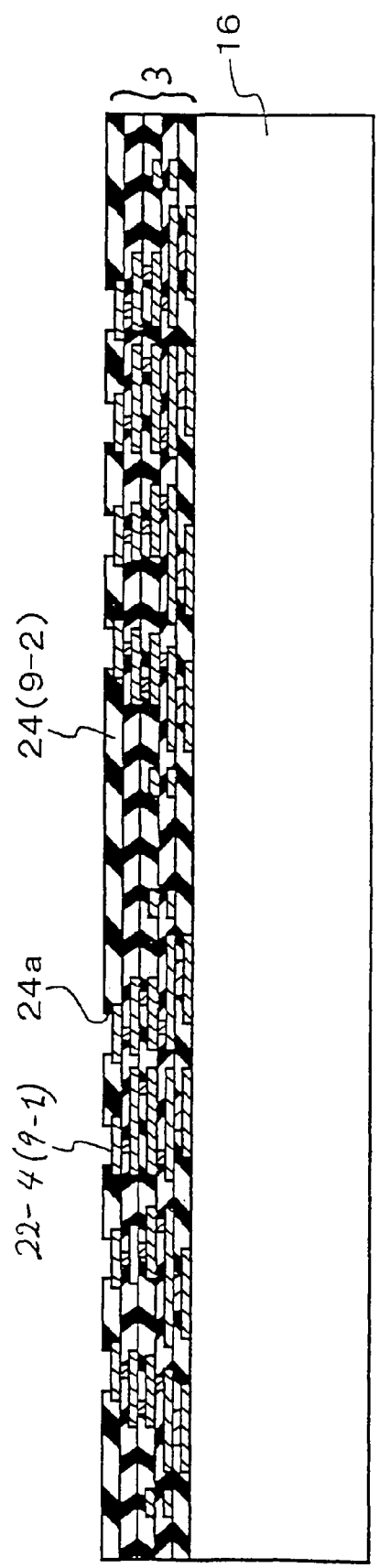
Figure 11N:
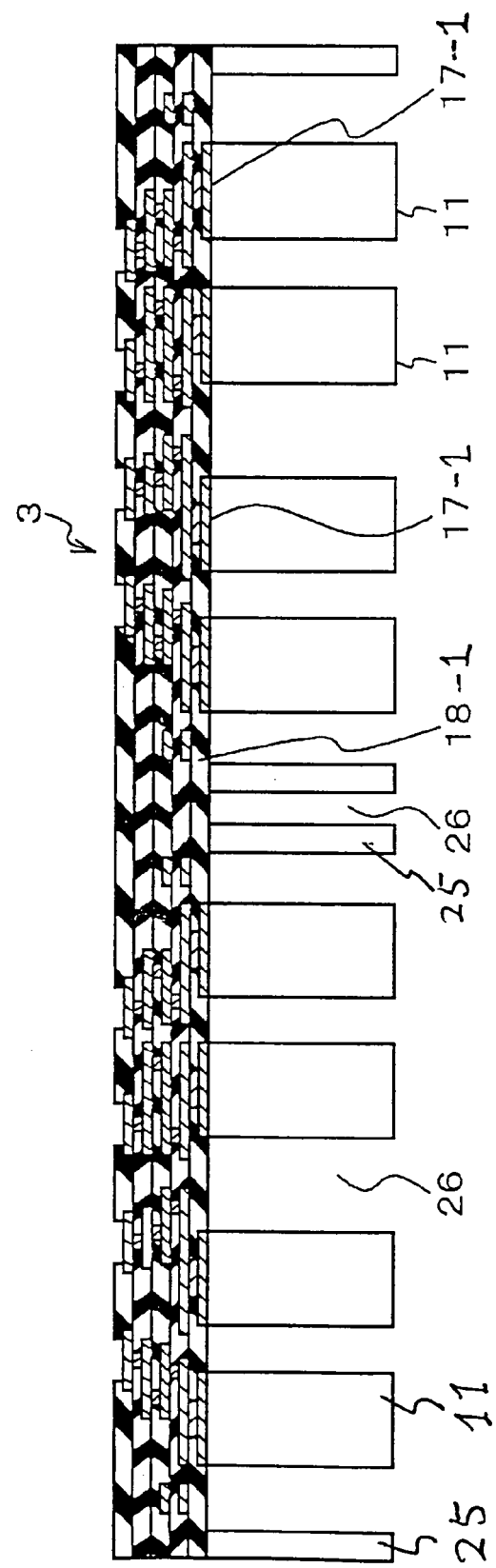
Figure 11O:
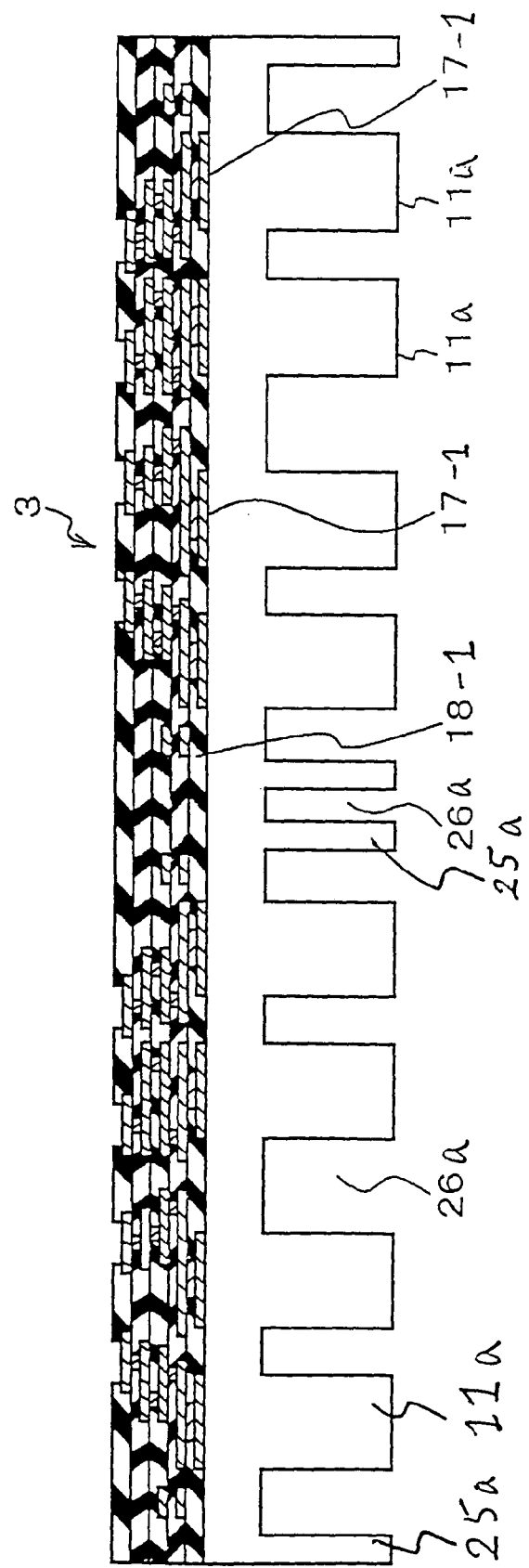
Figure 11P:
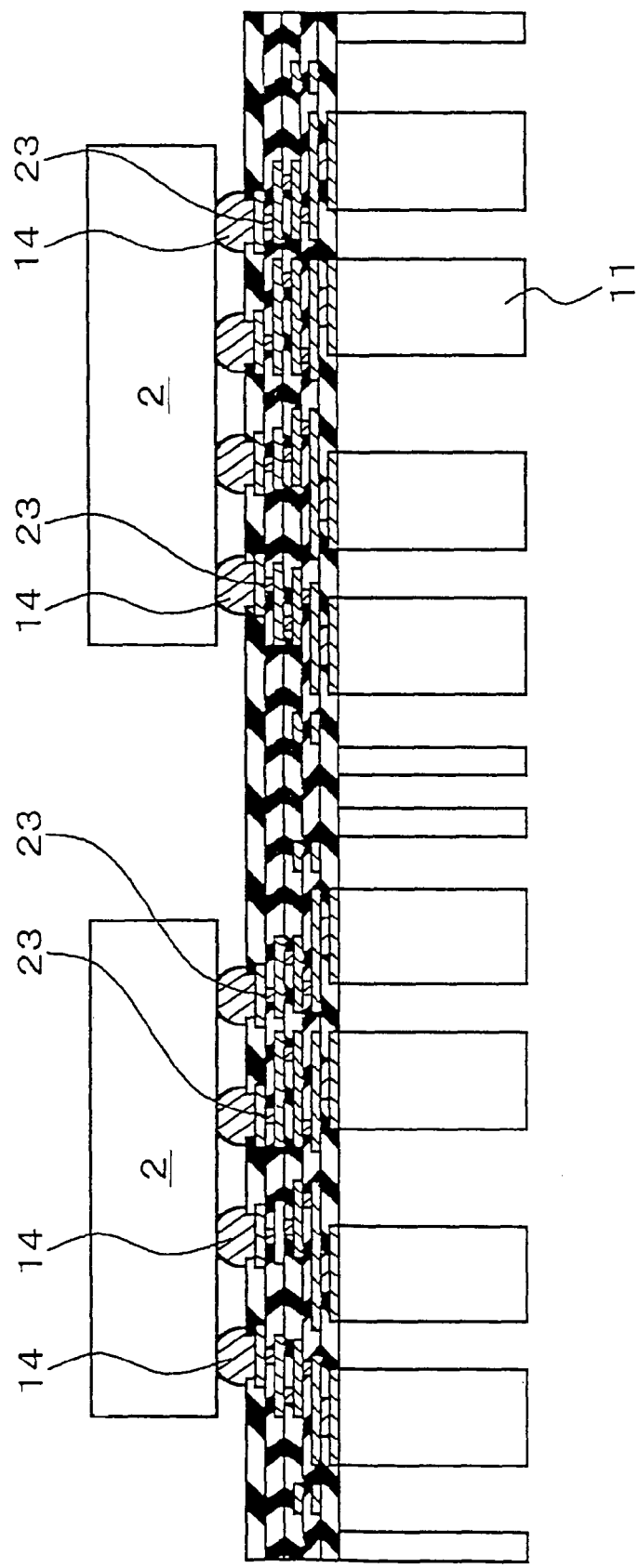
Figure 11Q:
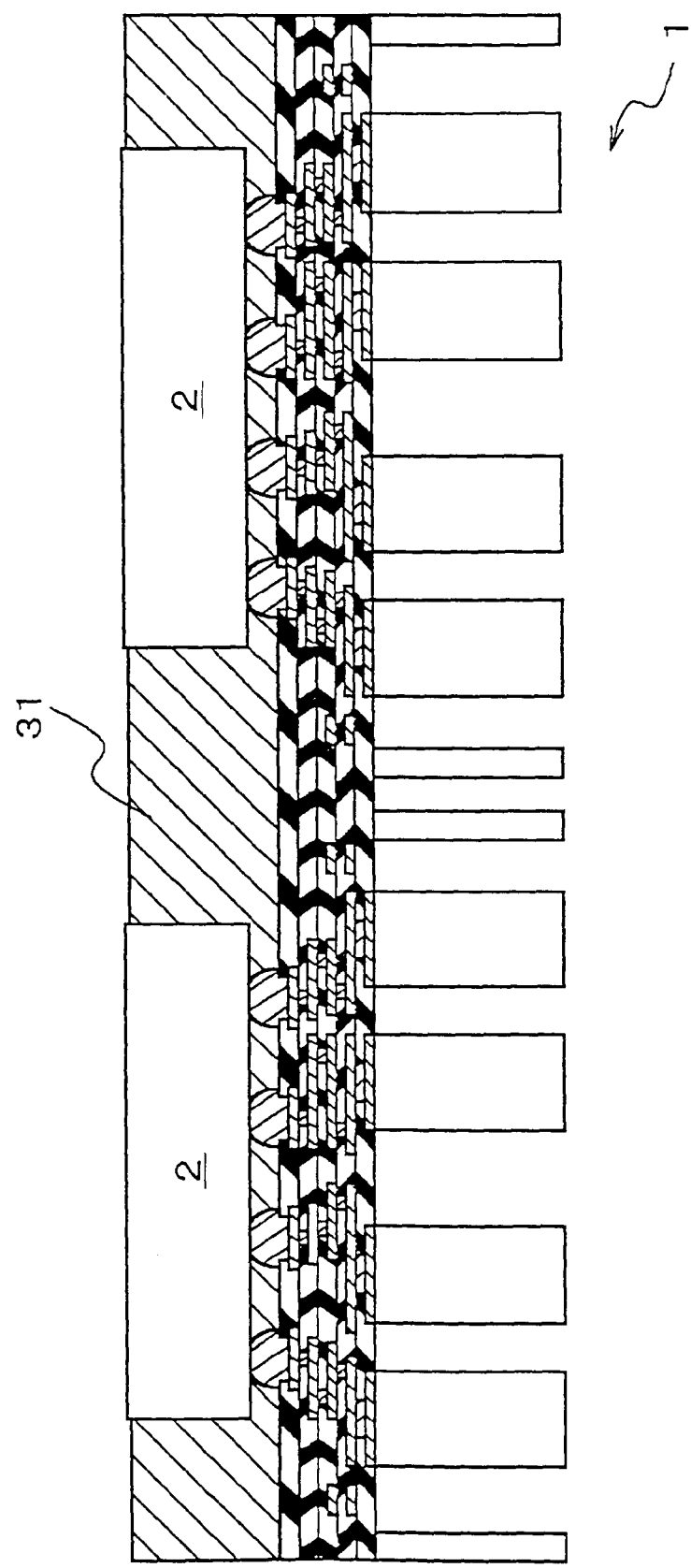
Figure 11R:
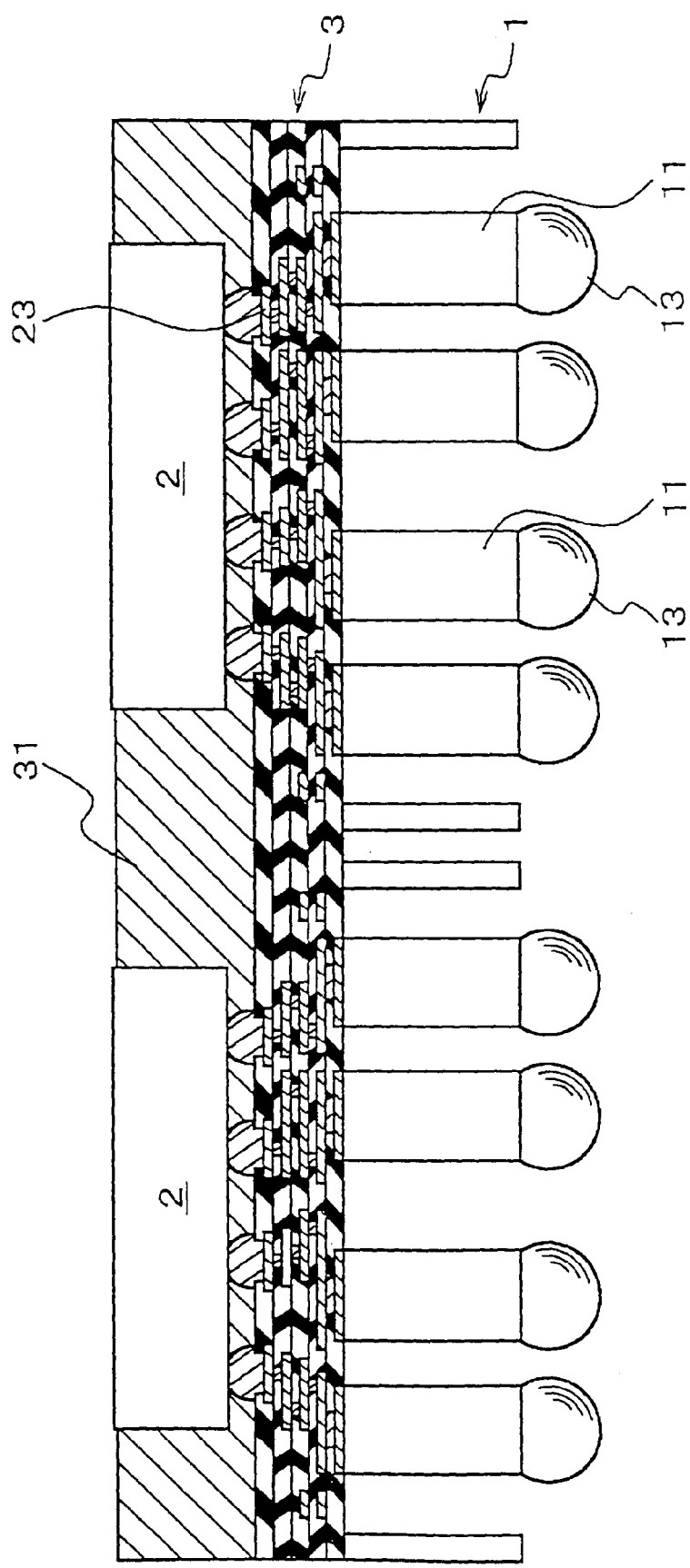
Figure 11S:
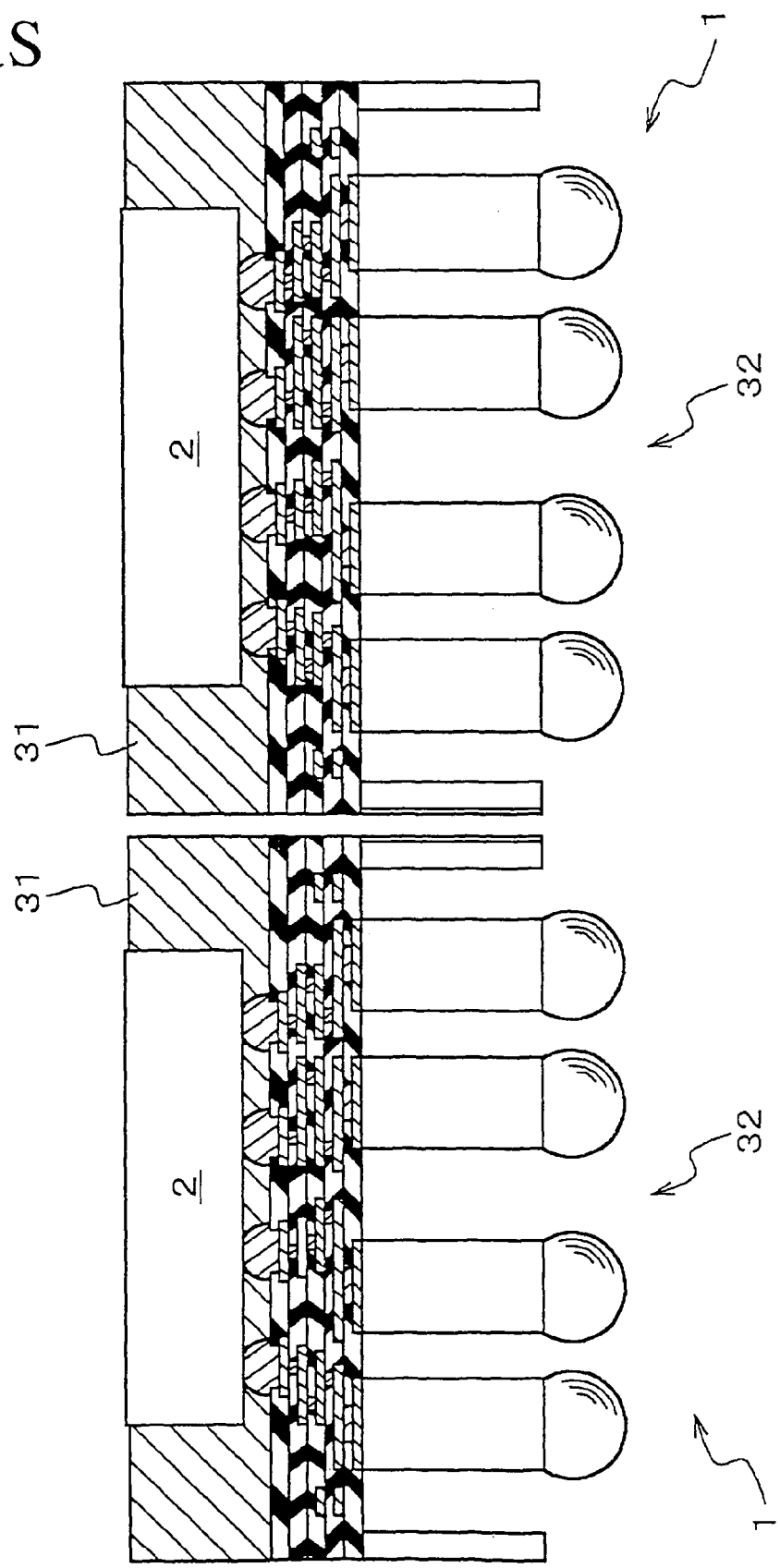

FIGS. 11A through 11S are fragmentary cross sectional elevation views illustrative of a novel method of forming a semiconductor device having a multilayer interconnection board on which a semiconductor chip is mounted in a fourth embodiment in accordance with the present invention.

With reference to FIG. 11A, a high rigidity plate 16 is prepared. The high rigidity plate 16 may be made of any material having a high rigidity. Metals such as Cu-, Ni-, Al-, W-, Mo-, Au-, Ag- and Pt-based metals, complex materials of different metals and ceramics are available for the high rigidity plate 16.

With reference to FIG. 11B, an adhesive metal layer of a metal such as a Ti-base alloy, a Cr-base alloy, a Mo-base alloy, and a W-base alloy is formed on a first surface of the high rigidity plate 16 by a sputtering method. An electrode material layer of a metal such as Cu, Al, and Ni is then formed on the adhesive metal layer by a sputtering method to form laminations of the adhesive metal layer and the electrode material layer. A resist film is then applied on the laminations of the adhesive metal layer and the electrode material layer. The resist film is then patterned by an exposure and a subsequent development to form a resist pattern. A selective wet etching process or a selective dry etching process to the laminations of the adhesive metal layer and the electrode material layer is carried out by use of the resist pattern as a mask so as to pattern the laminations of the adhesive metal layer and the electrode material layer, whereby external electrode pads 17-1 are selectively formed on the first surface of the high rigidity plate 16. The used resist pattern is then removed.

If a minimum pitch of the external electrode pads 17-1 is not so narrow, then it is possible as a modification that a resist is coated directly on the first surface of the high rigidity plate 16 and then patterned by an exposure and a development to form a resist pattern before a selective electroplating of metal is then carried out by use of the resist pattern as a mask, followed by removal of the used resist pattern.

With reference to FIG. 11C, an insulative resin thin film 18-1 is then formed over the external electrode pads 17-1 and the first surface of the high rigidity plate 16. The insulative resin thin film 18-1 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-1. If a fine pattern of not more than 1.0 micrometer is required, it is preferable to use the silicon dioxide based inorganic materials for utilizing diffusion processes of semiconductor.

With reference to FIG. 11D, the insulative resin thin film 18-1 is selectively removed to form openings 19-1 in the insulative resin thin film 18-1 and over the external electrode pads 17-1. A resist film is applied on the insulative resin thin film 18-1 and then patterned by an exposure and a subsequent development to form a resist pattern on the insulative resin thin film 18-1. If the insulative resin thin film 18-1 is made of a material which is removable by a chemical etching process, the insulative resin thin film 18-1 is selectively removed by a wet etching by use of the resist pattern as a mask to form the openings 19-1 in the insulative resin thin film 18-1. If the insulative resin thin film 18-1 is made of a material which is unremovable by the chemical etching process, the insulative resin thin film 18-1 is selectively removed by a dry etching by use of the resist pattern as a mask to form the openings 19-1 in the insulative resin thin film 18-1. The external electrode pads 17-1 are partially shown through the openings 19-1 formed in the insulative resin thin film 18-1. The used resist pattern is then removed.

With reference to FIG. 11E, an adhesive metal thin film 21a is entirely formed which extends on the surface of the insulative resin thin film 18-1 and the shown parts of the external electrode pads 17-1 by a sputtering method. The adhesive metal thin film 21a may be made of a Ti-based alloy, a Cr-based alloy, a Mo-based alloy, or a W-based alloy. Subsequently, a metal electrode thin film 21b is also entirely formed on the adhesive metal thin film 21a by a sputtering method, a chemical vapor deposition or an electroless plating method. The metal electrode thin film 21b may be made of Cu, Al or Ni. Laminations of the adhesive metal thin film 21a and the metal electrode thin film 21b form a metal thin film 21 which extends on the surface of the insulative resin thin film 18-1 and within the openings 19-1 over the external electrode pads 17-1.

With reference to FIG. 11F, a resist film is entirely formed on the metal thin film 21 and then patterned by an exposure and a subsequent development to form a resist pattern over the metal thin film 21. The metal thin film 21 is then patterned by a wet etching or a dry etching by use of the resist pattern as a mask to form metal thin film contact layers 23-1 in the openings 19-1 and metal thin film interconnection layers 22-1 over the insulative resin thin film 18-1, wherein the metal thin film interconnection layers 22-1 are in contact directly with the metal thin film contact layers 23-1, so that the metal thin film interconnection layers 22-1 are electrically connected through the metal thin film contact layers 23-1 to the external electrode pads 17-1. The used resist mask is then removed. The external electrode pads 17-1 shown in FIG. 11F correspond to the first level interconnection pattern 5-1 of the first interconnection layer 5 shown in FIG. 6. The insulative resin thin film 18-1 shown in FIG. 11F also corresponds to the first level insulating layer 5-2 of the first interconnection layer 5 shown in FIG. 6. The metal thin film contact layers 23-1 shown in FIG. 11F also corresponds to the first level contact layer 5-3 of the first interconnection layer 5. The metal thin film interconnection layers 22-1 shown in FIG. 11F also corresponds to the second level interconnection pattern 6-1 of the second interconnection layer 6.

If the pattern pitch of the metal thin film interconnection layers 22-1 is not so narrow, then it is possible as a modification that after the metal thin film 21 has been formed, then the resist pattern is formed on the metal thin film 21 so that a selective electroplating of metal such as Cu is carried out by use of the resist pattern as a mask to form Cu-plated patterns over the metal thin film 21. The used resist mask is then removed. The metal thin film 21 is then selectively etched by use of the Cu-plated patterns as a mask thereby to form the metal thin film interconnection layers 22-1 over the insulative resin thin film 18-1 and the metal thin film contact layers 23-1 in the openings 19-1.

In accordance with the above described method and its modification, it is possible that the thicknesses of the resist film and the metal thin film interconnection layers 22-1 are not more than 1 micrometers.

With reference to FIG. 11G, an insulative resin thin film 18-2 is then formed over the metal thin film interconnection layers 22-1 and the insulative resin thin film 18-1. The insulative resin thin film 18-2 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-2. If a fine pattern of not more than 1.0 micrometer is required, it is preferable to use the silicon dioxide based inorganic materials for utilizing diffusion processes of semiconductor. The insulative resin thin film 18-2 is selectively removed to form openings 19-2 in the insulative resin thin film 18-2 and over the metal thin film interconnection layers 22-1. A resist film is applied on the insulative resin thin film 18-2 and then patterned by an exposure and a subsequent development to form a resist pattern on the insulative resin thin film 18-2. If the insulative resin thin film 18-2 is made of a material which is removable by a chemical etching process, the insulative resin thin film 18-2 is selectively removed by a wet etching by use of the resist pattern as a mask to form the openings 19-2 in the insulative resin thin film 18-2. If the insulative resin thin film 18-2 is made of a material which is unremovable by the chemical etching process, the insulative resin thin film 18-2 is selectively removed by a dry etching by use of the resist pattern as a mask to form the openings 19-2 in the insulative resin thin film 18-2. The metal thin film interconnection layers 22-1 are partially shown through the openings 19-2 formed in the insulative resin thin film 18-2. The used resist pattern is then removed.

With reference to FIG. 11H, an adhesive metal thin film is entirely formed which extends on the surface of the insulative resin thin film 18-2 and the shown parts of the metal thin film interconnection layers 22-1 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-2 and within the openings 19-2 over the metal thin film interconnection layers 22-1. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-2 in the openings 19-2 and metal thin film interconnection layers 22-2 over the insulative resin thin film 18-2, wherein the metal thin film interconnection layers 22-2 are in contact directly with the metal thin film contact layers 23-2, so that the metal thin film interconnection layers 22-2 are electrically connected through the metal thin film contact layers 23-2 to the metal thin film interconnection layers 22-1. The used resist mask is then removed. The metal thin film interconnection layers 22-1 shown in FIG. 11H correspond to the second level interconnection pattern 6-1 of the second interconnection layer 6 shown in FIG. 6. The insulative resin thin film 18-2 shown in FIG. 11H also corresponds to the second level insulating layer 6-2 of the second interconnection layer 6 shown in FIG. 6. The metal thin film contact layers 23-2 shown in FIG. 11H also corresponds to the second level contact layer 6-3 of the second interconnection layer 6. The metal thin film interconnection layers 22-2 shown in FIG. 11H also corresponds to the third level interconnection pattern 7-1 of the third interconnection layer 7.

If the pattern pitch of the metal thin film interconnection layers 22-2 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-2 over the insulative resin thin film 18-2 and the metal thin film contact layers 23-2 in the openings 19-2.

In accordance with the above described method and its modification, it is possible that the thicknesses of the resist film and the metal thin film interconnection layers 22-2 are not more than 1 micrometers.

With reference to FIG. 11I, an insulative resin thin film 18-3 is then formed over the metal thin film interconnection layers 22-2 and the insulative resin thin film 18-2. The insulative resin thin film 18-3 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-3. If a fine pattern of not more than 1.0 micrometer is required, it is preferable to use the silicon dioxide based inorganic materials for utilizing diffusion processes of semiconductor. The insulative resin thin film 18-3 is selectively removed to form openings 19-3 in the insulative resin thin film 18-3 and over the metal thin film interconnection layers 22-2. A resist film is applied on the insulative resin thin film 18-3 and then patterned by an exposure and a subsequent development to form a resist pattern on the insulative resin thin film 18-3. If the insulative resin thin film 18-3 is made of a material which is removable by a chemical etching process, the insulative resin thin film 18-3 is selectively removed by a wet etching by use of the resist pattern as a mask to form the openings 19-3 in the insulative resin thin film 18-3. If the insulative resin thin film 18-3 is made of a material which is unremovable by the chemical etching process, the insulative resin thin film 18-3 is selectively removed by a dry etching by use of the resist pattern as a mask to form the openings 19-3 in the insulative resin thin film 18-3. The metal thin film interconnection layers 22-2 are partially shown through the openings 19-3 formed in the insulative resin thin film 18-3. The used resist pattern is then removed.

With reference to FIG. 11J, an adhesive metal thin film is entirely formed which extends on the surface of the insulative resin thin film 18-3 and the shown parts of the metal thin film interconnection layers 22-2 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-3 and within the openings 19-3 over the metal thin film interconnection layers 22-2. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-3 in the openings 19-3 and metal thin film interconnection layers 22-3 over the insulative resin thin film 18-3, wherein the metal thin film interconnection layers 22-3 are in contact directly with the metal thin film contact layers 23-3, so that the metal thin film interconnection layers 22-3 are electrically connected through the metal thin film contact layers 23-3 to the metal thin film interconnection layers 22-2. The used resist mask is then removed. The metal thin film interconnection layers 22-2 shown in FIG. 11J correspond to the third level interconnection pattern 7-1 of the third interconnection layer 7 shown in FIG. 6. The insulative resin thin film 18-3 shown in FIG. 11J also corresponds to the third level insulating layer 7-2 of the third interconnection layer 7 shown in FIG. 6. The metal thin film contact layers 23-3 shown in FIG. 11J also corresponds to the third level contact layer 7-3 of the third interconnection layer 7. The metal thin film interconnection layers 22-3 shown in FIG. 11J also corresponds to the fourth level interconnection pattern 8-1 of the third interconnection layer 8.

If the pattern pitch of the metal thin film interconnection layers 22-3 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-3 over the insulative resin thin film 18-3 and the metal thin film contact layers 23-3 in the openings 19-3.

In accordance with the above described method and its modification, it is possible that the thicknesses of the resist film and the metal thin film interconnection layers 22-3 are not more than 1 micrometers.

With reference to FIG. 11K, an insulative resin thin film 18-4 is then formed over the metal thin film interconnection layers 22-3 and the insulative resin thin film 18-3. The insulative resin thin film 18-4 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-4. If a fine pattern of not more than 1.0 micrometer is required, it is preferable to use the silicon dioxide based inorganic materials for utilizing diffusion processes of semiconductor. The insulative resin thin film 18-4 is selectively removed to form openings 19-4 in the insulative resin thin film 18-4 and over the metal thin film interconnection layers 22-3. A resist film is applied on the insulative resin thin film 18-4 and then patterned by an exposure and a subsequent development to form a resist pattern on the insulative resin thin film 18-4. If the insulative resin thin film 18-4 is made of a material which is removable by a chemical etching process, the insulative resin thin film 18-4 is selectively removed by a wet etching by use of the resist pattern as a mask to form the openings 19-4 in the insulative resin thin film 18-4. If the insulative resin thin film 18-4 is made of a material which is unremovable by the chemical etching process, the insulative resin thin film 18-4 is selectively removed by a dry etching by use of the resist pattern as a mask to form the openings 19-4 in the insulative resin thin film 18-3. The metal thin film interconnection layers 22-3 are partially shown through the openings 19-4 formed in the insulative resin thin film 18-4. The used resist pattern is then removed.

With reference to FIG. 11L, an adhesive metal thin film is entirely formed which extends on the surface of the insulative resin thin film 18-4 and the shown parts of the metal thin film interconnection layers 22-3 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-4 and within the openings 19-4 over the metal thin film interconnection layers 22-3. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-4 in the openings 19-4 and pad electrodes 22-4 over the insulative resin thin film 18-4, wherein the pad electrodes 22-4 are in contact directly with the metal thin film contact layers 23-4, so that the pad electrodes 22-4 are electrically connected through the metal thin film contact layers 23-4 to the metal thin film interconnection layers 22-3. The used resist mask is then removed. The metal thin film interconnection layers 22-3 shown in FIG. 11L correspond to the fourth level interconnection pattern 8-1 of the fourth interconnection layer 8 shown in FIG. 6. The insulative resin thin film 18-4 shown in FIG. 11L also corresponds to the fourth level insulating layer 8-2 of the fourth interconnection layer 8 shown in FIG. 6. The metal thin film contact layers 23-4 shown in FIG. 11L also corresponds to the fourth level contact layer 8-3 of the fourth interconnection layer 8. The pad electrodes 22-4 shown in FIG. 11L also corresponds to the fifth level interconnection pattern 9-1 of the fifth interconnection layer 9.

If the pattern pitch of the pad electrodes 22-4 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the pad electrodes 22-4 over the insulative resin thin film 18-4 and the metal thin film contact layers 23-4 in the openings 19-4.

In accordance with the above described method and its modification, it is possible that the thicknesses of the resist film and the pad electrodes 22-4 are not more than 1 micrometers.

With reference to FIG. 11M, a solder resist film 24 is then formed over the pad electrodes 22-4 and the insulative resin thin film 18-4 in order to protect the multilayer interconnection board 3 having the pad electrodes 24. The solder resist film 24 shown in FIG. 11M corresponds to the fifth level insulating layer 9-2 of the fifth interconnection layer 9 shown in FIG. 6. The solder resist film 24 may comprise an organic insulating film such an epoxy resin film containing an inorganic filler such as fine powders of silicon dioxide. Alternatively, the solder resist film 24 may be made of a material which has a large resistivity to external chemical stress, and a large resistivity to a Flux cleaning solution or an Au plating solution as well as a high adhesiveness to a sealing material such as an under-fill material. If the above first to fourth insulative resin thin films 18-1, 18-2, 18-3 and 18-4 are highly resistive to the chemical and chemical stresses, it is possible as a modification to eliminate the formation of the solder resist film 24. The solder resist film 24 is selectively removed to form openings 24a in the solder resist film 24 and over the pad electrodes 22-4. If the solder resist film 24 is made of a non-photosensitive material, a resist film is applied on the solder resist film 24 and then patterned by an exposure and a subsequent development to form a resist pattern on the solder resist film 24, so that the solder resist film 24 is selectively removed by a wet etching by use of the resist pattern as a mask to form the openings 24a in the solder resist film 24, followed by removal of the used resist pattern. If the solder resist film 24 is made of a photosensitive material, then the solder resist film 24 is directly patterned by an exposure and a subsequent development to form the openings 24a in the solder resist film 24. The electrode pads 22-4 are partially shown through the openings 24a formed in the solder resist film 24.

With reference to FIG. 11N, a resist film is entirely applied on a bottom surface of the high rigidity plate 16 and then patterned by an exposure and a subsequent development to form a resist pattern on the bottom surface of the high rigidity plate 16. The high rigidity plate 16 comprising the metal plate is then selectively etched by use of the resist pattern as a mask so as to form gaps 26 except under the external electrode pads 17-1 and peripheral regions of the unit multilayer interconnection boards to be used for the flip-chip semiconductor device, and thus so as to leave the high rigidity plate 16 under the external electrode pads 17-1 and peripheral regions of the unit multilayer interconnection boards to be used for the flip-chip semiconductor device, whereby plural metal layers 11 are formed on the external electrode pads 17-1 and supporting frames 25 on the peripheral regions of the unit multilayer interconnection boards, wherein the plural metal layers 11 and the supporting frames 25 are defined by gaps 26. The gaps 26 reach the bottom surface of the multilayer interconnection board 3 so that the plural metal layers 11 and the supporting frames 25 are completely separated by the gaps 26. Each of the plural metal layers 11 is in the form of column or pillar.

With reference to FIG. 11O, if the thickness of the high rigidity plate 16 comprising the metal plate is thick, for example in the range of 500 micrometers to 3 millimeters, it is difficult to realize a highly accurate selective etching by use of the resist pattern because the necessary time for etching the high rigidity plate 16 comprising the metal plate is so long as possibly causing that a part of the resist pattern is etched during the etching process. For this reason, if the thickness of the high rigidity plate 16 comprising the metal plate is thick, for example in the range of 500 micrometers to 3 millimeters, then it is preferable that the high rigidity plate 16 comprising the metal plate is first selectively etched by a depth in the range of more than a half of the thickness of the high rigidity plate 16 to less than the thickness of the high rigidity plate 16 by a laser beam machining, an electric discharge machining or a selective cutting, whereby plural columns 11a are formed under the external electrode pads 17-1 and plural columns 25a under the peripheral regions of the unit multilayer interconnection boards, wherein the plural columns 11a and the plural columns 25a are defined by gaps 26a. The gaps 26a do not reach the bottom surface of the multilayer interconnection board 3 so that the plural columns 11a and the columns 25a are partially separated by the gaps 26a. Subsequently, an etching process is then carried out by use of the resist pattern as a mask so as to increase the depth of the gaps 26a so that the gaps 26 reach the bottom surface of the multilayer interconnection board 3 except under the external electrode pads 17-1 and peripheral regions of the unit multilayer interconnection boards to be used for the flip-chip semiconductor device, and thus so as to leave the high rigidity plate 16 under the external electrode pads 17-1 and peripheral regions of the unit multilayer interconnection boards to be used for the flip-chip semiconductor device, whereby plural metal layers 11 are formed on the external electrode pads 17-1 and supporting frames 25 on the peripheral regions of the unit multilayer interconnection boards, wherein the plural metal layers 11 and the supporting frames 25 are defined by gaps 26. The gaps 26 reach the bottom surface of the multilayer interconnection board 3 so that the plural metal layers 11 and the supporting frames 25 are completely separated by the gaps 26. Each of the plural metal layers 11 is in the form of column or pillar.

With reference to FIG. 11P, semiconductor chips 2 are mounted on the multilayer interconnection board 3, wherein the semiconductor chips 2 have the plural bumps 14, and the plural bumps 14 are made into contact with the electrode pads 22-4 of the multilayer interconnection board 3, so that the semiconductor chips 2 are electrically connected through the plural bumps 14 to the multilayer interconnection board 3. If the bumps 14 are made of a metal based solder material such as Sn or Pb, a flip-chip bonding utilizing a heat re-flow process using Flux is available for bonding the plural bumps 14 to the electrode pads 22-4 of the multilayer interconnection board 3. If the bumps 14 are made of a metal based solder material such as Au or In, a flip-chip bonding utilizing a thermo-compression bonding is available for bonding the plural bumps 14 to the electrode pads 22-4 of the multilayer interconnection board 3.

The plural metal layers 11 of the buffer layer 4 are then subjected to an electroless plating for plating laminated Ni and Au layers or laminated Zn, Ni and Au layers on the plural metal layers 11 and the pad electrodes 22-4 in order to improve a bonding property between the plural metal layers 11 and also a bonding property between the pad electrodes 22-4 and the bumps 14 of the semiconductor chip 2. As a result, the multilayer interconnection board 3 is completed, which comprises plural unit multilayer interconnection boards. A test for electrical characteristics of the multilayer interconnection board 3 is then made, so that only quality-confirmed units in the plural unit multilayer interconnection boards in the electrical characteristic test are then subjected to a mounting process for mounting semiconductor chips thereon.

With reference to FIG. 11Q, an insulative resin material 31 is formed which coats side walls of the semiconductor chips 2, an inter-space between the semiconductor chips 2 and the multilayer interconnection board 3 around the bumps 14 and the surface of the solder resist film 24 of the multilayer interconnection board 3 in order to protect the semiconductor chips 2, the bumps 14 and the multilayer interconnection board 3. This coating process is carried out by use of a resin injection technique involving a vacuum sealing technique or a transfer sealing technique. The insulative resin material 31 may be made of one of epoxy resin materials, silicone resin materials, polyimide resin materials, polyolefin resin materials, cyanate ester resin materials, phenol resin materials and naphthalene resin materials.

With reference to FIG. 11R, solder balls 13 are formed which are in contact directly with the bottoms of the plural metal layers 11 of the buffer layer 4 to form a semiconductor device 1 having the multilayer interconnection board 3 and the plural semiconductor chips 2 mounted thereon. The solder balls 13 serve as external terminals. The solder balls 13 may be made of a metal based material such as Sn or Pb. The solder balls 13 may also be free of lead. The solder balls 13 may be made of an electrically conductive material having a low melting point, a high heat conductivity and a rapid solidity as well as a large surface tension so that the electrically conductive material becomes in the form of balls. Since the plural metal layers 11 of the buffer layer 4 are electrically conductive, the external electrode pads 17-1 and the solder balls 13 are eclectically connected through the plural metal layers 11 of the buffer layer 4.

With reference to FIG. 11S, the semiconductor device 1 is then diced by use of a dicing blade to divide the semiconductor device 1 into plural unit semiconductor devices 32 or flip-chip semiconductor devices 32, each of which comprises the multilayer interconnection board 3 and the single semiconductor chip 2 mounted thereon.

With reference back to FIG. 10, a heat conductive adhesive layer 41 is provided on a top surface of the semiconductor chip 2. A heat spreader 42 is provided on the heat conductive adhesive layer 41 so that the heat spreader 42 is adhered through the heat conductive adhesive layer 41 to the top surface of the semiconductor chip 2. A heat generated in the semiconductor chip 2 is conducted through the heat conductive adhesive layer 41 to the heat spreader 42 for causing a heat radiation from the heat spreader 42. The heat spreader 42 may be made of a heat conductive material such as a metal base material, for example, Cu, Al, W, Mo, Fe, Ni, and Cr, or $Al_2O_3$, AlN, SiC, other ceramics such as mullite. The heat conductive adhesive layer 41 may be made of a resin based material containing a heat conductive material, wherein the resin based material may be one of epoxy resin materials, silicone resin materials, polyimide resin materials, polyolefin resin materials, cyanate ester resin materials, phenol resin materials and naphthalene resin materials, whilst the heat conductive material may be one of Ag, Pd, Cu, Al, Au, Mo, W, diamond, $Al_2O_3$, AlN, and ceramic materials such as mullite, BN and SiC.

The flip-chip is usually applied to a high speed logic device having a large number of pins, for which reason the heat radiation from the semiconductor chip 2 is important. In this embodiment, the heat spreader 42 is provided to improve the heat radiation characteristic of the flip-chip semiconductor device 32.

In accordant with the present invention, the base material of the multilayer interconnection board is not largely different in thermal expansion coefficient from the semiconductor chip to reduce a stress applied between the multilayer interconnection board and the semiconductor chip, thereby keeping a high reliability in connection between the multilayer interconnection board and the semiconductor chip. The reduction in stress applied between the multilayer interconnection board and the semiconductor chip makes it unnecessary to increase the thicknesses of the multilevel interconnections 17-1, 2-1, 22-2, 22-3 and 24 for stress relaxation, but makes it possible that the thicknesses of the multilevel interconnections 17-1, 2-1, 22-2, 22-3 and 24 are thin, for example, not more than 1 micrometer. A metallization technique for the semiconductor wafer and an apparatus therefor are utilized for allowing the resist films and the multilevel interconnections 17-1, 2-1, 22-2, 22-3 and 24 to be patterned finely, thereby permitting a further shrinkage of the interconnection patterns.

Further, the multilayer interconnection board remains adhered or fixed to the high rigidity plate such as the metal plate during when the multilayer interconnection board is formed, so that the high rigidity plate provides or ensures a high planarity to the multilayer interconnection board. Even the high rigidity plate is different in linear expansion coefficient from the multilayer interconnection board, the high rigidity plate suppresses generation of internal stress in the multilayer interconnection board and expansion of the multilayer interconnection board, so that the high rigidity plate suppresses the multilayer interconnection board from being bent, whereby the multilayer interconnection board is free from any misalignment in patterning the insulating layers and the interconnection layers, resulting in a high yield of the flip-chip semiconductor device.

As described above, the high rigidity plate is necessary or important for keeping the multilayer interconnection board to have the high planarity until the multilayer interconnection board is completed. Notwithstanding, the high rigidity plate is not necessarily needed to the final product, for example, the flip-chip semiconductor device, for which reason as described above, after the multilayer interconnection board has been completed, then the high rigidity plate is removed.

After the high rigidity plate is removed from the bottom surface of the multilayer interconnection board, then the bottom surface of the multilayer interconnection board is shown, for which reason the bottom or first insulating layer of the multilayer interconnection board may preferably be made of an insulating material such as an organic material which has a flexibility to an externally applied stress.

Accordingly, the single multilayer interconnection board is adhered or fixed to the one side of the high rigidity plate to form an asymmetric structure. The high rigidity plate prevents the multilayer interconnection board from being bent during the fabrication of the multilayer interconnection board. If the multilayer interconnection boards are adhered or fixed to both surfaces of the high rigidity plate, then it is necessary to form through holes in the high rigidity plate. In accordance with the present invention, however, it is unnecessary to form such the through holes in the high rigidity plate, whereby there are raised no problem with defect of the final product due to dusts generated in forming the through holes in the high rigidity plate nor problem with increase in the manufacturing cost due to additional process for forming the through holes in the high rigidity plate.

In the above embodiment, the high rigidity plate is removed after the multilayer interconnection board is completed and before the semiconductor chips are mounted on the multilayer interconnection board.

It is, however, possible to remove the high rigidity plate from the multilayer interconnection board after the semiconductor chips have been mounted on the multilayer interconnection board. When the semiconductor chips are mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

It is, also, possible to remove the high rigidity plate from the multilayer interconnection board after the heat spreader has been adhered through the heat conductive adhesive layer to the semiconductor chips mounted on the multilayer interconnection board and before the solder balls are formed. When the semiconductor chips are mounted on the multilayer interconnection board and then the heat spreader are then adhered through the heat conductive adhesive layer to the semiconductor chips mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

Furthermore, in the end user's side, the above flip-chip semiconductor device 32 is mounted through the solder balls 13 to a circuit board which is not illustrated. The solder balls 13 have a small stand-off height which is insufficient for relaxation of the stress applied between the above flip-chip semiconductor device 32 and the circuit board. The buffer layer 4 is formed on the external electrode pads 17 of the multilayer interconnection board 3. Solder balls 13 are formed on the bottom surface of the buffer layer 4. The buffer layer 4 comprises plurality of metal buffer layers 11 which are in contact with the external electrode pads 17. The buffer layer 4 is thus provided between the external electrode pads 17 of the multilayer interconnection board 3 and the solder balls 13. The buffer layer 4 comprising plural metal buffer layers 11 has a sufficient stand-off height for relaxing the stress applied between the flip-chip semiconductor device 32 and the circuit board not illustrated due to a difference in thermal expansion coefficient between the flip-chip semiconductor device 32 and the circuit board. The buffer layer 4 further contributes to suppress the multilayer interconnection board 3 from being bent. Further, the supporting frame 25 is provided which extends on a peripheral region of the bottom surface of the multilayer interconnection board 3. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13.

The stress is likely to be concentrated to joint parts between the plural metal buffer layers 11 of the buffer layer 4 and the external electrode pads 17 of the multilayer interconnection board 3. Other novel technique for solving this disadvantage will be provided in the following fifth embodiment.

Fifth Embodiment

A fifth embodiment according to the present invention will be described in detail with reference to the drawings. A difference of the fifth embodiment from the fourth embodiment is in that the buffer layer comprises the plural metal layers and stress absorption layers which are provided between solder balls and external electrode pads for allowing relaxation to stress applied between the flip-chip semiconductor device and the circuit board. In the end user's side, the flip-chip semiconductor device is mounted through the solder balls to the circuit board which is not illustrated. The solder balls have a small stand-off height which is insufficient for relaxation of the stress applied between the flip-chip semiconductor device and the circuit board. The buffer layer as a first substrate layer is provided between the solder balls and the external electrode pads for relaxation of the stress applied between the flip-chip semiconductor device and the circuit board.

Figure 12:
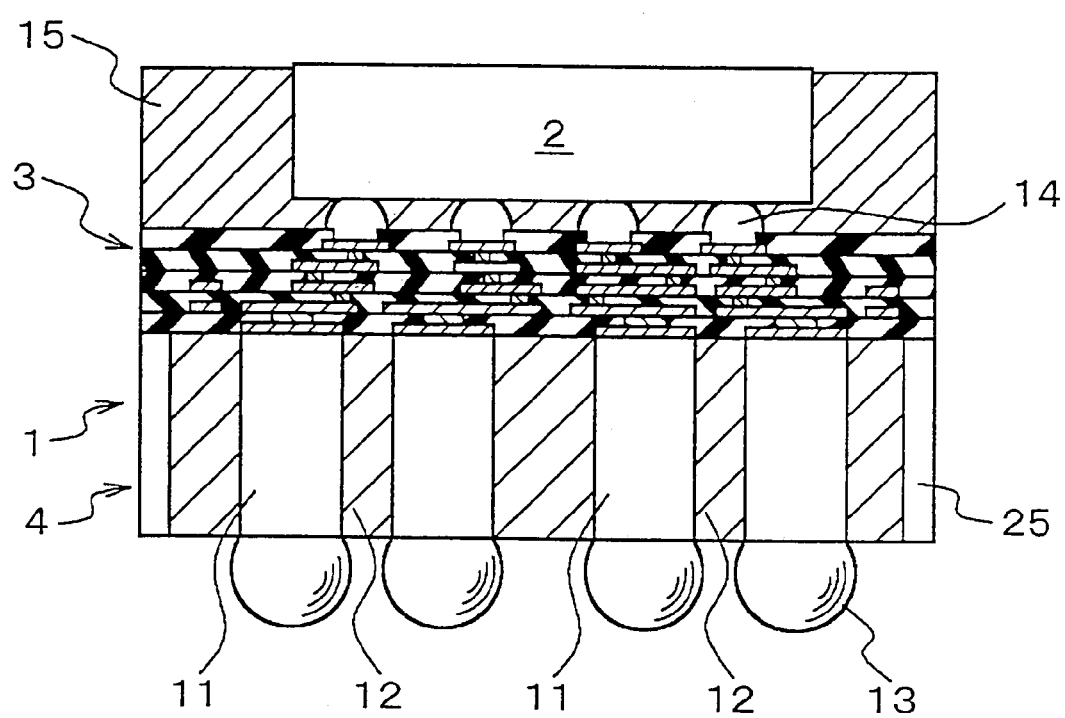
FIG. 12 is a cross sectional elevation view illustrative of a semiconductor device having a multilayer interconnection board, on which a semiconductor chip is mounted in a fifth embodiment according to the present invention.

FIG. 12 is a cross sectional elevation view illustrative of a semiconductor device having a multilayer interconnection board, on which a semiconductor chip is mounted in a fifth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17 on which a buffer layer 4 is formed. Solder balls 13 are formed on a bottom surface of the buffer layer 4. The buffer layer 4 comprises plural metal buffer layers 11 which are in contact with the external electrode pads 17 and a stress absorption layer 12 in gaps between the plural metal buffer layers 11. The buffer layer 4 is thus provided between the external electrode pads 17 of the multilayer interconnection board 3 and the solder balls 13. The buffer layer 4 comprising plural metal buffer layers 11 and the stress absorption layer 12 has a sufficient stand-off height for relaxing the stress applied between the flip-chip semiconductor device 32 and the circuit board not illustrated. Further, a supporting frame 25 is provided which extends on a peripheral region of the bottom surface of the multilayer interconnection board 3. The stress absorption layer 12 is provided on the bottom surface of the multilayer interconnection board 3 except under the external electrode pads 17 and the peripheral region of the multilayer interconnection board 3. The stress absorption layer 12 is also provided between the plural metal buffer layers 11 and the supporting frame 25. The stress absorption layer 12 has a multilayer structure which has physical properties absorbing stresses and strains. The stress absorption layer 12 may be made of a silicone resin material. Organic materials such as epoxy based resins, silicone based resins, polyolefin based resins, cyanate ester based resins, phenol based resins, naphthalene based resins are also available for the stress absorption layer 12. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13. A sealing resin material 31 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3.

The buffer layer 4 comprising the plural metal buffer layers 11 and the stress absorption layer 12 has a higher rigidity than the multilayer interconnection board 3, provided that the buffer layer 4 buffers or relaxes the stress applied between the multilayer interconnection board 3 and the circuit board not illustrated.

As a modification, it is possible for increasing the buffering ability of the stress absorption layer 12 to eliminate the supporting frame 25.

The structure of the multilayer interconnection board 3 is the same as in the fourth embodiment and as shown in FIG. 6.

Figure 13:
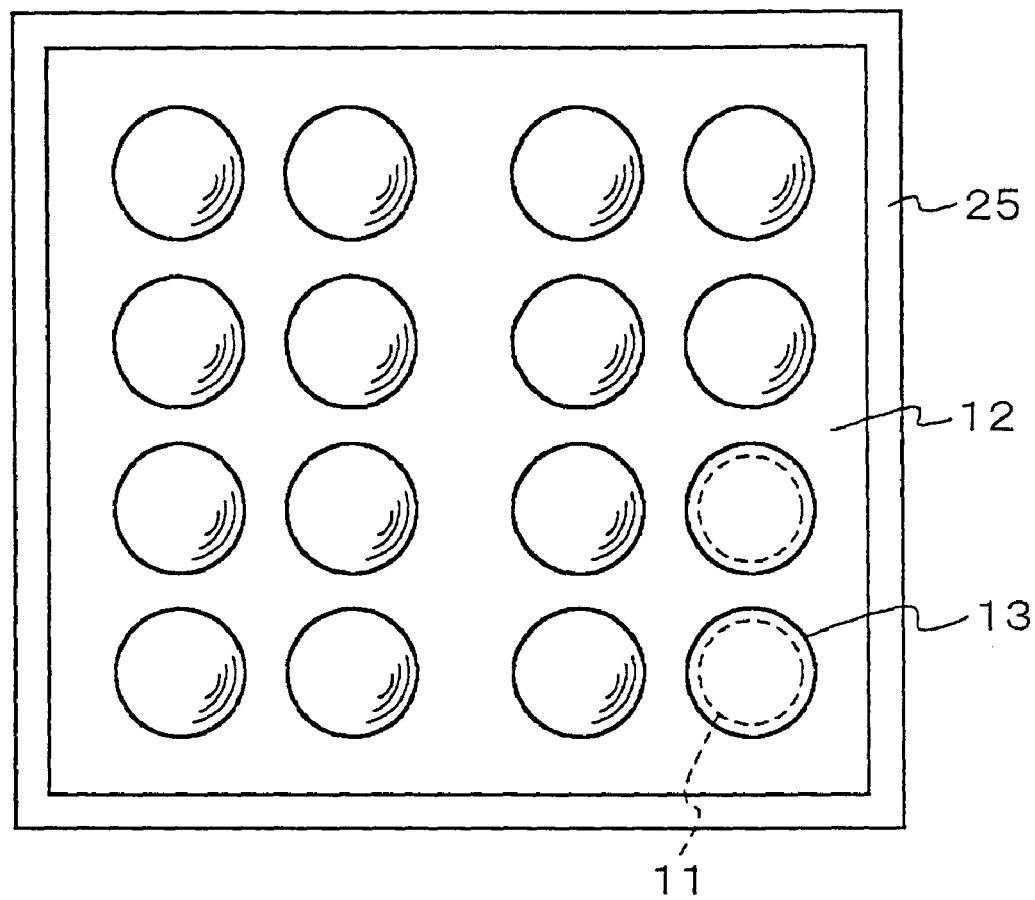
FIG. 13 is a bottom plane view illustrative of a bottom side of the flip-chip semiconductor device shown in FIG. 12.

FIG. 13 is a bottom plane view illustrative of a bottom side of the flip-chip semiconductor device shown in FIG. 12. The solder balls 13 are aligned in matrix over the second surface or the bottom surface of the multilayer interconnection board 3 of the semiconductor device 3. The supporting frame 25 extends on the peripheral region of the multilayer interconnection board 3. The stress absorption layer 12 extends around the plural metal buffer layers 11 and are surrounded by the supporting frame 25. A volume ratio of the plural metal buffer layers 11 to the stress absorption layer 12 and the alignment of the plural metal buffer layers 11 depend upon the specifications of the final product which comprises the semiconductor chip 2, the multilayer interconnection board 3 and the circuit board not illustrated.

Figure 14A:
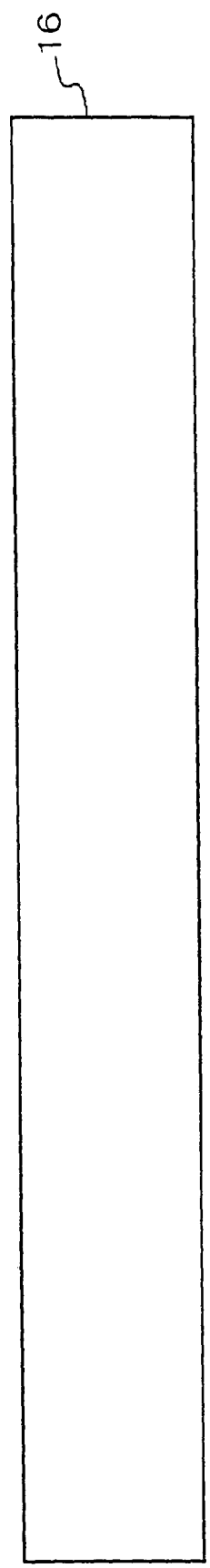
FIGS. 14A through 14S are fragmentary cross sectional elevation views illustrative of a novel method of forming a semiconductor device having a multilayer interconnection board on which a semiconductor chip is mounted in a fifth embodiment in accordance with the present invention.
Figure 14B:
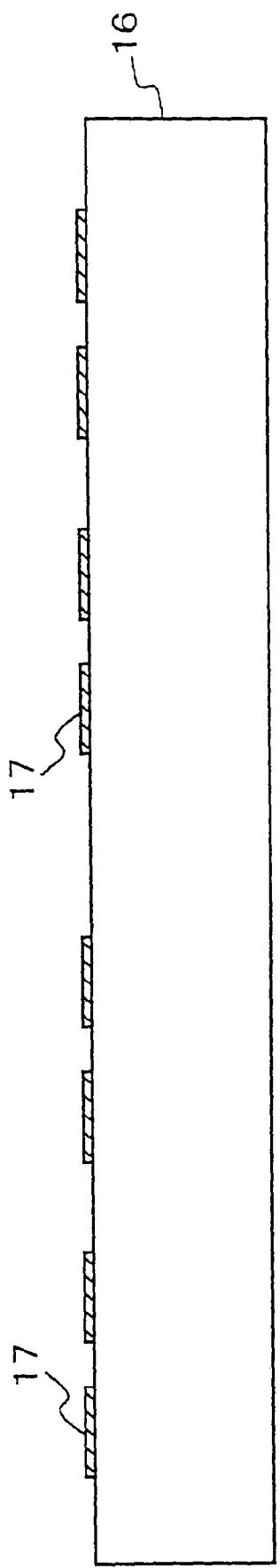
Figure 14C:
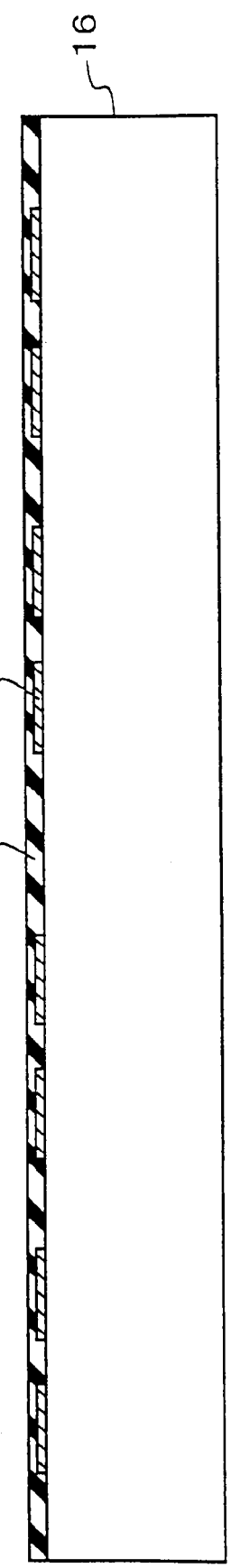
Figure 14D:
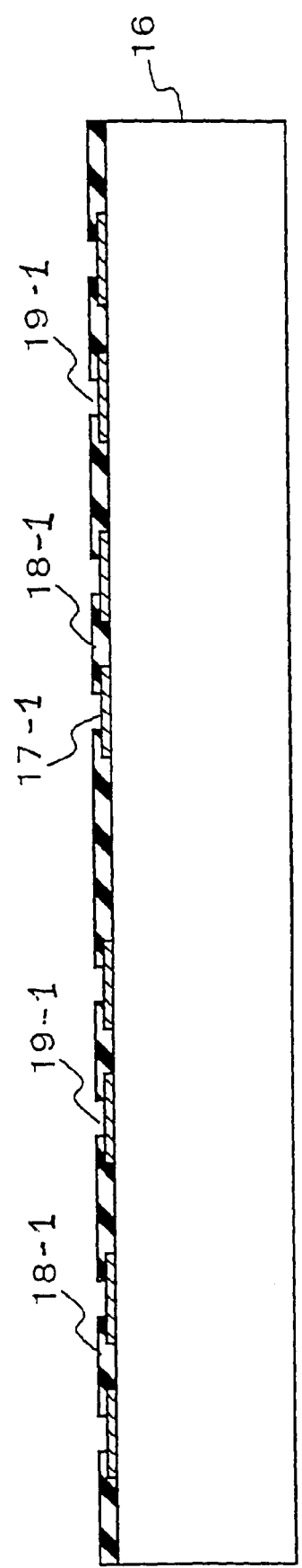
Figure 14E:
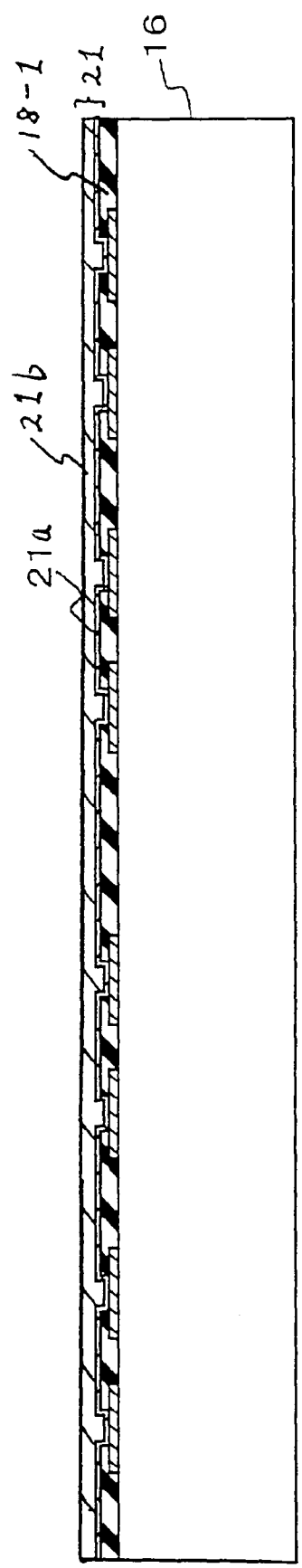
Figure 14F:
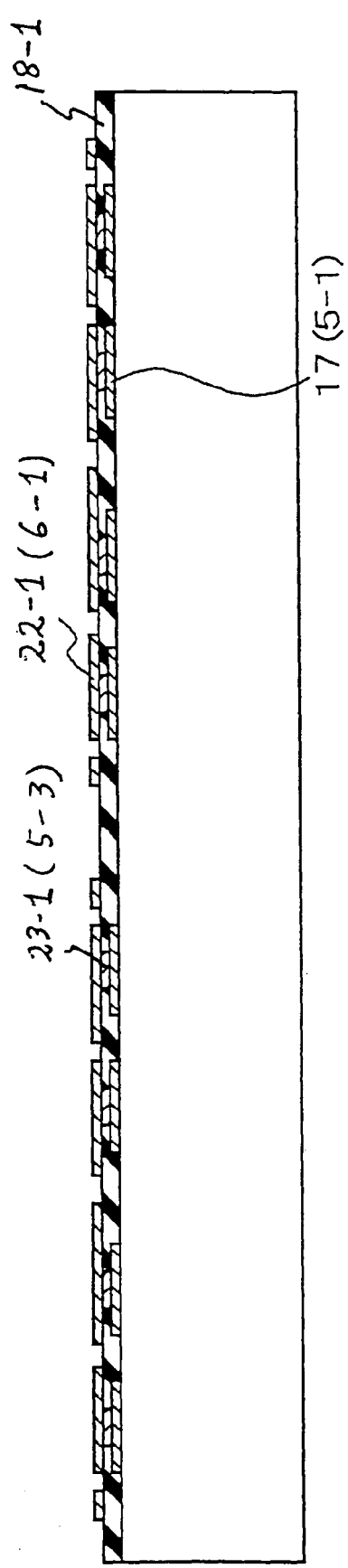
Figure 14G:
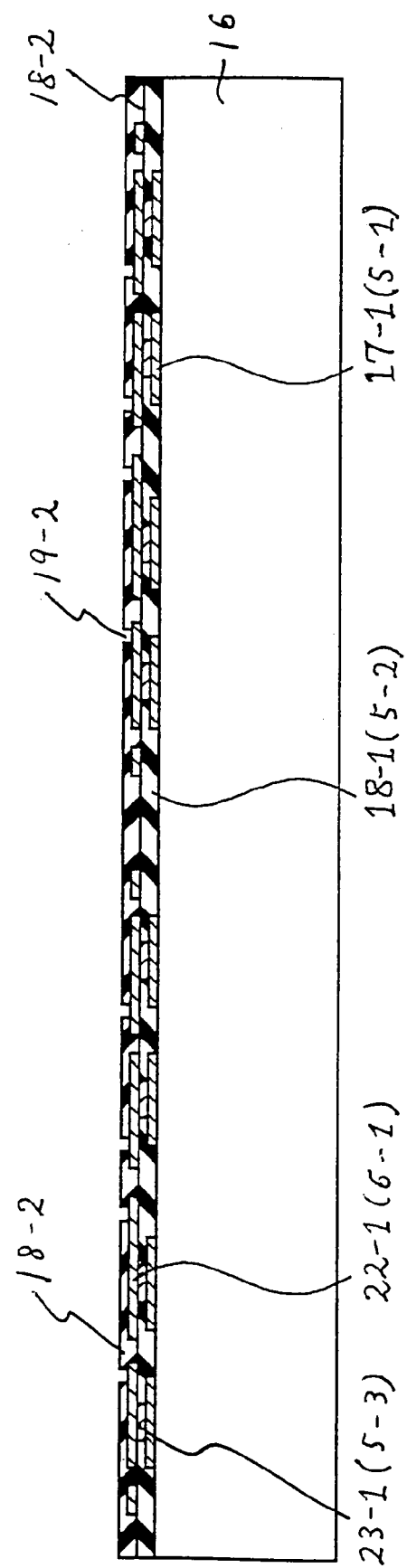
Figure 14H:
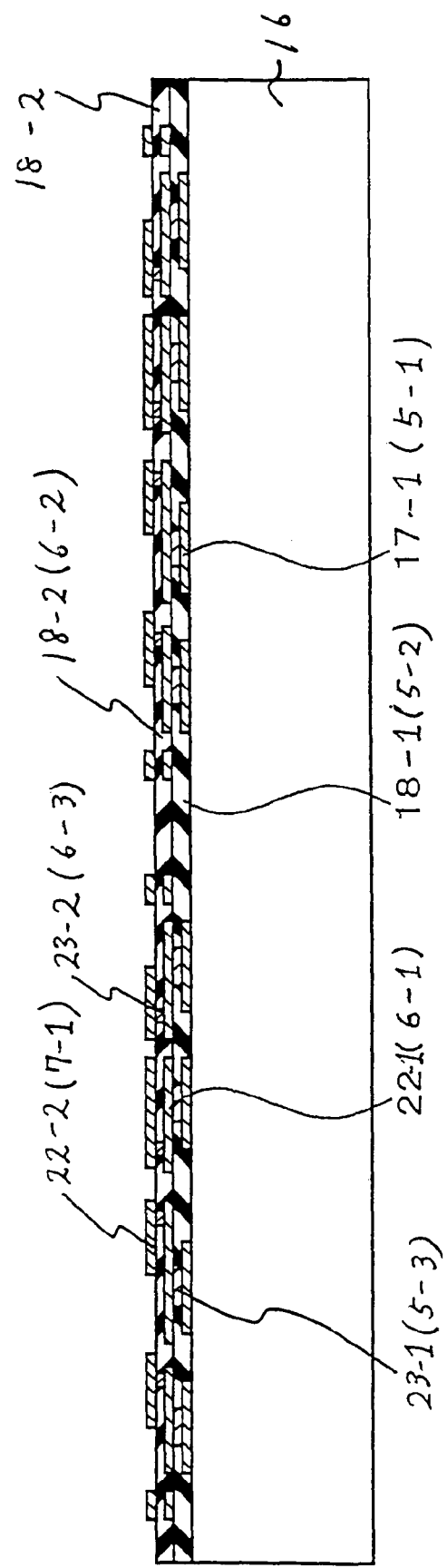
Figure 14I:
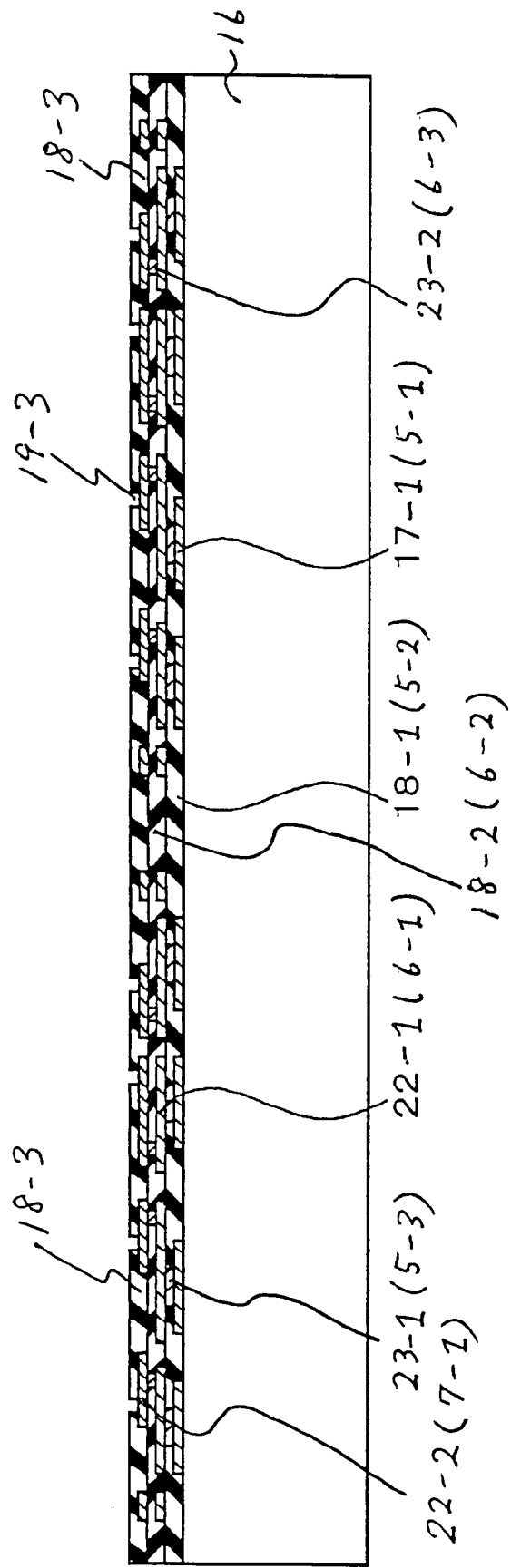
Figure 14J:
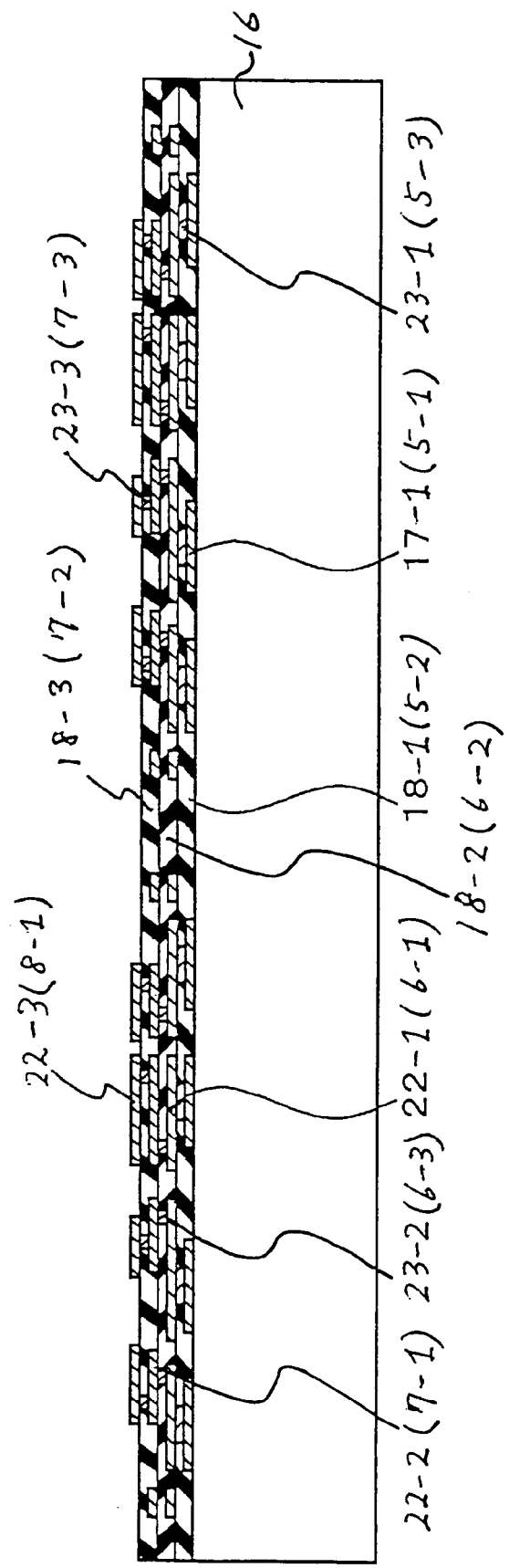
Figure 14K:
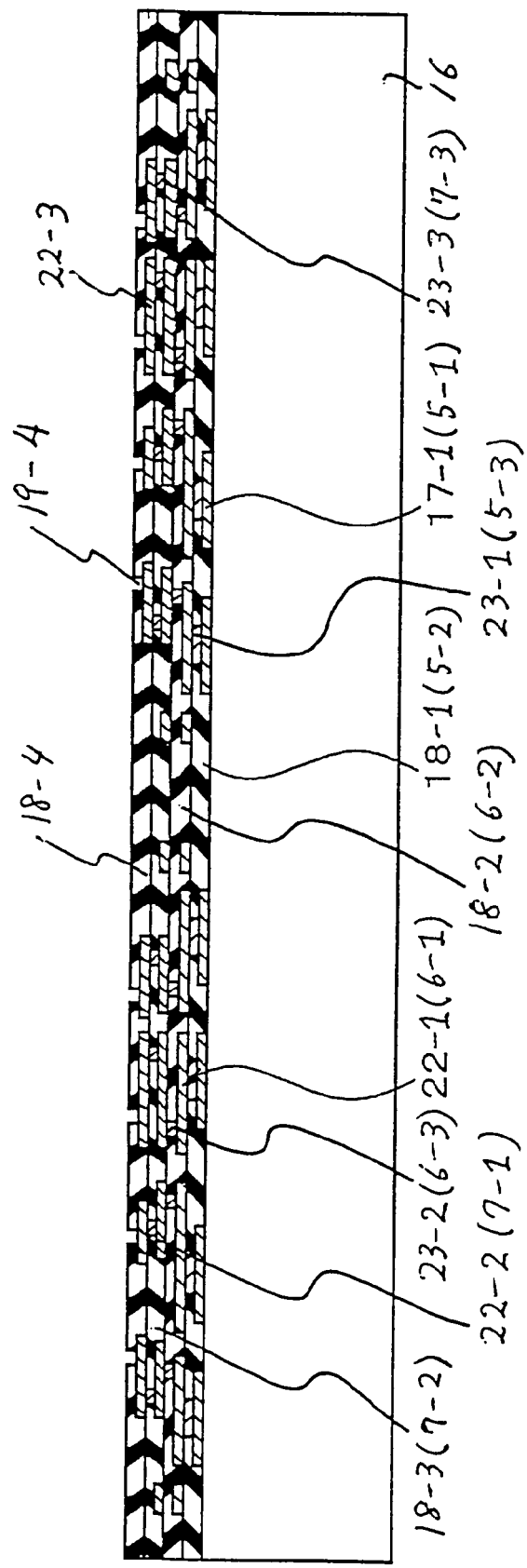
Figure 14L:
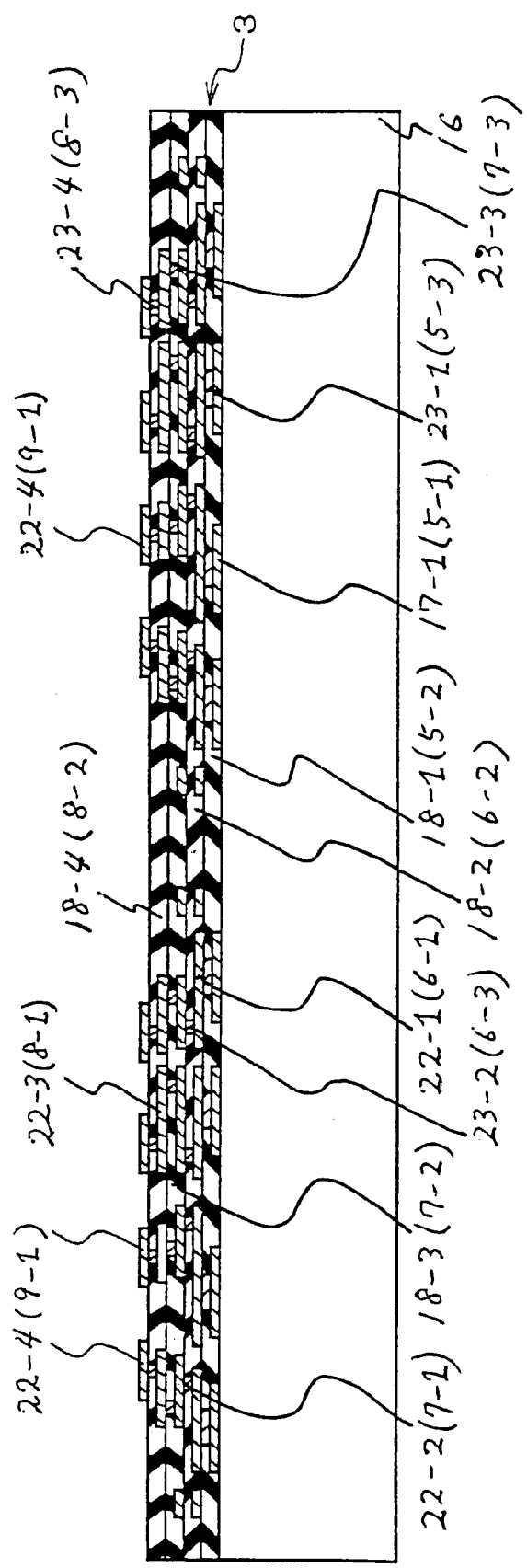
Figure 14M:
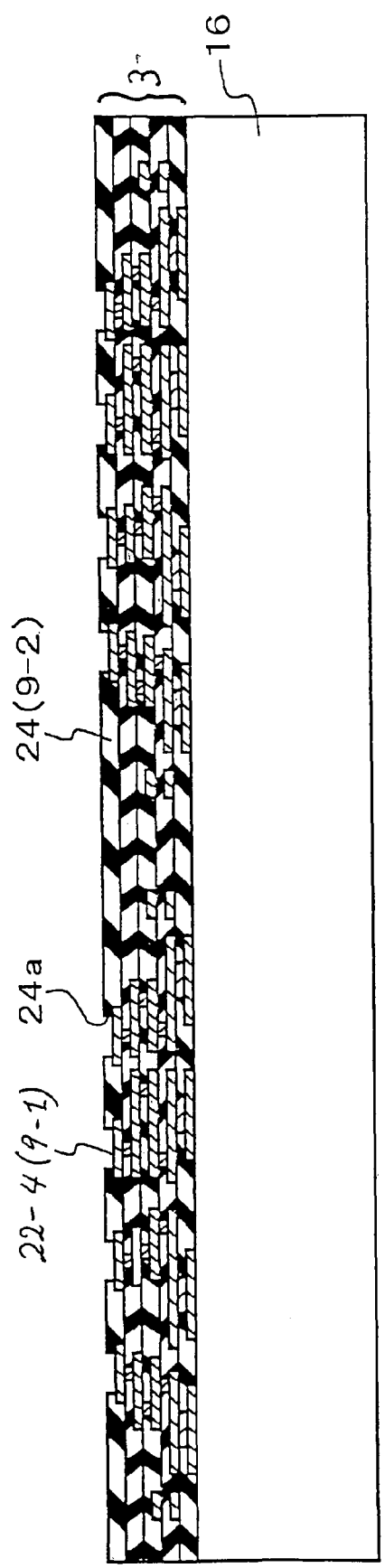
Figure 14N:
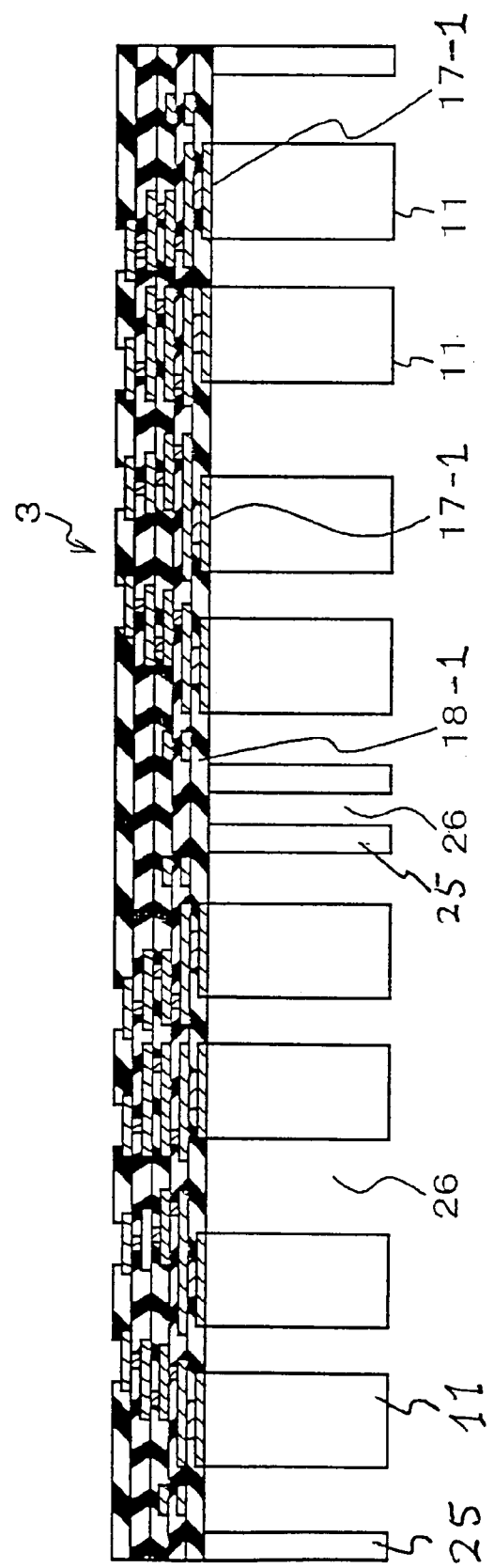
Figure 14O:
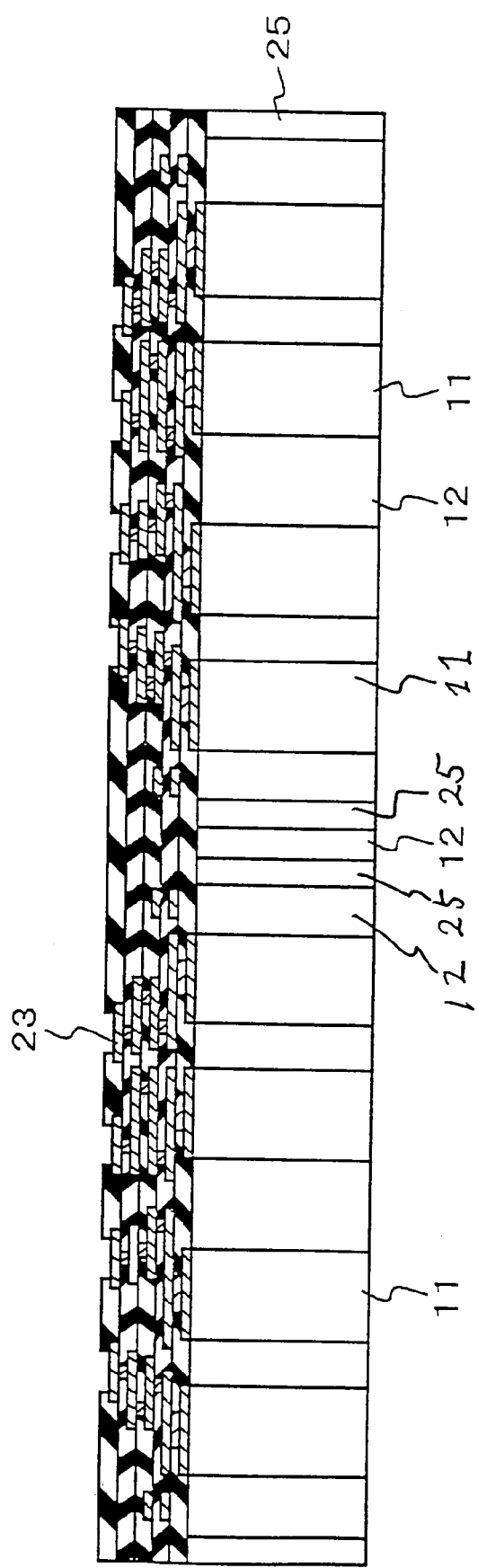
Figure 14P:
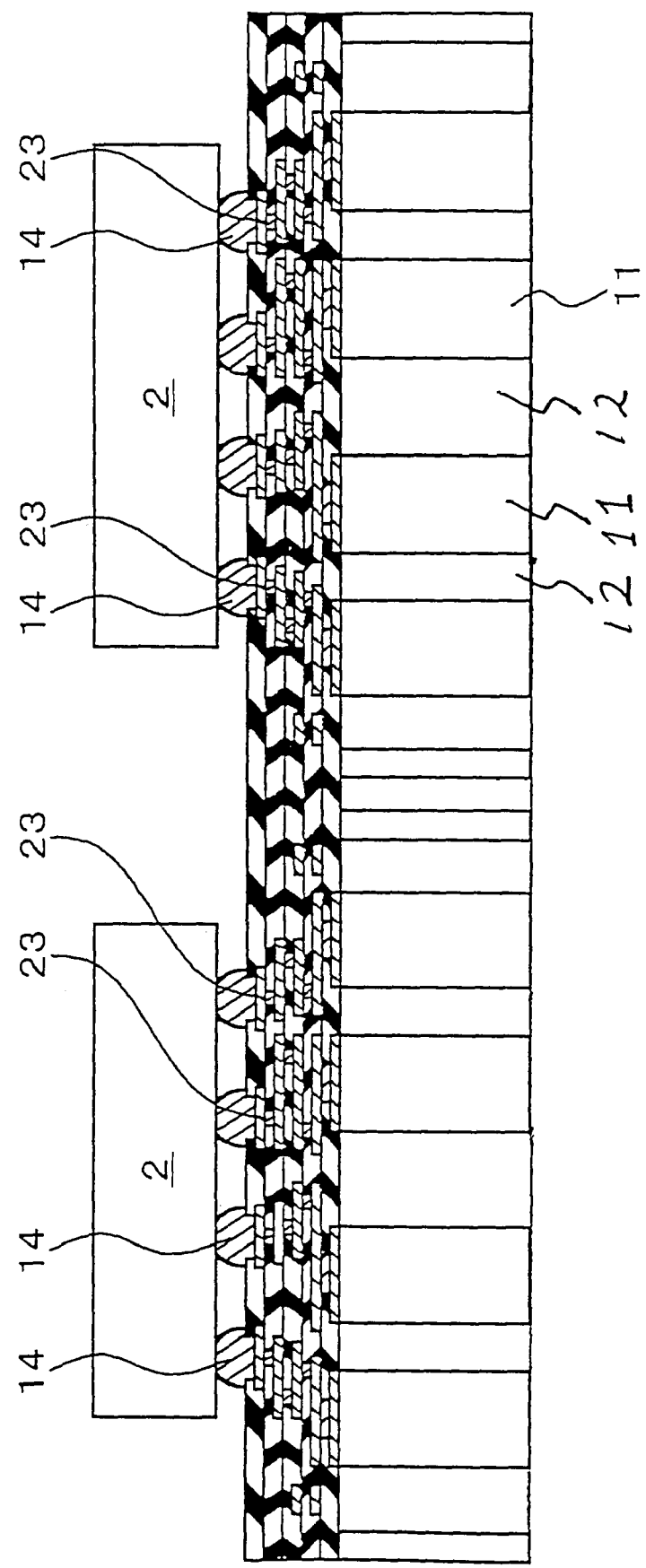
Figure 14Q:
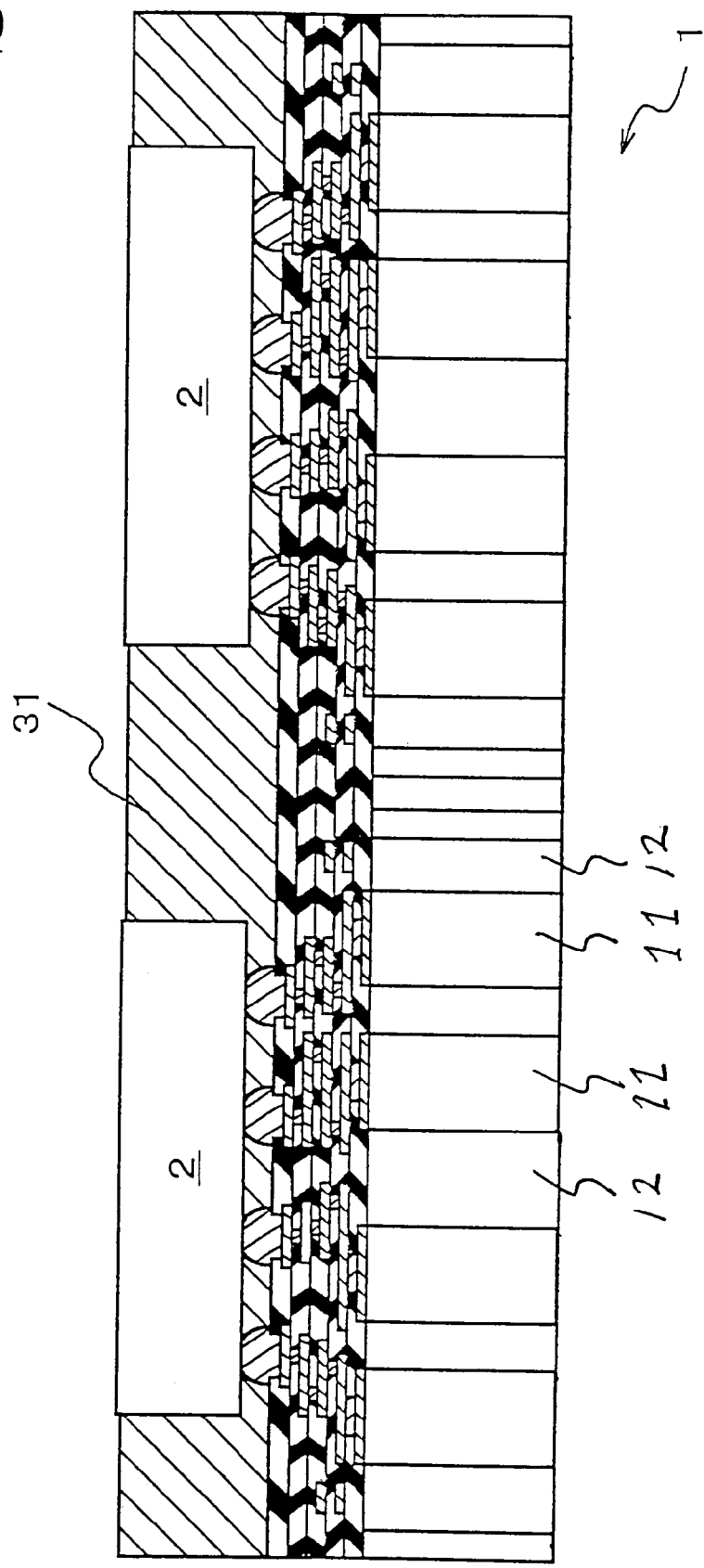
Figure 14R:
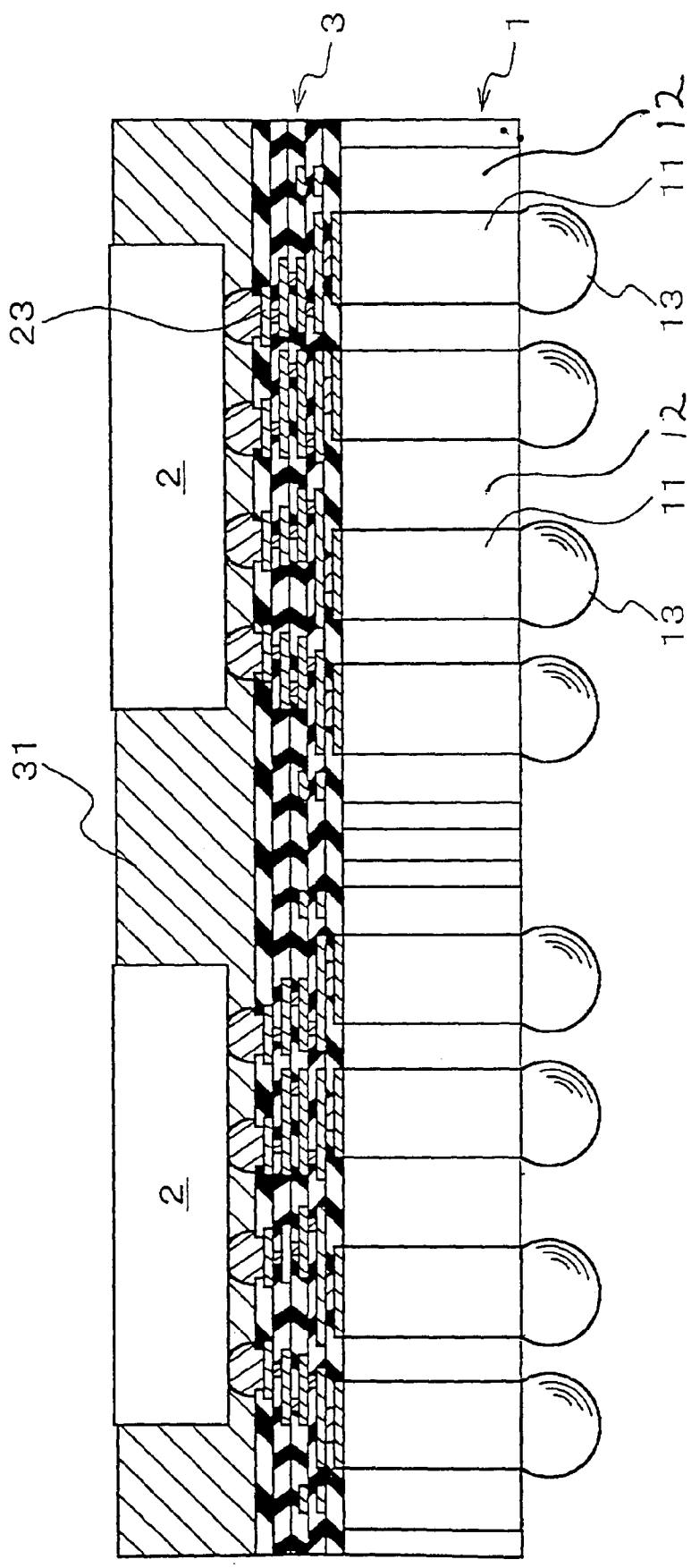
Figure 14S:
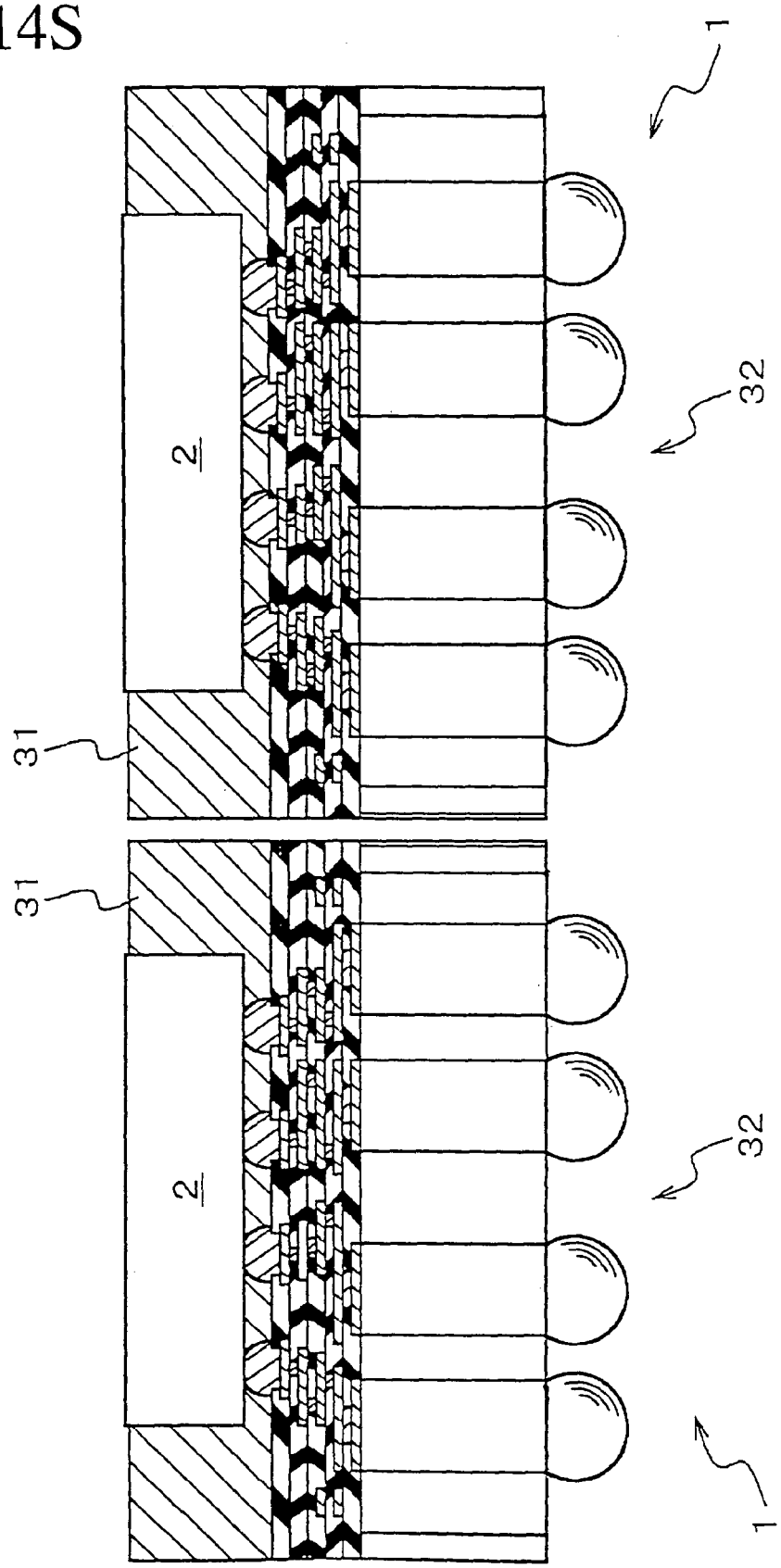

FIGS. 14A through 14S are fragmentary cross sectional elevation views illustrative of a novel method of forming a semiconductor device having a multilayer interconnection board on which a semiconductor chip is mounted in a fifth embodiment in accordance with the present invention.

With reference to FIG. 14A, a high rigidity plate 16 is prepared. The high rigidity plate 16 may be made of any material having a high rigidity. Metals such as Cu-, Ni-, Al-, W, Mo-, Au-, Ag- and Pt-based metals, complex materials of different metals and ceramics are available for the high rigidity plate 16.

With reference to FIG. 14B, an adhesive metal layer of a metal such as a Ti-base alloy, a Cr-base alloy, a Mo-base alloy, and a W-base alloy is formed on a first surface of the high rigidity plate 16 by a sputtering method. An electrode material layer of a metal such as Cu, Al, and Ni is then formed on the adhesive metal layer by a sputtering method to form laminations of the adhesive metal layer and the electrode material layer. A resist film is then applied on the laminations of the adhesive metal layer and the electrode material layer. The resist film is then patterned by an exposure and a subsequent development to form a resist pattern. A selective wet etching process or a selective dry etching process to the laminations of the adhesive metal layer and the electrode material layer is carried out by use of the resist pattern as a mask so as to pattern the laminations of the adhesive metal layer and the electrode material layer, whereby external electrode pads 17-1 are selectively formed on the first surface of the high rigidity plate 16. The used resist pattern is then removed.

If a minimum pitch of the external electrode pads 17-1 is not so narrow, then it is possible as a modification that a resist is coated directly on the first surface of the high rigidity plate 16 and then patterned by an exposure and a development to form a resist pattern before a selective electroplating of metal is then carried out by use of the resist pattern as a mask, followed by removal of the used resist pattern.

With reference to FIG. 14C, an insulative resin thin film 18-1 is then formed over the external electrode pads 17-1 and the first surface of the high rigidity plate 16. The insulative resin thin film 18-1 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-1. If a fine pattern of not more than 1.0 micrometer is required, it is preferable to use the silicon dioxide based inorganic materials for utilizing diffusion processes of semiconductor.

With reference to FIG. 14D, the insulative resin thin film 18-1 is selectively removed to form openings 19-1 in the insulative resin thin film 18-1 and over the external electrode pads 17-1. A resist film is applied on the insulative resin thin film 18-1 and then patterned by an exposure and a subsequent development to form a resist pattern on the insulative resin thin film 18-1. If the insulative resin thin film 18-1 is made of a material which is removable by a chemical etching process, the insulative resin thin film 18-1 selectively removed by a wet etching by use of the resist pattern as a mask to form the openings 19-1 in the insulative resin thin film 18-1. If the insulative resin thin film 18-1 is made of a material which is unremovable by the chemical etching process, the insulative resin thin film 18-1 is selectively removed by a dry etching by use of the resist pattern as a mask to form the openings 19-1 in the insulative resin thin film 18-1. The external electrode pads 17-1 are partially shown through the openings 19-1 formed in the insulative resin thin film 18-1. The used resist pattern is then removed.

With reference to FIG. 14E, an adhesive metal thin film 21a is entirely formed which extends on the surface of the insulative resin thin film 18-1 and the shown parts of the external electrode pads 17-1 by a sputtering method. The adhesive metal thin film 21a may be made of a Ti-based alloy, a Cr-based alloy, a Mo-based alloy, or a W-based alloy. Subsequently, a metal electrode thin film 21b is also entirely formed on the adhesive metal thin film 21a by a sputtering method, a chemical vapor deposition or an electroless plating method. The metal electrode thin film 21b may be made of Cu, Al or Ni. Laminations of the adhesive metal thin film 21a and the metal electrode thin film 21b form a metal thin film 21 which extends on the surface of the insulative resin thin film 18-1 and within the openings 19-1 over the external electrode pads 17-1.

With reference to FIG. 14F, a resist film is entirely formed on the metal thin film 21 and then patterned by an exposure and a subsequent development to form a resist pattern over the metal thin film 21. The metal thin film 21 is then patterned by a wet etching or a dry etching by use of the resist pattern as a mask to form metal thin film contact layers 23-1 in the openings 19-1 and metal thin film interconnection layers 22-1 over the insulative resin thin film 18-1, wherein the metal thin film interconnection layers 22-1 are in contact directly with the metal thin film contact layers 23-1, so that the metal thin film interconnection layers 22-1 are electrically connected through the metal thin film contact layers 23-1 to the external electrode pads 17-1. The used resist mask is then removed. The external electrode pads 17-1 shown in FIG. 14F correspond to the first level interconnection pattern 5-1 of the first interconnection layer 5 shown in FIG. 6. The insulative resin thin film 18-1 shown in FIG. 14F also corresponds to the first level insulating layer 5-2 of the first interconnection layer 5 shown in FIG. 6. The metal thin film contact layers 23-1 shown in FIG. 14F also corresponds to the first level contact layer 5-3 of the first interconnection layer 5. The metal thin film interconnection layers 22-1 shown in FIG. 14F also corresponds to the second level interconnection pattern 6-1 of the second interconnection layer 6.

If the pattern pitch of the metal thin film interconnection layers 22-1 is not so narrow, then it is possible as a modification that after the metal thin film 21 has been formed, then the resist pattern is formed on the metal thin film 21 so that a selective electroplating of metal such as Cu is carried out by use of the resist pattern as a mask to form Cu-plated patterns over the metal thin film 21. The used resist mask is then removed. The metal thin film 21 is then selectively etched by use of the Cu-plated patterns as a mask thereby to form the metal thin film interconnection layers 22-1 over the insulative resin thin film 18-1 and the metal thin film contact layers 23-1 in the openings 19-1.

In accordance with the above described method and its modification, it is possible that the thicknesses of the resist film and the metal thin film interconnection layers 22-1 are not more than 1 micrometers.

With reference to FIG. 14G, an insulative resin thin film 18-2 is then formed over the metal thin film interconnection layers 22-1 and the insulative resin thin film 18-1. The insulative resin thin film 18-2 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-2. If a fine pattern of not more than 1.0 micrometer is required, it is preferable to use the silicon dioxide based inorganic materials for utilizing diffusion processes of semiconductor. The insulative resin thin film 18-2 is selectively removed to form openings 19-2 in the insulative resin thin film 18-2 and over the metal thin film interconnection layers 22-1. A resist film is applied on the insulative resin thin film 18-2 and then patterned by an exposure and a subsequent development to form a resist pattern on the insulative resin thin film 18-2. If the insulative resin thin film 18-2 is made of a material which is removable by a chemical etching process, the insulative resin thin film 18-2 is selectively removed by a wet etching by use of the resist pattern as a mask to form the openings 19-2 in the insulative resin thin film 18-2. If the insulative resin thin film 18-2 is made of a material which is unremovable by the chemical etching process, the insulative resin thin film 18-2 is selectively removed by a dry etching by use of the resist pattern as a mask to form the openings 19-2 in the insulative resin thin film 18-2. The metal thin film interconnection layers 22-1 are partially shown through the openings 19-2 formed in the insulative resin thin film 18-2. The used resist pattern is then removed.

With reference to FIG. 14H, an adhesive metal thin film is entirely formed which extends on the surface of the insulative resin thin film 18-2 and the shown parts of the metal thin film interconnection layers 22-1 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-2 and within the openings 19-2 over the metal thin film interconnection layers 22-1. A resist film is, entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-2 in the openings 19-2 and metal thin film interconnection layers 22-2 over the insulative resin thin film 18-2, wherein the metal thin film interconnection layers 22-2 are in contact directly with the metal thin film contact layers 23-2, so that the metal thin film interconnection layers 22-2 are electrically connected through the metal thin film contact layers 23-2 to the metal thin film interconnection layers 22-1. The used resist mask is then removed. The metal thin film interconnection layers 22-1 shown in FIG. 14H correspond to the second level interconnection pattern 6-1 of the second interconnection layer 6 shown in FIG. 6. The insulative resin thin film 18-2 shown in FIG. 14H also corresponds to the second level insulating layer 6-2 of the second interconnection layer 6 shown in FIG. 6. The metal thin film contact layers 23-2 shown in FIG. 14H also corresponds to the second level contact layer 6-3 of the second interconnection layer 6. The metal thin film interconnection layers 22-2 shown in FIG. 14H also corresponds to the third level interconnection pattern 7-1 of the third interconnection layer 7.

If the pattern pitch of the metal thin film interconnection layers 22-2 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal to thin film. The used resist mask is then removed. The metal thin film is then selectively etched by use of the Cu-plated patterns as a mask thereby to form the metal thin film interconnection layers 22-2 over the insulative resin thin film 18-2 and the metal thin film contact layers 23-2 in the openings 19-2.

In accordance with the above described method and its modification, it is possible that the thicknesses of the resist film and the metal thin film interconnection layers 22-2 are not more than 1 micrometers.

With reference to FIG. 14I, an insulative resin thin film 18-3 is then formed over the metal thin film interconnection layers 22-2 and the insulative resin thin film 18-2. The insulative resin thin film 18-3 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-3. If a fine pattern of not more than 1.0 micrometer is required, it is preferable to use the silicon dioxide based inorganic materials for utilizing diffusion processes of semiconductor. The insulative resin thin film 18-3 is selectively removed to form openings 19-3 in the insulative resin thin film 18-3 and over the metal thin film interconnection layers 22-2. A resist film is applied on the insulative resin thin film 18-3 and then patterned by an exposure and a subsequent development to form a resist pattern on the insulative resin thin film 18-3. If the insulative resin thin film 18-3 is made of a material which is removable by a chemical etching process, the insulative resin thin film 18-3 is selectively removed by a wet etching by use of the resist pattern as a mask to form the openings 19-3 in the insulative resin thin film 18-3. If the insulative resin thin film 18-3 is made of a material which is unremovable by the chemical etching process, the insulative resin thin film 18-3 is selectively removed by a dry etching by use of the resist pattern as a mask to form the openings 19-3 in the insulative resin thin film 18-3. The metal thin film interconnection layers 22-2 are partially shown through the openings 19-3 formed in the insulative resin thin film 18-3. The used resist pattern is then removed.

With reference to FIG. 14J, an adhesive metal thin film is entirely formed which extends on the surface of the insulative resin thin film 18-3 and the shown parts of the metal thin film interconnection layers 22-2 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-3 and within the openings 19-3 over the metal thin film interconnection layers 22-2. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-3 in the openings 19-3 and metal thin film interconnection layers 22-3 over the insulative resin thin film 18-3, wherein the metal thin film interconnection layers 22-3 are in contact directly with the metal thin film contact layers 23-3, so that the metal thin film interconnection layers 22-3 are electrically connected through the metal thin film contact layers 23-3 to the metal thin film interconnection layers 22-2. The used resist mask is then removed. The metal thin film interconnection layers 22-2 shown in FIG. 14J correspond to the third level interconnection pattern 7-1 of the third interconnection layer 7 shown in FIG. 6. The insulative resin thin film 18-3 shown in FIG. 14J also corresponds to the third level insulating layer 7-2 of the third interconnection layer 7 shown in FIG. 6. The metal thin film contact layers 23-3 shown in FIG. 14J also corresponds to the third level contact layer 7-3 of the third interconnection layer 7. The metal thin film interconnection layers 22-3 shown in FIG. 14J also corresponds to the fourth level interconnection pattern 8-1 of the third interconnection layer 8.

If the pattern pitch of the metal thin film interconnection layers 22-3 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-3 over the insulative resin thin film 18-3 and the metal thin film contact layers 23-3 in the openings 19-3.

In accordance with the above described method and its modification, it is possible that the thicknesses of the resist film and the metal thin film interconnection layers 22-3 are not more than 1 micrometers.

With reference to FIG. 14K, an insulative resin thin film 18-4 is then formed over the metal thin film interconnection layers 22-3 and the insulative resin thin film 18-3. The insulative resin thin film 18-4 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-4. If a fine pattern of not more than 1.0 micrometer is required, it is preferable to use the silicon dioxide based inorganic materials for utilizing diffusion processes of semiconductor. The insulative resin thin film 18-4 is selectively removed to form openings 19-4 in the insulative resin thin film 18-4 and over the metal thin film interconnection layers 22-3. A resist film is applied on the insulative resin thin film 18-4 and then patterned by an exposure and a subsequent development to form a resist pattern on the insulative resin thin film 18-4. If the insulative resin thin film 18-4 is made of a material which is removable by a chemical etching process, the insulative resin thin film 18-4 is selectively removed by a wet etching by use of the resist pattern as a mask to form the openings 19-4 in the insulative resin thin film 18-4. If the insulative resin thin film 18-4 is made of a material which is unremovable by the chemical etching process, the insulative resin thin film 18-4 is selectively removed by a dry etching by use of the resist pattern as a mask to form the openings 19-4 in the insulative resin thin film 18-3. The metal thin film interconnection layers 22-3 are partially shown through the openings 19-4 formed in the insulative resin thin film 18-4. The used resist pattern is then removed.

With reference to FIG. 14L, an adhesive metal thin film is entirely formed which extends on the surface of the insulative resin thin film 18-4 and the shown parts of the metal thin film interconnection layers 22-3 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-4 and within the openings 19-4 over the metal thin film interconnection layers 22-3. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-4 in the openings 19-4 and pad electrodes 22-4 over the insulative resin thin film 18-4, wherein the pad electrodes 22-4 are in contact directly with the metal thin film contact layers 23-4, so that the pad electrodes 22-4 are electrically connected through the metal thin film contact layers 23-4 to the metal thin film interconnection layers 22-3. The used resist mask is then removed. The metal thin film interconnection layers 22-3 shown in FIG. 14L correspond to the fourth level interconnection pattern 8-1 of the fourth interconnection layer 8 shown in FIG. 6. The insulative resin thin film 18-4 shown in FIG. 14L also corresponds to the fourth level insulating layer 8-2 of the fourth interconnection layer 8 shown in FIG. 6. The metal thin film contact layers 23-4 shown in FIG. 14L also corresponds to the fourth level contact layer 8-3 of the fourth interconnection layer 8. The pad electrodes 22-4 shown in FIG. 14L also corresponds to the fifth level interconnection pattern 9-1 of the fifth interconnection layer 9.

If the pattern pitch of the pad electrodes 22-4 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the pad electrodes 22-4 over the insulative resin thin film 18-4 and the metal thin film contact layers 23-4 in the openings 19-4.

In accordance with the above described method and its modification, it is possible that the thicknesses of the resist film and the pad electrodes 22-4 are not more than 1 micrometers.

With reference to FIG. 14M, a solder resist film 24 is then formed over the pad electrodes 22-4 and the insulative resin thin film 18-4 in order to protect the multilayer interconnection board 3 having the pad electrodes 24. The solder resist film 24 shown in FIG. 14M corresponds to the fifth level insulating layer 9-2 of the fifth interconnection layer 9 shown in FIG. 6. The solder resist film 24 may comprise an organic insulating film such an epoxy resin film containing an inorganic filler such as fine powders of silicon dioxide. Alternatively, the solder resist film 24 may be made of a material which has a large resistivity to external chemical stress, and a large resistivity to a Flux cleaning solution or an Au plating solution as well as a high adhesiveness to a sealing material such as an under-fill material. If the above first to fourth insulative resin thin films 18-1, 18-2, 18-3 and 18-4 are highly resistive to the chemical and chemical stresses, it is possible as a modification to eliminate the formation of the solder resist film 24. The solder resist film 24 is selectively removed to form openings 24a in the solder resist film 24 and over the pad electrodes 22-4. If the solder resist film 24 is made of a non-photosensitive material, a resist film is applied on the solder resist film 24 and then patterned by an exposure and a subsequent development to form a resist pattern on the solder resist film 24, so that the solder resist film 24 is selectively removed by a wet etching by use of the resist pattern as a mask to form the openings 24a in the solder resist film 24, followed by removal of the used resist pattern. If the solder resist film 24 is made of a photosensitive material, then the solder resist film 24 is directly patterned by an exposure and a subsequent development to form the openings 24a in the solder resist film 24. The electrode pads 22-4 are partially shown through the openings 24a formed in the solder resist film 24.

With reference to FIG. 14N, a resist film is entirely applied on a bottom surface of the high rigidity plate 16 and then patterned by an exposure and a subsequent development to form a resist pattern on the bottom surface of the high rigidity plate 16. The high rigidity plate 16 comprising the metal plate is then selectively etched by use of the resist pattern as a mask so as to form gaps 26 except under the external electrode pads 17-1 and peripheral regions of the unit multilayer interconnection boards to be used for the flip-chip semiconductor device, and thus so as to leave the high rigidity plate 16 under the external electrode pads 17-1 and peripheral regions of the unit multilayer interconnection boards to be used for the flip-chip semiconductor device, whereby plural metal layers 11 are formed on the external electrode pads 17-1 and supporting frames 25 on the peripheral regions of the unit multilayer interconnection boards, wherein the plural metal layers 11 and the supporting frames 25 are defined by gaps 26. The gaps 26 reach the bottom surface of the multilayer interconnection board 3 so that the plural metal layers 11 and the supporting frames 25 are completely separated by the gaps 26. Each of the plural metal layers 11 is in the form of column or pillar.

If the thickness of the high rigidity plate 16 comprising the metal plate is thick, for example in the range of 500 micrometers to 3 millimeters, it is difficult to realize a highly accurate selective etching by use of the resist pattern because the necessary time for etching the high rigidity plate 16 comprising the metal plate is so long as possibly causing that a part of the resist pattern is etched during the etching process. For this reason, if the thickness of the high rigidity plate 16 comprising the metal plate is thick, for example in the range of 500 micrometers to 3 millimeters, then it is preferable that the high rigidity plate 16 comprising the metal plate is first selectively etched by a depth in the range of more than a half of the thickness of the high rigidity plate 16 to less than the thickness of the high rigidity plate 16 by a laser beam machining, an electric discharge machining or a selective cutting, whereby plural columns 11a are formed under the external electrode pads 17-1 and plural columns 25a under the peripheral regions of the unit multilayer interconnection boards, wherein the plural columns 11a and the plural columns 25a are defined by gaps 26a. The gaps 26a do not reach the bottom surface of the multilayer interconnection board 3 so that the plural columns 11a and the columns 25a are partially separated by the gaps 26a. Subsequently, an etching process is then carried out by use of the resist pattern as a mask so as to increase the depth of the gaps 26a so that the gaps 26 reach the bottom surface of the multilayer interconnection board 3 except under the external electrode pads 17-1 and peripheral regions of the unit multilayer interconnection boards to be used for the flip-chip semiconductor device, and thus so as to leave the high rigidity plate 16 under the external electrode pads 17-1 and peripheral regions of the unit multilayer interconnection boards to be used for the flip-chip semiconductor device, whereby plural metal layers 11 are formed on the external electrode pads 17-1 and supporting frames 25 on the peripheral regions of the unit multilayer interconnection boards, wherein the plural metal layers 11 and the supporting frames 25 are defined by gaps 26. The gaps 26 reach the bottom surface of the multilayer interconnection board 3 so that the plural metal layers 11 and the supporting frames 25 are completely separated by the gaps 26. Each of the plural metal layers 11 is in the form of column or pillar.

With reference to FIG. 14O, an insulative stress absorption resin is provided to completely fill the gaps 26 between the plural metal layers 11 and the supporting frames 25 to form stress absorption layers 12 between the plural metal layers 11 and the supporting frames 25. The stress absorption layers 12 protects the plural metal layers 11 and the multilayer interconnection board 3 from mechanical and chemical stresses. The insulative stress absorption resin is provided to completely fill the gaps 26 by a spin coating method or a transfer sealing technique. If the bottom surfaces of the plural metal layers 11 are coated with the insulative stress absorption resin, then the insulative stress absorption resin coating the bottom surfaces of the plural metal layers 11 are removed, for example by a chemical mechanical polishing method or any available removal method, so that the bottom surfaces of the plural metal layers 11 are shown. The plural metal layers 11 of the buffer layer 4 are then subjected to an electroless plating for plating laminated Ni and Au layers or laminated Zn, Ni and Au layers on the plural metal layers 11 and the pad electrodes 22-4 in order to improve a bonding property between the plural metal layers 11 and also a bonding property between the pad electrodes 22-4 and the bumps 14 of the semiconductor chip 2. As a result, the multilayer interconnection board 3 is completed, which comprises plural unit multilayer interconnection boards.

With reference to FIG. 14P, semiconductor chips 2 are mounted on the multilayer interconnection board 3, wherein the semiconductor chips 2 have the plural bumps 14, and the plural bumps 14 are made into contact with the electrode pads 22-4 of the multilayer interconnection board 3, so that the semiconductor chips 2 are electrically connected through the plural bumps 14 to the multilayer interconnection board 3. If the bumps 14 are made of a metal based solder material such as Sn or Pb, a flip-chip bonding utilizing a heat re-flow process using Flux is available for bonding the plural bumps 14 to the electrode pads 22-4 of the multilayer interconnection board 3. If the bumps 14 are made of a metal based solder material such as Au or In, a flip-chip bonding utilizing a thermo-compression bonding is available for bonding the plural bumps 14 to the electrode pads 22-4 of the multilayer interconnection board 3.

With reference to FIG. 14Q, an insulative resin material 31 is formed which coats side walls of the semiconductor chips 2, an inter-space between the semiconductor chips 2 and the multilayer interconnection board 3 around the bumps 14 and the surface of the solder resist film 24 of the multilayer interconnection board 3 in order to protect the semiconductor chips 2, the bumps 14 and the multilayer interconnection board 3. This coating process is carried out by use of a resin injection technique involving a vacuum sealing technique or a transfer sealing technique. The insulative resin material 31 may be made of one of epoxy resin materials, silicone resin materials, polyimide resin materials, polyolefin resin materials, cyanate ester resin materials, phenol resin materials and naphthalene resin materials.

With reference to FIG. 14R, solder balls 13 are formed which are in contact directly with the bottoms of the plural metal layers 11 of the buffer layer 4 to form a semiconductor device 1 having the multilayer interconnection board 3 and the plural semiconductor chips 2 mounted thereon. The solder balls 13 serve as external terminals. The solder balls 13 may be made of a metal based material such as Sn or Pb. The solder balls 13 may also be free of lead. The solder balls 13 may be made of an electrically conductive material having a low melting point, a high heat conductivity and a rapid solidity as well as a large surface tension so that the electrically conductive material becomes in the form of balls. Since the plural metal layers 11 of the buffer layer 4 are electrically conductive, the external electrode pads 17-1 and the solder balls 13 are eclectically connected through the plural metal layers 11 of the buffer layer 4.

With reference to FIG. 14S, the semiconductor device 1 is then diced by use of a dicing blade to divide the semiconductor device 1 into plural unit semiconductor devices 32 or flip-chip semiconductor devices 32, each of which comprises the multilayer interconnection board 3 and the single semiconductor chip 2 mounted thereon.

The flip-chip is usually applied to a high speed logic device having a large number of pins, for which reason the heat radiation from the semiconductor chip 2 is important. In this embodiment, the heat spreader 42 is provided to improve the heat radiation characteristic of the flip-chip semiconductor device 32.

In accordant with the present invention, the base material of the multilayer interconnection board is not largely different in thermal expansion coefficient from the semiconductor chip to reduce a stress applied between the multilayer interconnection board and the semiconductor chip, thereby keeping a high reliability in connection between the multilayer interconnection board and the semiconductor chip. The reduction in stress applied between the multilayer interconnection board and the semiconductor chip makes it unnecessary to increase the thicknesses of the multilevel interconnections 17-1, 2-1, 22-2, 22-3 and 24 for stress relaxation, but makes it possible that the thicknesses of the multilevel interconnections 17-1, 2-1, 22-2, 22-3 and 24 are thin, for example, not more than 1 micrometer. A metallization technique for the semiconductor wafer and an apparatus therefor are utilized for allowing the resist films and the multilevel interconnections 17-1, 2-1, 22-2, 22-3 and 24 to be patterned finely, thereby permitting a further shrinkage of the interconnection patterns.

Further, the multilayer interconnection board remains adhered or fixed to the high rigidity plate such as the metal plate during when the multilayer interconnection board is formed, so that the high rigidity plate provides or ensures a high planarity to the multilayer interconnection board. Even the high rigidity plate is different in linear expansion coefficient from the multilayer interconnection board, the high rigidity plate suppresses generation of internal stress in the multilayer interconnection board and expansion of the multilayer interconnection board, so that the high rigidity plate suppresses the multilayer interconnection board from being bent, whereby the multilayer interconnection board is free from any misalignment in patterning the insulating layers and the interconnection layers, resulting in a high yield of the flip-chip semiconductor device.

As described above, the high rigidity plate is necessary or important for keeping the multilayer interconnection board to have the high planarity until the multilayer interconnection board is completed. Notwithstanding, the high rigidity plate is not necessarily needed to the final product, for example, the flip-chip semiconductor device, for which reason as described above, after the multilayer interconnection board has been completed, then the high rigidity plate is removed. After the high rigidity plate is removed from the bottom surface of the multilayer interconnection board, then the bottom surface of the multilayer interconnection board is shown, for which reason the bottom or first insulating layer of the multilayer interconnection board may preferably be made of an insulating material such as an organic material which has a flexibility to an externally applied stress.

Accordingly, the single multilayer interconnection board is adhered or fixed to the one side of the high rigidity plate to form an asymmetric structure. The high rigidity plate prevents the multilayer interconnection board from being bent during the fabrication of the multilayer interconnection board. If the multilayer interconnection boards are adhered or fixed to both surfaces of the high rigidity plate, then it is necessary to form through holes in the high rigidity plate. In accordance with the present invention, however, it is unnecessary to form such the through holes in the high rigidity plate, whereby there are raised no problem with defect of the final product due to dusts generated in forming the through holes in the high rigidity plate nor problem with increase in the manufacturing cost due to additional process for forming the through holes in the high rigidity plate.

In the above embodiment, the high rigidity plate is removed after the multilayer interconnection board is completed and before the semiconductor chips are mounted on the multilayer interconnection board.

It is, however, possible to remove the high rigidity plate from the multilayer interconnection board after the semiconductor chips have been mounted on the multilayer interconnection board. When the semiconductor chips are mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

It is, also, possible to remove the high rigidity plate from the multilayer interconnection board after the heat spreader has been adhered through the heat conductive adhesive layer to the semiconductor chips mounted on the multilayer interconnection board and before the solder balls are formed. When the semiconductor chips are mounted on the multilayer interconnection board and then the heat spreader are then adhered through the heat conductive adhesive layer to the semiconductor chips mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

Furthermore, in the end user's side, the above flip-chip semiconductor device 32 is mounted through the solder balls 13 to a circuit board which is not illustrated. The solder balls 13 have a small stand-off height which is insufficient for relaxation of the stress applied between the above flip-chip semiconductor device 32 and the circuit board. The buffer layer 4 is formed on the external electrode pads 17 of the multilayer interconnection board 3. Solder balls 13 are formed on the bottom surface of the buffer layer 4. The buffer layer 4 comprises plurality of metal buffer layers 11 which are in contact with the external electrode pads 17. The buffer layer 4 is thus provided between the external electrode pads 17 of the multilayer interconnection board 3 and the solder balls 13. The buffer layer 4 comprising plural metal buffer layers 11 has a sufficient stand-off height for relaxing the stress applied between the flip-chip semiconductor device 32 and the circuit board not illustrated due to a difference in thermal expansion coefficient between the flip-chip semiconductor device 32 and the circuit board. The buffer layer 4 further contributes to suppress the multilayer interconnection board 3 from being bent. Further, the supporting frame 25 is provided which extends on a peripheral region of the bottom surface of the multilayer interconnection board 3. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13.

The stress is likely to be concentrated to joint parts between the plural metal buffer layers 11 of the buffer layer 4 and the external electrode pads 17 of the multilayer interconnection board 3. The buffer layer 4 comprising the plural metal buffer layers 11 and the stress absorption layer 12 has a higher rigidity than the multilayer interconnection board 3, provided that the buffer layer 4 buffers or relaxes the stress concentration between the multilayer interconnection board 3 and the circuit board not illustrated. The stress absorption layers 12 protects the plural metal layers 11 and the multilayer interconnection board 3 from mechanical and chemical stresses.

Sixth Embodiment

A sixth embodiment according to the present invention will be described in detail with reference to the drawings. A difference of the sixth embodiment from the fifth embodiment is in that the heat conductive adhesive layer and the heat spreader are further provided.

Figure 15:
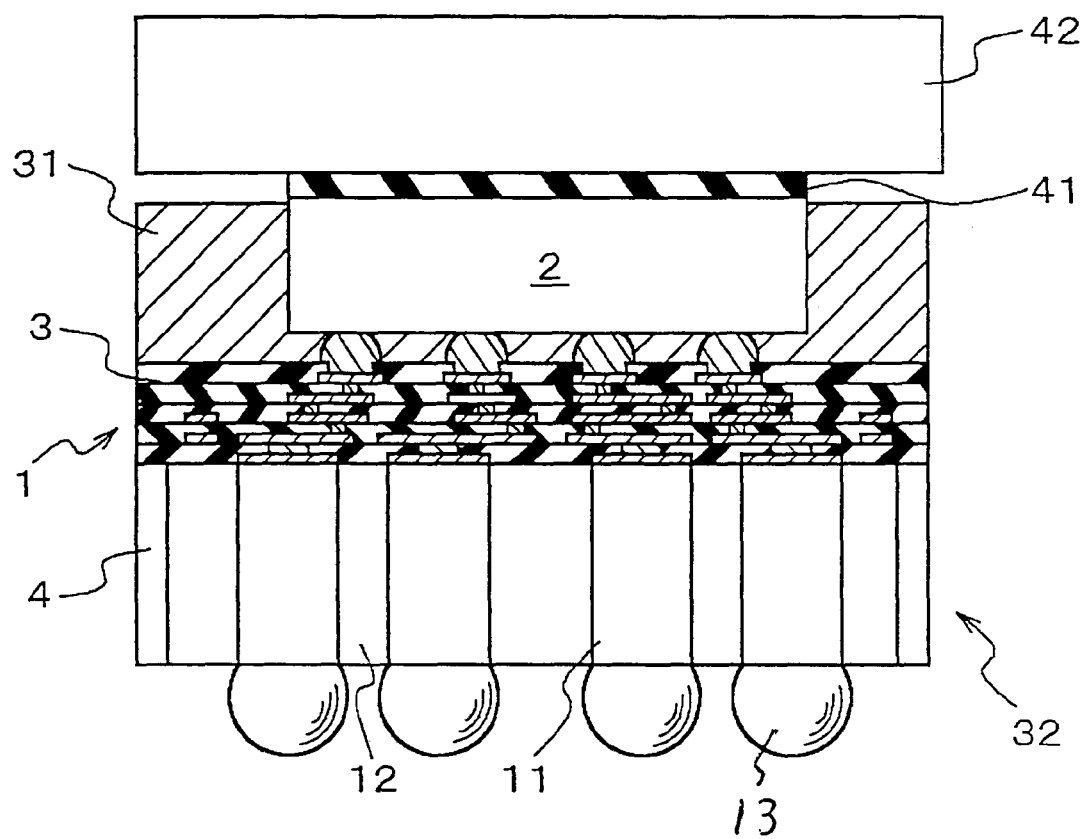
FIG. 15 is a cross sectional elevation view illustrative of a semiconductor device having a multilayer interconnection board, on which a semiconductor chip is mounted in a sixth embodiment according to the present invention.

FIG. 15 is a cross sectional elevation view illustrative of a semiconductor device having a multilayer interconnection board, on which a semiconductor chip is mounted in a sixth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17 on which a buffer layer 4 is formed. Solder balls 13 are formed on a bottom surface of the buffer layer 4. The buffer layer 4 comprises plural metal buffer layers 11 which are in contact with the external electrode pads 17 and a stress absorption layer 12 in gaps between the plural metal buffer layers 11. The buffer layer 4 is thus provided between the external electrode pads 17 of the multilayer interconnection board 3 and the solder balls 13. The buffer layer 4 comprising plural metal buffer layers 11 and the stress absorption layer 12 has a sufficient stand-off height for relaxing the stress applied between the flip-chip semiconductor device 32 and the circuit board not illustrated. Further, a supporting frame 25 is provided which extends on a peripheral region of the bottom surface of the multilayer interconnection board 3. The stress absorption layer 12 is provided on the bottom surface of the multilayer interconnection board 3 except under the external electrode pads 17 and the peripheral region of the multilayer interconnection board 3. The stress absorption layer 12 is also provided between the plural metal buffer layers 11 and the supporting frame 25. The stress absorption layer 12 has a multilayer structure which has physical properties absorbing stresses and strains. The stress absorption layer 12 may be made of a silicone resin material. Organic materials such as epoxy based resins, silicone based resins, polyolefin based resins, cyanate ester based resins, phenol based resins, naphthalene based resins are also available for the stress absorption layer 12. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13. A sealing resin material 31 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. A heat conductive adhesive layer 41 is provided on a top surface of the semiconductor chip 2. A heat spreader 42 is provided on the heat conductive adhesive layer 41 so that the heat spreader 42 is adhered through the heat conductive adhesive layer 41 to the top surface of the semiconductor chip 2. A heat generated in the semiconductor chip 2 is conducted through the heat conductive adhesive layer 41 to the heat spreader 42 for causing a heat radiation from the heat spreader 42. The heat spreader 42 may be made of a heat conductive material such as a metal base material, for example, Cu, Al, W, Mo, Fe, Ni, and Cr, or $Al_2O_3$, AlN, SiC, other ceramics such as mullite. The heat conductive adhesive layer 41 may be made of a resin based material containing a heat conductive material, wherein the resin based material may be one of epoxy resin materials, silicone resin materials, polyimide resin materials, polyolefin resin materials, cyanate ester resin materials, phenol resin materials and naphthalene resin materials, whilst the heat conductive material may be one of Ag, Pd, Cu, Al, Au, Mo, W, diamond, $Al_2O_3$, AlN, and ceramic materials such as mullite, BN and SiC.

The buffer layer 4 comprising the plural metal buffer layers 11 and the stress absorption layer 12 has a higher rigidity than the multilayer interconnection board 3, provided that the buffer layer 4 buffers or relaxes the stress applied between the multilayer interconnection board 3 and the circuit board not illustrated.

As a modification, it is possible for increasing the buffering ability of the stress absorption layer 12 to eliminate the supporting frame 25.

The structure of the multilayer interconnection board 3 is the same as in the fourth embodiment and as shown in FIG. 6.

The flip-chip is usually applied to a high speed logic device having a large number of pins, for which reason the heat radiation from the semiconductor chip 2 is important. In this embodiment, the heat spreader 42 is provided to improve the heat radiation characteristic of the flip-chip semiconductor device 32.

In accordant with the present invention, the base material of the multilayer interconnection board is not largely different in thermal expansion coefficient from the semiconductor chip to reduce a stress applied between the multilayer interconnection board and the semiconductor chip, thereby keeping a high reliability in connection between the multilayer interconnection board and the semiconductor chip. The reduction in stress applied between the multilayer interconnection board and the semiconductor chip makes it unnecessary to increase the thicknesses of the multilevel interconnections 17-1, 2-1, 22-2, 22-3 and 24 for stress relaxation, but makes it possible that the thicknesses of the multilevel interconnections 17-1, 2-1, 22-2, 22-3 and 24 are thin, for example, not more than 1 micrometer. A metallization technique for the semiconductor wafer and an apparatus therefor are utilized for allowing the resist films and the multilevel interconnections 17-1, 2-1, 22-2, 22-3 and 24 to be patterned finely, thereby permitting a further shrinkage of the interconnection patterns.

Further, the multilayer interconnection board remains adhered or fixed to the high rigidity plate such as the metal plate during when the multilayer interconnection board is formed, so that the high rigidity plate provides or ensures a high planarity to the multilayer interconnection board. Even the high rigidity plate is different in linear expansion coefficient from the multilayer interconnection board, the high rigidity plate suppresses generation of internal stress in the multilayer interconnection board and expansion of the multilayer interconnection board, so that the high rigidity plate suppresses the multilayer interconnection board from being bent, whereby the multilayer interconnection board is free from any misalignment in patterning the insulating layers and the interconnection layers, resulting in a high yield of the flip-chip semiconductor device.

As described above, the high rigidity plate is necessary or important for keeping the multilayer interconnection board to have the high planarity until the multilayer interconnection board is completed. Notwithstanding, the high rigidity plate is not necessarily needed to the final product, for example, the flip-chip semiconductor device, for which reason as described above, after the multilayer interconnection board has been completed, then the high rigidity plate is removed. After the high rigidity plate is removed from the bottom surface of the multilayer interconnection board, then the bottom surface of the multilayer interconnection board is shown, for which reason the bottom or first insulating layer of the multilayer interconnection board may preferably be made of an insulating material such as an organic material which has a flexibility to an externally applied stress.

Accordingly, the single multilayer interconnection board is adhered or fixed to the one side of the high rigidity plate to form an asymmetric structure. The high rigidity plate prevents the multilayer interconnection board from being bent during the fabrication of the multilayer interconnection board. If the multilayer interconnection boards are adhered or fixed to both surfaces of the high rigidity plate, then it is necessary to form through holes in the high rigidity plate. In accordance with the present invention, however, it is unnecessary to form such the through holes in the high rigidity plate, whereby there are raised no problem with defect of the final product due to dusts generated in forming the through holes in the high rigidity plate nor problem with increase in the manufacturing cost due to additional process for forming the through holes in the high rigidity plate.

In the above embodiment, the high rigidity plate is removed after the multilayer interconnection board is completed and before the semiconductor chips are mounted on the multilayer interconnection board.

It is, however, possible to remove the high rigidity plate from the multilayer interconnection board after the semiconductor chips have been mounted on the multilayer interconnection board. When the semiconductor chips are mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

It is, also, possible to remove the high rigidity plate from the multilayer interconnection board after the heat spreader has been adhered through the heat conductive adhesive layer to the semiconductor chips mounted on the multilayer interconnection board and before the solder balls are formed. When the semiconductor chips are mounted on the multilayer interconnection board and then the heat spreader are then adhered through the heat conductive adhesive layer to the semiconductor chips mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

Furthermore, in the end user's side, the above flip-chip semiconductor device 32 is mounted through the solder balls 13 to a circuit board which is not illustrated. The solder balls 13 have a small stand-off height which is insufficient for relaxation of the stress applied between the above flip-chip semiconductor device 32 and the circuit board. The buffer layer 4 is formed on the external electrode pads 17 of the multilayer interconnection board 3. Solder balls 13 are formed on the bottom surface of the buffer layer 4. The buffer layer 4 comprises plurality of metal buffer layers 11 which are in contact with the external electrode pads 17. The buffer layer 4 is thus provided between the external electrode pads 17 of the multilayer interconnection board 3 and the solder balls 13. The buffer layer 4 comprising plural metal buffer layers 11 has a sufficient stand-off height for relaxing the stress applied between the flip-chip semiconductor device 32 and the circuit board not illustrated due to a difference in thermal expansion coefficient between the flip-chip semiconductor device 32 and the circuit board. The buffer layer 4 further contributes to suppress the multilayer interconnection board 3 from being bent. Further, the supporting frame 25 is provided which extends on a peripheral region of the bottom surface of the multilayer interconnection board 3. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13.

The stress is likely to be concentrated to joint parts between the plural metal buffer layers 11 of the buffer layer 4 and the external electrode pads 17 of the multilayer interconnection board 3. The buffer layer 4 comprising the plural metal buffer layers 11 and the stress absorption layer 12 has a higher rigidity than the multilayer interconnection board 3, provided that the buffer layer 4 buffers or relaxes the stress concentration between the multilayer interconnection board 3 and the circuit board not illustrated. The stress absorption layers 12 protects the plural metal layers 11 and the multilayer interconnection board 3 from mechanical and chemical stresses.

Seventh Embodiment

A seventh embodiment according to the present invention will be described in detail with reference to the drawings. A difference of the seventh embodiment from the sixth embodiment is in that, in place of the sealing resin material 31, an under-fill resin layer and a stiffener are further provided.

Figure 16:
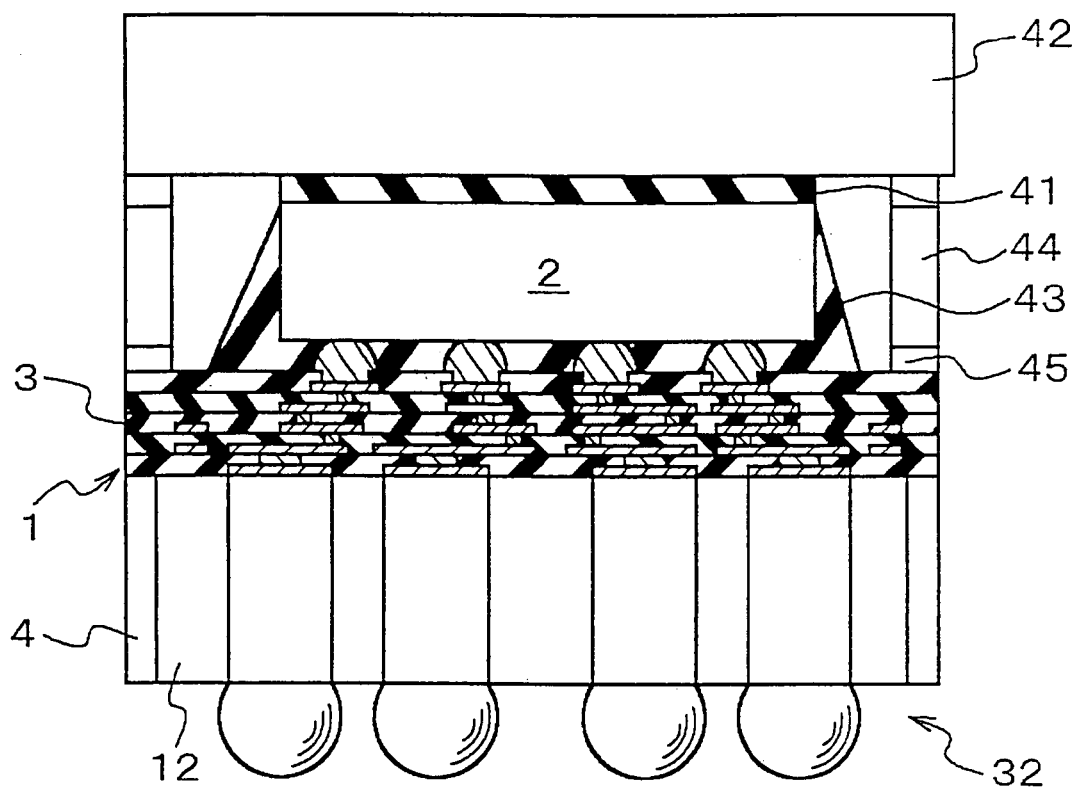
FIG. 16 is a cross sectional elevation view illustrative of a semiconductor device having a multilayer interconnection board, on which a semiconductor chip is mounted in a seventh embodiment according to the present invention.

FIG. 16 is a cross sectional elevation view illustrative of a semiconductor device having a multilayer interconnection board, on which a semiconductor chip is mounted in a seventh embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17 on which a buffer layer 4 is formed. Solder balls 13 are formed on a bottom surface of the buffer layer 4. The buffer layer 4 comprises plural metal buffer layers 11 which are in contact with the external electrode pads 17 and a stress absorption layer 12 in gaps between the plural metal buffer layers 11. The buffer layer 4 is thus provided between the external electrode pads 17 of the multilayer interconnection board 3 and the solder balls 13. The buffer layer 4 comprising plural metal buffer layers 11 and the stress absorption layer 12 has a sufficient stand-off height for relaxing the stress applied between the flip-chip semiconductor device 32 and the circuit board not illustrated. Further, a supporting frame 25 is provided which extends on a peripheral region of the bottom surface of the multilayer interconnection board 3. The stress absorption layer 12 is provided on the bottom surface of the multilayer interconnection board 3 except under the external electrode pads 17 and the peripheral region of the multilayer interconnection board 3. The stress absorption layer 12 is also provided between the plural metal buffer layers 11 and the supporting frame 25. The stress absorption layer 12 has a multilayer structure which has physical properties absorbing stresses and strains. The stress absorption layer 12 may be made of a silicone resin material. Organic materials such as epoxy based resins, silicone based resins, polyolefin based resins, cyanate ester based resins, phenol based resins, naphthalene based resins are also available for the stress absorption layer 12. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13. In place of the sealing resin material, an under-fill resin layer 43 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. The under-fill resin layer 43 may be made of one of epoxy resin materials, silicone resin materials, polyimide resin materials, polyolefin resin materials, cyanate ester resin materials, phenol resin materials and naphthalene resin materials. A heat conductive adhesive layer 41 is provided on a top surface of the semiconductor chip 2. Further, a stiffener 44 is adhered through an adhesive 45 on a peripheral region of the first surface or the upper surface of the multiyear interconnection board. A heat spreader 42 is provided on the heat conductive adhesive layer 41 and on an adhesive applied on the top of the stiffener 44 so that the heat spreader 42 is adhered through the heat conductive adhesive layer 41 to the top surface of the semiconductor chip 2 and also adhered through the adhesive 45 to the stiffener 44. A heat generated in the semiconductor chip 2 is conducted through the heat conductive adhesive layer 41 to the heat spreader 42 for causing a heat radiation from the heat spreader 42. The heat spreader 42 may be made of a heat conductive material such as a metal base material, for example, Cu, Al, W, Mo, Fe, Ni, and Cr, or $Al_2O_3$, AlN, SiC, other ceramics such as mullite. The heat conductive adhesive layer 41 may be made of a resin based material containing a heat conductive material, wherein the resin based material may be one of epoxy resin materials, silicone resin materials, polyimide resin materials, polyolefin resin materials, cyanate ester resin materials, phenol resin materials and naphthalene resin materials, whilst the heat conductive material may be one of Ag, Pd, Cu, Al, Au, Mo, W, diamond, $Al_2O_3$, AlN, and ceramic materials such as mullite, BN and SiC.

In this embodiment, no injection method nor transfer sealing method is used for forming the insulative sealing resin and in place the under-fill resin 43 is used which is the majority technique of the flip-chip semiconductor device. No further specific equipment is needed.

The under-fill resin 43 partially coats the top surface or the first surface of the multilayer interconnection board 3. In order to ensure a sufficiently high planarity of the multilayer interconnection board 3, the stiffener 44 is provided which extends on the peripheral region of the top surface or the first surface of the multilayer interconnection board 3. The stiffener 44 may be made of any metal or any ceramic.

The buffer layer 4 comprising the plural metal buffer layers 11 and the stress absorption layer 12 has a higher rigidity than the multilayer interconnection board 3, provided that the buffer layer 4 buffers or relaxes the stress applied between the multilayer interconnection board 3 and the circuit board not illustrated.

As a modification, it is possible for increasing the buffering ability of the stress absorption layer 12 to eliminate the supporting frame 25.

The structure of the multilayer interconnection board 3 is the same as in the fourth embodiment and as shown in FIG. 6.

The flip-chip is usually applied to a high speed logic device having a large number of pins, for which reason the heat radiation from the semiconductor chip 2 is important. In this embodiment, the heat spreader 42 is provided to improve the heat radiation characteristic of the flip-chip semiconductor device 32.

In accordant with the present invention, the base material of the multilayer interconnection board is not largely different in thermal expansion coefficient from the semiconductor chip to reduce a stress applied between the multilayer interconnection board and the semiconductor chip, thereby keeping a high reliability in connection between the multilayer interconnection board and the semiconductor chip. The reduction in stress applied between the multilayer interconnection board and the semiconductor chip makes it unnecessary to increase the thicknesses of the multilevel interconnections 17-1, 2-1, 22-2, 22-3 and 24 for stress relaxation, but makes it possible that the thicknesses of the multilevel interconnections 17-1, 2-1, 22-2, 22-3 and 24 are thin, for example, not more than 1 micrometer. A metallization technique for the semiconductor wafer and an apparatus therefor are utilized for allowing the resist films and the multilevel interconnections 17-1, 2-1, 22-2, 22-3 and 24 to be patterned finely, thereby permitting a further shrinkage of the interconnection patterns.

Further, the multilayer interconnection board remains adhered or fixed to the high rigidity plate such as the metal plate during when the multilayer interconnection board is formed, so that the high rigidity plate provides or ensures a high planarity to the multilayer interconnection board. Even the high rigidity plate is different in linear expansion coefficient from the multilayer interconnection board, the high rigidity plate suppresses generation of internal stress in the multilayer interconnection board and expansion of the multilayer interconnection board, so that the high rigidity plate suppresses the multilayer interconnection board from being bent, whereby the multilayer interconnection board is free from any misalignment in patterning the insulating layers and the interconnection layers, resulting in a high yield of the flip-chip semiconductor device.

As described above, the high rigidity plate is necessary or important for keeping the multilayer interconnection board to have the high planarity until the multilayer interconnection board is completed. Notwithstanding, the high rigidity plate is not necessarily needed to the final product, for example, the flip-chip semiconductor device, for which reason as described above, after the multilayer interconnection board has been completed, then the high rigidity plate is removed. After the high rigidity plate is removed from the bottom surface of the multilayer interconnection board, then the bottom surface of the multilayer interconnection board is shown, for which reason the bottom or first insulating layer of the multilayer interconnection board may preferably be made of an insulating material such as an organic material which has a flexibility to an externally applied stress.

Accordingly, the single multilayer interconnection board is adhered or fixed to the one side of the high rigidity plate to form an asymmetric structure. The high rigidity plate prevents the multilayer interconnection board from being bent during the fabrication of the multilayer interconnection board. If the multilayer interconnection boards are adhered or fixed to both surfaces of the high rigidity plate, then it is necessary to form through holes in the high rigidity plate. In accordance with the present invention, however, it is unnecessary to form such the through holes in the high rigidity plate, whereby there are raised no problem with defect of the final product due to dusts generated in forming the through holes in the high rigidity plate nor problem with increase in the manufacturing cost due to additional process for forming the through holes in the high rigidity plate.

In the above embodiment, the high rigidity plate is removed after the multilayer interconnection board is completed and before the semiconductor chips are mounted on the multilayer interconnection board.

It is, however, possible to remove the high rigidity plate from the multilayer interconnection board after the semiconductor chips have been mounted on the multilayer interconnection board. When the semiconductor chips are mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

It is, also, possible to remove the high rigidity plate from the multilayer interconnection board after the heat spreader has been adhered through the heat conductive adhesive layer to the semiconductor chips mounted on the multilayer interconnection board and before the solder balls are formed. When the semiconductor chips are mounted on the multilayer interconnection board and then the heat spreader are then adhered through the heat conductive adhesive layer to the semiconductor chips mounted on the multilayer interconnection board, the multilayer interconnection board still remains adhered or fixed to the high rigidity plate, so that in order to ensure or keep the high planarity of the multilayer interconnection board, the high rigidity plate suppresses various strains of the entire or part of the multilayer interconnection board and the semiconductor chips due to mechanical and thermal stresses applied to the multilayer interconnection board and the semiconductor chips.

Furthermore, in the end user's side, the above flip-chip semiconductor device 32 is mounted through the solder balls 13 to a circuit board which is not illustrated. The solder balls 13 have a small stand-off height which is insufficient for relaxation of the stress applied between the above flip-chip semiconductor device 32 and the circuit board. The buffer layer 4 is formed on the external electrode pads 17 of the multilayer interconnection board 3. Solder balls 13 are formed on the bottom surface of the buffer layer 4. The buffer layer 4 comprises plurality of metal buffer layers 11 which are in contact with the external electrode pads 17. The buffer layer 4 is thus provided between the external electrode pads 17 of the multilayer interconnection board 3 and the solder balls 13. The buffer layer 4 comprising plural metal buffer layers 11 has a sufficient stand-off height for relaxing the stress applied between the flip-chip semiconductor device 32 and the circuit board not illustrated due to a difference in thermal expansion coefficient between the flip-chip semiconductor device 32 and the circuit board. The buffer layer 4 further contributes to suppress the multilayer interconnection board 3 from being bent. Further, the supporting frame 25 is provided which extends on a peripheral region of the bottom surface of the multilayer interconnection board 3. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13.

The stress is likely to be concentrated to joint parts between the plural metal buffer layers 11 of the buffer layer 4 and the external electrode pads 17 of the multilayer interconnection board 3. The buffer layer 4 comprising the plural metal buffer layers 11 and the stress absorption layer 12 has a higher rigidity than the multilayer interconnection board 3, provided that the buffer layer 4 buffers or relaxes the stress concentration between the multilayer interconnection board 3 and the circuit board not illustrated. The stress absorption layers 12 protects the plural metal layers 11 and the multilayer interconnection board 3 from mechanical and chemical stresses.

Eighth Embodiment

Figure 17:
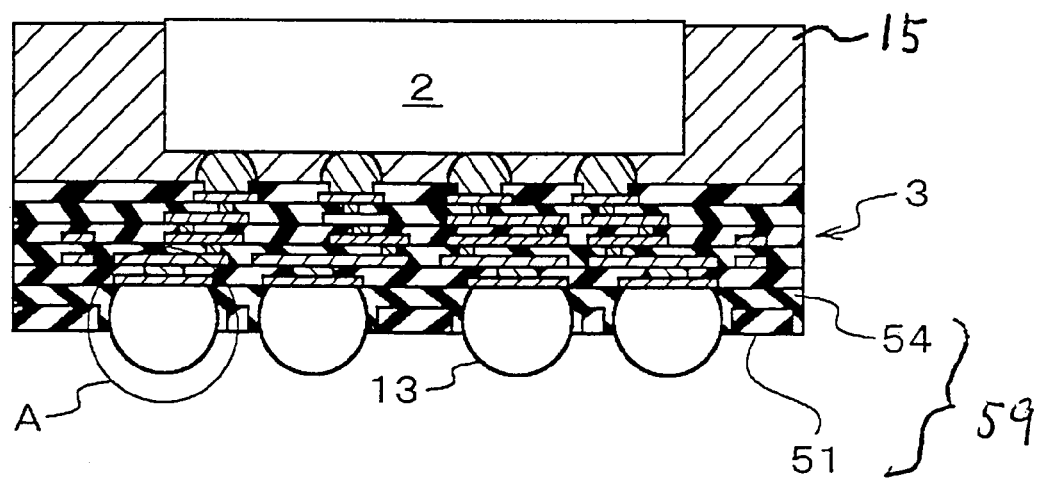
FIG. 17 is a cross sectional elevation view illustrative of a semiconductor device having a multilayer interconnection board, on which a semiconductor chip is mounted in an eighth embodiment according to the present invention.

An eighth embodiment according to the present invention will be described in detail with reference to the drawings. A difference in the eighth embodiment from the first embodiment is in that a supporting layer is provided, surrounding each of the solder balls for supporting the solder balls to increase a bonding strength between the solder balls and external electrode pads of the multilayer interconnection board. FIG. 17 is a cross sectional elevation view illustrative of a semiconductor device having a multilayer interconnection board, on which a semiconductor chip is mounted in an eighth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17 on which solder balls 13 are formed. A sealing resin material 15 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. In this embodiment, in order to increase a bonding strength between the solder balls 13 and the external electrode pads 17 of the multilayer interconnection board 3, a supporting layer 59 is provided on the second surface or the bottom surface of the multilayer interconnection board 3 so that the supporting layer 59 surrounds the solder balls 13 for supporting the solder balls 13 to increase the bonding stability between the solder balls 13 and the external electrode pads 17 of the multilayer interconnection board 3. The supporting layer 59 comprises a supporting plate 51 and a supporting sealing resin material 54. The supporting plate 51 extends in parallel to the second surface or the bottom surface of the multilayer interconnection board 3, wherein the supporting plate 51 has an array of solder ball insertion holes 52 having a diameter which is slightly larger than a diameter of the solder balls 13, so that the solder balls 13 are inserted in the solder ball insertion holes 52 and surrounded by the supporting plate 51. The supporting plate 51 is so provided as to form an inter-space between the supporting plate 51 and the bottom surface or the second surface of the multilayer interconnection board 3. The supporting plate 51 further has a resin injection hole 53 for allowing a resin material into the inter-space between the supporting plate 51 and the bottom surface or the second surface of the multilayer interconnection board 3. The supporting plate 51 may be made of a high rigidity material. Insulating materials and conductive materials are also available for the supporting plate 51, provided that the material has the high rigidity. The resin material is injected through the resin injection hole 53 of the supporting plate 51 into the inter-space between the supporting plate 51 and the bottom surface or the second surface of the multilayer interconnection board 3, thereby to form the supporting sealing resin material 54 in the inter-space between the supporting plate 51 and the bottom surface or the second surface of the multilayer interconnection board 3. The supporting sealing resin material 54 is tightly contact with upper portions of the solder balls 13 for supporting the solder balls 13 to increase the bonding stability between the solder balls 13 and the external electrode pads 17 of the multilayer interconnection board 3. The supporting plate 51 defines a height or a thickness of the supporting sealing resin material 54, wherein the thickness of the supporting sealing resin material 54 is defined to be smaller than the height of the solder balls 13 so that the tops of the solder balls 13 project from the solder ball insertion holes 52 of the supporting plate 51 and from the bottom surface of the supporting sealing resin material 54.

Figure 18:
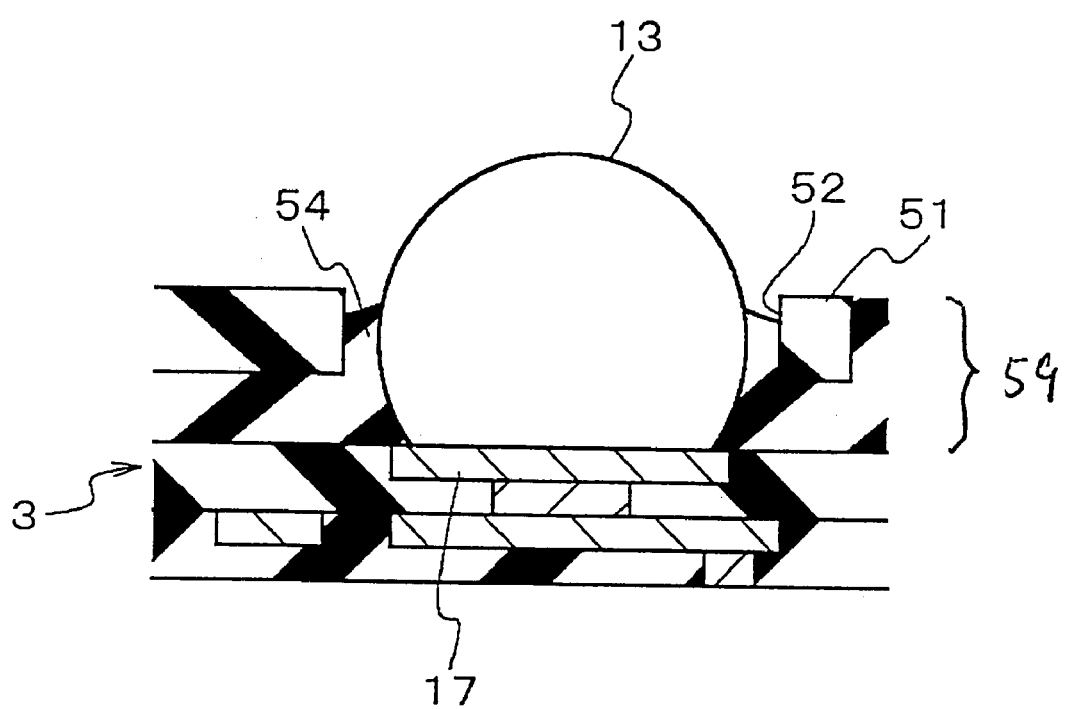
FIG. 18 is a fragmentary enlarged cross sectional elevation view illustrative of a solder ball bonded on an external electrode pad of a multilayer interconnection board and a partial supporting layer around the solder ball as encompassed by a circle line marked with "A" in FIG. 17.

FIG. 18 is a fragmentary enlarged cross sectional elevation view illustrative of a solder ball bonded on an external electrode pad of a multilayer interconnection board and a partial supporting layer around the solder ball as encompassed by a circle line marked with "A" in FIG. 17. The solder ball 13 is bonded on the external electrode pad 17 of the multilayer interconnection board 3. The supporting plate 51 is so provided as to form the inter-space between the supporting plate 51 and the bottom surface or the second surface of the multilayer interconnection board 3. The resin material injected through the resin injection hole 53 of the supporting plate 51 into the inter-space between the supporting plate 51 and the bottom surface or the second surface of the multilayer interconnection board 3, thereby to form the supporting sealing resin material 54 in the inter-space between the supporting plate 51 and the bottom surface or the second surface of the multilayer interconnection board 3. The supporting sealing resin material 54 is tightly contact with upper portions of the solder balls 13 for supporting the solder balls 13 to increase the bonding stability between the solder balls 13 and the external electrode pads 17 of the multilayer interconnection board 3. The supporting plate 51 defines a height or a thickness of the supporting sealing resin material 54, wherein the thickness of the supporting sealing resin material 54 is defined to be smaller than the height of the solder balls 13 so that the tops of the solder balls 13 project from the solder ball insertion holes 52 of the supporting plate 51 and from the bottom surface of the supporting sealing resin material 54.

As described above, the eighth embodiment is different from the first embodiment only in further providing the supporting layer 59 for supporting the solder balls 13 to increase the bonding stability between the solder balls 13 and the external electrode pads 17 of the multilayer interconnection board 3. The above semiconductor device may be fabricated by further providing the supporting layer 59 to the sequential fabrication processes described with reference to FIGS. 7A through 7Q in the first embodiment, for which reason the following descriptions will focus on the further fabrication processes for forming the supporting layer 59 on the flip-chip semiconductor device 32 fabricated in the sequential fabrication processes described with reference to FIGS. 7A through 7Q in the first embodiment.

Figure 19A:
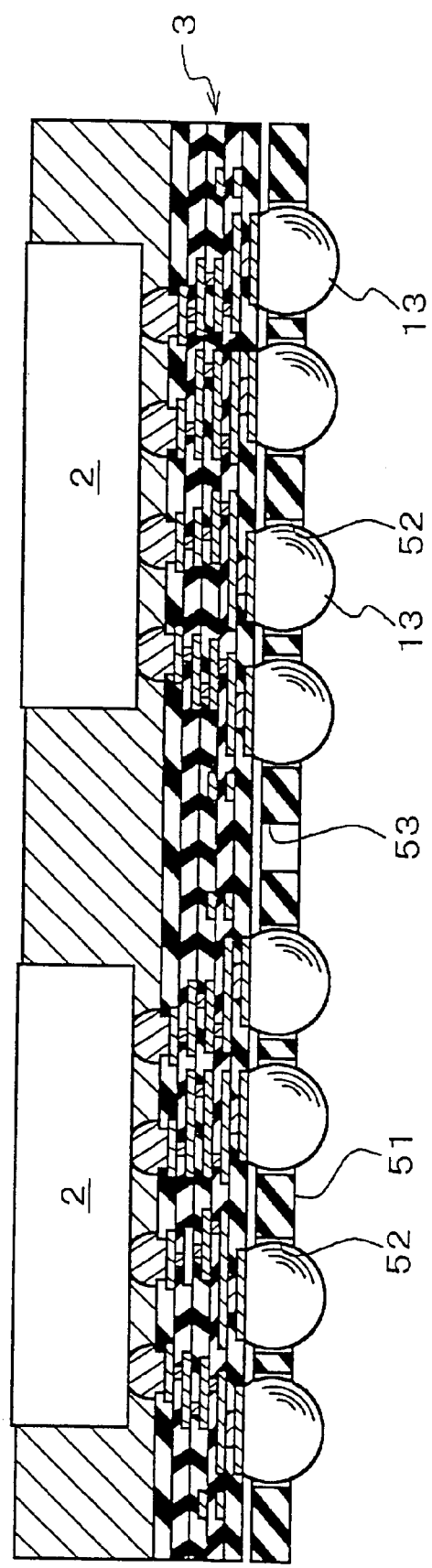
FIGS. 19A through 19B are fragmentary cross sectional elevation views illustrative of sequential steps involved in a method of forming a supporting layer on a flip-chip semiconductor device in an eighth embodiment in accordance with the present invention, wherein the flip-chip semiconductor device has already been fabricated in the sequential fabrication processes described with reference to FIGS. 7A through 7Q described in the first embodiment of the present invention.
Figure 19B:
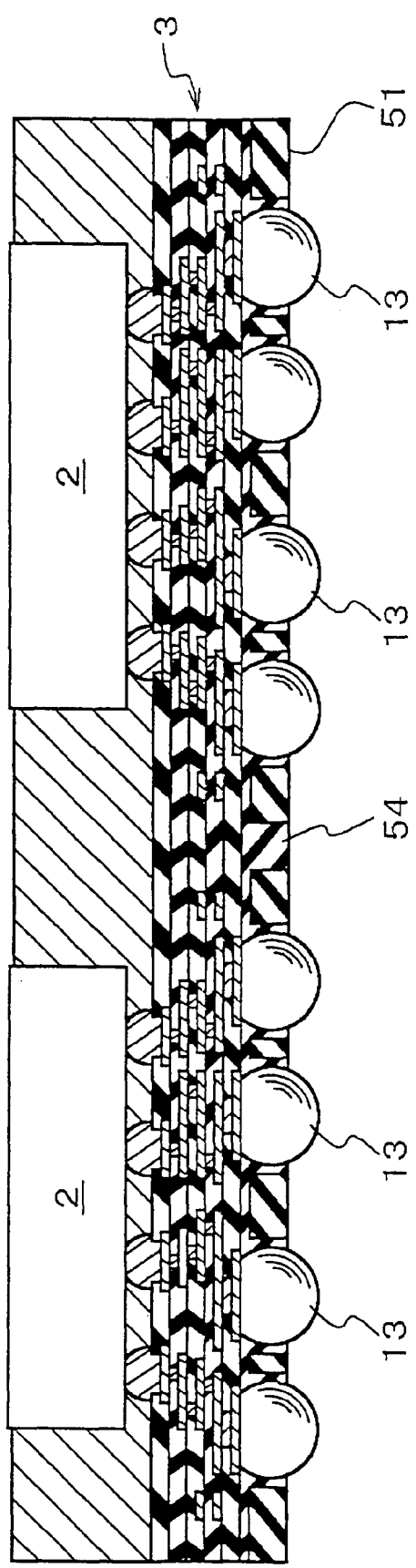

FIGS. 19A through 19B are fragmentary cross sectional elevation views illustrative of sequential steps involved in a method of forming a supporting layer on a flip-chip semiconductor device in an eighth embodiment in accordance with the present invention, wherein the flip-chip semiconductor device has already been fabricated in the sequential fabrication processes described with reference to FIGS. 7A through 7Q described in the first embodiment of the present invention.

With reference to FIG. 19A, the supporting plate 51 is provided which extends in parallel to the second surface or the bottom surface of the multilayer interconnection board 3, wherein the supporting plate 51 has the array of solder ball insertion holes 52 having a diameter which is slightly larger than a diameter of the solder balls 13, so that the solder balls 13 are inserted in the solder ball insertion holes 52 and surrounded by the supporting plate 51, thereby to form an inter-space between the supporting plate 51 and the bottom surface or the second surface of the multilayer interconnection board 3. The supporting plate 51 further has a resin injection hole 53 for allowing a resin material into the inter-space between the supporting plate 51 and the bottom surface or the second surface of the multilayer interconnection board 3.

With reference to FIG. 19B, a resin material is injected through the resin injection hole 53 of the supporting plate 51 into the inter-space between the supporting plate 51 and the bottom surface or the second surface of the multilayer interconnection board 3, thereby to form the supporting sealing resin material 54 in the inter-space between the supporting plate 51 and the bottom surface or the second surface of the multilayer interconnection board 3. The supporting sealing resin material 54 is tightly contact with upper portions of the solder balls 13 for supporting the solder balls 13 to increase the bonding stability between the solder balls 13 and the external electrode pads 17 of the multilayer interconnection board 3.

In accordance with this embodiment, the supporting layer 59, which comprises the supporting plate 51 and the supporting sealing resin material 54, is provided on the second surface or the bottom surface of the multilayer interconnection board 3 so that the supporting layer 59 surrounds the solder balls 13 for supporting the solder balls 13 to increase the bonding stability between the solder balls 13 and the external electrode pads 17 of the multilayer interconnection board 3.

Ninth Embodiment

Figure 20:
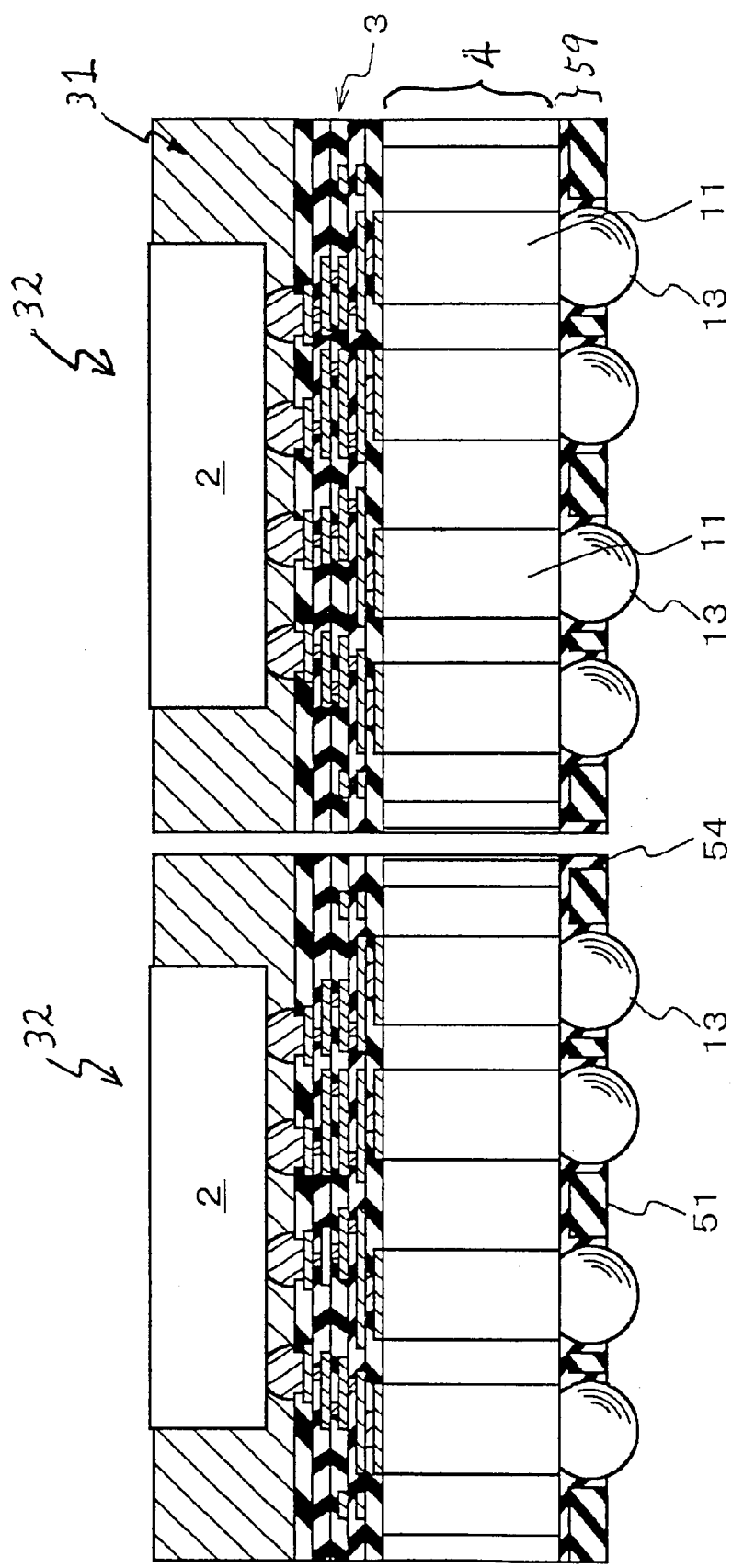
FIG. 20 is a cross sectional elevation view illustrative of a semiconductor device having a multilayer interconnection board, on which a semiconductor chip is mounted in a ninth embodiment according to the present invention.

A ninth embodiment according to the present invention will be described in detail with reference to the drawings. A difference in the ninth embodiment from the fifth embodiment is in that a supporting layer is provided, surrounding each of the solder balls for supporting the solder balls to increase a bonding strength between the solder balls and external electrode pads of the multilayer interconnection board. FIG. 20 is a cross sectional elevation view illustrative of a semiconductor device having a multilayer interconnection board, on which a semiconductor chip is mounted in a ninth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17. A sealing resin material 31 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. A second surface of the multilayer interconnection board 3 has arrays of external electrode pads 17 on which a buffer layer 4 is formed. Solder balls 13 are formed on a bottom surface of the buffer layer 4. The buffer layer 4 comprises plural metal buffer layers 11 which are in contact with the external electrode pads 17 and a stress absorption layer 12 in gaps between the plural metal buffer layers 11. The buffer layer 4 is thus provided between the external electrode pads 17 of the multilayer interconnection board 3 and the solder balls 13. The buffer layer 4 comprising plural metal buffer layers 11 and the stress absorption layer 12 has a sufficient stand-off height for relaxing the stress applied between the flip-chip semiconductor device 32 and the circuit board not illustrated. Further, a supporting frame 25 is provided which extends on a peripheral region of the bottom surface of the multilayer interconnection board 3. The stress absorption layer 12 is provided on the bottom surface of the multilayer interconnection board 3 except under the external electrode pads 17 and the peripheral region of the multilayer interconnection board 3. The stress absorption layer 12 is also provided between the plural metal buffer layers 11 and the supporting frame 25. The stress absorption layer 12 has a multilayer structure which has physical properties absorbing stresses and strains. The stress absorption layer 12 may be made of a silicone resin material. Organic materials such as epoxy based resins, silicone based resins, polyolefin based resins, cyanate ester based resins, phenol based resins, naphthalene based resins are also available for the stress absorption layer 12. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13. A sealing resin material 31 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3.

In this embodiment, in order to increase a bonding strength between the solder balls 13 and the plural metal buffer layers 11 of the buffer layer 4, a supporting layer 59 is provided on the bottom surface of the buffer layer 4 so that the supporting layer 59 surrounds the solder balls 13 for supporting the solder balls 13 to increase the bonding stability between the solder balls 13 and the plural metal buffer layers 11 of the buffer layer 4. The supporting layer 59 comprises a supporting plate 51 and a supporting sealing resin material 54. The supporting plate 51 extends in parallel to the bottom surface of the buffer layer 4, wherein the supporting plate 51 has an array of solder ball insertion holes 52 having a diameter which is slightly larger than a diameter of the solder balls 13, so that the solder balls 13 are inserted in the solder ball insertion holes 52 and surrounded by the supporting plate 51. The supporting plate 51 is so provided as to form an inter-space between the supporting plate 51 and the bottom surface or the buffer layer 4. The supporting plate 51 further has a resin injection hole 53 for allowing a resin material into the inter-space between the supporting plate 51 and the bottom surface of the buffer layer 4. The supporting plate 51 may be made of a high rigidity material. Insulating materials and conductive materials are also available for the supporting plate 51, provided that the material has the high rigidity. The resin material is injected through the resin injection hole 53 of the supporting plate 51 into the inter-space between the supporting plate 51 and the bottom surface or the second surface of the multilayer interconnection board 3, thereby to form the supporting sealing resin material 54 in the inter-space between the supporting plate 51 and the bottom surface or the second surface of the multilayer interconnection board 3. The supporting sealing resin material 54 is tightly contact with upper portions of the solder balls 13 for supporting the solder balls 13 to increase the bonding stability between the solder balls 13 and the plural metal buffer layers 11 of the buffer layer 4. The supporting plate 51 defines a height or a thickness of the supporting sealing resin material 54, wherein the thickness of the supporting sealing resin material 54 is defined to be smaller than the height of the solder balls 13 so that the tops of the solder balls 13 project from the solder ball insertion holes 52 of the supporting plate 51 and from the bottom surface of the supporting sealing resin material 54.

As described above, the ninth embodiment is different from the fifth embodiment only in further providing the supporting layer 59 for supporting the solder balls 13 to increase the bonding stability between the solder balls 13 and the plural metal buffer layers 11 of the buffer layer 4. The above semiconductor device may be fabricated by further providing the supporting layer 59 to the sequential fabrication processes described with reference to FIGS. 14A through 14S in the fifth embodiment, for which reason the following descriptions will focus on the further fabrication processes for forming the supporting layer 59 on the flip-chip semiconductor device 32 fabricated in the sequential fabrication processes described with reference to FIGS. 14A through 14S in the fifth embodiment.

Figure 21A:
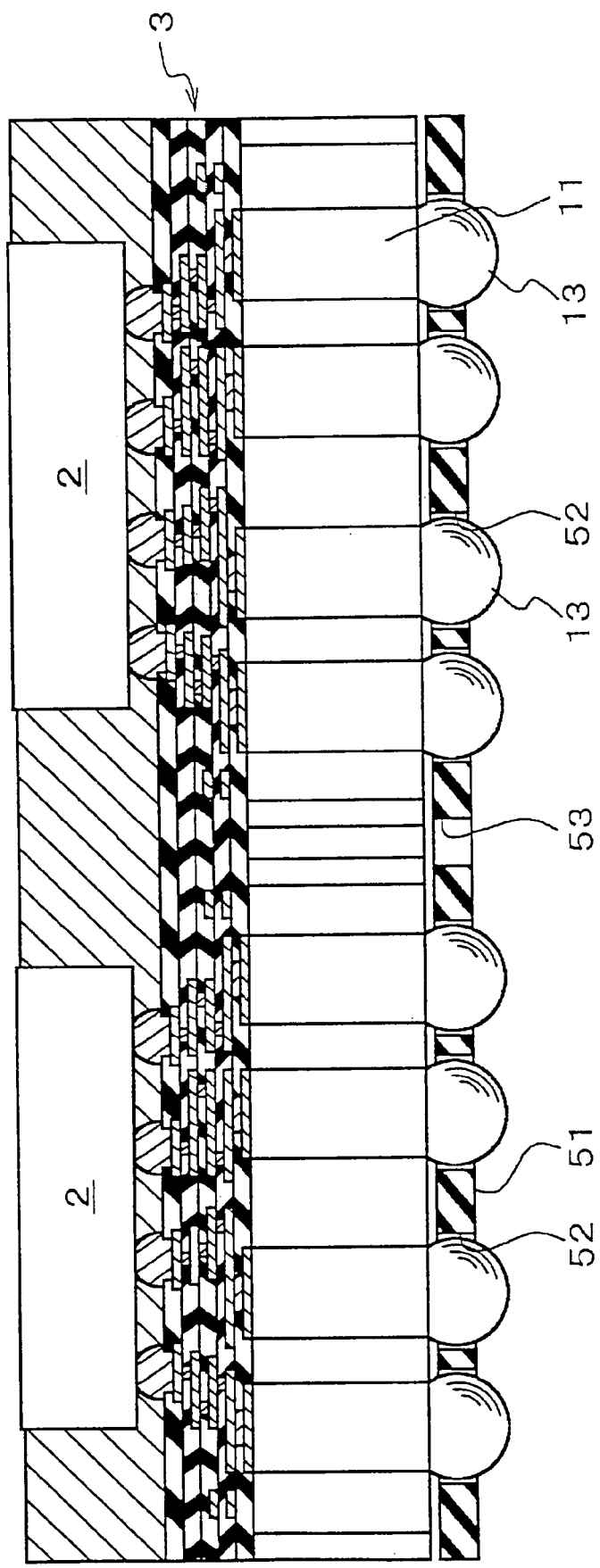
FIGS. 21A through 21B are fragmentary cross sectional elevation views illustrative of sequential steps involved in a method of forming a supporting layer on a flip-chip semiconductor device in an ninth embodiment in accordance with the present invention, wherein the flip-chip semiconductor device has already been fabricated in the sequential fabrication processes described with reference to FIGS. 14A through 14S described in the fifth embodiment of the present invention.
Figure 21B:
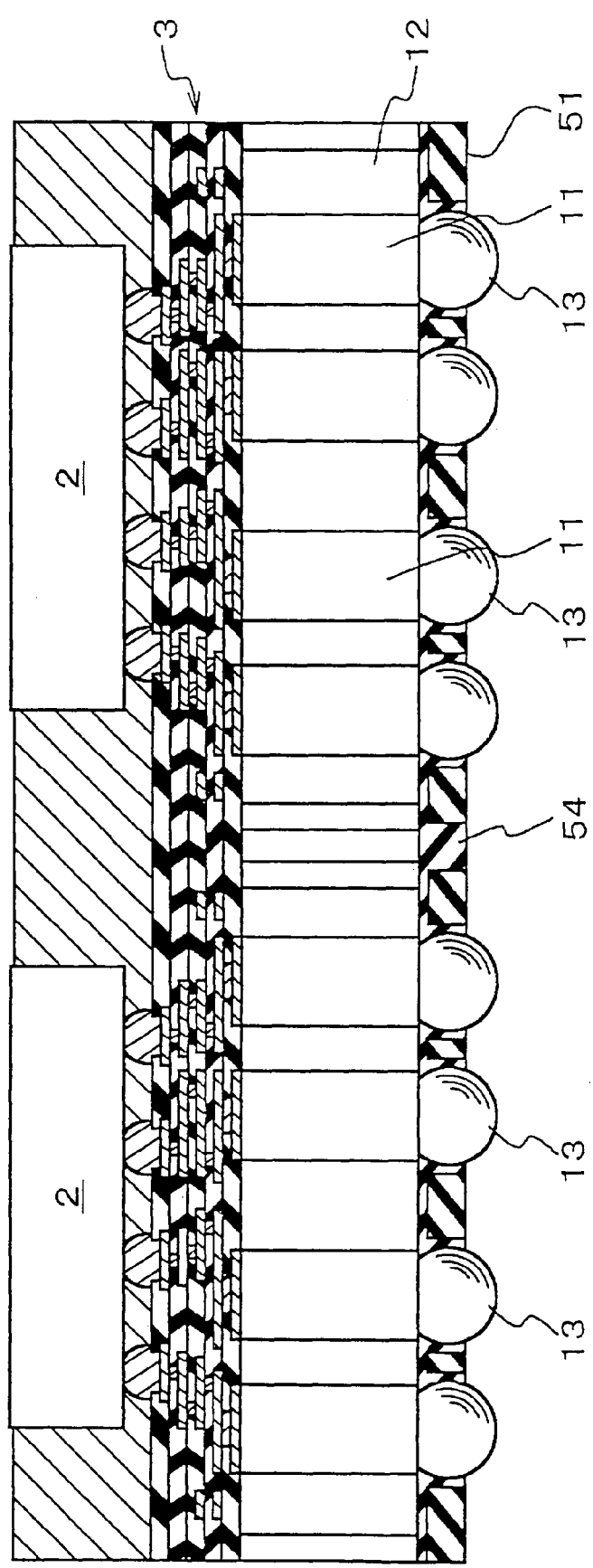

FIGS. 21A through 21B are fragmentary cross sectional elevation views illustrative of sequential steps involved in a method of forming a supporting layer on a flip-chip semiconductor device in an ninth embodiment in accordance with the present invention, wherein the flip-chip semiconductor device has already been fabricated in the sequential fabrication processes described with reference to FIGS. 14A through 14S described in the fifth embodiment of the present invention.

With reference to FIG. 21A, the supporting plate 51 is provided which extends in parallel to the bottom surface of the buffer layer 4, wherein the supporting plate 51 has the array of solder ball insertion holes 52 having a diameter which is slightly larger than a diameter of the solder balls 13, so that the solder balls 13 are inserted in the solder ball insertion holes 52 and surrounded by the supporting plate 51, thereby to form an inter-space between the supporting plate 51 and the bottom surface or the second surface of the buffer layer 4. The supporting plate 51 further has a resin injection hole 53 for allowing a resin material into the inter-space between the supporting plate 51 and the bottom surface or the second surface of the multilayer interconnection board 3.

With reference to FIG. 21B, a resin material is injected through the resin injection hole 53 of the supporting plate 51 into the inter-space between the supporting plate 51 and the bottom surface or the second surface of the multilayer interconnection board 3, thereby to form the supporting sealing resin material 54 in the inter-space between the supporting plate 51 and the bottom surface of the buffer layer 4. The supporting sealing resin material 54 is tightly contact with upper portions of the solder balls 13 for supporting the solder balls 13 to increase the bonding stability between the solder balls 13 and the plural metal buffer layers 11 of the buffer layer 4.

In accordance with this embodiment, the supporting layer 59, which comprises the supporting plate 51 and the supporting sealing resin material 54, is provided on the second surface or the bottom surface of the multilayer interconnection board 3 so that the supporting layer 59 surrounds the solder balls 13 for supporting the solder balls 13 to increase the bonding stability between the solder balls 13 and the plural metal buffer layers 11 of the buffer layer 4.

Tenth Embodiment

Figure 22:
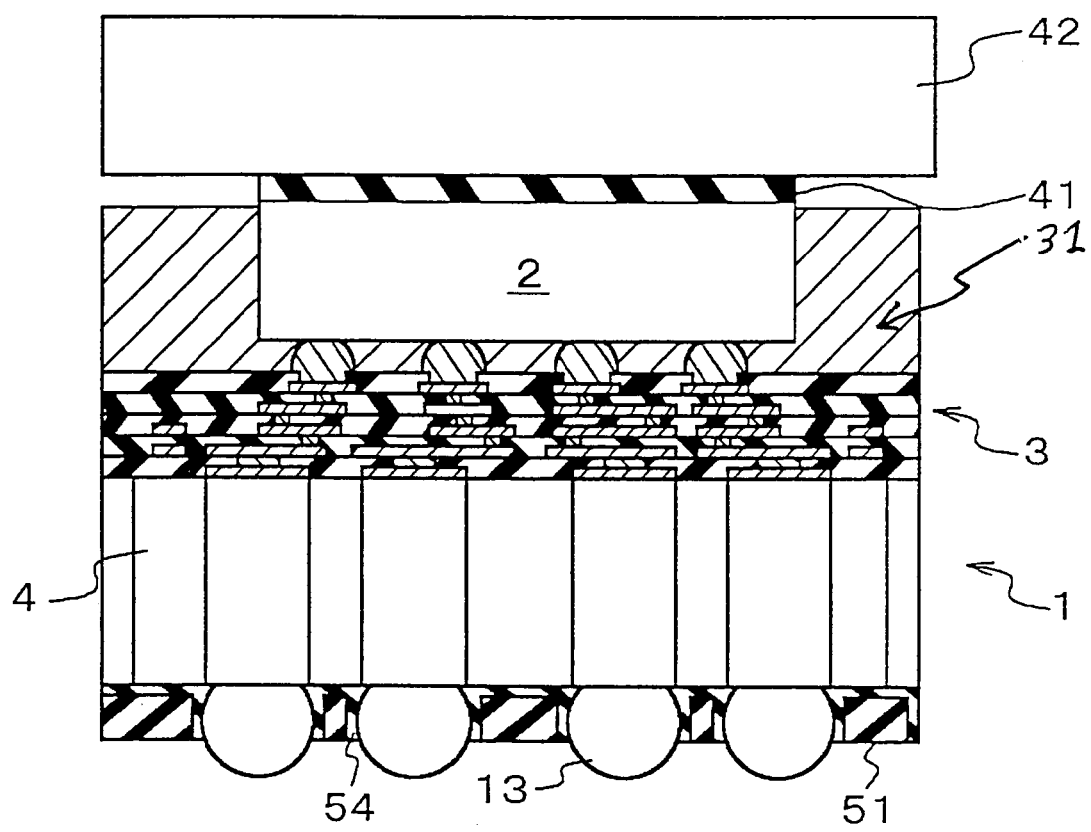
FIG. 22 is a cross sectional elevation view illustrative of a semiconductor device having a multilayer interconnection board, on which a semiconductor chip is mounted in a tenth embodiment according to the present invention.

A tenth embodiment according to the present invention will be described in detail with reference to the drawings. A difference in the tenth embodiment from the ninth embodiment is in that a heat spreader is further provided for promoting a heat radiation from the semiconductor chip. FIG. 22 is a cross sectional elevation view illustrative of a semiconductor device having a multilayer interconnection board, on which a semiconductor chip is mounted in a tenth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17. A sealing resin material 31 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. A second surface of the multilayer interconnection board 3 has arrays of external electrode pads 17 on which a buffer layer 4 is formed. Solder balls 13 are formed on a bottom surface of the buffer layer 4. The buffer layer 4 comprises plural metal buffer layers 11 which are in contact with the external electrode pads 17 and a stress absorption layer 12 in gaps between the plural metal buffer layers 11. The buffer layer 4 is thus provided between the external electrode pads 17 of the multilayer interconnection board 3 and the solder balls 13. The buffer layer 4 comprising plural metal buffer layers 11 and the stress absorption layer 12 has a sufficient stand-off height for relaxing the stress applied between the flip-chip semiconductor device 32 and the circuit board not illustrated. Further, a supporting frame 25 is provided which extends on a peripheral region of the bottom surface of the multilayer interconnection board 3. The stress absorption layer 12 is provided on the bottom surface of the multilayer interconnection board 3 except under the external electrode pads 17 and the peripheral region of the multilayer interconnection board 3. The stress absorption layer 12 is also provided between the plural metal buffer layers 11 and the supporting frame 25. The stress absorption layer 12 has a multilayer structure which has physical properties absorbing stresses and strains. The stress absorption layer 12 may be made of a silicone resin material. Organic materials such as epoxy based resins, silicone based resins, polyolefin based resins, cyanate ester based resins, phenol based resins, naphthalene based resins are also available for the stress absorption layer 12. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13. A sealing resin material 31 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. In order to increase a bonding strength between the solder balls 13 and the plural metal buffer layers 11 of the buffer layer 4, a supporting layer 59 is provided on the bottom surface of the buffer layer 4 so that the supporting layer 59 surrounds the solder balls 13 for supporting the solder balls 13 to increase the bonding stability between the solder balls 13 and the external electrode pads 17 of the multilayer interconnection board 3. The supporting layer 59 comprises a supporting plate 51 and a supporting sealing resin material 54. The supporting plate 51 extends in parallel to the bottom surface of the buffer layer 4, wherein the supporting plate 51 has an array of solder ball insertion holes 52 having a diameter which is slightly larger than a diameter of the solder balls 13, so that the solder balls 13 are inserted in the solder ball insertion holes 52 and surrounded by the supporting plate 51. The supporting plate 51 is so provided as to form an inter-space between the supporting plate 51 and the bottom surface or the buffer layer 4. The supporting plate 51 further has a resin injection hole 53 for allowing a resin material into the inter-space between the supporting plate 51 and the bottom surface or the second surface of the multilayer interconnection board 3. The supporting plate 51 may be made of a high rigidity material. Insulating materials and conductive materials are also available for the supporting plate 51, provided that the material has the high rigidity. The resin material is injected through the resin injection hole 53 of the supporting plate 51 into the inter-space between the supporting plate 51 and the bottom surface or the second surface of the multilayer interconnection board 3, thereby to form the supporting sealing resin material 54 in the inter-space between the supporting plate 51 and the bottom surface or the second surface of the multilayer interconnection board 3. The supporting sealing resin material 54 is tightly contact with upper portions of the solder balls 13 for supporting the solder balls 13 to increase the bonding stability between the solder balls 13 and the plural metal buffer layers 11 of the buffer layer 4. The supporting plate 51 defines a height or a thickness of the supporting sealing resin material 54, wherein the thickness of the supporting sealing resin material 54 is defined to be smaller than the height of the solder balls 13 so that the tops of the solder balls 13 project from the solder ball insertion holes 52 of the supporting plate 51 and from the bottom surface of the supporting sealing resin material 54.

In this embodiment, a heat conductive adhesive layer 41 is provided on a second surface of the semiconductor chip 2. A heat spreader 42 is provided on the heat conductive adhesive layer 41 so that the heat spreader 42 is adhered through the heat conductive adhesive layer 41 to the second surface of the semiconductor chip 2. The bumps 14 and the solder balls 13 are eclectically connected to each other through multilevel interconnections of the multilayer interconnection board 3. A heat generated in the semiconductor chip 2 is conducted through the heat conductive adhesive layer 41 to the heat spreader 42 for causing a heat radiation from the heat spreader 42. The heat spreader 42 may be made of a heat conductive material such as a metal base material, for example, Cu, Al, W, Mo, Fe, Ni, and Cr, or $Al_2O_3$, AlN, SiC, other ceramics such as mullite. The heat conductive adhesive layer 41 may be made of a resin based material containing a heat conductive material, wherein the resin based material may be one of epoxy resin materials, silicone resin materials, polyimide resin materials, polyolefin resin materials, cyanate ester resin materials, phenol resin materials and naphthalene resin materials, whilst the heat conductive material may be one of Ag, Pd, Cu, Al, Au, Mo, W, diamond, $Al_2O_3$, AlN, and ceramic materials such as mullite, BN and SiC.

Eleventh Embodiment

Figure 23:
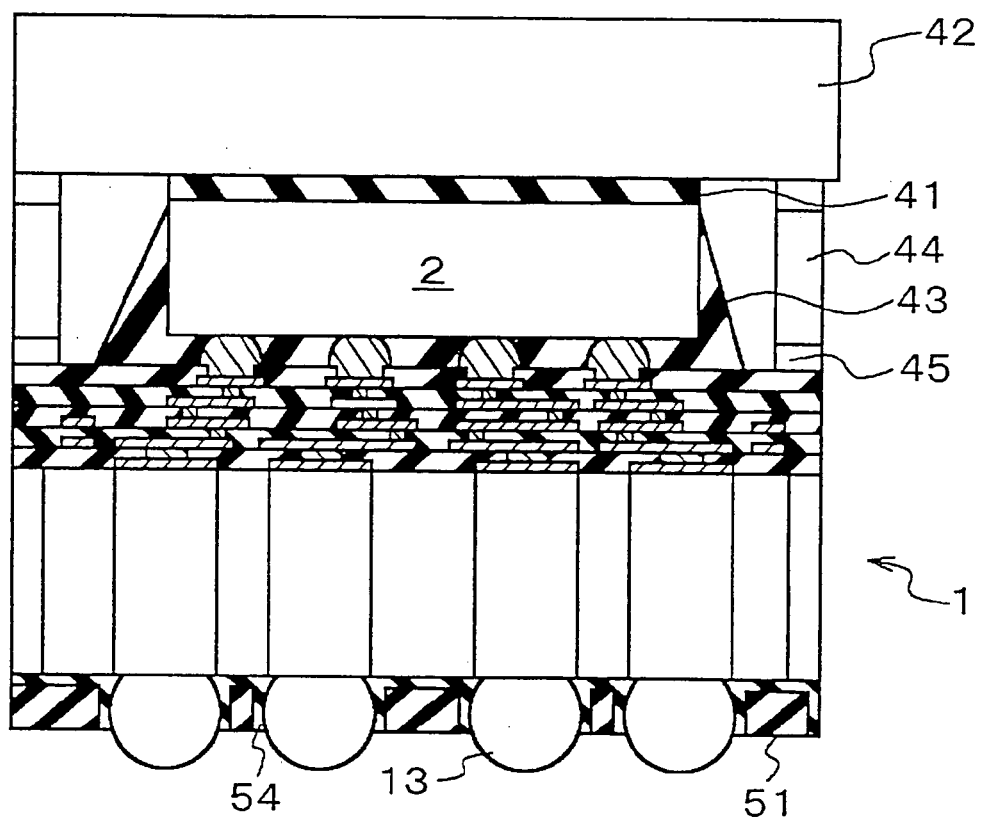
FIG. 23 is a cross sectional elevation view illustrative of a semiconductor device having a multilayer interconnection board, on which a semiconductor chip is mounted in an eleventh embodiment according to the present invention.

An eleventh embodiment according to the present invention will be described in detail with reference to the drawings. A difference in the eleventh embodiment from the tenth embodiment is in that in place of the sealing resin material, an under-fill resin material and a stiffener are further provided. FIG. 23 is a cross sectional elevation view illustrative of a semiconductor device having a multilayer interconnection board, on which a semiconductor chip is mounted in an eleventh embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17. The bumps 14 and the solder balls 13 are eclectically connected to each other through multilevel interconnections of the multilayer interconnection board 3. A second surface of the multilayer interconnection board 3 has arrays of external electrode pads 17 on which a buffer layer 4 is formed. Solder balls 13 are formed on a bottom surface of the buffer layer 4. The buffer layer 4 comprises plural metal buffer layers 11 which are in contact with the external electrode pads 17 and a stress absorption layer 12 in gaps between the plural metal buffer layers 11. The buffer layer 4 is thus provided between the external electrode pads 17 of the multilayer interconnection board 3 and the solder balls 13. The buffer layer 4 comprising plural metal buffer layers 11 and the stress absorption layer 12 has a sufficient stand-off height for relaxing the stress applied between the flip-chip semiconductor device 32 and the circuit board not illustrated. Further, a supporting frame 25 is provided which extends on a peripheral region of the bottom surface of the multilayer interconnection board 3. The stress absorption layer 12 is provided on the bottom surface of the multilayer interconnection board 3 except under the external electrode pads 17 and the peripheral region of the multilayer interconnection board 3. The stress absorption layer 12 is also provided between the plural metal buffer layers 11 and the supporting frame 25. The stress absorption layer 12 has a multilayer structure which has physical properties absorbing stresses and strains. The stress absorption layer 12 may be made of a silicone resin material. Organic materials such as epoxy based resins, silicone based resins, polyolefin based resins, cyanate ester based resins, phenol based resins, naphthalene based resins are also available for the stress absorption layer 12. The supporting frame 25 protects the multilayer interconnection board 3 and the buffer layer 4 comprising plurality of metal buffer layers 11 from mechanical stresses when the product is handled. Since the buffer layer 4 comprises the plural metal buffer layers 11, the external electrode pads 17 of the multilayer interconnection board 3 are electrically connected through the plural metal buffer layers 11 to the solder balls 13. In place of the sealing resin material, an under-fill resin layer 43 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. The under-fill resin layer 43 may be made of one of epoxy resin materials, silicone resin materials, polyimide resin materials, polyolefin resin materials, cyanate ester resin materials, phenol resin materials and naphthalene resin materials. A heat conductive adhesive layer 41 is provided on a top surface of the semiconductor chip 2. Further, a stiffener 44 is adhered through an adhesive 45 on a peripheral region of the first surface or the upper surface of the multiyear interconnection board. A heat spreader 42 is provided on the heat conductive adhesive layer 41 and on an adhesive applied on the top of the stiffener 44 so that the heat spreader 42 is adhered through the heat conductive adhesive layer 41 to the top surface of the semiconductor chip 2 and also adhered through the adhesive 45 to the stiffener 44. A heat generated in the semiconductor chip 2 is conducted through the heat conductive adhesive layer 41 to the heat spreader 42 for causing a heat radiation from the heat spreader 42. The heat spreader 42 may be made of a heat conductive material such as a metal base material, for example, Cu, Al, W, Mo, Fe, Ni, and Cr, or $Al_2O_3$, AlN, SiC, other ceramics such as mullite. The heat conductive adhesive layer 41 may be made of a resin based material containing a heat conductive material, wherein the resin based material may be one of epoxy resin materials, silicone resin materials, polyimide resin materials, polyolefin resin materials, cyanate ester resin materials, phenol resin materials and naphthalene resin materials, whilst the heat conductive material may be one of Ag, Pd, Cu, Al, Au, Mo, W, diamond, $Al_2O_3$, AlN, and ceramic materials such as mullite, BN and SiC. The bumps 14 and the solder balls 13 are eclectically connected to each other through multilevel interconnections of the multilayer interconnection board 3. In order to increase a bonding strength between the solder balls 13 and the plural metal buffer layers 11 of the buffer layer 4, a supporting layer 59 is provided on the bottom surface of the buffer layer 4 so that the supporting layer 59 surrounds the solder balls 13 for supporting the solder balls 13 to increase the bonding stability between the solder balls 13 and the external electrode pads 17 of the multilayer interconnection board 3. The supporting layer 59 comprises a supporting plate 51 and a supporting sealing resin material 54. The supporting plate 51 extends in parallel to the bottom surface of the buffer layer 4, wherein the supporting plate 51 has an array of solder ball insertion holes 52 having a diameter which is slightly larger than a diameter of the solder balls 13, so that the solder balls 13 are inserted in the solder ball insertion holes 52 and surrounded by the supporting plate 51. The supporting plate 51 is so provided as to form an inter-space between the supporting plate 51 and the bottom surface or the buffer layer 4. The supporting plate 51 further has a resin injection hole 53 for allowing a resin material into the inter-space between the supporting plate 51 and the bottom surface or the second surface of the multilayer interconnection board 3. The supporting plate 51 may be made of a high rigidity material. Insulating materials and conductive materials are also available for the supporting plate 51, provided that the material has the high rigidity. The resin material is injected through the resin injection hole 53 of the supporting plate 51 into the inter-space between the supporting plate 51 and the bottom surface or the second surface of the multilayer interconnection board 3, thereby to form the supporting sealing resin material 54 in the inter-space between the supporting plate 51 and the bottom surface or the second surface of the multilayer interconnection board 3. The supporting sealing resin material 54 is tightly contact with upper portions of the solder balls 13 for supporting the solder balls 13 to increase the bonding stability between the solder balls 13 and the plural metal buffer layers 11 of the buffer layer 4. The supporting plate 51 defines a height or a thickness of the supporting sealing resin material 54, wherein the thickness of the supporting sealing resin material 54 is defined to be smaller than the height of the solder balls 13 so that the tops of the solder balls 13 project from the solder ball insertion holes 52 of the supporting plate 51 and from the bottom surface of the supporting sealing resin material 54.

Twelfth Embodiment

A twelfth embodiment according to the present invention will be described in detail with reference to the drawings. A difference in the twelfth embodiment from the ninth embodiment is in that plural metal column electrodes are bonded by an adhesive to external electrode pads of a multilayer interconnection board and a stress absorption resin layer 12' is also provided to fill gaps between the plural metal column electrodes in the above ninth embodiment, the plural metal electrode layers are formed by selective etching to the metal plate. In this embodiment, the metal plate or the high rigidity plate is once completely removed and then the plural metal column electrodes are bonded by an adhesive to external electrode pads of a multilayer interconnection board.

Figure 24:
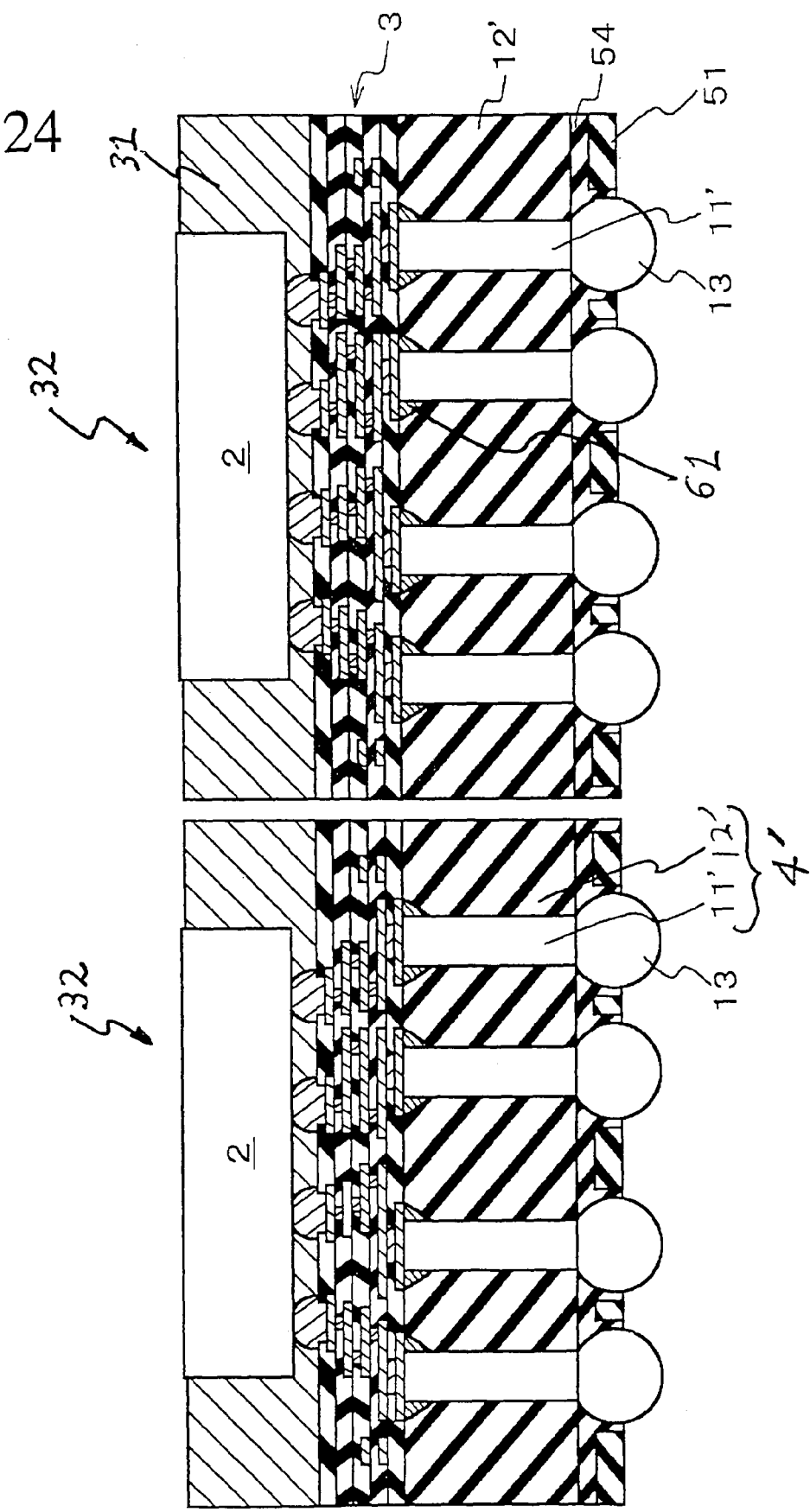
FIG. 24 is a cross sectional elevation view illustrative of a semiconductor device having a multilayer interconnection board, on which a semiconductor chip is mounted in a twelfth embodiment according to the present invention.

FIG. 24 is a cross sectional elevation view illustrative of a semiconductor device having a multilayer interconnection board, on which a semiconductor chip is mounted in a twelfth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17. A sealing resin material 15 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. A second surface of the multilayer interconnection board 3 has arrays of external electrode pads 17 on which a buffer layer 4' is formed. Solder balls 13 are formed on a bottom surface of the buffer layer 4'. The buffer layer 4' comprises plural metal column-shaped buffer layers 11' which are bonded by an adhesive 61 in to the external electrode pads 17 and a stress absorption layer 12' in gaps between the plural metal column-shaped buffer layers 11'. The buffer layer 4' is thus provided between the external electrode pads 17 of the multilayer interconnection board 3 and the solder balls 13. The buffer layer 4' comprising the plural metal column-shaped buffer layers 11' and the stress absorption layer 12 has a sufficient stand-off height for relaxing the stress applied between the flip-chip semiconductor device 32 and the circuit board not illustrated. The stress absorption layer 12' is provided on the bottom surface of the multilayer interconnection board 3 except under the external electrode pads 17 and the peripheral region of the multilayer interconnection board 3. The stress absorption layer 12' has a multilayer structure which has physical properties absorbing stresses and strains. The stress absorption layer 12' may be made of a silicone resin material. Organic materials such as epoxy based resins, silicone based resins, polyolefin based resins, cyanate ester based resins, phenol based resins, naphthalene based resins are also available for the stress absorption layer 12'. Since the buffer layer 4' comprises the plural metal column-shaped buffer layers 11', the external electrode pads 17 of the multilayer interconnection board 3 are electrically connected through the plural metal column-shaped buffer layers 11' to the solder balls 13. A sealing resin material 31 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3.

In this embodiment, in order to increase a bonding strength between the solder balls 13 and the plural metal column-shaped buffer layers 11' of the buffer layer 4', a supporting layer 59 is provided on the bottom surface of the buffer layer 4' so that the supporting layer 59 surrounds the solder balls 13 for supporting the solder balls 13 to increase the bonding stability between the solder balls 13 and the plural metal column-shaped buffer layers 11' of the buffer layer 4'. The supporting layer 59 comprises a supporting plate 51 and a supporting sealing resin material 54. The supporting plate 51 extends in parallel to the bottom surface of the buffer layer 4', wherein the supporting plate 51 has an array of solder ball insertion holes 52 having a diameter which is slightly larger than a diameter of the solder balls 13, so that the solder balls 13 are inserted in the solder ball insertion holes 52 and surrounded by the supporting plate 51. The supporting plate 51 is so provided as to form an inter-space between the supporting plate 51 and the bottom surface or the buffer layer 4'. The supporting plate 51 further has a resin injection hole 53 for allowing a resin material into the inter-space between the supporting plate 51 and the bottom surface or the second surface of the multilayer interconnection board 3. The supporting plate 51 may be made of a high rigidity material. Insulating materials and conductive materials are also available for the supporting plate 51, provided that the material has the high rigidity. The resin material is injected through the resin injection hole 53 of the supporting plate 51 into the inter-space between the supporting plate 51 and the bottom surface or the second surface of the multilayer interconnection board 3, thereby to form the supporting sealing resin material 54 in the inter-space between the supporting plate 51 and the bottom surface of the buffer layer 4'. The supporting sealing resin material 54 is tightly contact with upper portions of the solder balls 13 for supporting the solder balls 13 to increase the bonding stability between the solder balls 13 and the plural metal buffer layers 11 of the buffer layer 4. The supporting plate 51 defines a height or a thickness of the supporting sealing resin material 54, wherein the thickness of the supporting sealing resin material 54 is defined to be smaller than the height of the solder balls 13 so that the tops of the solder balls 13 project from the solder ball insertion holes 52 of the supporting plate 51 and from the bottom surface of the supporting sealing resin material 54.

Figure 25A:
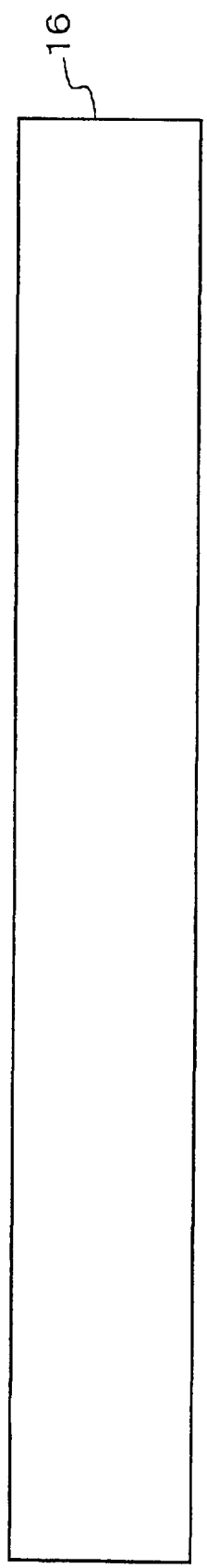
FIGS. 25A through 25U are fragmentary cross sectional elevation views illustrative of a novel method of forming a semiconductor device having a multilayer interconnection board on which a semiconductor chip is mounted in a twelfth embodiment in accordance with the present invention.
Figure 25B:
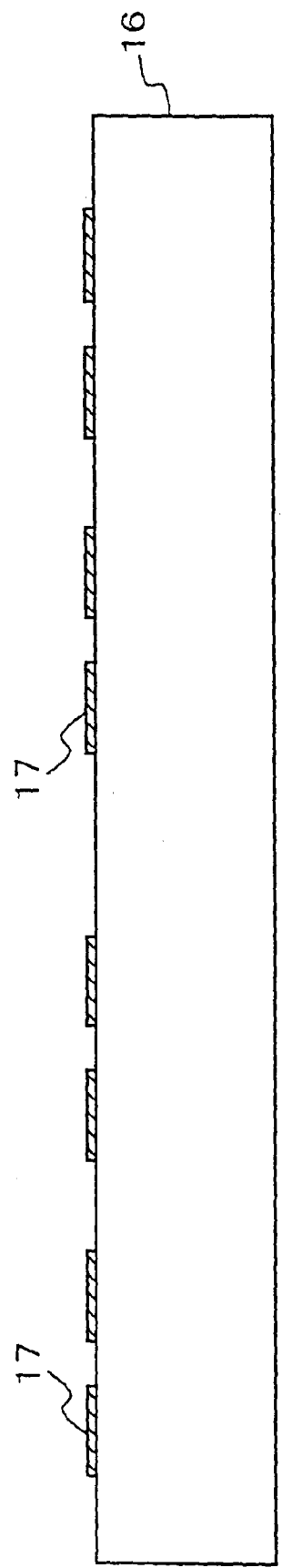
Figure 25C:
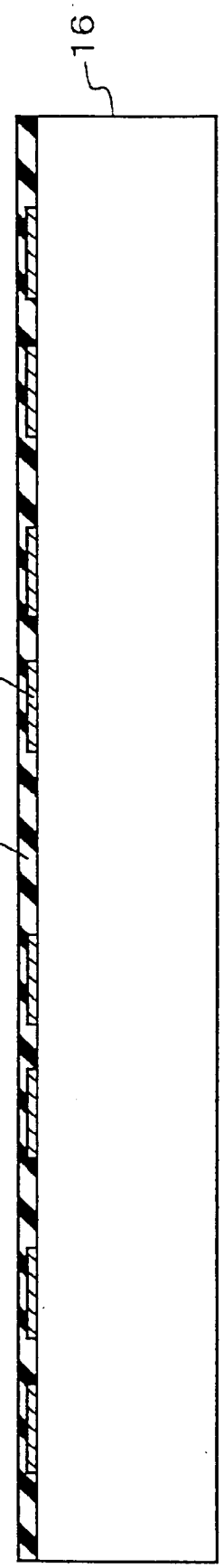
Figure 25D:
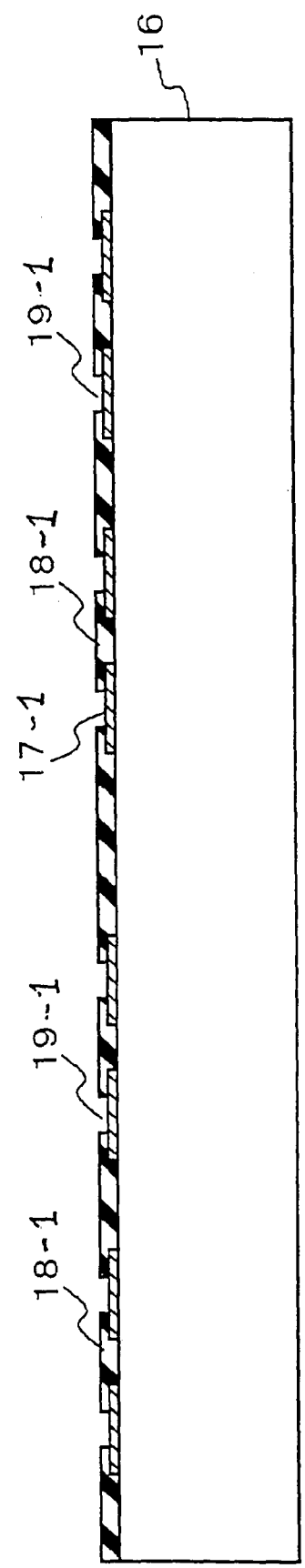
Figure 25E:
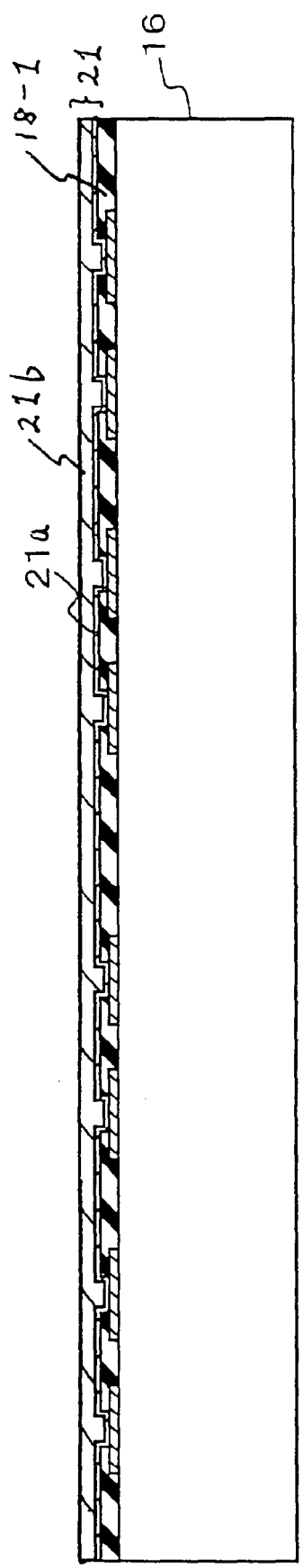
Figure 25F:
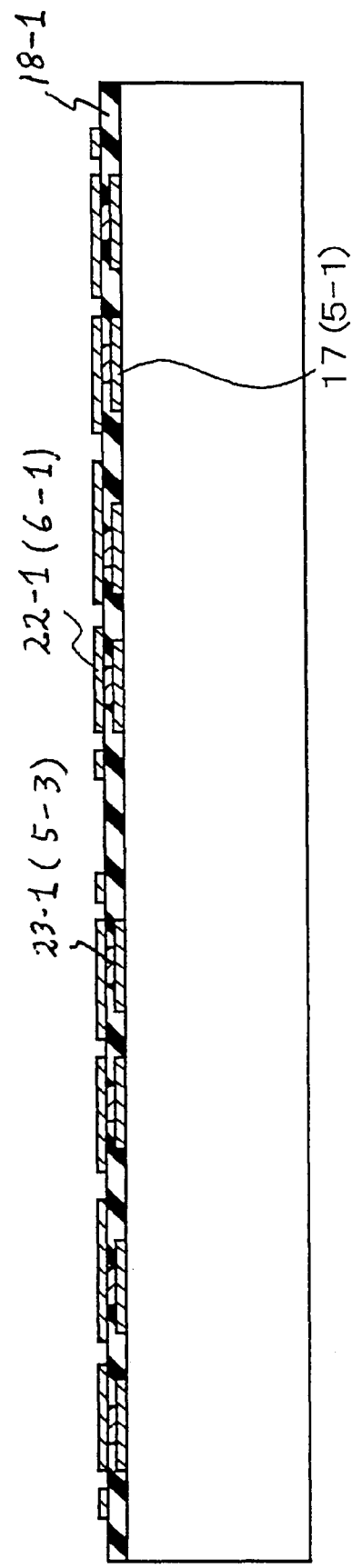
Figure 25G:
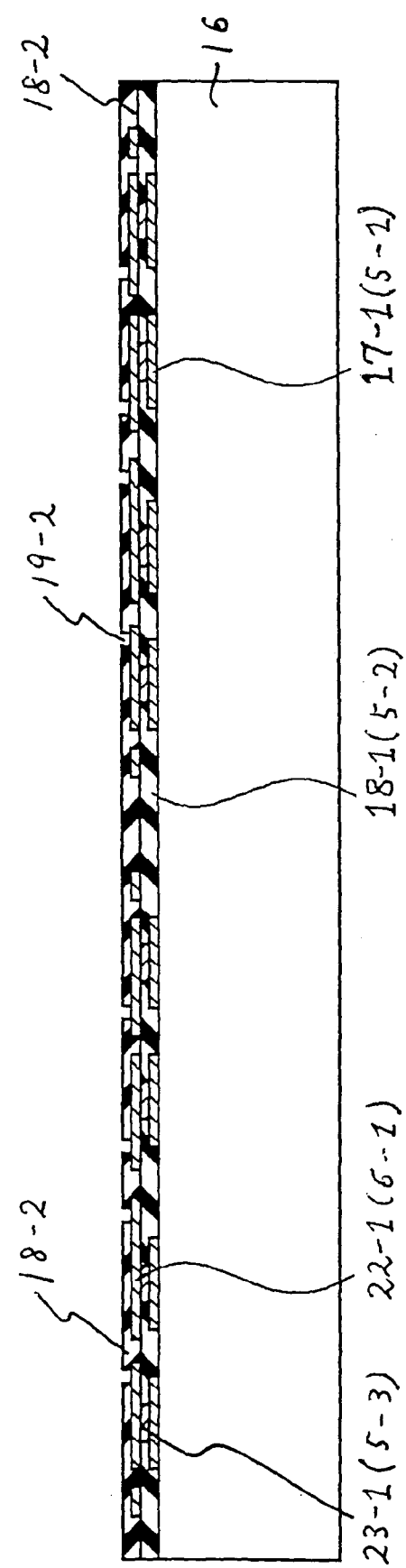
Figure 25H:
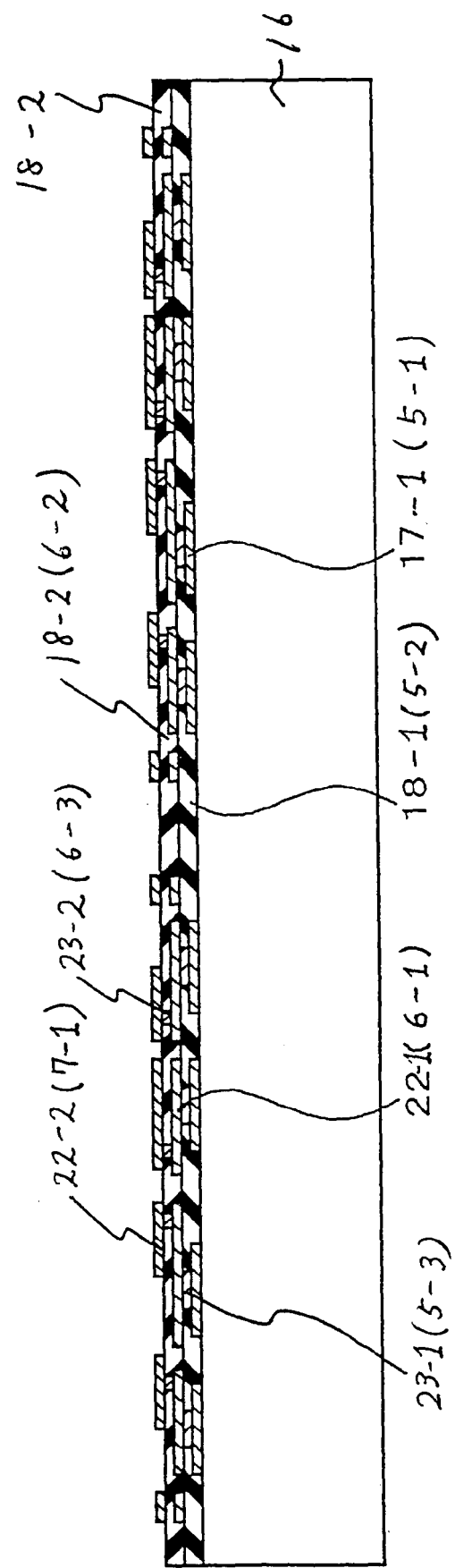
Figure 25I:
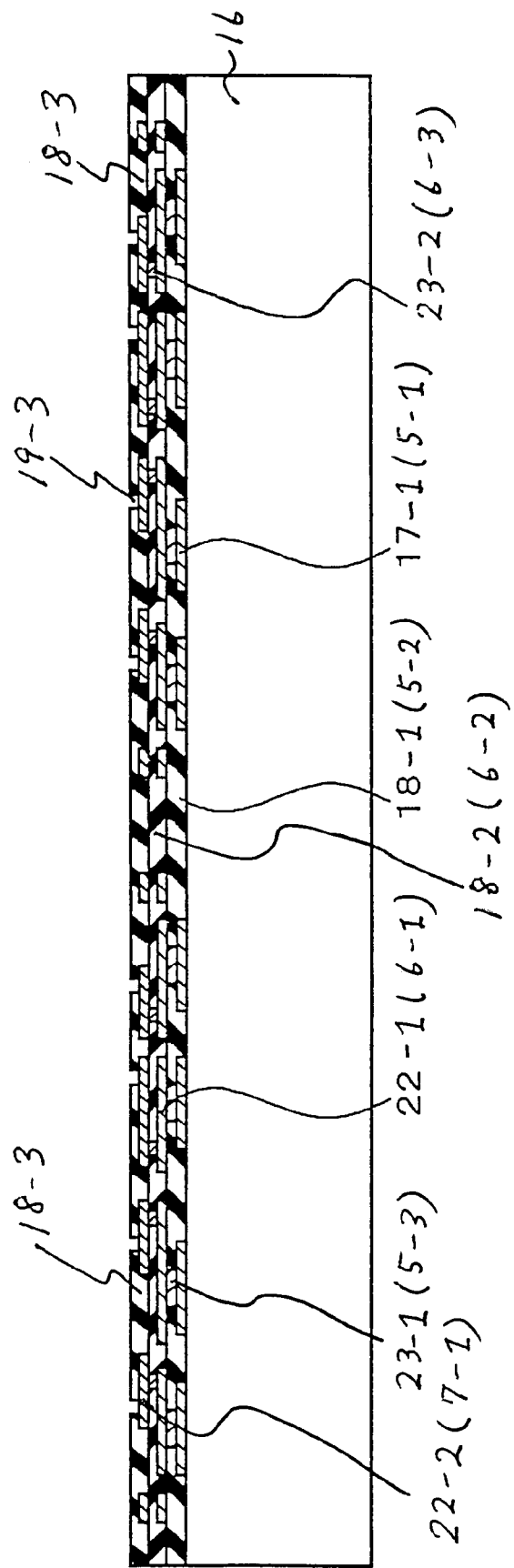
Figure 25J:
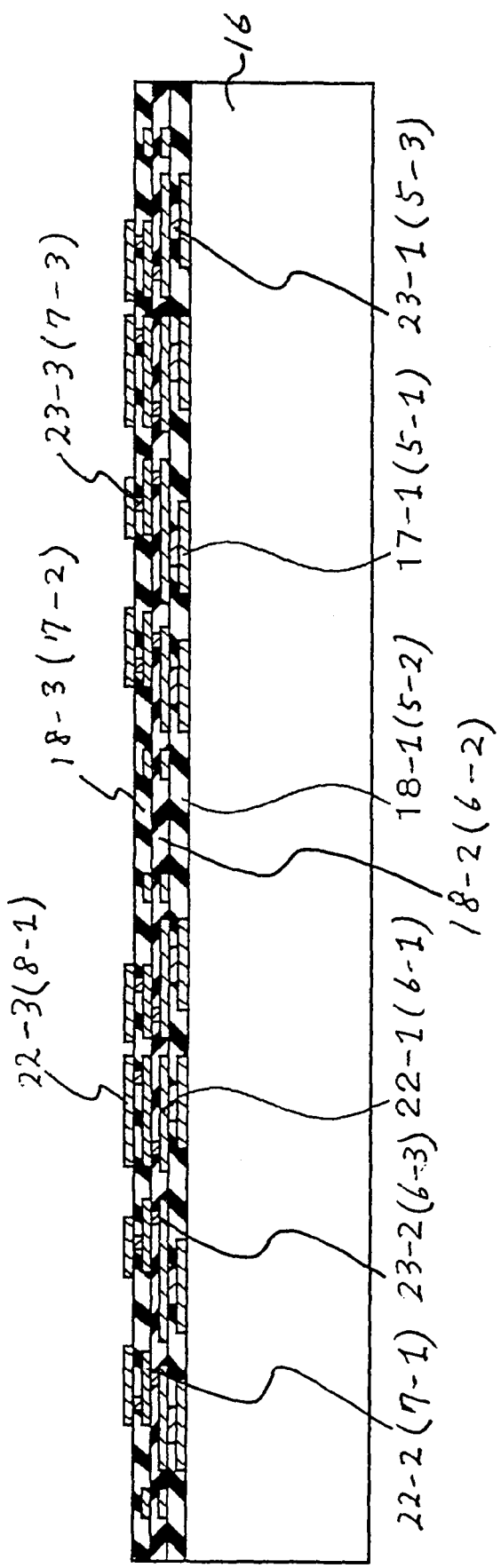
Figure 25K:
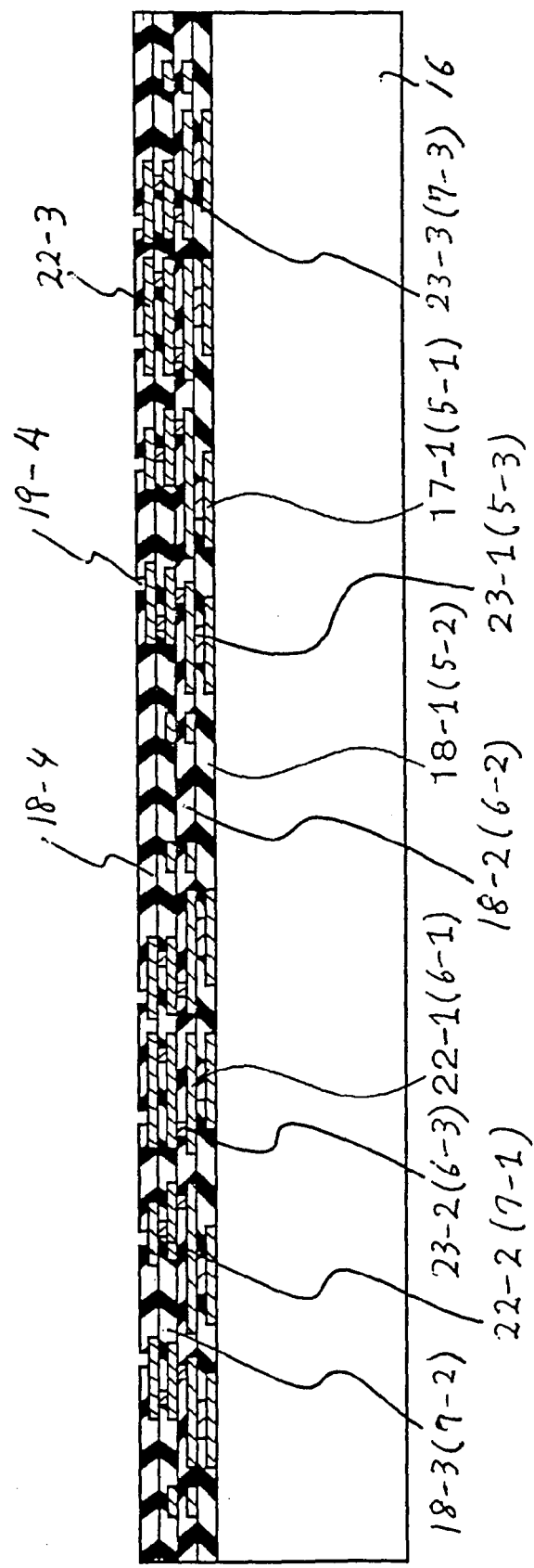
Figure 25L:
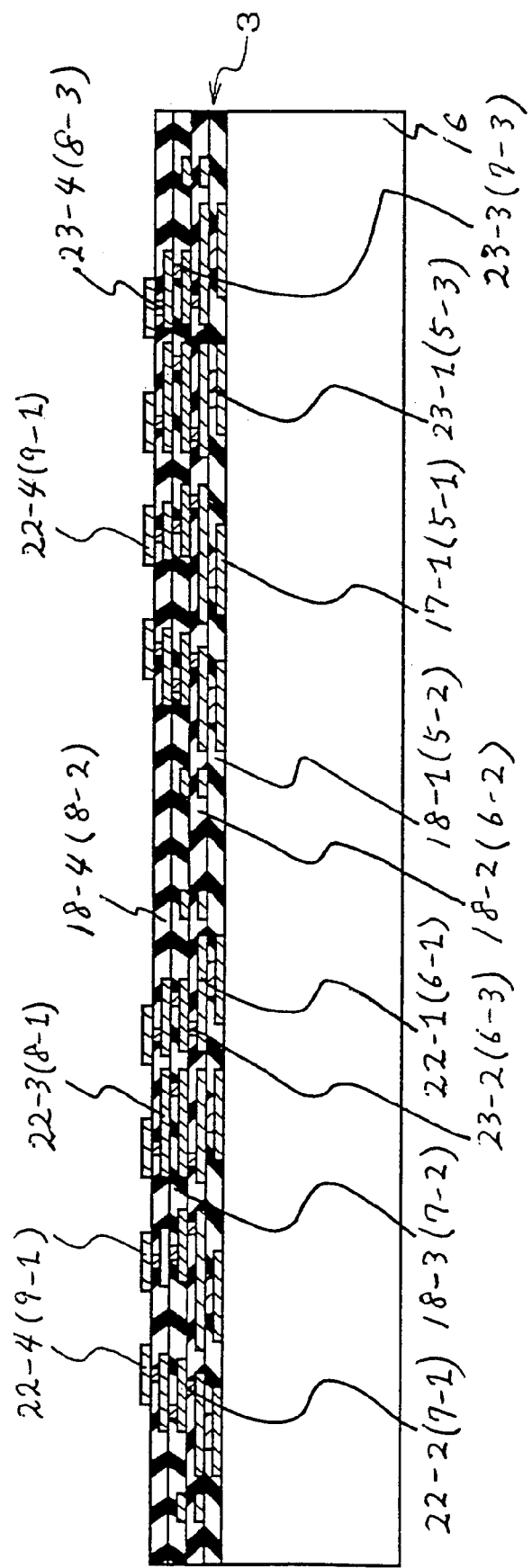
Figure 25M:
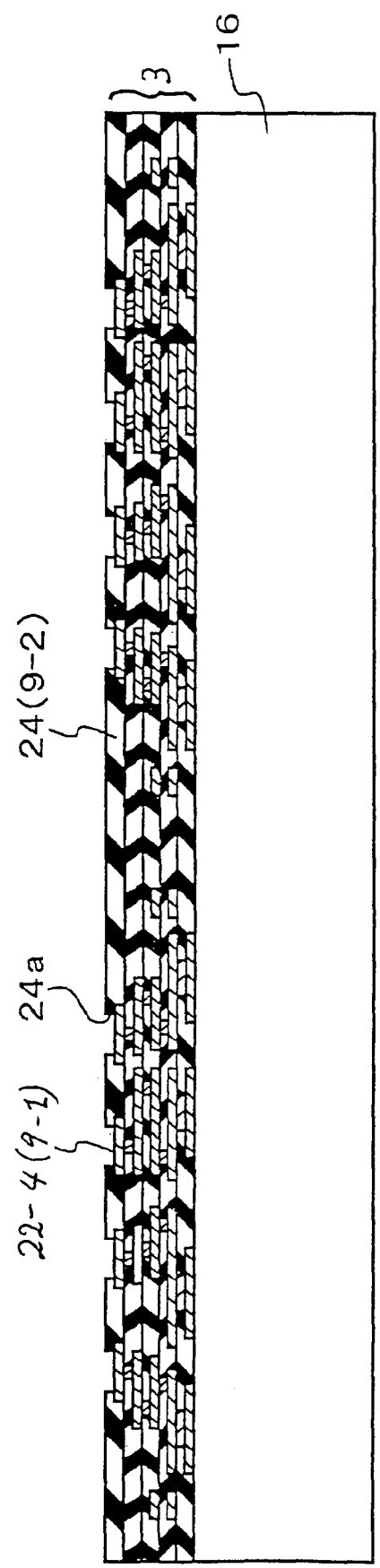
Figure 25N:
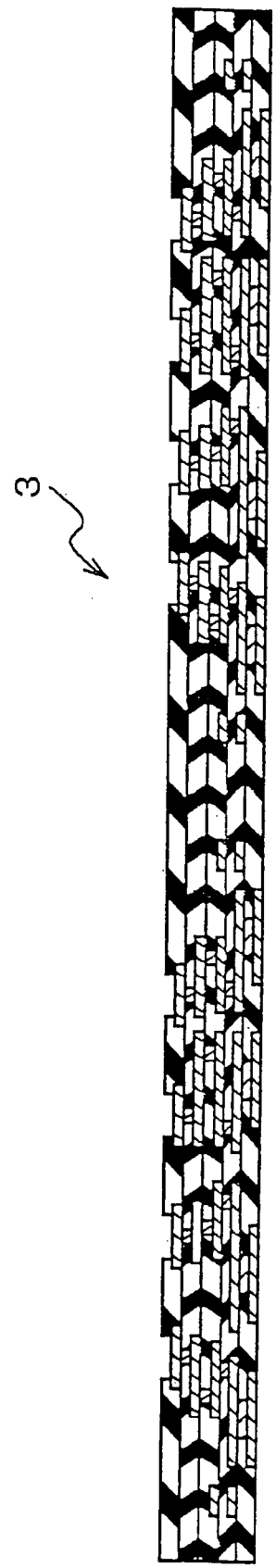
Figure 25O:
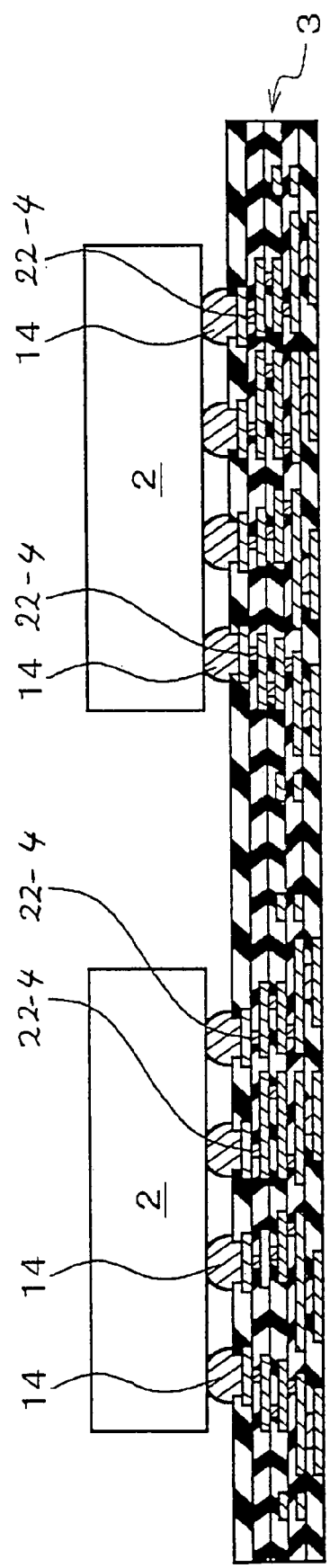
Figure 25P:
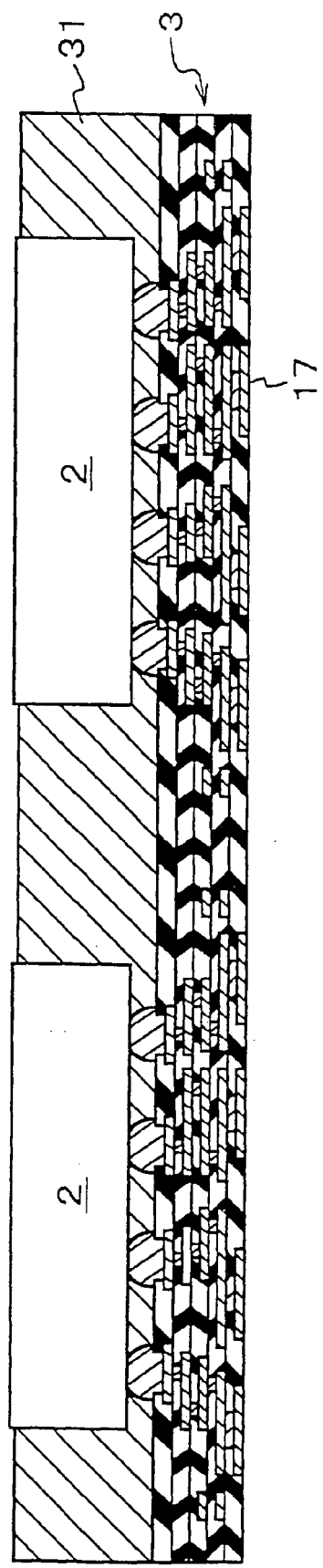
Figure 25Q:
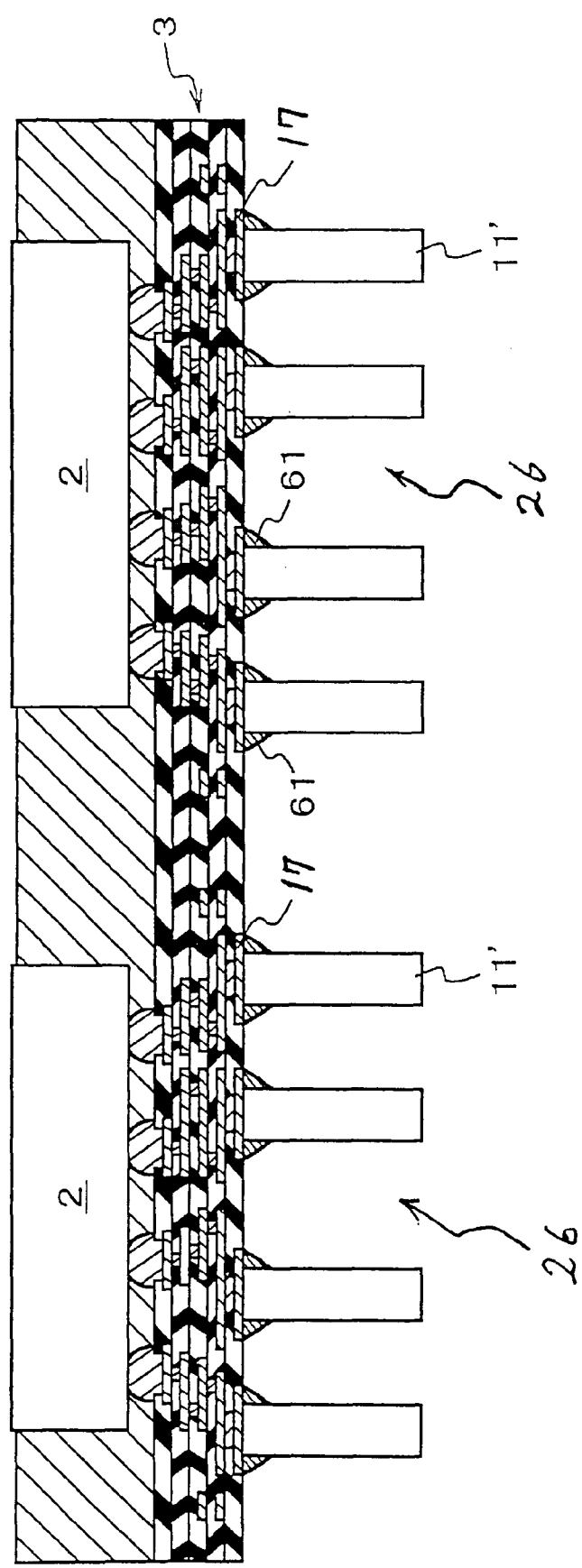
Figure 25R:
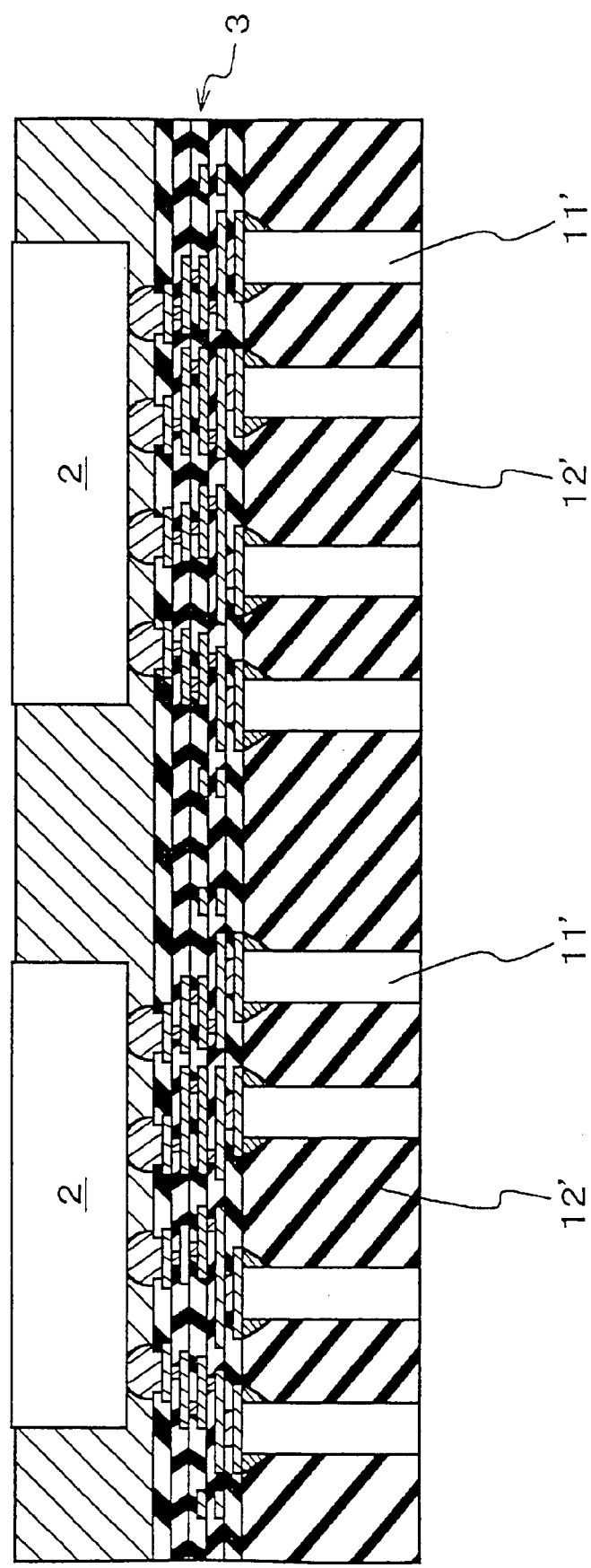
Figure 25S:
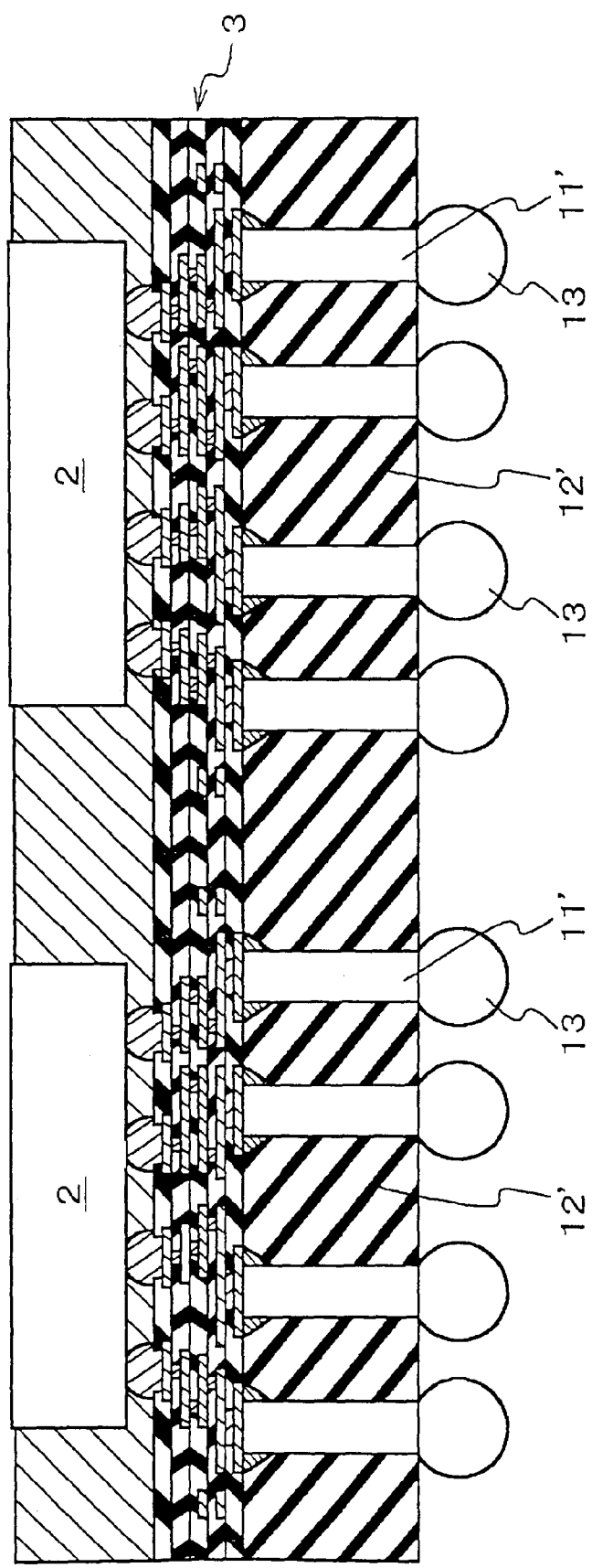
Figure 25T:
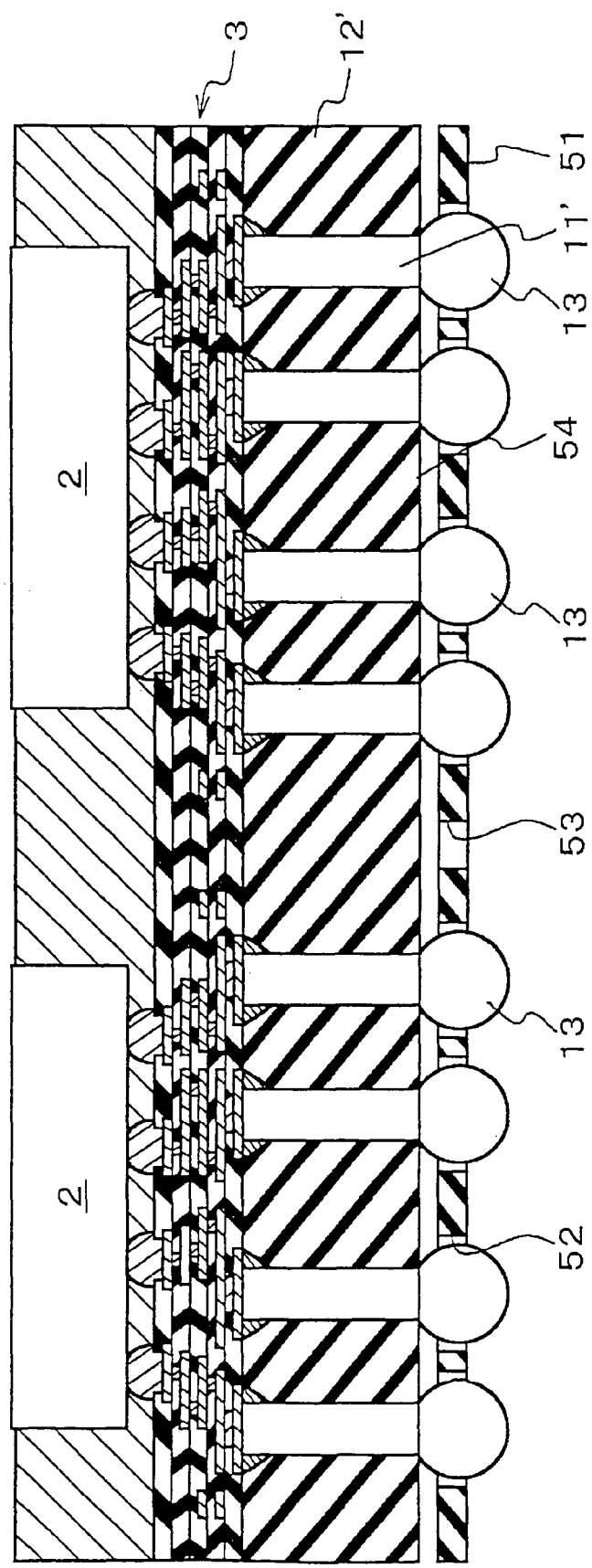
Figure 25U:
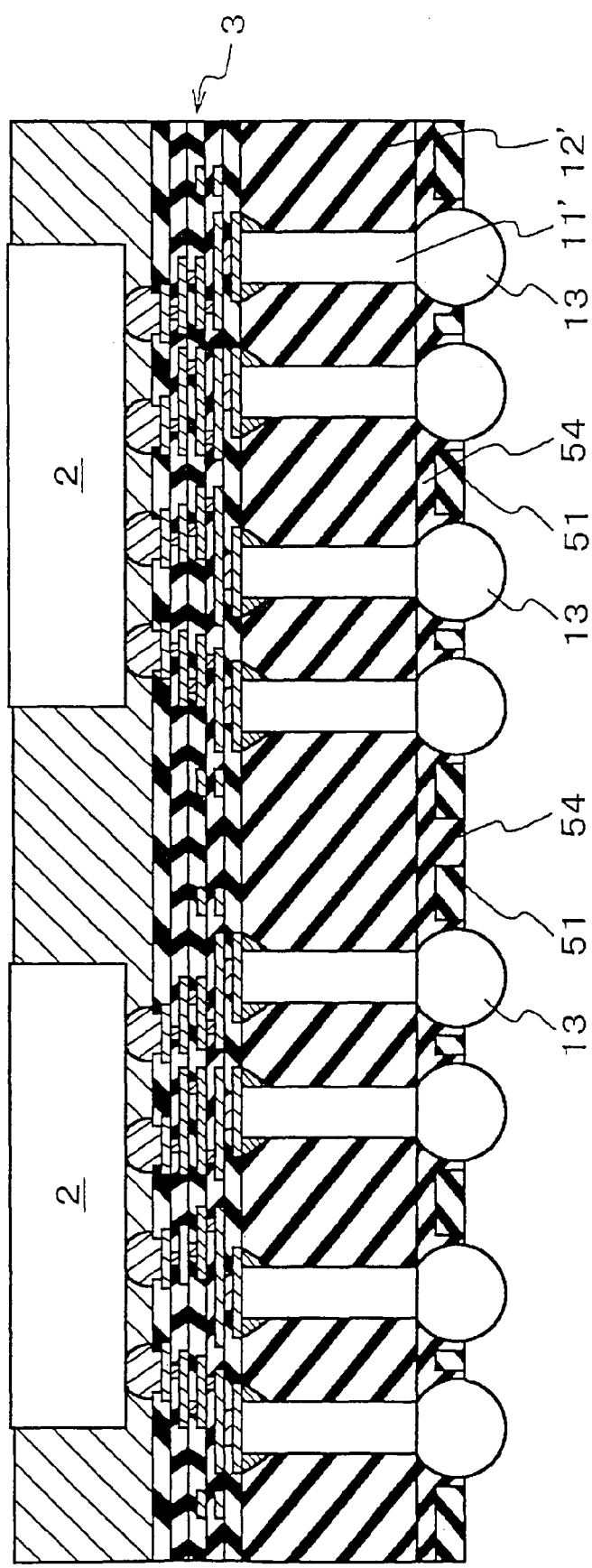

FIGS. 25A through 25U are fragmentary cross sectional elevation views illustrative of a novel method of forming a semiconductor device having a multilayer interconnection board on which a semiconductor chip is mounted in a twelfth embodiment in accordance with the present invention.

With reference to FIG. 25A, a high rigidity plate 16 is prepared. The high rigidity plate 16 may be made of any material having a high rigidity. Metals such as Cu-, Ni-, Al-, W, Mo-, Au-, Ag- and Pt-based metals, complex materials of different metals and ceramics are available for the high rigidity plate 16.

With reference to FIG. 25B, an adhesive metal layer of a metal such as a Ti-base alloy, a Cr-base alloy, a Mo-base alloy, and a W-base alloy is formed on a first surface of the high rigidity plate 16 by a sputtering method. An electrode material layer of a metal such as Cu, Al, and Ni is then formed on the adhesive metal layer by a sputtering method to form laminations of the adhesive metal layer and the electrode material layer. A resist film is then applied on the laminations of the adhesive metal layer and the electrode material layer. The resist film is then patterned by an exposure and a subsequent development to form a resist pattern. A selective wet etching process or a selective dry etching process to the laminations of the adhesive metal layer and the electrode material layer is carried out by use of the resist pattern as a mask so as to pattern the laminations of the adhesive metal layer and the electrode material layer, whereby external electrode pads 17-1 are selectively formed on the first surface of the high rigidity plate 16. The used resist pattern is then removed.

If a minimum pitch of the external electrode pads 17-1 is not so narrow, then it is possible as a modification that a resist is coated directly on the first surface of the high rigidity plate 16 and then patterned by an exposure and a development to form a resist pattern before a selective electroplating of metal is then carried out by use of the resist pattern as a mask, followed by removal of the used resist pattern.

With reference to FIG. 25C, an insulative resin thin film 18-1 is then formed over the external electrode pads 17-1 and the first surface of the high rigidity plate 16. The insulative resin thin film 18-1 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-1. If a fine pattern of not more than 1.0 micrometer is required, it is preferable to use the silicon dioxide based inorganic materials for utilizing diffusion processes of semiconductor.

With reference to FIG. 25D, the insulative resin thin film 18-1 is selectively removed to form openings 19-1 in the insulative resin thin film 18-1 and over the external electrode pads 17-1. A resist film is applied on the insulative resin thin film 18-1 and then patterned by an exposure and a subsequent development to form a resist pattern on the insulative resin thin film 18-1. If the insulative resin thin film 18-1 is made of a material which is removable by a chemical etching process, the insulative resin thin film 18-1 is selectively removed by a wet etching by use of the resist pattern as a mask to form the openings 19-1 in the insulative resin thin film 18-1. If the insulative resin thin film 18-1 is made of a material which is unremovable by the chemical etching process, the insulative resin thin film 18-1 is selectively removed by a dry etching by use of the resist pattern as a mask to form the openings 19-1 in the insulative resin thin film 18-1. The external electrode pads 17-1 are partially shown through the openings 19-1 formed in the insulative resin thin film 18-1. The used resist pattern is then removed.

With reference to FIG. 25E, an adhesive metal thin film 21a is entirely formed which extends on the surface of the insulative resin thin film 18-1 and the shown parts of the external electrode pads 17-1 by a sputtering method. The adhesive metal thin film 21a may be made of a Ti-based alloy, a Cr-based alloy, a Mo-based alloy, or a W-based alloy. Subsequently, a metal electrode thin film 21b is also entirely formed on the adhesive metal thin film 21a by a sputtering method, a chemical vapor deposition or an electroless plating method. The metal electrode thin film 21b may be made of Cu, Al or Ni. Laminations of the adhesive metal thin film 21a and the metal electrode thin film 21b form a metal thin film 21 which extends on the surface of the insulative resin thin film 18-1 and within the openings 19-1 over the external electrode pads 17-1.

With reference to FIG. 25F, a resist film is entirely formed on the metal thin film 21 and then patterned by an exposure and a subsequent development to form a resist pattern over the metal thin film 21. The metal thin film 21 is then patterned by a wet etching or a dry etching by use of the resist pattern as a mask to form metal thin film contact layers 23-1 in the openings 19-1 and metal thin film interconnection layers 22-1 over the insulative resin thin film 18-1, wherein the metal thin film interconnection layers 22-1 are in contact directly with the metal thin film contact layers 23-1, so that the metal thin film interconnection layers 22-1 are electrically connected through the metal thin film contact layers 23-1 to the external electrode pads 17-1. The used resist mask is then removed. The external electrode pads 17-1 shown in FIG. 25F correspond to the first level interconnection pattern 5-1 of the first interconnection layer 5 shown in FIG. 6. The insulative resin thin film 18-1 shown in FIG. 25F also corresponds to the first level insulating layer 5-2 of the first interconnection layer 5 shown in FIG. 6. The metal thin film contact layers 23-1 shown in FIG. 25F also corresponds to the first level contact layer 5-3 of the first interconnection layer 5. The metal thin film interconnection layers 22-1 shown in FIG. 25F also corresponds to the second level interconnection pattern 6-1 of the second interconnection layer 6.

If the pattern pitch of the metal thin film interconnection layers 22-1 is not so narrow, then it is possible as a modification that after the metal thin film 21 has been formed, then the resist pattern is formed on the metal thin film 21 so that a selective electroplating of metal such as Cu is carried out by use of the resist pattern as a mask to form Cu-plated patterns over the metal thin film 21. The used resist mask is then removed. The metal thin film 21 is then selectively etched by use of the Cu-plated patterns as a mask thereby to form the metal thin film interconnection layers 22-1 over the insulative resin thin film 18-1 and the metal thin film contact layers 23-1 in the openings 19-1.

In accordance with the above described method and its modification, it is possible that the thicknesses of the resist film and the metal thin film interconnection layers 22-1 are not more than 1 micrometers.

With reference to FIG. 25G, an insulative resin thin film 18-2 is then formed over the metal thin film interconnection layers 22-1 and the insulative resin thin film 18-1. The insulative resin thin film 18-2 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-2. If a fine pattern of not more than 1.0 micrometer is required, it is preferable to use the silicon dioxide based inorganic materials for utilizing diffusion processes of semiconductor. The insulative resin thin film 18-2 is selectively removed to form openings 19-2 in the insulative resin thin film 18-2 and over the metal thin film interconnection layers 22-1. A resist film is applied on the insulative resin thin film 18-2 and then patterned by an exposure and a subsequent development to form a resist pattern on the insulative resin thin film 18-2. If the insulative resin thin film 18-2 is made of a material which is removable by a chemical etching process, the insulative resin thin film 18-2 is selectively removed by a wet etching by use of the resist pattern as a mask to form the openings 19-2 in the insulative resin thin film 18-2. If the insulative resin thin film 18-2 is made of a material which is unremovable by the chemical etching process, the insulative resin thin film 18-2 is selectively removed by a dry etching by use of the resist pattern as a mask to form the openings 19-2 in the insulative resin thin film 18-2. The metal thin film interconnection layers 22-1 are partially shown through the openings 19-2 formed in the insulative resin thin film 18-2. The used resist pattern is then removed.

With reference to FIG. 25H, an adhesive metal thin film is entirely formed which extends on the surface of the insulative resin thin film 18-2 and the shown parts of the metal thin film interconnection layers 22-1 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-2 and within the openings 19-2 over the metal thin film interconnection layers 22-1. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-2 in the openings 19-2 and metal thin film interconnection layers 22-2 over the insulative resin thin film 18-2, wherein the metal thin film interconnection layers 22-2 are in contact directly with the metal thin film contact layers 23-2, so that the metal thin film interconnection layers 22-2 are electrically connected through the metal thin film contact layers 23-2 to the metal thin film interconnection layers 22-1. The used resist mask is then removed. The metal thin film interconnection layers 22-1 shown in FIG. 25H correspond to the second level interconnection pattern 6-1 of the second interconnection layer 6 shown in FIG. 6. The insulative resin thin film 18-2 shown in FIG. 25H also corresponds to the second level insulating layer 6-2 of the second interconnection layer 6 shown in FIG. 6. The metal thin film contact layers 23-2 shown in FIG. 25H also corresponds to the second level contact layer 6-3 of the second interconnection layer 6. The metal thin film interconnection layers 22-2 shown in FIG. 25H also corresponds to the third level interconnection pattern 7-1 of the third interconnection layer 7.

If the pattern pitch of the metal thin film interconnection layers 22-2 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-2 over the insulative resin thin film 18-2 and the metal thin film contact layers 23-2 in the openings 19-2.

In accordance with the above described method and its modification, it is possible that the thicknesses of the resist film and the metal thin film interconnection layers 22-2 are not more than 1 micrometers.

With reference to FIG. 25I, an insulative resin thin film 18-3 is then formed over the metal thin film interconnection layers 22-2 and the insulative resin thin film 18-2. The insulative resin thin film 18-3 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-3. If a fine pattern of not more than 1.0 micrometer is required, it is preferable to use the silicon dioxide based inorganic materials for utilizing diffusion processes of semiconductor. The insulative resin thin film 18-3 is selectively removed to form openings 19-3 in the insulative resin thin film 18-3 and over the metal thin film interconnection layers 22-2. A resist film is applied on the insulative resin thin film 18-3 and then patterned by an exposure and a subsequent development to form a resist pattern on the insulative resin thin film 18-3. If the insulative resin thin film 18-3 is made of a material which is removable by a chemical etching process, the insulative resin thin film 18-3 is selectively removed by a wet etching by use of the resist pattern as a mask to form the openings 19-3 in the insulative resin thin film 18-3. If the insulative resin thin film 18-3 is made of a material which is unremovable by the chemical etching process, the insulative resin thin film 18-3 is selectively removed by a dry etching by use of the resist pattern as a mask to form the openings 19-3 in the insulative resin thin film 18-3. The metal thin film interconnection layers 22-2 are partially shown through the openings 19-3 formed in the insulative resin thin film 18-3. The used resist pattern is then removed.

With reference to FIG. 25J, an adhesive metal thin film is entirely formed which extends on the surface of the insulative resin thin film 18-3 and the shown parts of the metal thin film interconnection layers 22-2 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-3 and within the openings 19-3 over the metal thin film interconnection layers 22-2. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-3 in the openings 19-3 and metal thin film interconnection layers 22-3 over the insulative resin thin film 18-3, wherein the metal thin film interconnection layers 22-3 are in contact directly with the metal thin film contact layers 23-3, so that the metal thin film interconnection layers 22-3 are electrically connected through the metal thin film contact layers 23-3 to the metal thin film interconnection layers 22-2. The used resist mask is then removed. The metal thin film interconnection layers 22-2 shown in FIG. 25J correspond to the third level interconnection pattern 7-1 of the third interconnection layer 7 shown in FIG. 6. The insulative resin thin film 18-3 shown in FIG. 25J also corresponds to the third level insulating layer 7-2 of the third interconnection layer 7 shown in FIG. 6. The metal thin film contact layers 23-3 shown in FIG. 25J also corresponds to the third level contact layer 7-3 of the third interconnection layer 7. The metal thin film interconnection layers 22-3 shown in FIG. 25J also corresponds to the fourth level interconnection pattern 8-1 of the third interconnection layer 8.

If the pattern pitch of the metal thin film interconnection layers 22-3 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-3 over the insulative resin thin film 18-3 and the metal thin film contact layers 23-3 in the openings 19-3.

In accordance with the above described method and its modification, it is possible that the thicknesses of the resist film and the metal thin film interconnection layers 22-3 are not more than 1 micrometers.

With reference to FIG. 25K, an insulative resin thin film 18-4 is then formed over the metal thin film interconnection layers 22-3 and the insulative resin thin film 18-3. The insulative resin thin film 18-4 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-4. If a fine pattern of not more than 1.0 micrometer is required, it is preferable to use the silicon dioxide based inorganic materials for utilizing diffusion processes of semiconductor. The insulative resin thin film 18-4 is selectively removed to form openings 19-4 in the insulative resin thin film 18-4 and over the metal thin film interconnection layers 22-3. A resist film is applied on the insulative resin thin film 18-4 and then patterned by an exposure and a subsequent development to form a resist pattern on the insulative resin thin film 18-4. If the insulative resin thin film 18-4 is made of a material which is removable by a chemical etching process, the insulative resin thin film 18-4 is selectively removed by a wet etching by use of the resist pattern as a mask to form the openings 19-4 in the insulative resin thin film 18-4. If the insulative resin thin film 18-4 is made of a material which is unremovable by the chemical etching process, the insulative resin thin film 18-4 is selectively removed by a dry etching by use of the resist pattern as a mask to form the openings 19-4 in the insulative resin thin film 18-3. The metal thin film interconnection layers 22-3 are partially shown through the openings 19-4 formed in the insulative resin thin film 18-4. The used resist pattern is then removed.

With reference to FIG. 25L, an adhesive metal thin film is entirely formed which extends on the surface of the insulative resin thin film 18-4 and the shown parts of the metal thin film interconnection layers 22-3 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-4 and within the openings 19-4 over the metal thin film interconnection layers 22-3. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-4 in the openings 19-4 and pad electrodes 22-4 over the insulative resin thin film 18-4, wherein the pad electrodes 22-4 are in contact directly with the metal thin film contact layers 23-4, so that the pad electrodes 22-4 are electrically connected through the metal thin film contact layers 23-4 to the metal thin film interconnection layers 22-3. The used resist mask is then removed. The metal thin film interconnection layers 22-3 shown in FIG. 25L correspond to the fourth level interconnection pattern 8-1 of the fourth interconnection layer 8 shown in FIG. 6. The insulative resin thin film 18-4 shown in FIG. 25L also corresponds to the fourth level insulating layer 8-2 of the fourth interconnection layer 8 shown in FIG. 6. The metal thin film contact layers 23-4 shown in FIG. 25L also corresponds to the fourth level contact layer 8-3 of the fourth interconnection layer 8. The pad electrodes 22-4 shown in FIG. 25L also corresponds to the fifth level interconnection pattern 9-1 of the fifth interconnection layer 9.

If the pattern pitch of the pad electrodes 22-4 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the pad electrodes 22-4 over the insulative resin thin film 18-4 and the metal thin film contact layers 23-4 in the openings 19-4.

In accordance with the above described method and its modification, it is possible that the thicknesses of the resist film and the pad electrodes 22-4 are not more than 1 micrometers.

With reference to FIG. 25M, a solder resist film 24 is then formed over the pad electrodes 22-4 and the insulative resin thin film 18-4 in order to protect the multilayer interconnection board 3 having the pad electrodes 24. The solder resist film 24 shown in FIG. 25M corresponds to the fifth level insulating layer 9-2 of the fifth interconnection layer 9 shown in FIG. 6. The solder resist film 24 may comprise an organic insulating film such an epoxy resin film containing an inorganic filler such as fine powders of silicon dioxide. Alternatively, the solder resist film 24 may be made of a material which has a large resistivity to external chemical stress, and a large resistivity to a Flux cleaning solution or an Au plating solution as well as a high adhesiveness to a sealing material such as an under-fill material. If the above first to fourth insulative resin thin films 18-1, 18-2, 18-3 and 18-4 are highly resistive to the chemical and chemical stresses, it is possible as a modification to eliminate the formation of the solder resist film 24. The solder resist film 24 is selectively removed to form openings 24a in the solder resist film 24 and over the pad electrodes 22-4. If the solder resist film 24 is made of a non-photosensitive material, a resist film is applied on the solder resist film 24 and then patterned by an exposure and a subsequent development to form a resist pattern on the solder resist film 24, so that the solder resist film 24 is selectively removed by a wet etching by use of the resist pattern as a mask to form the openings 24a in the solder resist film 24, followed by removal of the used resist pattern. If the solder resist film 24 is made of a photosensitive material, then the solder resist film 24 is directly patterned by an exposure and a subsequent development to form the openings 24a in the solder resist film 24. The electrode pads 22-4 are partially shown through the openings 24a formed in the solder resist film 24.

With reference to FIG. 25N, the high rigidity plate 16 is completely removed by an etching process, whereby the multilayer interconnection board 3 remains. The external electrode pads 17-1 in the first interconnection layer 5 and the pad electrodes 22-4 in the fifth interconnection layer 9 are then subjected to an electroless plating for plating laminated Ni and Au layers or laminated Zn, Ni and Au layers on the external electrode pads 17-1 and the pad electrodes 22-4 in order to improve a bonding property between the external electrode pads 17-1 and also a bonding property between the pad electrodes 22-4 and the bumps 14 of the semiconductor chip 2. As a result, the multilayer interconnection board 3 is completed, which comprises plural unit multilayer interconnection boards. A test for electrical characteristics of the multilayer interconnection board 3 is then made, so that only quality-confirmed units in the plural unit multilayer interconnection boards in the electrical characteristic test are then subjected to a mounting process for mounting semiconductor chips thereon.

With reference to FIG. 25O, semiconductor chips 2 are mounted on the multilayer interconnection board 3, wherein the semiconductor chips 2 have the plural bumps 14, and the plural bumps 14 are made into contact with the electrode pads 22-4 of the multilayer interconnection board 3, so that the semiconductor chips 2 are electrically connected through the plural bumps 14 to the multilayer interconnection board 3. If the bumps 14 are made of a metal based solder material such as Sn or Pb, a flip-chip bonding utilizing a heat re-flow process using Flux is available for bonding the plural bumps 14 to the electrode pads 22-4 of the multilayer interconnection board 3. If the bumps 14 are made of a metal based solder material such as Au or In, a flip-chip bonding utilizing a thermo-compression bonding is available for bonding the plural bumps 14 to the electrode pads 22-4 of the multilayer interconnection board 3.

With reference to FIG. 25P, an insulative resin material 31 is formed which coats side walls of the semiconductor chips 2, an inter-space between the semiconductor chips 2 and the multilayer interconnection board 3 around the bumps 14 and the surface of the solder resist film 24 of the multilayer interconnection board 3 in order to protect the semiconductor chips 2, the bumps 14 and the multilayer interconnection board 3. This coating process is carried out by use of a resin injection technique involving a vacuum sealing technique or a transfer sealing technique. The insulative resin material 31 may be made of one of epoxy resin materials, silicone resin materials, polyimide resin materials, polyolefin resin materials, cyanate ester resin materials, phenol resin materials and naphthalene resin materials.

With reference to FIG. 25Q, plural metal column-shaped buffer layers 11' are bonded by an adhesive 61 in to the external electrode pads 17 of the multilayer interconnection board 3. It is preferable to select an adhesive material which is high in wettability to both the plural metal column-shaped buffer layers 11' and the external electrode pads 17.

With reference to FIG. 25R, an insulative stress absorption resin is provided to completely fill the gaps 26 between the plural metal column-shaped buffer layers 11' to form stress absorption layers 12' between the plural metal column-shaped buffer layers 11'. The stress absorption layers 12' protects the plural metal column-shaped buffer layers 11' and the multilayer interconnection board 3 from mechanical and chemical stresses. The insulative stress absorption resin is provided to completely fill the gaps 26 by a spin coating method or a transfer sealing technique. If the bottom surfaces of the plural metal column-shaped buffer layers 11' are coated with the insulative stress absorption resin, then the insulative stress absorption resin coating the bottom surfaces of the plural metal column-shaped buffer layers 11' are removed, for example by a chemical mechanical polishing method or any available removal method, so that the bottom surfaces of the plural metal column-shaped buffer layers 11' are shown. The plural metal column-shaped buffer layers 11' of the buffer layer 4 are then subjected to an electroless plating for plating laminated Ni and Au layers or laminated Zn, Ni and Au layers on the plural metal column-shaped buffer layers 11' and the pad electrodes 22-4 in order to improve a bonding property between the plural metal column-shaped buffer layers 11' and also a bonding property between the pad electrodes 22-4 and the bumps 14 of the semiconductor chip 2. As a result, the multilayer interconnection board 3 is completed, which comprises plural unit multilayer interconnection boards.

With reference to FIG. 25S, solder balls 13 are formed which are in contact directly with the bottoms of the plural metal column-shaped buffer layers 11' of the buffer layer 4' to form a semiconductor device 1 having the multilayer interconnection board 3 and the plural semiconductor chips 2 mounted thereon. The solder balls 13 serve as external terminals. The solder balls 13 may be made of a metal based material such as Sn or Pb. The solder balls 13 may also be free of lead. The solder balls 13 may be made of an electrically conductive material having a low melting point, a high heat conductivity and a rapid solidity as well as a large surface tension so that the electrically conductive material becomes in the form of balls. Since the plural metal column-shaped buffer layers 11' of the buffer layer 4' are electrically conductive, the external electrode pads 17-1 and the solder balls 13 are eclectically connected through the plural metal column-shaped buffer layers 11' of the buffer layer 4'.

With reference to FIG. 25T, a supporting plate 51 is provided which extends in parallel to the bottom surface of the buffer layer 4', wherein the supporting plate 51 has the array of solder ball insertion holes 52 having a diameter which is slightly larger than a diameter of the solder balls 13, so that the solder balls 13 are inserted in the solder ball insertion holes 52 and surrounded by the supporting plate 51, thereby to form an inter-space between the supporting plate 51 and the bottom surface or the second surface of the buffer layer 4'. The supporting plate 51 further has a resin injection hole 53 for allowing a resin material into the inter-space between the supporting plate 51 and the bottom surface or the second surface of the multilayer interconnection board 3.

With reference to FIG. 25U, a resin material is injected through the resin injection hole 53 of the supporting plate 51 into the inter-space between the supporting plate 51 and the bottom surface of the buffer layer 4', thereby to form the supporting sealing resin material 54 in the inter-space between the supporting plate 51 and the bottom surface of the buffer layer 4'. The supporting sealing resin material 54 is tightly contact with upper portions of the solder balls 13 for supporting the solder balls 13 to increase the bonding stability between the solder balls 13 and the plural metal column-shaped buffer layers 11' of the buffer layer 4'.

In accordance with this embodiment, the plural metal column-shaped buffer layers 11' are bonded by the adhesive 61 to the external electrode pads 17 of the multilayer interconnection board 3 after the high rigidity plate 16 of the metal plate has completely been removed from the bottom surface or the second surface of the multilayer interconnection board 3. It is unnecessary to selectively etch the high rigidity plate 16 of the metal plate, whereby it is impossible to cause any in-plane variation in etching to the high rigidity plate 16.

Thirteenth Embodiment

A thirteenth embodiment according to the present invention will be described in detail with reference to the drawings. A difference in the thirteenth embodiment from the twelfth embodiment is in that a supporting layer 59 is provided in gaps between the plural metal column-shaped buffer layers 11' in place of the stress absorption layer 12'.

Figure 26:
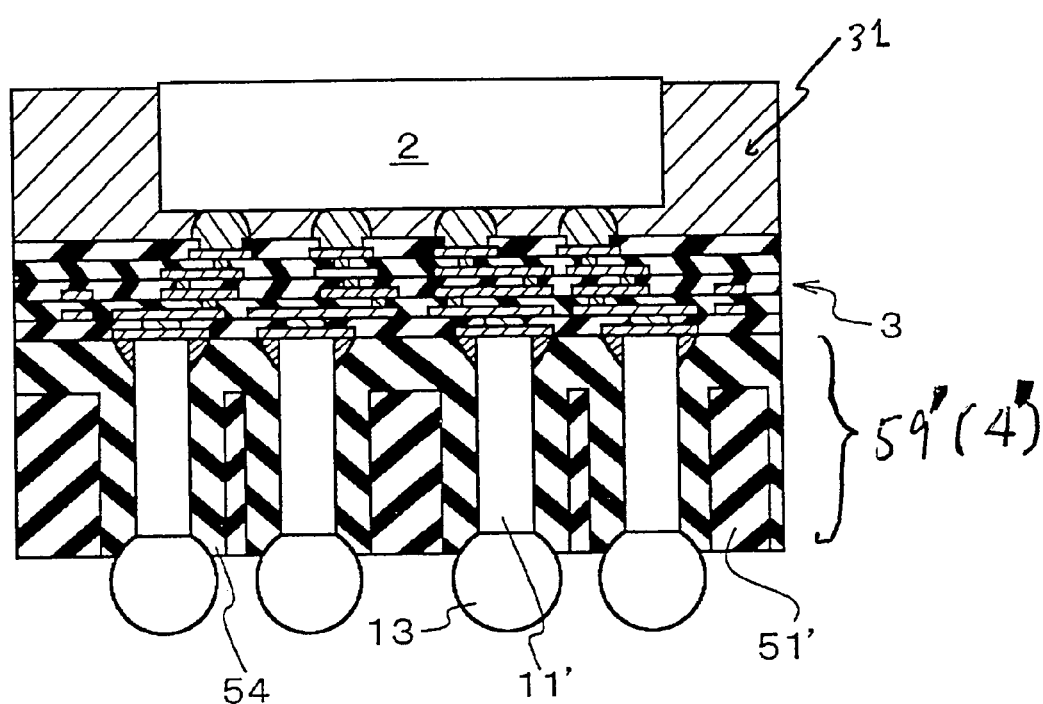
FIG. 26 is a cross sectional elevation view illustrative of a semiconductor device having a multilayer interconnection board, on which a semiconductor chip is mounted in a thirteenth embodiment according to the present invention.

FIG. 26 is a cross sectional elevation view illustrative of a semiconductor device having a multilayer interconnection board, on which a semiconductor chip is mounted in a thirteenth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17. A sealing resin material 15 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. A sealing resin material 31 is provided over the first surface of the multilayer interconnection board 3 for sealing the semiconductor chip 2 and the bumps 14. A second surface of the multilayer interconnection board 3 has arrays of external electrode pads 17 on which a buffer layer 4' is formed. Solder balls 13 are formed on a bottom surface of the buffer layer 4'. The buffer layer 4' comprises plural metal column-shaped buffer layers 11' which are bonded by an adhesive 61 in to the external electrode pads 17 and a supporting layer 59' in gaps 26 between the plural metal column-shaped buffer layers 11'. The buffer layer 4' is thus provided between the external electrode pads 17 of the multilayer interconnection board 3 and the solder balls 13. The buffer layer 4' comprising the plural metal column-shaped buffer layers 11' and the supporting layer 59' has a sufficient standoff height for relaxing the stress applied between the flip-chip semiconductor device 32 and the circuit board not illustrated. The supporting layer 59' is provided on the bottom surface of the multilayer interconnection board 3 except under the external electrode pads 17. Since the buffer layer 4' comprises the plural metal column-shaped buffer layers 11', the external electrode pads 17 of the multilayer interconnection board 3 are electrically connected through the plural metal column-shaped buffer layers 11' to the solder balls 13. The supporting layer 59 is provided on the bottom surface of the buffer layer 4' so that the supporting layer 59 surrounds upper parts of the solder balls 13 for supporting the solder balls 13 to increase the bonding stability between the solder balls 13 and the plural metal column-shaped buffer layers 11' of the buffer layer 4'. The supporting layer 59 comprises a supporting plate 51 and a supporting sealing resin material 54. The supporting plate 51 extends in parallel to the bottom surface of the buffer layer 4'. The supporting plate 51 may be made of a high rigidity material. Insulating materials and conductive materials are also available for the supporting plate 51, provided that the material has the high rigidity. The supporting sealing resin material 54 is filled in the gaps 26 between the plural metal column-shaped buffer layers 11' of the buffer layer 4'. The supporting sealing resin material 54 is tightly contact with upper portions of the solder balls 13 for supporting the solder balls 13 to increase the bonding stability between the solder balls 13 and the plural metal column-shaped buffer layers 11' of the buffer layer 4'. The supporting plate 51 defines a height or a thickness of the supporting sealing resin material 54, wherein the thickness of the supporting sealing resin material 54 is so defined that the upper portions of the solder balls 13 are tightly contact with the supporting sealing resin material 54, so that the tops of the solder balls 13 project from the supporting sealing resin material 54.

Figure 27A:
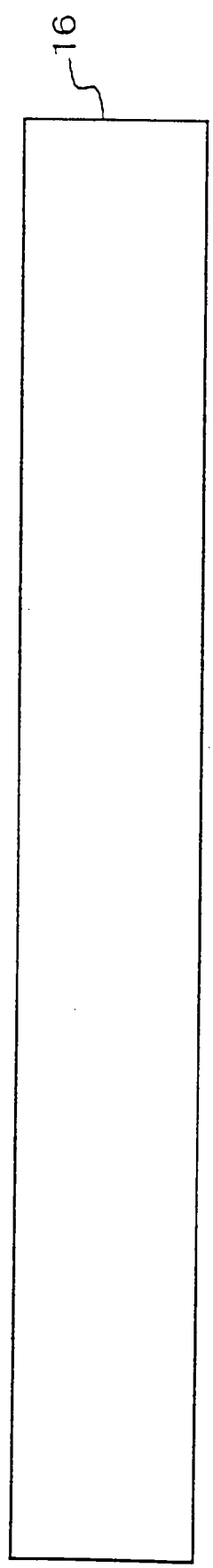
FIGS. 27A through 27R are fragmentary cross sectional elevation views illustrative of a novel method of forming a semiconductor device having a multilayer interconnection board on which a semiconductor chip is mounted in a thirteenth embodiment in accordance with the present invention.
Figure 27B:
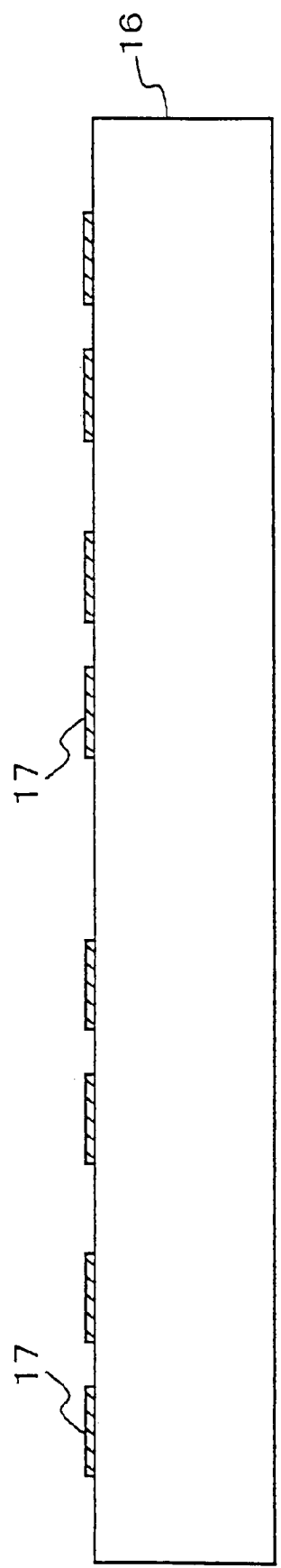
Figure 27C:
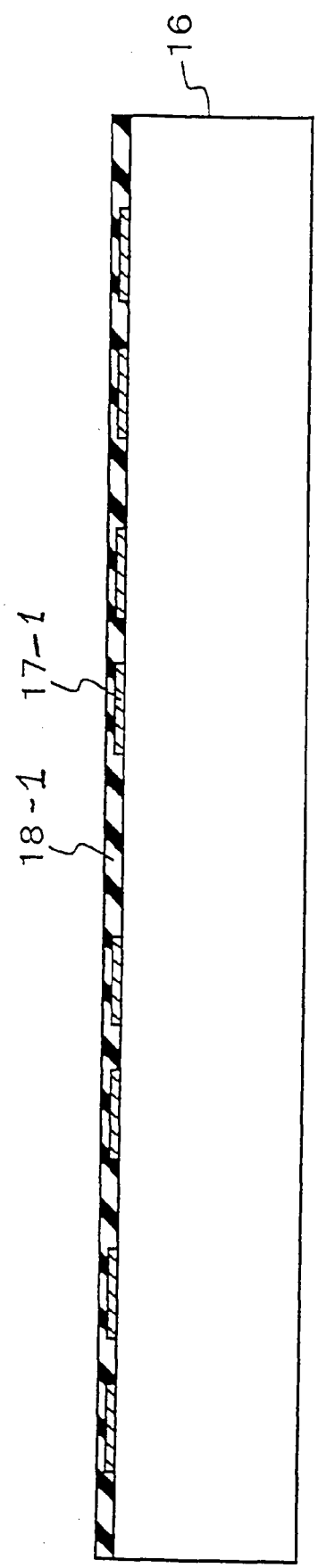
Figure 27D:
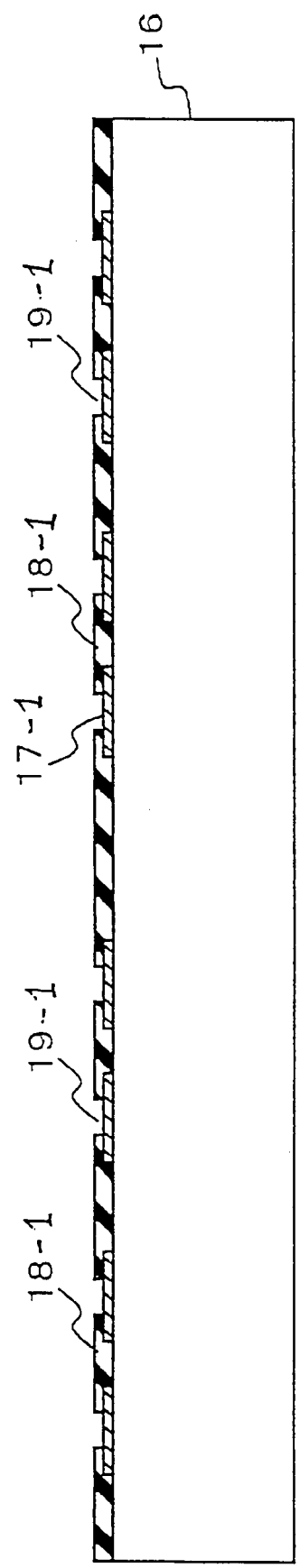
Figure 27E:
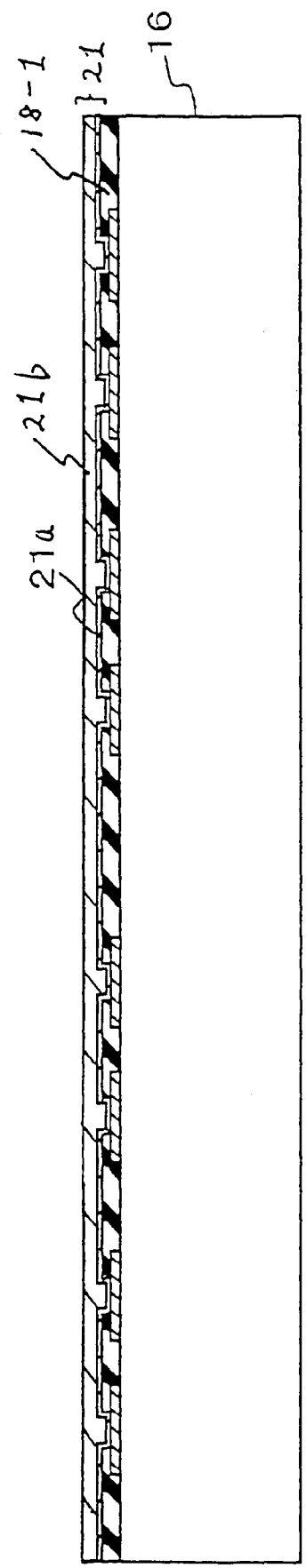
Figure 27F:
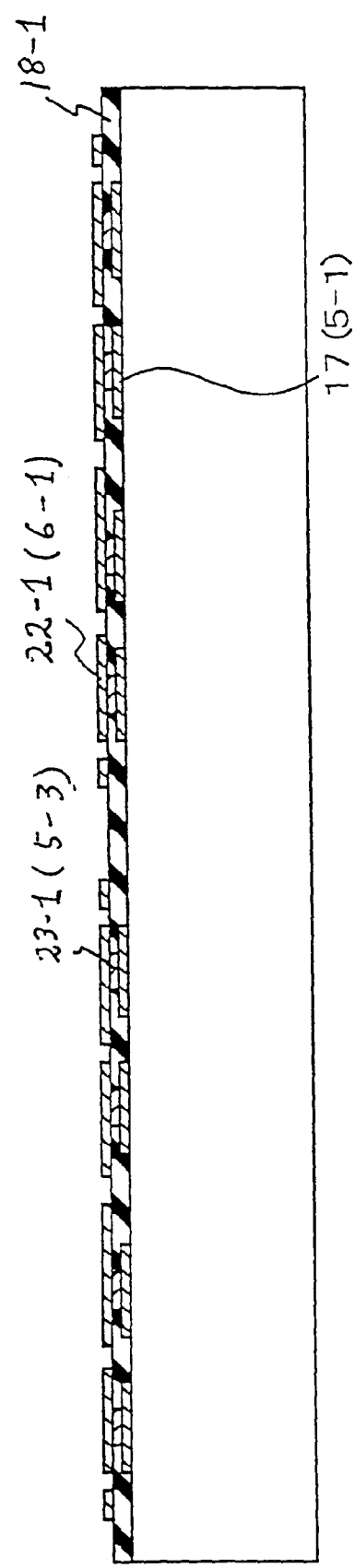
Figure 27G:
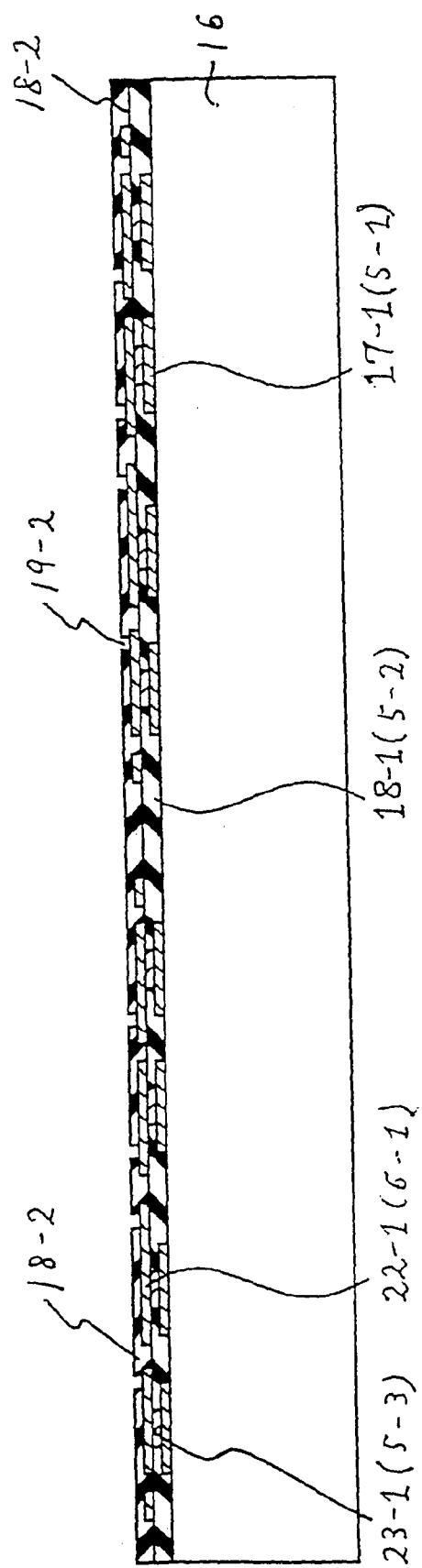
Figure 27H:
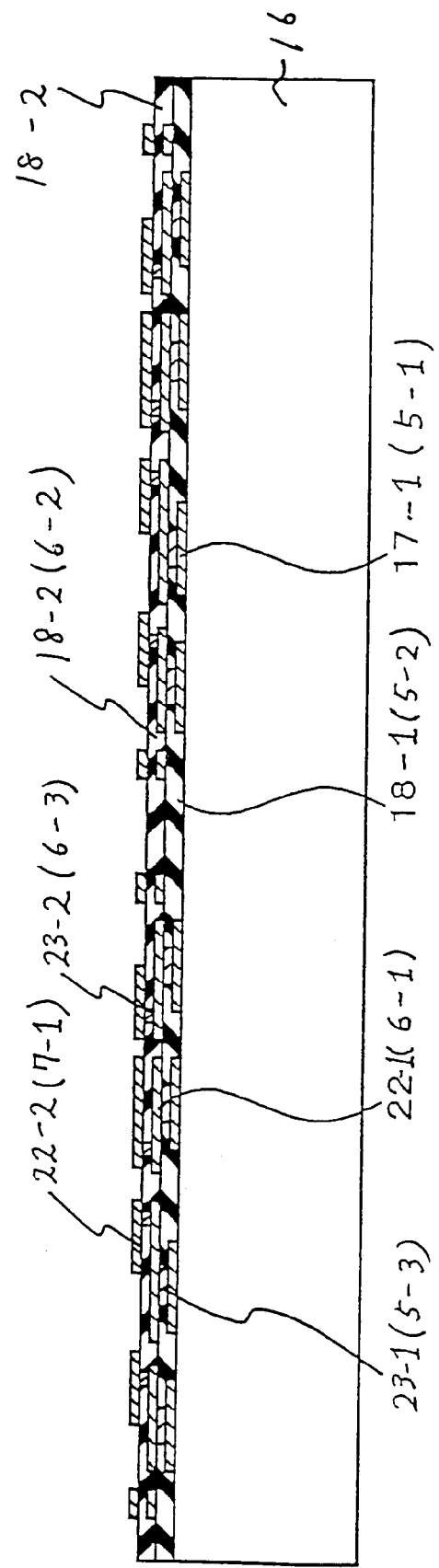
Figure 27I:
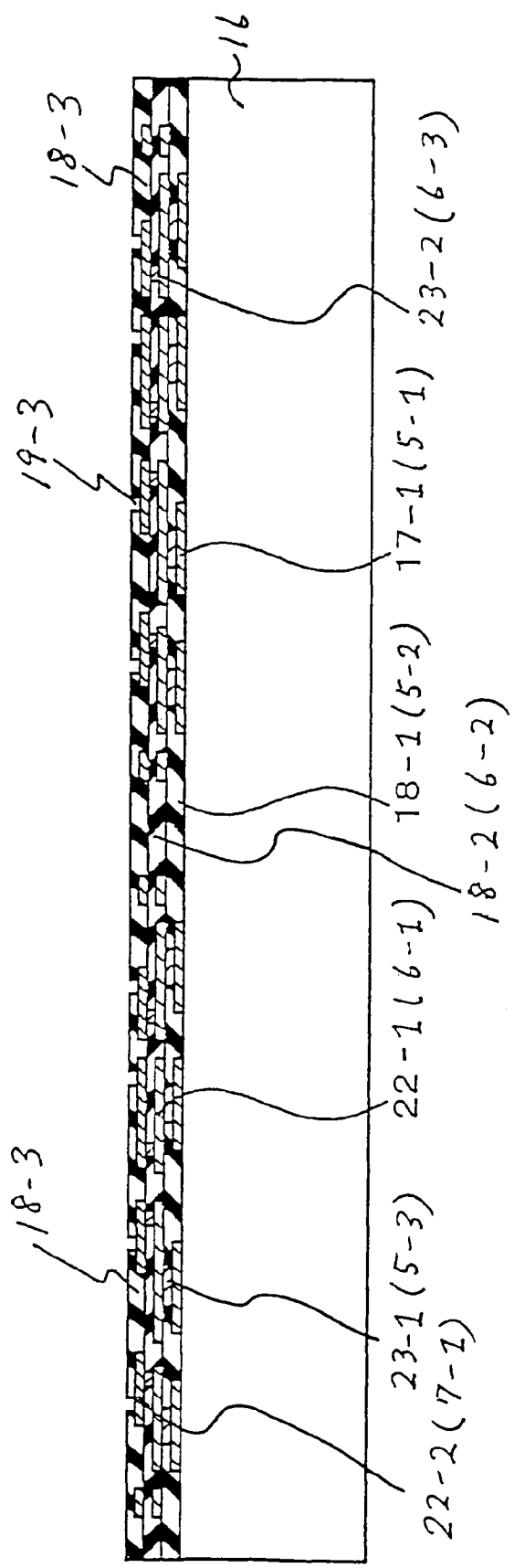
Figure 27J:
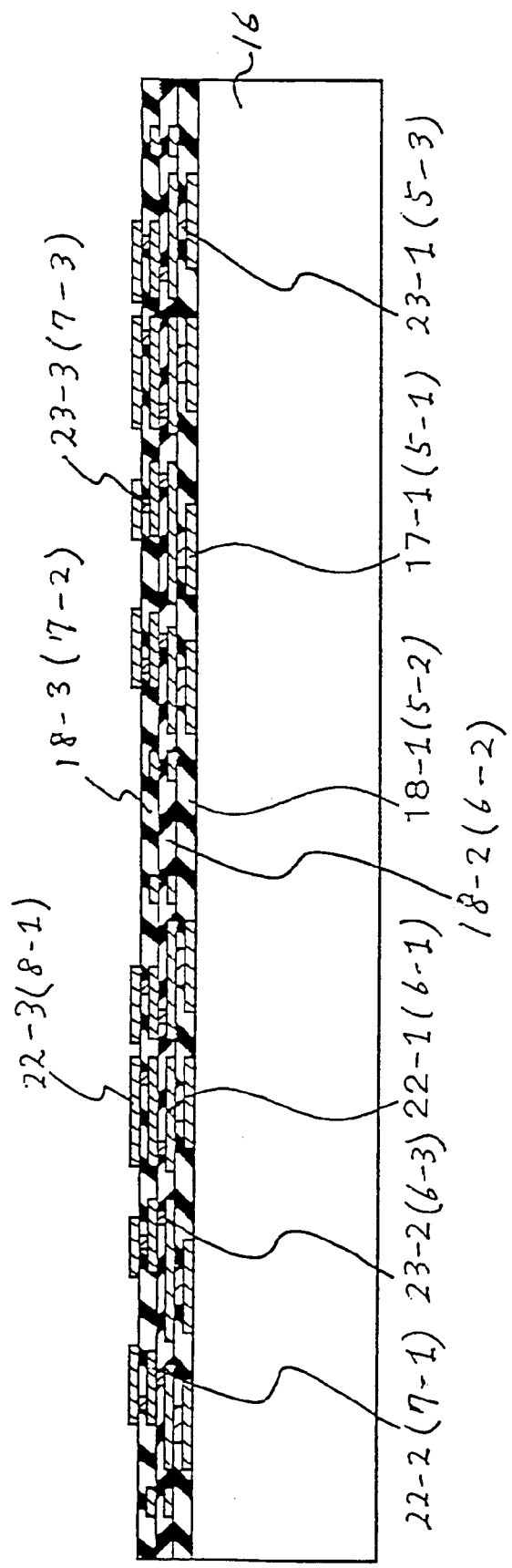
Figure 27K:
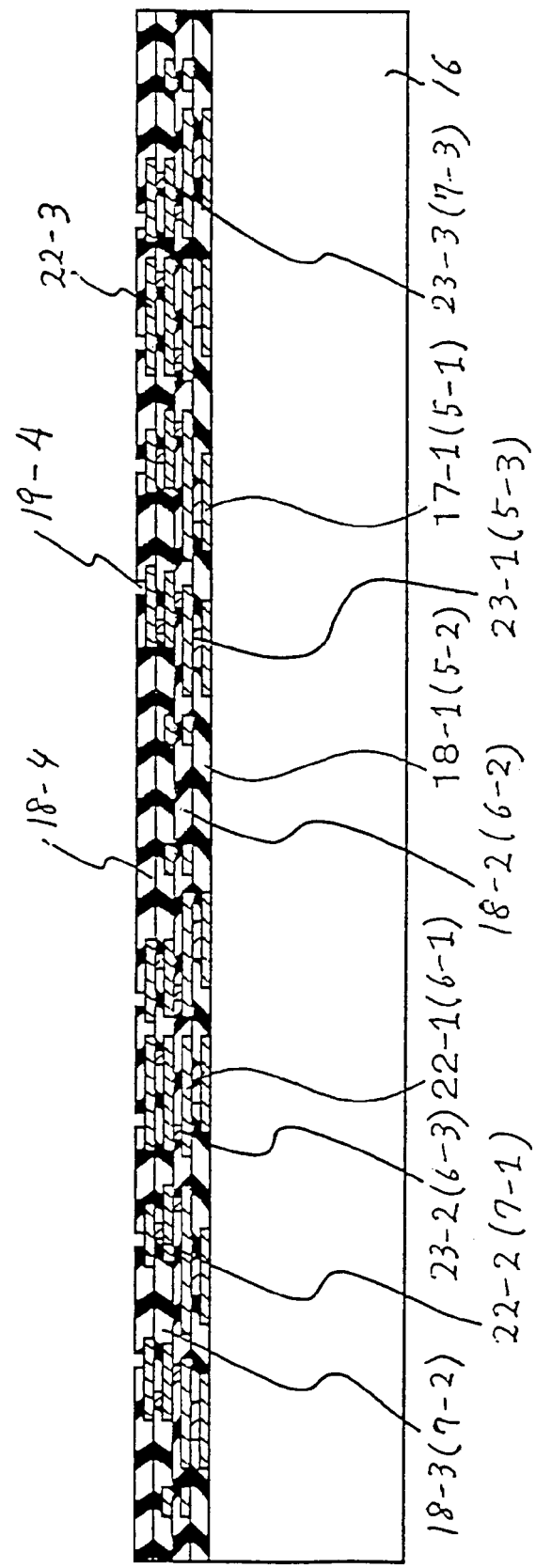
Figure 27L:
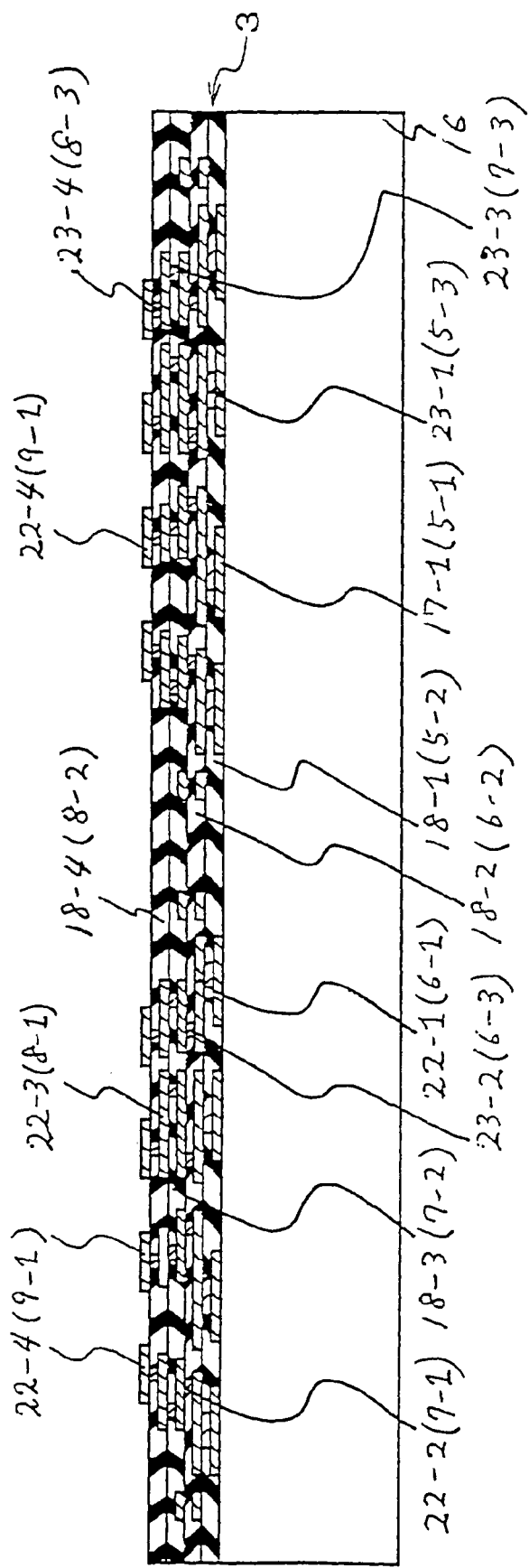
Figure 27M:
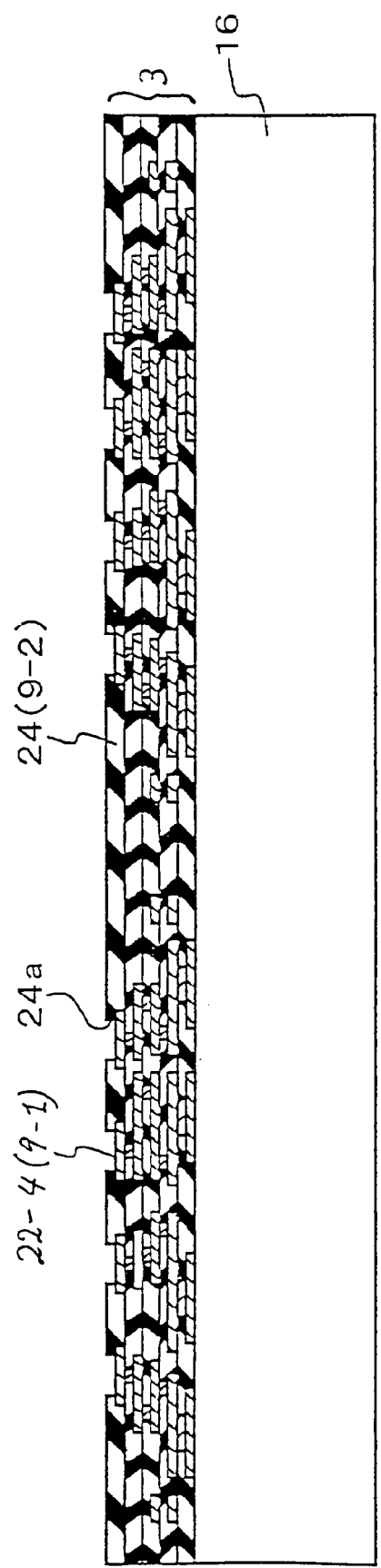
Figure 27N:
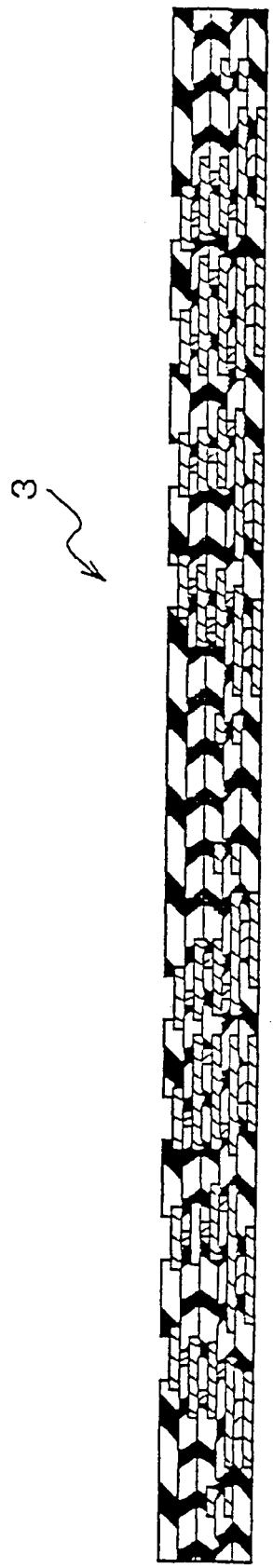
Figure 27O:
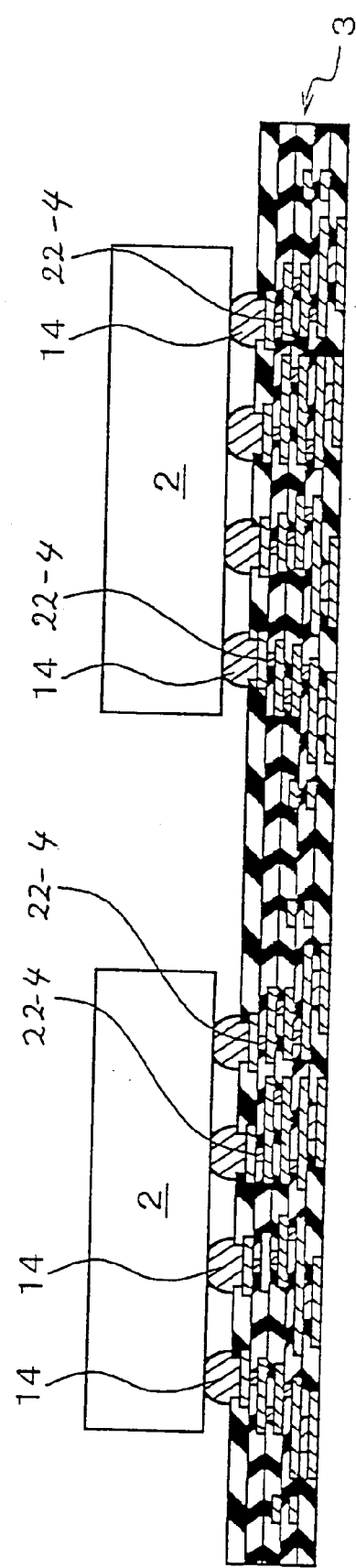
Figure 27P:
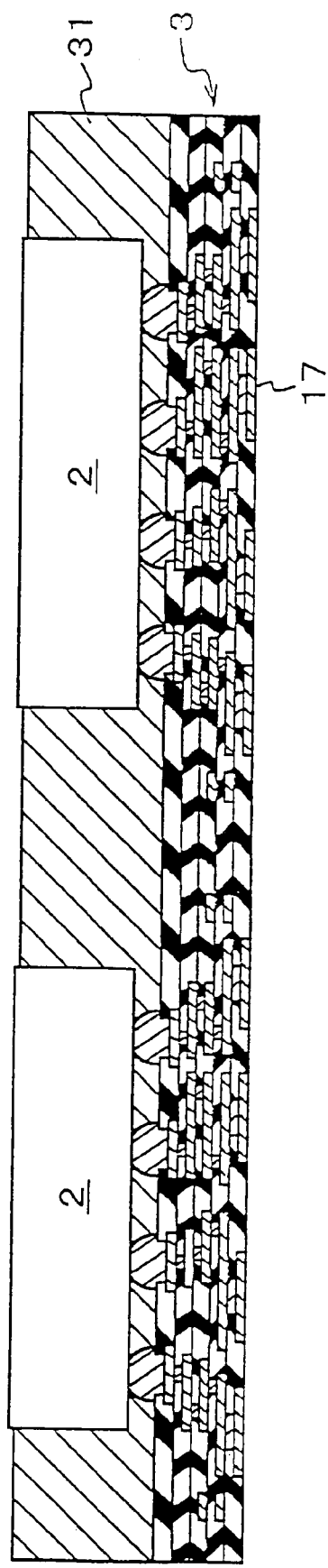
Figure 27Q:
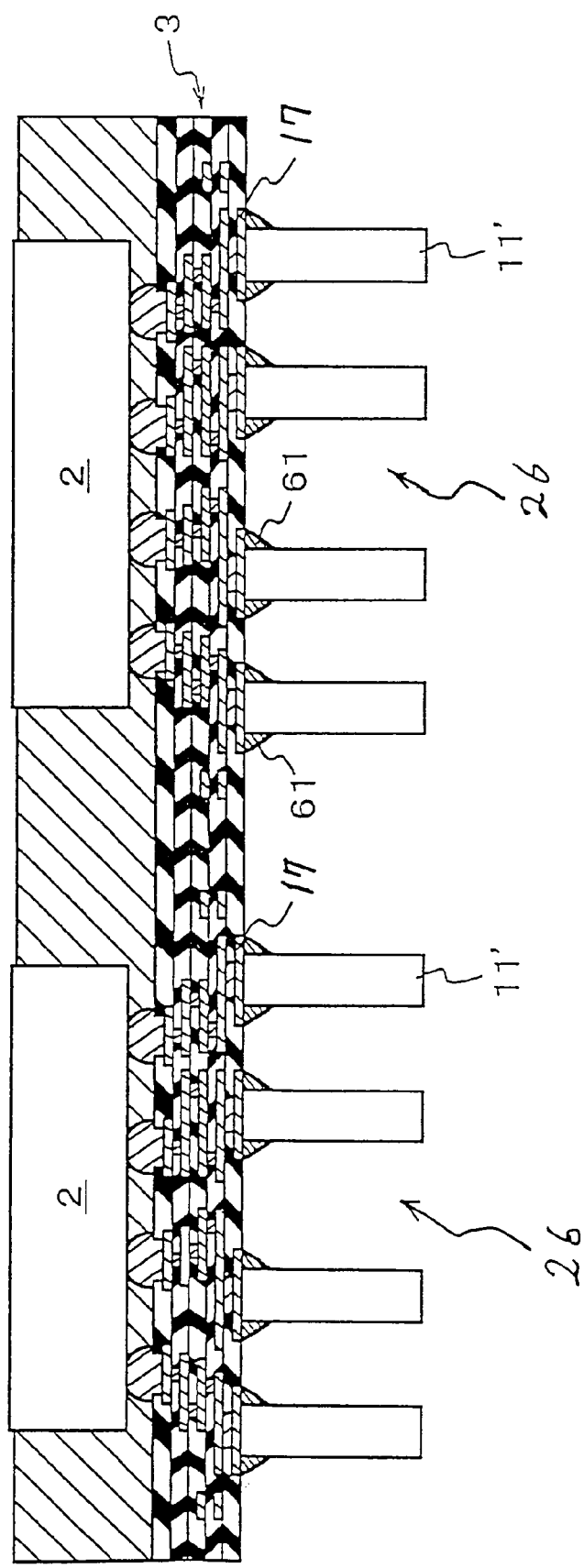
Figure 27R:
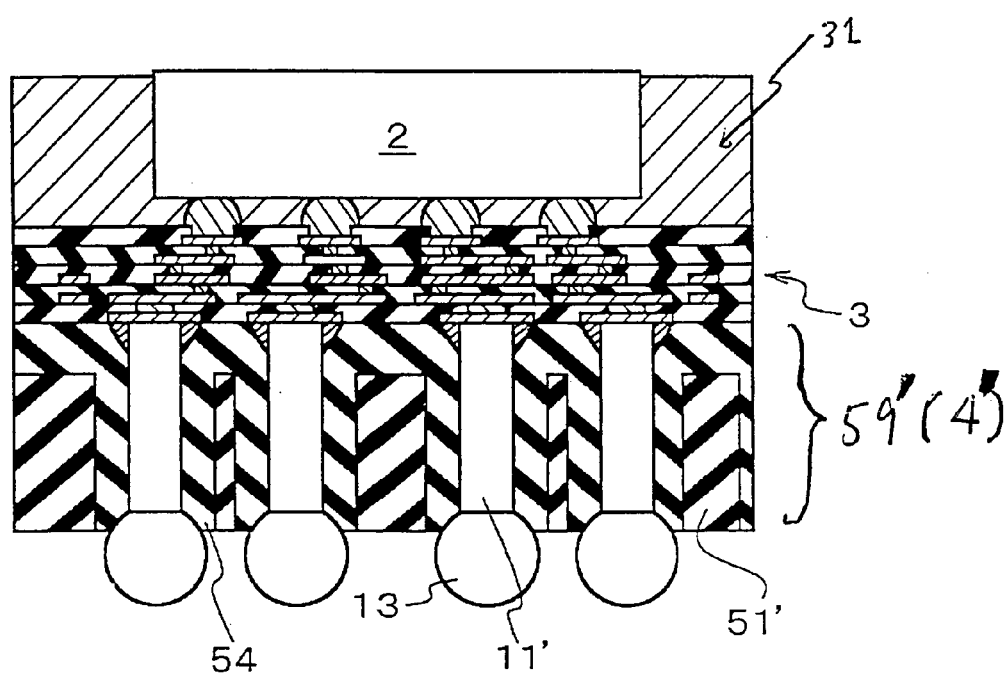

FIGS. 27A through 27R are fragmentary cross sectional elevation views illustrative of a novel method of forming a semiconductor device having a multilayer interconnection board on which a semiconductor chip is mounted in a thirteenth embodiment in accordance with the present invention.

With reference to FIG. 27A, a high rigidity plate 16 is prepared. The high rigidity plate 16 may be made of any material having a high rigidity. Metals such as Cu-, Ni-, Al-, W, Mo-, Au-, Ag- and Pt-based metals, complex materials of different metals and ceramics are available for the high rigidity plate 16.

With reference to FIG. 27B, an adhesive metal layer of a metal such as a Ti-base alloy, a Cr-base alloy, a Mo-base alloy, and a W-base alloy is formed on a first surface of the high rigidity plate 16 by a sputtering method. An electrode material layer of a metal such as Cu, Al, and Ni is then formed on the adhesive metal layer by a sputtering method to form laminations of the adhesive metal layer and the electrode material layer. A resist film is then applied on the laminations of the adhesive metal layer and the electrode material layer. The resist film is then patterned by an exposure and a subsequent development to form a resist pattern. A selective wet etching process or a selective dry etching process to the laminations of the adhesive metal layer and the electrode material layer is carried out by use of the resist pattern as a mask so as to pattern the laminations of the adhesive metal layer and the electrode material layer, whereby external electrode pads 17-1 are selectively formed on the first surface of the high rigidity plate 16. The used resist pattern is then removed.

If a minimum pitch of the external electrode pads 17-1 is not so narrow, then it is possible as a modification that a resist is coated directly on the first surface of the high rigidity plate 16 and then patterned by an exposure and a development to form a resist pattern before a selective electroplating of metal is then carried out by use of the resist pattern as a mask, followed by removal of the used resist pattern.

With reference to FIG. 27C, an insulative resin thin film 18-1 is then formed over the external electrode pads 17-1 and the first surface of the high rigidity plate 16. The insulative resin thin film 18-1 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-1. If a fine pattern of not more than 1.0 micrometer is required, it is preferable to use the silicon dioxide based inorganic materials for utilizing diffusion processes of semiconductor.

With reference to FIG. 27D, the insulative resin thin film 18-1 is selectively removed to form openings 19-1 in the insulative resin thin film 18-1 and over the external electrode pads 17-1. A resist film is applied on the insulative resin thin film 18-1 and then patterned by an exposure and a subsequent development to form a resist pattern on the insulative resin thin film 18-1. If the insulative resin thin film 18-1 is made of a material which is removable by a chemical etching process, the insulative resin thin film 18-1 is selectively removed by a wet etching by use of the resist pattern as a mask to form the openings 19-1 in the insulative resin thin film 18-1. If the insulative resin thin film 18-1 is made of a material which is unremovable by the chemical etching process, the insulative resin thin film 18-1 is selectively removed by a dry etching by use of the resist pattern as a mask to form the openings 19-1 in the insulative resin thin film 18-1. The external electrode pads 17-1 are partially shown through the openings 19-1 formed in the insulative resin thin film 18-1. The used resist pattern is then removed.

With reference to FIG. 27E, an adhesive metal thin film 21*a* is entirely formed which extends on the surface of the insulative resin thin film 18-1 and the shown parts of the external electrode pads 17-1 by a sputtering method. The adhesive metal thin film 21*a* may be made of a Ti-based alloy, a Cr-based alloy, a Mo-based alloy, or a W-based alloy. Subsequently, a metal electrode thin film 21*b* is also entirely formed on the adhesive metal thin film 21*a* by a sputtering method, a chemical vapor deposition or an electroless plating method. The metal electrode thin film 21*b* may be made of Cu, Al or Ni. Laminations of the adhesive metal thin film 21*a* and the metal electrode thin film 21*b* form a metal thin film 21 which extends on the surface of the insulative resin thin film 18-1 and within the openings 19-1 over the external electrode pads 17-1.

With reference to FIG. 27F, a resist film is entirely formed on the metal thin film 21 and then patterned by an exposure and a subsequent development to form a resist pattern over the metal thin film 21. The metal thin film 21 is then patterned by a wet etching or a dry etching by use of the resist pattern as a mask to form metal thin film contact layers 23-1 in the openings 19-1 and metal thin film interconnection layers 22-1 over the insulative resin thin film 18-1, wherein the metal thin film interconnection layers 22-1 are in contact directly with the metal thin film contact layers 23-1, so that the metal thin film interconnection layers 22-1 are electrically connected through the metal thin film contact layers 23-1 to the external electrode pads 17-1. The used resist mask is then removed. The external electrode pads 17-1 shown in FIG. 27F correspond to the first level interconnection pattern 5-1 of the first interconnection layer 5 shown in FIG. 6. The insulative resin thin film 18-1 shown in FIG. 27F also corresponds to the first level insulating layer 5-2 of the first interconnection layer 5 shown in FIG. 6. The metal thin film contact layers 23-1 shown in FIG. 27F also corresponds to the first level contact layer 5-3 of the first interconnection layer 5. The metal thin film interconnection layers 22-1 shown in FIG. 27F also corresponds to the second level interconnection pattern 6-1 of the second interconnection layer 6.

If the pattern pitch of the metal thin film interconnection layers 22-1 is not so narrow, then it is possible as a modification that after the metal thin film 21 has been formed, then the resist pattern is formed on the metal thin film 21 so that a selective electroplating of metal such as Cu is carried out by use of the resist pattern as a mask to form Cu-plated patterns over the metal thin film 21. The used resist mask is then removed. The metal thin film 21 is then selectively etched by use of the Cu-plated patterns as a mask thereby to form the metal thin film interconnection layers 22-1 over the insulative resin thin film 18-1 and the metal thin film contact layers 23-1 in the openings 19-1.

In accordance with the above described method and its modification, it is possible that the thicknesses of the resist film and the metal thin film interconnection layers 22-1 are not more than 1 micrometers.

With reference to FIG. 27G, an insulative resin thin film 18-2 is then formed over the metal thin film interconnection layers 22-1 and the insulative resin thin film 18-1. The insulative resin thin film 18-2 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-2. If a fine pattern of not more than 1.0 micrometer is required, it is preferable to use the silicon dioxide based inorganic materials for utilizing diffusion processes of semiconductor. The insulative resin thin film 18-2 is selectively removed to form openings 19-2 in the insulative resin thin film 18-2 and over the metal thin film interconnection layers 22-1. A resist film is applied on the insulative resin thin film 18-2 and then patterned by an exposure and a subsequent development to form a resist pattern on the insulative resin thin film 18-2. If the insulative resin thin film 18-2 is made of a material which is removable by a chemical etching process, the insulative resin thin film 18-2 is selectively removed by a wet etching by use of the resist pattern as a mask to form the openings 19-2 in the insulative resin thin film 18-2. If the insulative resin thin film 18-2 is made of a material which is unremovable by the chemical etching process, the insulative resin thin film 18-2 is selectively removed by a dry etching by use of the resist pattern as a mask to form the openings 19-2 in the insulative resin thin film 18-2. The metal thin film interconnection layers 22-1 are partially shown through the openings 19-2 formed in the insulative resin thin film 18-2. The used resist pattern is then removed.

With reference to FIG. 27H, an adhesive metal thin film is entirely formed which extends on the surface of the insulative resin thin film 18-2 and the shown parts of the metal thin film interconnection layers 22-1 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-2 and within the openings 19-2 over the metal thin film interconnection layers 22-1. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-2 in the openings 19-2 and metal thin film interconnection layers 22-2 over the insulative resin thin film 18-2, wherein the metal thin film interconnection layers 22-2 are in contact directly with the metal thin film contact layers 23-2, so that the metal thin film interconnection layers 22-2 are electrically connected through the metal thin film contact layers 23-2 to the metal thin film interconnection layers 22-1. The used resist mask is then removed. The metal thin film interconnection layers 22-1 shown in FIG. 27H correspond to the second level interconnection pattern 6-1 of the second interconnection layer 6 shown in FIG. 6. The insulative resin thin film 18-2 shown in FIG. 27H also corresponds to the second level insulating layer 6-2 of the second interconnection layer 6 shown in FIG. 6. The metal thin film contact layers 23-2 shown in FIG. 27H also corresponds to the second level contact layer 6-3 of the second interconnection layer 6. The metal thin film interconnection layers 22-2 shown in FIG. 27H also corresponds to the third level interconnection pattern 7-1 of the third interconnection layer 7.

If the pattern pitch of the metal thin film interconnection layers 22-2 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-2 over the insulative resin thin film 18-2 and the metal thin film contact layers 23-2 in the openings 19-2.

In accordance with the above described method and its modification, it is possible that the thicknesses of the resist film and the metal thin film interconnection layers 22-2 are not more than 1 micrometers.

With reference to FIG. 27I, an insulative resin thin film 18-3 is then formed over the metal thin film interconnection layers 22-2 and the insulative resin thin film 18-2. The insulative resin thin film 18-3 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, to phenol based resins, naphthalene based resins are available for the insulative resin thin film 18-3. If a fine pattern of not more than 1.0 micrometer is required, it is preferable to use the silicon dioxide based inorganic materials for utilizing diffusion processes of semiconductor. The insulative resin thin film 18-3 is selectively removed to form openings 19-3 in the insulative resin thin film 18-3 and over the metal thin film interconnection layers 22-2. A resist film is applied on the insulative resin thin film 18-3 and then patterned by an exposure and a subsequent development to form a resist pattern on the insulative resin thin film 18-3. If the insulative resin thin film 18-3 is made of a material which is removable by a chemical etching process, the insulative resin thin film 18-3 is selectively removed by a wet etching by use of the resist pattern as a mask to form the openings 19-3 in the insulative resin thin film 18-3. If the insulative resin thin film 18-3 is made of a material which is unremovable by the chemical etching process, the insulative resin thin film 18-3 is selectively removed by a dry etching by use of the resist pattern as a mask to form the openings 19-3 in the insulative resin thin film 18-3. The metal thin film interconnection layers 22-2 are partially shown through the openings 19-3 formed in the insulative resin thin film 18-3. The used resist pattern is then removed.

With reference to FIG. 27J, an adhesive metal thin film is entirely formed which extends on the surface of the insulative resin thin film 18-3 and the shown parts of the metal thin film interconnection layers 22-2 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-3 and within the openings 19-3 over the metal thin film interconnection layers 22-2. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-3 in the openings 19-3 and metal thin film interconnection layers 22-3 over the insulative resin thin film 18-3, wherein the metal thin film interconnection layers 22-3 are in contact directly with the metal thin film contact layers 23-3, so that the metal thin film interconnection layers 22-3 are electrically connected through the metal thin film contact layers 23-3 to the metal thin film interconnection layers 22-2. The used resist mask is then removed. The metal thin film interconnection layers 22-2 shown in FIG. 27J correspond to the third level interconnection pattern 7-1 of the third interconnection layer 7 shown in FIG. 6. The insulative resin thin film 18-3 shown in FIG. 27J also corresponds to the third level insulating layer 7-2 of the third interconnection layer 7 shown in FIG. 6. The metal thin film contact layers 23-3 shown in FIG. 27J also corresponds to the third level contact layer 7-3 of the third interconnection layer 7. The metal thin film interconnection layers 22-3 shown in FIG. 27J also corresponds to the fourth level interconnection pattern 8-1 of the third interconnection layer 8.

If the pattern pitch of the metal thin film interconnection layers 22-3 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the metal thin film interconnection layers 22-3 over the insulative resin thin film 18-3 and the metal thin film contact layers 23-3 in the openings 19-3.

In accordance with the above described method and its modification, it is possible that the thicknesses of the resist film and the metal thin film interconnection layers 22-3 are not more than 1 micrometers.

With reference to FIG. 27K, an insulative resin thin film 18-4 is then formed over the metal thin film interconnection layers 22-3 and the insulative resin thin film 18-3. The insulative resin thin film 18-4 may comprise a polyimide based resin thin film which may be formed by a spin coating method, a chemical vapor deposition method or a physical vapor deposition method. In place of the polyimide based resin, silicon dioxide based inorganic materials, and organic materials such as epoxy based resins, silicone based resins, polyolefin based resins, cyanate ester based resins, phenol based resins, naphthalene based resins are available for the insulative resin thin film 18-4. If a fine pattern of not more than 1.0 micrometer is required, it is preferable to use the silicon dioxide based inorganic materials for utilizing diffusion processes of semiconductor. The insulative resin thin film 18-4 is selectively removed to form openings 19-4 in the insulative resin thin film 18-4 and over the metal thin film interconnection layers 22-3. A resist film is applied on the insulative resin thin film 18-4 and then patterned by an exposure and a subsequent development to form a resist pattern on the insulative resin thin film 18-4. If the insulative resin thin film 18-4 is made of a material which is removable by a chemical etching process, the insulative resin thin film 18-4 is selectively removed by a wet etching by use of the resist pattern as a mask to form the openings 19-4 in the insulative resin thin film 18-4. If the insulative resin thin film 18-4 is made of a material which is unremovable by the chemical etching process, the insulative resin thin film 18-4 is selectively removed by a dry etching by use of the resist pattern as a mask to form the openings 19-4 in the insulative resin thin film 18-3. The metal thin film interconnection layers 22-3 are partially shown through the openings 19-4 formed in the insulative resin thin film 18-4. The used resist pattern is then removed.

With reference to FIG. 27L, an adhesive metal thin film is entirely formed which extends on the surface of the insulative resin thin film 18-4 and the shown parts of the metal thin film interconnection layers 22-3 by a sputtering method. The adhesive metal thin film may be made of a Ti-based alloy, a Cr-based alloy, a Mo-based alloy, or a W-based alloy. Subsequently, a metal electrode thin film is also entirely formed on the adhesive metal thin film by a sputtering method, a chemical vapor deposition or an electroless plating method. The metal electrode thin film may be made of Cu, Al or Ni. Laminations of the adhesive metal thin film and the metal electrode thin film form a metal thin film which extends on the surface of the insulative resin thin film 18-4 and within the openings 19-4 over the metal thin film interconnection layers 22-3. A resist film is entirely formed on the metal thin film and then patterned by an exposure and a subsequent development to form a resist pattern over the metal thin film. The metal thin film is then patterned by a wet etching or a dry etching by use of the resist pattern as a mask to form metal thin film contact layers 23-4 in the openings 19-4 and pad electrodes 22-4 over the insulative resin thin film 18-4, wherein the pad electrodes 22-4 are in contact directly with the metal thin film contact layers 23-4, so that the pad electrodes 22-4 are electrically connected through the metal thin film contact layers 23-4 to the metal thin film interconnection layers 22-3. The used resist mask is then removed. The metal thin film interconnection layers 22-3 shown in FIG. 27L correspond to the fourth level interconnection pattern 8-1 of the fourth interconnection layer 8 shown in FIG. 6. The insulative resin thin film 18-4 shown in FIG. 27L also corresponds to the fourth level insulating layer 8-2 of the fourth interconnection layer 8 shown in FIG. 6. The metal thin film contact layers 23-4 shown in FIG. 27L also corresponds to the fourth level contact layer 8-3 of the fourth interconnection layer 8. The pad electrodes 22-4 shown in FIG. 27L also corresponds to the fifth level interconnection pattern 9-1 of the fifth interconnection layer 9.

If the pattern pitch of the pad electrodes 22-4 is not so narrow, then it is possible as a modification that after the metal thin film has been formed, then the resist pattern is formed on the metal thin film so that a selective electroplating of metal such as Cu is carried out by use of the resist pattern as a mask to form Cu-plated patterns over the metal thin film. The used resist mask is then removed. The metal thin film is then selectively etched by use of the Cu-plated patterns as a mask thereby to form the pad electrodes 22-4 over the insulative resin thin film 18-4 and the metal thin film contact layers 23-4 in the openings 19-4.

In accordance with the above described method and its modification, it is possible that the thicknesses of the resist film and the pad electrodes 22-4 are not more than 1 micrometers.

With reference to FIG. 27M, a solder resist film 24 is then formed over the pad electrodes 22-4 and the insulative resin thin film 18-4 in order to protect the multilayer interconnection board 3 having the pad electrodes 24. The solder resist film 24 shown in FIG. 27M corresponds to the fifth level insulating layer 9-2 of the fifth interconnection layer 9 shown in FIG. 6. The solder resist film 24 may comprise an organic insulating film such an epoxy resin film containing an inorganic filler such as fine powders of silicon dioxide. Alternatively, the solder resist film 24 may be made of a material which has a large resistivity to external chemical stress, and a large resistivity to a Flux cleaning solution or an Au plating solution as well as a high adhesiveness to a sealing material such as an under-fill material. If the above first to fourth insulative resin thin films 18-1, 18-2, 18-3 and 18-4 are highly resistive to the chemical and chemical stresses, it is possible as a modification to eliminate the formation of the solder resist film 24. The solder resist film 24 is selectively removed to form openings 24a in the solder resist film 24 and over the pad electrodes 22-4. If the solder resist film 24 is made of a non-photosensitive material, a resist film is applied on the solder resist film 24 and then patterned by an exposure and a subsequent development to form a resist pattern on the solder resist film 24, so that the solder resist film 24 is selectively removed by a wet etching by use of the resist pattern as a mask to form the openings 24a in the solder resist film 24, followed by removal of the used resist pattern. If the solder resist film 24 is made of a photosensitive material, then the solder resist film 24 is directly patterned by an exposure and a subsequent development to form the openings 24a in the solder resist film 24. The electrode pads 22-4 are partially shown through the openings 24a formed in the solder resist film 24.

With reference to FIG. 27N, the high rigidity plate 16 is completely removed by an etching process, whereby the multilayer interconnection board 3 remains. The external electrode pads 17-1 in the first interconnection layer 5 and the pad electrodes 22-4 in the fifth interconnection layer 9 are then subjected to an electroless plating for plating laminated Ni and Au layers or laminated Zn, Ni and Au layers on the external electrode pads 17-1 and the pad electrodes 22-4 in order to improve a bonding property between the external electrode pads 17-1 and also a bonding property between the pad electrodes 22-4 and the bumps 14 of the semiconductor chip 2. As a result, the multilayer interconnection board 3 is completed, which comprises plural unit multilayer interconnection boards. A test for electrical characteristics of the multilayer interconnection board 3 is then made, so that only quality-confirmed units in the plural unit multilayer interconnection boards in the electrical characteristic test are then subjected to a mounting process for mounting semiconductor chips thereon.

With reference to FIG. 27O, semiconductor chips 2 are mounted on the multilayer interconnection board 3, wherein the semiconductor chips 2 have the plural bumps 14, and the plural bumps 14 are made into contact with the electrode pads 22-4 of the multilayer interconnection board 3, so that the semiconductor chips 2 are electrically connected through the plural bumps 14 to the multilayer interconnection board 3. If the bumps 14 are made of a metal based solder material such as Sn or Pb, a flip-chip bonding utilizing a heat re-flow process using Flux is available for bonding the plural bumps 14 to the electrode pads 22-4 of the multilayer interconnection board 3. If the bumps 14 are made of a metal based solder material such as Au or In, a flip-chip bonding utilizing a thermo-compression bonding is available for bonding the plural bumps 14 to the electrode pads 22-4 of the multilayer interconnection board 3.

With reference to FIG. 27P, an insulative resin material 31 is formed which coats side walls of the semiconductor chips 2, an inter-space between the semiconductor chips 2 and the multilayer interconnection board 3 around the bumps 14 and the surface of the solder resist film 24 of the multilayer interconnection board 3 in order to protect the semiconductor chips 2, the bumps 14 and the multilayer interconnection board 3. This coating process is carried out by use of a resin injection technique involving a vacuum sealing technique or a transfer sealing technique. The insulative resin material 31 may be made of one of epoxy resin materials, silicone resin materials, polyimide resin materials, polyolefin resin materials, cyanate ester resin materials, phenol resin materials and naphthalene resin materials.

With reference to FIG. 27Q, plural metal column-shaped buffer layers 11' are bonded by an adhesive 61 in to the external electrode pads 17 of the multilayer interconnection board 3. It is preferable to select an adhesive material which is high in wettability to both the plural metal column-shaped buffer layers 11' and the external electrode pads 17.

With reference to FIG. 27R, the supporting layer 59' comprising the supporting plate 51 and the supporting sealing resin material 54 is formed in gaps 26 between the plural metal column-shaped buffer layers 11'. Namely, the supporting plate 51 is provided which extends in parallel to the bottom surface of the buffer layer 4'. The supporting sealing resin material 54 is filled in the gaps 26 between the plural metal column-shaped buffer layers 11' of the buffer layer 4'. The supporting sealing resin material 54 is tightly contact with upper portions of the solder balls 13 for supporting the solder balls 13 to increase the bonding stability between the solder balls 13 and the plural metal column-shaped buffer layers 11' of the buffer layer 4'. The supporting plate 51 defines a height or a thickness of the supporting sealing resin material 54, wherein the thickness of the supporting sealing resin material 54 is so defined that the upper portions of the solder balls 13 are tightly contact with the supporting sealing resin material 54, so that the tops of the solder balls 13 project from the supporting sealing resin material 54. In accordance with this embodiment, the plural metal column-shaped buffer layers 11' are bonded by the adhesive 61 to the external electrode pads 17 of the multilayer interconnection board 3 after the high rigidity plate 16 of the metal plate has completely been removed from the bottom surface or the second surface of the multilayer interconnection board 3. It is unnecessary to selectively etch the high rigidity plate 16 of the metal plate, whereby it is impossible to cause any in-plane variation in etching to the high rigidity plate 16.

Further, the supporting layer 59' comprising the supporting plate 51 and the supporting sealing resin material 54 is formed in gaps 26 between the plural metal column-shaped buffer layers 11', so that the upper portions of the solder balls 13 are tightly contact with the supporting sealing resin material 54, so that the tops of the solder balls 13 project from the supporting sealing resin material 54. The supporting sealing resin material 54 is also tightly contact with upper portions of the solder balls 13 for supporting the solder balls 13 to increase the bonding stability between the solder balls 13 and the plural metal column-shaped buffer layers 11' of the buffer layer 4'.

In this embodiment, no process for forming the stress absorption layer 12' nor subsequent process for removing a part of the stress absorption layer 12' from the surfaces of the solder balls 13 are required, thereby reducing the number of the necessary fabrication processes as compared to the twelfth embodiment. The support plate 59' of this embodiment is much thicker than that of the twelfth embodiment. This means that the amount of the injected supporting sealing resin material 54 is much larger. Even if a large pressure is applied to the supporting layer 59', then the supporting layer 59' keeps a high planarity of its surface, thereby ensuring that the tops of the solder balls 13 are projected from the planer surface of the supporting layer 59'.

Fourteenth Embodiment

Figure 28:
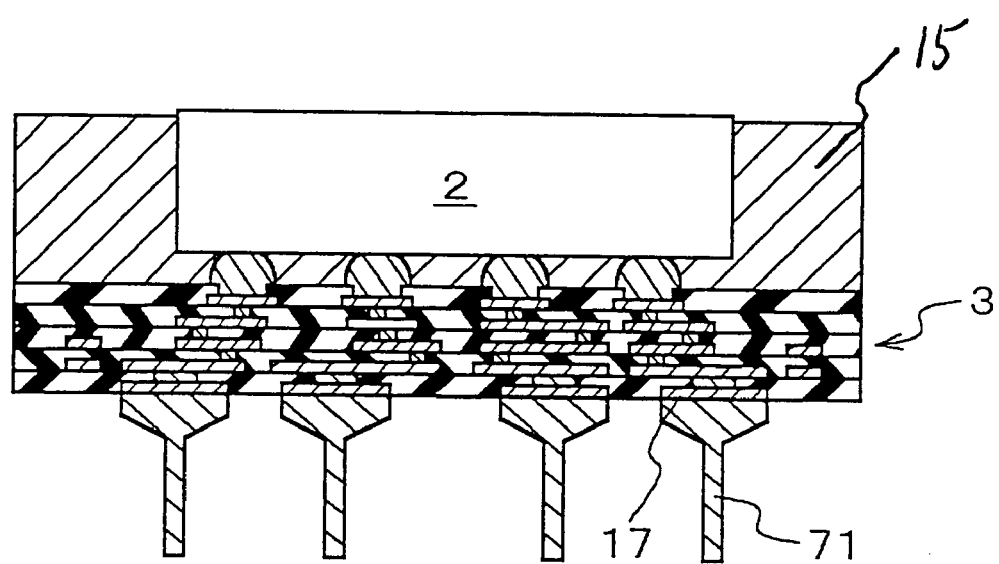
FIG. 28 is a cross sectional elevation view illustrative of a semiconductor device having a multilayer interconnection board, on which a semiconductor chip is mounted in a fourteenth embodiment according to the present invention.

A fourteenth embodiment according to the present invention will be described with reference to the drawing. A difference in the fourteenth embodiment from the first embodiment is in that in place of the solder balls, external pin electrodes are provided which are in contact with external electrode pads of the multilayer interconnection and further that the heat spreader is not provided. FIG. 28 is a cross sectional elevation view illustrative of a semiconductor device having a multilayer interconnection board, on which a semiconductor chip is mounted in a fourteenth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17 on which external pin electrodes 71 are provided. A sealing resin material 15 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. The external pin electrodes 71 are much higher in flexibility or stress-absorbility than the solder balls. In this embodiment, in place of the solder balls, the external pin electrodes 71 are provided which are much higher in flexibility or stress-absorbility than the solder balls for highly absorbing a stress applied between the multilayer interconnection board 3 and a circuit board not illustrated.

Fifteenth Embodiment

Figure 29:
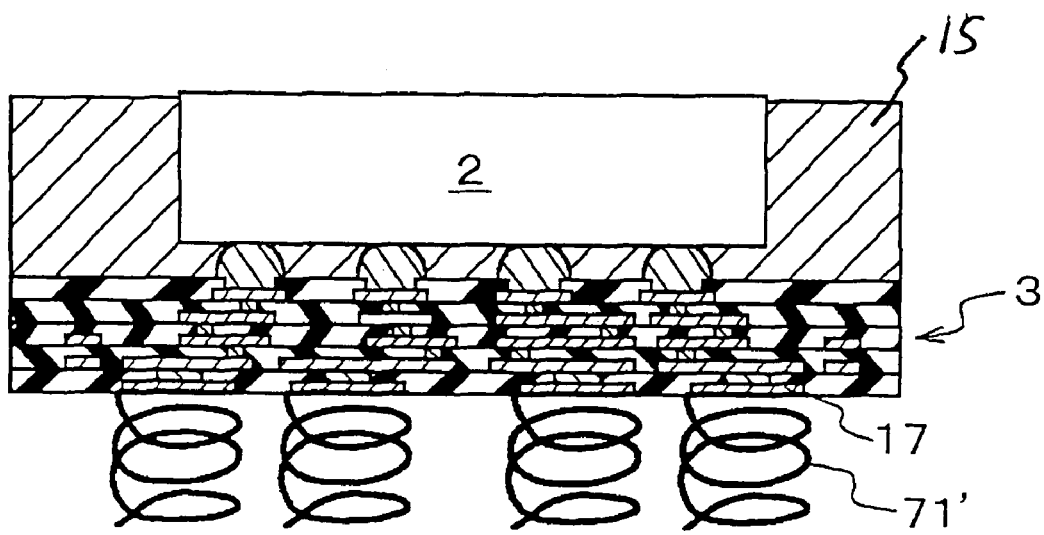
FIG. 29 is a cross sectional elevation view illustrative of a semiconductor device having a multilayer interconnection board, on which a semiconductor chip is mounted in a fifteenth embodiment according to the present invention.

A fifteenth embodiment according to the present invention will be described with reference to the drawing. A difference in the fifteenth embodiment from the first embodiment is in that in place of the solder balls, external coil-spring electrodes are provided which are in contact with external electrode pads of the multilayer interconnection and further that the heat spreader is not provided. FIG. 29 is a cross sectional elevation view illustrative of a semiconductor device having a multilayer interconnection board, on which a semiconductor chip is mounted in a fifteenth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17 on which external coil-spring electrodes 71' are provided. A sealing resin material 15 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. The external coil-spring electrodes 71' are much higher in flexibility or stress-absorbility than the solder balls. In this embodiment, in place of the solder balls, the external coil-spring electrodes 71' are provided which are much higher in flexibility or stress-absorbility than the solder balls for highly absorbing a stress applied between the multilayer interconnection board 3 and a circuit board not illustrated.

Sixteenth Embodiment

Figure 30:
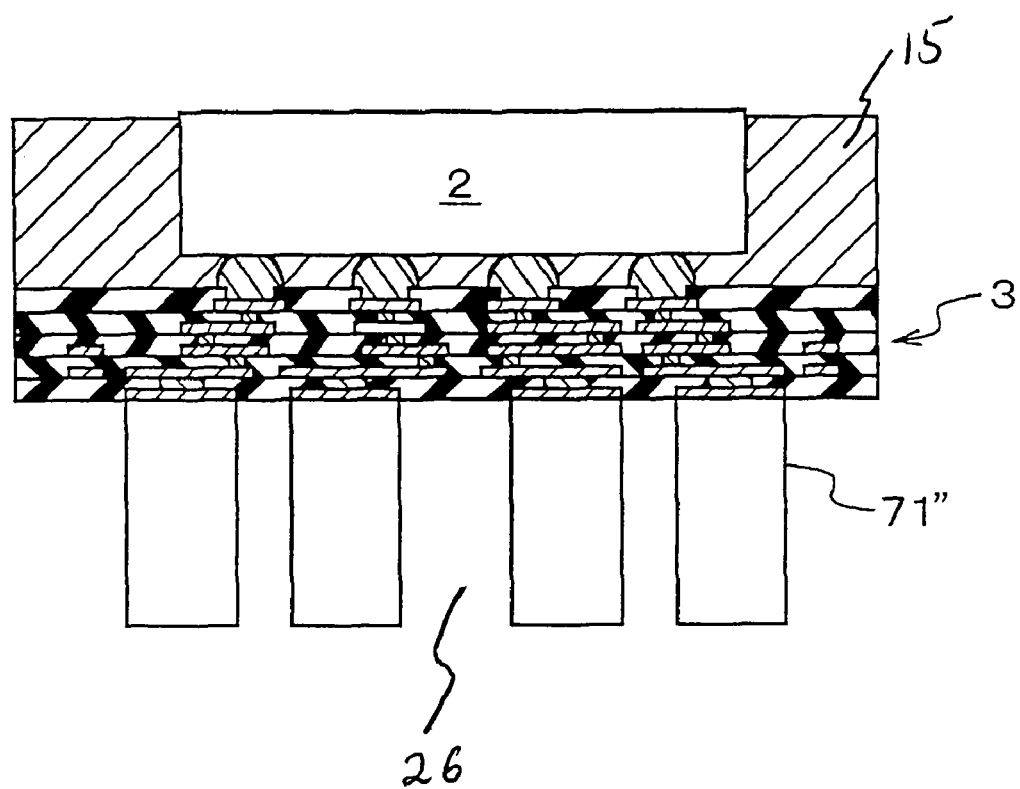
FIG. 30 is a cross sectional elevation view illustrative of a semiconductor device having a multilayer interconnection board, on which a semiconductor chip is mounted in a sixteenth embodiment according to the present invention.

A sixteenth embodiment according to the present invention will be described with reference to the drawing. A difference in the sixteenth embodiment from the first embodiment is in that in place of the solder balls, external column electrodes are provided which are in contact with external electrode pads of the multilayer interconnection and further that the heat spreader is not provided. FIG. 30 is a cross sectional elevation view illustrative of a semiconductor device having a multilayer interconnection board, on which a semiconductor chip is mounted in a sixteenth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17 on which external column electrodes 71" are provided. A sealing resin material 15 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. The external column electrodes 71" are not higher in flexibility or stress-absorbility than the pin electrodes or the coil-spring electrodes, but much higher in rigidity than the pin electrodes or the coil-spring electrodes. Further, the external column electrodes 71" ensures the planarity of the multilayer interconnection board 3 when the multilayer interconnection board 3 is mounted on a circuit board not illustrated. The external column electrodes 71" provide a large stand-off height, whereby a reliability in mounting the multilayer interconnection board 3 on the circuit board is improved.

Seventeenth Embodiment

Figure 31:
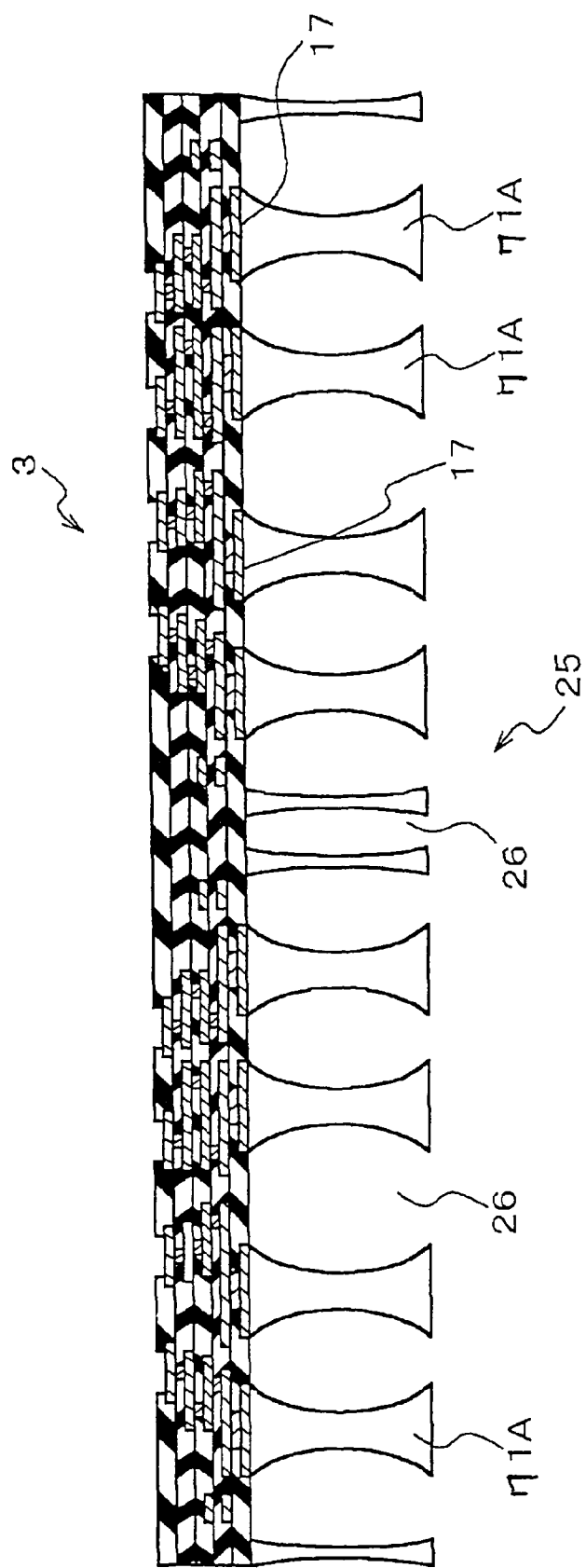
FIG. 31 is a cross sectional elevation view illustrative of a semiconductor device having a multilayer interconnection board, on which a semiconductor chip is mounted in a sixteenth embodiment according to the present invention.

A seventeenth embodiment according to the present invention will be described with reference to the drawing. A difference in the seventeenth embodiment from the first embodiment is in that external center-pinched column electrodes are provided which are in contact with external electrode pads of the multilayer interconnection and further that the heat spreader is not provided. FIG. 31 is a cross sectional elevation view illustrative of a semiconductor device having a multilayer interconnection board, on which a semiconductor chip is mounted in a sixteenth embodiment according to the present invention. A semiconductor device 32 has a multilayer interconnection board 3. A flip-chip semiconductor chip 2 is flip-mounted on the multilayer interconnection board 3, wherein a first surface of the flip-chip semiconductor chip 2 is electrically connected through bumps 14 to a first surface of the multilayer interconnection board 3. A second surface of the multilayer interconnection board 3 has arrays of external electrode pads 17 on which external center-pinched column electrodes 71A are provided. Each of the external center-pinched column electrodes 71A varies in horizontal cross sectional area in a vertical direction or a longitudinal direction, so that the horizontal cross sectional area becomes minimum at its center position or at an intermediate height whilst the horizontal cross sectional area becomes increased toward the top and bottom thereof. Namely, each of the external center-pinched column electrodes 71A is pinched at its center position or at an intermediate height. A sealing resin material 15 is provided over the first surface of the multilayer interconnection board 3 for sealing the semiconductor chip 2 and the bumps 14. The bumps 14 and the solder balls 13 are eclectically connected to each other through multilevel interconnections of the multilayer interconnection board 3. The external center-pinched column electrodes 71A are higher in flexibility or stress-absorbility than the external straight column electrodes 71" and further higher in rigidity than the pin electrodes or the coil-spring electrodes.

In this embodiment, in place of the solder balls, the external center-pinched column electrodes 71A are provided which are much higher in flexibility or stress-absorbility than the solder balls for highly absorbing a stress applied between the multilayer interconnection board 3 and a circuit board not illustrated. Further, the external center-pinched column electrodes 71A ensures the planarity of the multilayer interconnection board 3 when the multilayer interconnection board 3 is mounted on a circuit board not illustrated. The external center-pinched column electrodes 71A provide a large stand-off height, whereby a reliability in mounting the multilayer interconnection board 3 on the circuit board is improved.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

The invention claimed is:

1. A method of forming an interconnection board, comprising:
    forming an interconnection board on a plate; and
    removing said plate from a first side of said interconnection board thereby exposing at least one external electrode pad having an exposed surface level with said first side so that said first side and said exposed surface form a single flat plane;
    forming a supporting plate having a plurality of holes corresponding to the exposed at least one external electrode pad of said interconnection board, into which a plurality of external electrodes are inserted, so that said supporting plate extends in parallel to a second surface of a buffer layer to form an inter-space between said supporting plate and said second surface of said buffer layer; and
    forming a supporting sealing resin material which fills said inter-space and surrounding parts of said external electrodes so that said supporting sealing resin material is in contact with said parts of said external electrodes for supporting said external electrodes,
    wherein during the forming of said interconnection board, said interconnection board remains fixed to said plate, and during the removing said plate the exposed surface of said at least one external electrode pad remains exposed.

2. The method as claimed in claim 1, wherein said interconnection board comprises a multilayer interconnection board having a multilevel interconnection structure.

3. The method as claimed in claim 1, the removing said plate includes completely removing said plate from said interconnection board, after said interconnection board is fabricated on said plate.

4. The method as claimed in claim 3, wherein said plate is made of a metal.

5. The method as claimed in claim 3, wherein said plate is made of an alloy.

6. The method as claimed in claim 3, wherein said high rigidity plate is made of a ceramic.

7. The method as claimed in claim 3, wherein said interconnection board includes an organic insulative material.

8. The method as claimed in claim 7, wherein said organic material is a polymer resin material.

9. The method as claimed in claim 1, further comprising the step of: selectively removing said high rigidity plate from said interconnection board to form plural generally column shaped electrically conductive layers on said interconnection board, after said interconnection board is fabricated on said high rigidity plate.

10. The method as claimed in claim 9, further comprising the step of: forming external electrodes on said plural generally column shaped electrically conductive layers so that said external electrodes are electrically connected through said plural generally column shaped electrically conductive layers to said interconnection board.

11. The method as claimed in claim 9, further comprising the step of: forming an stress absorption layer being lower in rigidity than said plural generally column shaped electrically conductive layers, which fills gaps between said plural generally column shaped electrically conductive layers, so that said stress absorption layer surrounds said plural generally column shaped electrically conductive layers, whereby said stress absorption layer is in tightly contact with said plural generally column shaped electrically conductive layers.

12. The method as claimed in claim 11, further comprising the step of: forming external electrodes on said plural generally column shaped electrically conductive layers so that said external electrodes are electrically connected through said plural generally column shaped electrically conductive layers to said interconnection board.

13. The method as claimed in claim 12, further comprising the step of:
    forming a supporting plate having plural holes, into which said external electrodes are inserted, so that said supporting plate extends in parallel to said second surface of said buffer layer to form an inter-space between said supporting plate and said second surface of said buffer layer; and
    forming a supporting sealing resin material which fills said inter-space and surrounding parts of said external electrodes so that said supporting sealing resin material is in tightly contact with said parts of said external electrodes for supporting said external electrodes.

14. The method as claimed in claim 1, further comprising the step of:
    bonding a plurality of column-shaped electrically conductive layers to said exposed at least one external electrode pad of said interconnection board via an adhesive; and forming external electrodes on said plurality of column-shaped electrically conductive layers so that said external electrodes are electrically connected through said plurality of column-shaped electrically conductive layers to said exposed at least one external electrode pad of said interconnection board.

15. A method of forming an interconnection board, comprising:

forming an interconnection board on a plate; and removing said plate from a first side of said interconnection board thereby exposing at least one external electrode pad having an exposed surface level with said first side so that said first side and said exposed surface form a single flat plane;

bonding a plurality of column-shaped electrically conductive layers to said exposed at least one external electrode pad of said interconnection board via an adhesive;

forming external electrodes on said plurality of column-shaped electrically conductive layers so that said external electrodes are electrically connected through said plurality of column-shaped electrically conductive layers to said exposed at least one external electrode pad of said interconnection board;

forming a supporting plate having a plurality of holes corresponding to said exposed at least one external electrode pad of said interconnection board, into which said plurality of column-shaped electrically conductive layers with said external electrodes are inserted, and said supporting plate extending in parallel to a second surface of said interconnection board to form an inter-space between said supporting plate and said second surface of said interconnection board; and forming a supporting sealing resin material which fills said inter-space and surrounds both said plurality of column-shaped electrically conductive layers and parts of said external electrodes so that said supporting sealing resin material is in contact with said plurality of column-shaped electrically conductive layers and said parts of said external electrodes for supporting said external electrodes;

wherein during the forming of said interconnection board, said interconnection board remains fixed to said plate, and during the removing said plate the exposed surface of said at least one external electrode pad remains exposed.

16. The method as claimed in claim 1, further comprising the step of:

mounting at least a semiconductor chip on said interconnection board; and completely removing said plate from said interconnection board.

17. The method as claimed in claim 1, further comprising the step of:

mounting at least a semiconductor chip on said interconnection board;

forming at least a heat spreader on said at least semiconductor chip; and completely removing said plate from said interconnection board.

18. The method as claimed in claim 1 further comprising the step of:

mounting at least a semiconductor chip on said interconnection board; and selectively removing said high rigidity plate from said interconnection board to form plural generally column shaped electrically conductive layers on said interconnection board.

19. The method as claimed in claim 1 further comprising the step of:

mounting at least a semiconductor chip on said interconnection board;

forming at least a heat spreader on said at least semiconductor chip; and selectively removing said high rigidity plate from said interconnection board to form plural generally column shaped electrically conductive layers on said interconnection board.

* * * * *